United States Patent
Buller et al.

(10) Patent No.: US 11,691,343 B2
(45) Date of Patent: *Jul. 4, 2023

(54) THREE-DIMENSIONAL PRINTING AND THREE-DIMENSIONAL PRINTERS

(71) Applicant: Velo3D, Inc., Campbell, CA (US)

(72) Inventors: Benyamin Buller, Cupertino, CA (US); Zachary Ryan Murphree, San Jose, CA (US); Richard Joseph Romano, San Jose, CA (US); Thomas Blasius Brezoczky, Los Gatos, CA (US); Alan Rick Lappen, San Jose, CA (US)

(*) Notice: Subject to any disclaimer, the term of this patent is extended or adjusted under 35 U.S.C. 154(b) by 252 days.

This patent is subject to a terminal disclaimer.

(21) Appl. No.: 16/419,912

(22) Filed: May 22, 2019

(65) Prior Publication Data
US 2019/0291184 A1  Sep. 26, 2019

Related U.S. Application Data

(63) Continuation of application No. 16/253,103, filed on Jan. 21, 2019, now abandoned, which is a
(Continued)

(51) Int. Cl.
*B29C 64/364* (2017.01)
*B33Y 50/02* (2015.01)
(Continued)

(52) U.S. Cl.
CPC ............ *B29C 64/364* (2017.08); *B28B 1/001* (2013.01); *B28B 17/0081* (2013.01);
(Continued)

(58) Field of Classification Search
CPC .............. B22F 2201/00; B22F 2201/10; B22F 3/1055; B22F 2003/1056;
(Continued)

(56) References Cited

U.S. PATENT DOCUMENTS 430,047 A   6/1890  Tylee
3,790,787 A  2/1974  Geller
(Continued)

FOREIGN PATENT DOCUMENTS

CN   1057034 C   10/2000
CN   1648802 A   8/2005
(Continued)

OTHER PUBLICATIONS

US 10,507,527 B2, 12/2019, Romano et al. (withdrawn)
(Continued)

*Primary Examiner* — Philip C Tucker
*Assistant Examiner* — Jimmy R Smith, Jr.
(74) *Attorney, Agent, or Firm* — Ronit Buller; Wilson Sonsini Goodrich & Rosati

(57) ABSTRACT

The present disclosure provides three-dimensional (3D) printing processes, apparatuses, software, and systems for the production of at least one desired 3D object. The 3D printer system (e.g., comprising a processing chamber, build module, or an unpacking station) described herein may retain a desired (e.g., inert) atmosphere around the material bed and/or 3D object at multiple 3D printing stages. The 3D printer described herein comprises one or more build modules that may have a controller separate from the controller of the processing chamber. The 3D printer described herein comprises a platform that may be automatically constructed. The invention(s) described herein may allow the 3D printing process to occur for a long time without operator intervention and/or down time.

42 Claims, 37 Drawing Sheets

Related U.S. Application Data continuation of application No. 15/634,267, filed on Jun. 27, 2017, now Pat. No. 10,252,336.

(60) Provisional application No. 62/506,149, filed on May 15, 2017, provisional application No. 62/472,320, filed on Mar. 16, 2017, provisional application No. 62/421,836, filed on Nov. 14, 2016, provisional application No. 62/356,465, filed on Jun. 29, 2016.

(51) Int. Cl.

| | |
|---|---|
| *B33Y 30/00* | (2015.01) |
| *B29C 64/393* | (2017.01) |
| *B29C 64/371* | (2017.01) |
| *B29C 64/386* | (2017.01) |
| *B33Y 40/20* | (2020.01) |
| *B22F 10/12* | (2021.01) |
| *B22F 10/25* | (2021.01) |
| *B29C 64/153* | (2017.01) |
| *B28B 17/00* | (2006.01) |
| *B28B 1/00* | (2006.01) |
| *B33Y 40/00* | (2020.01) |
| *B29C 64/188* | (2017.01) |
| *B29C 64/20* | (2017.01) |
| *B29C 64/255* | (2017.01) |
| *B29C 64/25* | (2017.01) |
| *B22F 10/18* | (2021.01) |
| *B22F 10/28* | (2021.01) |
| *B22F 12/33* | (2021.01) |
| *B22F 12/49* | (2021.01) |
| *B22F 12/70* | (2021.01) |
| *B22F 12/88* | (2021.01) |
| *B22F 12/90* | (2021.01) |
| *B22F 10/43* | (2021.01) |
| *B22F 10/31* | (2021.01) |
| *B22F 10/32* | (2021.01) |

(52) U.S. Cl.
CPC .......... *B29C 64/153* (2017.08); *B29C 64/188* (2017.08); *B29C 64/20* (2017.08); *B29C 64/25* (2017.08); *B29C 64/255* (2017.08); *B29C 64/371* (2017.08); *B29C 64/386* (2017.08); *B29C 64/393* (2017.08); *B33Y 30/00* (2014.12); *B33Y 40/00* (2014.12); *B33Y 40/20* (2020.01); *B33Y 50/02* (2014.12); *B22F 10/12* (2021.01); *B22F 10/18* (2021.01); *B22F 10/25* (2021.01); *B22F 10/28* (2021.01); *B22F 10/31* (2021.01); *B22F 10/32* (2021.01); *B22F 10/43* (2021.01); *B22F 12/33* (2021.01); *B22F 12/49* (2021.01); *B22F 12/70* (2021.01); *B22F 12/88* (2021.01); *B22F 12/90* (2021.01); *B22F 2201/10* (2013.01)

(58) Field of Classification Search
CPC ...... B22F 2003/1057; B22F 2003/1058; B22F 2003/1059; B22F 10/20; B29C 64/364; B29C 64/153; B29C 64/371; B33Y 40/00; B33Y 40/20; B33Y 30/00; B33Y 10/00

See application file for complete search history.

(56) References Cited

U.S. PATENT DOCUMENTS

| | | |
|---|---|---|
| 3,849,003 A | 11/1974 | Velzel |
| 3,864,809 A | 2/1975 | Donachie |
| 4,019,066 A | 4/1977 | Lucas et al. |
| 4,177,087 A | 12/1979 | Hills et al. |
| 4,300,474 A | 11/1981 | Livsey et al. |
| 4,323,756 A | 4/1982 | Brown et al. |
| 4,359,622 A | 11/1982 | Dostoomian et al. |
| 4,823,158 A | 4/1989 | Casey et al. |
| 4,845,356 A | 7/1989 | Baker |
| 4,863,538 A | 9/1989 | Deckard |
| 4,927,582 A | 5/1990 | Bryson |
| 4,938,816 A | 7/1990 | Beaman et al. |
| 4,961,154 A | 10/1990 | Pomerantz et al. |
| 4,962,988 A | 10/1990 | Swann |
| 5,088,047 A | 2/1992 | Bynum |
| 5,127,037 A | 6/1992 | Bynum |
| 5,155,321 A | 10/1992 | Grube et al. |
| 5,156,697 A | 10/1992 | Bourell et al. |
| 5,162,660 A | 11/1992 | Popil |
| 5,202,837 A | 4/1993 | Coe et al. |
| 5,203,944 A | 4/1993 | Prinz et al. |
| 5,204,055 A | 4/1993 | Sachs et al. |
| 5,208,431 A | 5/1993 | Uchiyama et al. |
| 5,223,781 A | 6/1993 | Criswell et al. |
| 5,252,264 A | 10/1993 | Forderhase et al. |
| 5,255,057 A | 10/1993 | Stelter et al. |
| 5,286,573 A | 2/1994 | Prinz et al. |
| 5,296,062 A | 3/1994 | Bourell et al. |
| 5,303,141 A | 4/1994 | Batchelder et al. |
| 5,325,516 A | 6/1994 | Blomgren et al. |
| 5,342,919 A | 8/1994 | Dickens, Jr. et al. |
| 5,352,405 A | 10/1994 | Beaman et al. |
| 5,354,414 A | 10/1994 | Feygin et al. |
| 5,386,427 A | 1/1995 | Zayhowski |
| 5,387,380 A | 2/1995 | Cima et al. |
| 5,393,482 A | 2/1995 | Benda et al. |
| 5,396,333 A | 3/1995 | Aleshin et al. |
| 5,424,834 A | 6/1995 | Akedo et al. |
| 5,430,666 A | 7/1995 | Deangelis et al. |
| 5,460,758 A | 10/1995 | Langer et al. |
| 5,508,489 A | 4/1996 | Benda et al. |
| 5,527,877 A | 6/1996 | Dickens, Jr. et al. |
| 5,530,221 A | 6/1996 | Benda et al. |
| 5,534,104 A | 7/1996 | Langer et al. |
| 5,536,467 A | 7/1996 | Reichle et al. |
| 5,582,876 A | 12/1996 | Langer et al. |
| 5,593,531 A | 1/1997 | Penn |
| 5,594,652 A | 1/1997 | Penn et al. |
| 5,601,737 A | 2/1997 | Asahi et al. |
| 5,615,013 A | 3/1997 | Rueb et al. |
| 5,640,667 A | 6/1997 | Freitag et al. |
| 5,647,931 A | 7/1997 | Retallick et al. |
| 5,648,450 A | 7/1997 | Dickens, Jr. et al. |
| 5,658,412 A | 8/1997 | Retallick et al. |
| 5,665,401 A | 9/1997 | Serbin et al. |
| 5,730,925 A | 3/1998 | Mattes et al. |
| 5,733,497 A | 3/1998 | McAlea et al. |
| 5,745,834 A | 4/1998 | Bampton et al. |
| 5,749,041 A | 5/1998 | Lakshminarayan et al. |
| 5,753,171 A | 5/1998 | Serbin et al. |
| 5,753,274 A | 5/1998 | Wilkening et al. |
| 5,764,874 A | 6/1998 | White |
| 5,786,562 A | 7/1998 | Larson |
| 5,800,579 A | 9/1998 | Billingsley et al. |
| 5,818,718 A | 10/1998 | Thomas et al. |
| 5,821,475 A | 10/1998 | Morehead et al. |
| 5,824,259 A | 10/1998 | Allanic et al. |
| 5,832,415 A | 11/1998 | Wilkening et al. |
| 5,859,786 A | 1/1999 | Klein |
| 5,876,550 A | 3/1999 | Feygin et al. |
| 5,876,767 A | 3/1999 | Mattes et al. |
| 5,904,890 A | 5/1999 | Lohner et al. |
| 5,908,569 A | 6/1999 | Wilkening et al. |
| 5,932,059 A | 8/1999 | Langer et al. |
| 5,951,864 A | 9/1999 | Hazrati et al. |
| 6,042,774 A | 3/2000 | Wilkening et al. |
| 6,051,055 A | 4/2000 | Ukawa et al. |
| 6,066,285 A | 5/2000 | Kumar |
| 6,085,122 A | 7/2000 | Manning |
| 6,106,659 A | 8/2000 | Spence et al. |
| 6,126,276 A | 10/2000 | Davis et al. |
| 6,136,257 A | 10/2000 | Graf et al. |

(56) References Cited

U.S. PATENT DOCUMENTS

| | | |
|---|---|---|
| 6,138,892 A | 10/2000 | Kim et al. |
| 6,143,378 A | 11/2000 | Harwell et al. |
| 6,151,345 A | 11/2000 | Gray |
| 6,169,605 B1 | 1/2001 | Penn et al. |
| 6,175,422 B1 | 1/2001 | Penn et al. |
| 6,206,672 B1 | 3/2001 | Grenda |
| 6,207,097 B1 | 3/2001 | Iverson |
| 6,215,093 B1 | 4/2001 | Meiners et al. |
| 6,251,488 B1 | 6/2001 | Miller et al. |
| 6,261,077 B1 | 7/2001 | Bishop et al. |
| 6,268,584 B1 | 7/2001 | Keicher et al. |
| 6,336,480 B2 | 1/2002 | Gaylo et al. |
| 6,337,459 B1 | 1/2002 | Terwijn et al. |
| 6,341,042 B1 | 1/2002 | Matsunaka et al. |
| 6,376,148 B1 | 4/2002 | Liu et al. |
| 6,391,251 B1 | 5/2002 | Keicher et al. |
| 6,401,001 B1 | 6/2002 | Jang et al. |
| 6,483,596 B1 | 11/2002 | Philippi et al. |
| 6,492,651 B2 | 12/2002 | Kerekes |
| 6,531,036 B1 | 3/2003 | Leitgeb et al. |
| 6,531,086 B1 | 3/2003 | Larsson |
| 6,554,600 B1 | 4/2003 | Hofmann et al. |
| 6,583,379 B1 | 6/2003 | Meiners et al. |
| 6,636,676 B1 | 10/2003 | Renn |
| 6,656,409 B1 | 12/2003 | Keicher et al. |
| 6,656,410 B2 | 12/2003 | Hull et al. |
| 6,672,343 B1 | 1/2004 | Perret et al. |
| 6,682,688 B1 | 1/2004 | Higashi et al. |
| 6,688,886 B2 | 2/2004 | Hughes et al. |
| 6,722,872 B1 | 4/2004 | Swanson et al. |
| 6,767,499 B1 | 7/2004 | Hory et al. |
| 6,811,744 B2 | 11/2004 | Keicher et al. |
| 6,814,823 B1 | 11/2004 | White |
| 6,815,636 B2 | 11/2004 | Chung et al. |
| 6,823,124 B1 | 11/2004 | Renn et al. |
| 6,824,714 B1 | 11/2004 | Tuerck et al. |
| 6,861,613 B1 | 3/2005 | Meiners et al. |
| 6,905,645 B2 | 6/2005 | Iskra |
| 6,930,278 B1 | 8/2005 | Chung et al. |
| 6,932,935 B1 | 8/2005 | Oberhofer et al. |
| 6,945,638 B2 | 9/2005 | Teung et al. |
| 6,949,216 B2 | 9/2005 | Brice et al. |
| 6,955,023 B2 | 10/2005 | Rotheroe |
| 6,963,338 B1 | 11/2005 | Bachelder et al. |
| 6,986,654 B2 | 1/2006 | Imiolek et al. |
| 6,989,115 B2 | 1/2006 | Russell et al. |
| 6,994,894 B2 | 2/2006 | Hofmeister |
| 7,008,209 B2 | 3/2006 | Iskra et al. |
| 7,027,887 B2 | 4/2006 | Gaylo et al. |
| 7,045,015 B2 | 5/2006 | Renn et al. |
| 7,047,098 B2 | 5/2006 | Lindemann et al. |
| 7,073,442 B2 | 7/2006 | Fedor et al. |
| 7,084,370 B2 | 8/2006 | Hagemeister et al. |
| 7,107,118 B2 | 9/2006 | Orozco et al. |
| 7,108,894 B2 | 9/2006 | Renn |
| 7,149,596 B2 | 12/2006 | Berger et al. |
| 7,153,463 B2 | 12/2006 | Leuterer et al. |
| 7,229,272 B2 | 6/2007 | Leuterer et al. |
| 7,241,415 B2 | 7/2007 | Khoshnevis |
| 7,261,542 B2 | 8/2007 | Hickerson et al. |
| 7,261,550 B2 | 8/2007 | Herzog |
| 7,270,844 B2 | 9/2007 | Renn |
| 7,294,366 B2 | 11/2007 | Renn et al. |
| 7,296,599 B2 | 11/2007 | Cox et al. |
| 7,326,377 B2 | 2/2008 | Adams |
| 7,357,629 B2 | 4/2008 | Weiskopf et al. |
| 7,419,632 B2 | 9/2008 | Keller |
| 7,435,368 B2 | 10/2008 | Davidson et al. |
| 7,452,500 B2 | 11/2008 | Uckelmann |
| 7,454,262 B2 | 11/2008 | Larsson |
| 7,485,345 B2 | 2/2009 | Renn et al. |
| 7,515,986 B2 | 4/2009 | Huskamp |
| 7,521,652 B2 | 4/2009 | Chung et al. |
| 7,537,722 B2 | 5/2009 | Andersson et al. |
| 7,540,738 B2 | 6/2009 | Larsson et al. |
| 7,604,768 B2 | 10/2009 | Kritchman |
| 7,615,179 B2 | 11/2009 | Dumond et al. |
| 7,628,600 B2 | 12/2009 | Perret |
| 7,635,825 B2 | 12/2009 | Larsson |
| 7,639,267 B1 | 12/2009 | Desimone et al. |
| 7,658,163 B2 | 2/2010 | Renn et al. |
| 7,661,948 B2 | 2/2010 | Perret et al. |
| 7,665,979 B2 | 2/2010 | Heugel |
| 7,674,107 B2 | 3/2010 | Perret et al. |
| 7,674,671 B2 | 3/2010 | Renn et al. |
| 7,686,605 B2 | 3/2010 | Perret et al. |
| 7,704,432 B2 | 4/2010 | Dumond et al. |
| 7,713,048 B2 | 5/2010 | Perret et al. |
| 7,713,454 B2 | 5/2010 | Larsson |
| 7,740,683 B2 | 6/2010 | Thorsson et al. |
| 7,741,578 B2 | 6/2010 | Adams et al. |
| 7,789,037 B2 | 9/2010 | Teulet et al. |
| 7,799,253 B2 | 9/2010 | Hochsmann et al. |
| 7,814,441 B2 | 10/2010 | Bae et al. |
| 7,820,241 B2 | 10/2010 | Perret et al. |
| 7,833,465 B2 | 11/2010 | Larsson |
| 7,837,458 B2 | 11/2010 | Perret et al. |
| 7,847,212 B2 | 12/2010 | Renz et al. |
| 7,850,885 B2 | 12/2010 | Philippi et al. |
| 7,863,544 B2 | 1/2011 | Serruys et al. |
| 7,871,551 B2 | 1/2011 | Wallgren et al. |
| 7,879,394 B1 | 2/2011 | Keicher et al. |
| 7,891,095 B2 | 2/2011 | Jonsson et al. |
| 7,901,604 B2 | 3/2011 | Oberhofer et al. |
| 7,931,462 B2 | 4/2011 | Mattes |
| 7,936,352 B2 | 5/2011 | Baran et al. |
| 7,938,079 B2 | 5/2011 | King et al. |
| 7,938,341 B2 | 5/2011 | Renn et al. |
| 7,946,840 B2 | 5/2011 | Perret et al. |
| 7,976,302 B2 | 7/2011 | Halder et al. |
| 7,987,813 B2 | 8/2011 | Renn et al. |
| 7,991,465 B2 | 8/2011 | Bartic et al. |
| 8,025,831 B2 | 9/2011 | Kong et al. |
| 8,031,384 B2 | 10/2011 | Perret et al. |
| 8,034,279 B2 | 10/2011 | Dimter et al. |
| 8,048,359 B2 | 11/2011 | Wang et al. |
| 8,073,315 B2 | 12/2011 | Philippi |
| 8,075,814 B2 | 12/2011 | Fruth et al. |
| 8,083,513 B2 | 12/2011 | Montero-Escuder et al. |
| 8,110,247 B2 | 2/2012 | Renn et al. |
| 8,124,192 B2 | 2/2012 | Paasche et al. |
| 8,132,744 B2 | 3/2012 | Renn et al. |
| 8,137,739 B2 | 3/2012 | Philippi et al. |
| 8,172,562 B2 | 5/2012 | Mattes |
| 8,186,414 B2 | 5/2012 | Furlong et al. |
| 8,186,990 B2 | 5/2012 | Perret et al. |
| 8,187,521 B2 | 5/2012 | Larsson et al. |
| 8,187,522 B2 | 5/2012 | Higashi et al. |
| 8,249,480 B2 | 8/2012 | Aslam et al. |
| 8,260,447 B2 | 9/2012 | Mattes et al. |
| 8,272,579 B2 | 9/2012 | King et al. |
| 8,299,208 B2 | 10/2012 | Muller et al. |
| 8,303,886 B2 | 11/2012 | Philippi |
| 8,308,466 B2 | 11/2012 | Ackelid et al. |
| 8,313,087 B2 | 11/2012 | Hesse et al. |
| 8,317,508 B2 | 11/2012 | Bokodi et al. |
| 8,366,432 B2 | 2/2013 | Perret et al. |
| 8,414,281 B2 | 4/2013 | Schleiss et al. |
| 8,455,051 B2 | 6/2013 | Renn et al. |
| 8,488,994 B2 | 7/2013 | Hanson et al. |
| 8,501,075 B2 | 8/2013 | Philippi et al. |
| 8,502,107 B2 | 8/2013 | Uckelmann |
| 8,524,142 B2 | 9/2013 | Uckelmann et al. |
| 8,525,071 B2 | 9/2013 | Leuterer |
| 8,543,361 B2 | 9/2013 | Chen et al. |
| 8,556,981 B2 | 10/2013 | Jones et al. |
| 8,570,534 B1 | 10/2013 | Loewgren |
| 8,590,157 B2 | 11/2013 | Kruth et al. |
| 8,640,975 B2 | 2/2014 | King |
| 8,658,078 B2 | 2/2014 | Weidinger et al. |
| 8,705,144 B2 | 4/2014 | Gullentops et al. |
| 8,710,144 B2 | 4/2014 | Hesse et al. |
| 8,728,387 B2 | 5/2014 | Jones et al. |
| 8,734,694 B2 | 5/2014 | Perret et al. |

(56) References Cited

U.S. PATENT DOCUMENTS

| | | |
|---|---|---|
| 8,753,105 B2 | 6/2014 | Scott |
| 8,784,720 B2 | 7/2014 | Oberhofer et al. |
| 8,784,721 B2 | 7/2014 | Philippi et al. |
| 8,794,263 B2 | 8/2014 | Scott et al. |
| 8,796,146 B2 | 8/2014 | Renn et al. |
| 8,803,073 B2 | 8/2014 | Philippi |
| 8,845,319 B2 | 9/2014 | Oberhofer et al. |
| 8,884,186 B2 | 11/2014 | Uckelmann et al. |
| 8,887,658 B2 | 11/2014 | Essien et al. |
| 8,895,893 B2 | 11/2014 | Perret et al. |
| 8,906,216 B2 | 12/2014 | Detor et al. |
| 8,915,620 B2 | 12/2014 | Vaes et al. |
| 8,945,456 B2 | 2/2015 | Zenere et al. |
| 8,967,990 B2 | 3/2015 | Weidinger et al. |
| 8,968,625 B2 | 3/2015 | Tan |
| 8,994,592 B2 | 3/2015 | Scott et al. |
| 9,011,982 B2 | 4/2015 | Muller et al. |
| 9,037,068 B2 | 5/2015 | Kojima |
| 9,064,671 B2 | 6/2015 | Ljungblad et al. |
| 9,073,265 B2 | 7/2015 | Snis |
| 9,079,248 B2 | 7/2015 | Ackelid |
| 9,114,478 B2 | 8/2015 | Scott et al. |
| 9,114,652 B1 | 8/2015 | Wayman |
| 9,117,039 B1 | 8/2015 | Mosterman et al. |
| 9,126,167 B2 | 9/2015 | Ljungblad |
| 9,162,393 B2 | 10/2015 | Ackelid |
| 9,162,394 B2 | 10/2015 | Ackelid |
| 9,192,054 B2 | 11/2015 | King et al. |
| 9,205,691 B1 | 12/2015 | Jones et al. |
| 9,221,100 B2 | 12/2015 | Schwarze et al. |
| 9,233,507 B2 | 1/2016 | Bibas |
| 9,254,535 B2 | 2/2016 | Buller et al. |
| 9,272,369 B2 | 3/2016 | Bruck et al. |
| 9,308,583 B2 | 4/2016 | El-Dasher et al. |
| 9,314,972 B2 | 4/2016 | Green |
| 9,327,450 B2 | 5/2016 | Hein et al. |
| 9,327,451 B2 | 5/2016 | Teulet |
| 9,346,127 B2 | 5/2016 | Buller et al. |
| 9,366,422 B2 | 6/2016 | McClure et al. |
| 9,380,304 B1 | 6/2016 | Chang et al. |
| 9,399,256 B2 | 7/2016 | Buller et al. |
| 9,403,235 B2 | 8/2016 | Buller et al. |
| 9,415,443 B2 | 8/2016 | Ljungblad et al. |
| 9,486,878 B2 | 11/2016 | Buller et al. |
| 9,498,921 B2 | 11/2016 | Teulet et al. |
| 9,505,057 B2 | 11/2016 | Nordkvist et al. |
| 9,522,426 B2 | 12/2016 | Das et al. |
| 9,527,246 B2 | 12/2016 | Wiesner et al. |
| 9,533,452 B2 | 1/2017 | Guenster et al. |
| 9,550,207 B2 | 1/2017 | Ackelid et al. |
| 9,573,193 B2 | 2/2017 | Buller et al. |
| 9,573,225 B2 | 2/2017 | Buller et al. |
| 9,586,290 B2 | 3/2017 | Buller et al. |
| 9,592,554 B2 | 3/2017 | Abe et al. |
| 9,662,840 B1 | 5/2017 | Buller et al. |
| 9,676,145 B2 | 6/2017 | Buller et al. |
| 9,700,908 B2 | 7/2017 | Baker et al. |
| 9,757,760 B2 | 9/2017 | Halder et al. |
| 9,821,411 B2 | 11/2017 | Buller et al. |
| 9,827,717 B2 | 11/2017 | Huang et al. |
| 9,835,568 B2 | 12/2017 | Woods et al. |
| 9,886,526 B2 | 2/2018 | Huang et al. |
| 9,919,360 B2 | 3/2018 | Buller et al. |
| 9,919,476 B2 | 3/2018 | Paternoster et al. |
| 9,931,697 B2 | 4/2018 | Levin et al. |
| 9,962,767 B2 | 5/2018 | Buller et al. |
| 10,022,915 B2 | 7/2018 | Bostick et al. |
| 10,035,188 B2 | 7/2018 | Weilhammer et al. |
| 10,035,304 B2 | 7/2018 | Reinarz et al. |
| 10,058,920 B2 | 8/2018 | Buller et al. |
| 10,065,270 B2 | 9/2018 | Buller et al. |
| 10,071,422 B2 | 9/2018 | Buller et al. |
| 10,112,236 B2 | 10/2018 | Schlick et al. |
| 10,144,176 B1 | 12/2018 | Buller et al. |
| 10,183,330 B2 | 1/2019 | Buller et al. |
| 10,195,693 B2 | 2/2019 | Buller et al. |
| 10,207,454 B2 | 2/2019 | Buller et al. |
| 10,252,335 B2 | 4/2019 | Buller et al. |
| 10,252,336 B2* | 4/2019 | Buller ................ B28B 17/0081 |
| 10,259,044 B2 | 4/2019 | Buller et al. |
| 10,272,525 B1 | 4/2019 | Buller et al. |
| 10,286,452 B2 | 5/2019 | Buller et al. |
| 10,286,603 B2 | 5/2019 | Buller et al. |
| 10,315,252 B2 | 6/2019 | Symeonidis et al. |
| 10,357,829 B2 | 7/2019 | Spink et al. |
| 10,357,957 B2 | 7/2019 | Buller et al. |
| 10,369,629 B2 | 8/2019 | Symeonidis et al. |
| 10,434,573 B2 | 10/2019 | Buller et al. |
| 10,442,003 B2 | 10/2019 | Symeonidis et al. |
| 10,449,696 B2 | 10/2019 | Elgar et al. |
| 10,493,564 B2 | 12/2019 | Buller et al. |
| 10,507,549 B2 | 12/2019 | Buller et al. |
| 10,583,482 B2 | 3/2020 | Heugel et al. |
| 10,611,092 B2 | 4/2020 | Buller et al. |
| 10,625,374 B2 | 4/2020 | Schwarze |
| 10,688,722 B2 | 6/2020 | Buller et al. |
| 2001/0017085 A1 | 8/2001 | Kubo et al. |
| 2002/0017509 A1 | 2/2002 | Ishide et al. |
| 2002/0020945 A1 | 2/2002 | Cho et al. |
| 2002/0041818 A1 | 4/2002 | Abe et al. |
| 2002/0079601 A1 | 6/2002 | Russell et al. |
| 2002/0090410 A1 | 7/2002 | Tochimoto et al. |
| 2002/0104973 A1 | 8/2002 | Kerekes |
| 2002/0129485 A1 | 9/2002 | Mok et al. |
| 2002/0145213 A1 | 10/2002 | Liu et al. |
| 2002/0152002 A1 | 10/2002 | Lindemann et al. |
| 2002/0158054 A1 | 10/2002 | Manetsberger et al. |
| 2002/0195747 A1 | 12/2002 | Hull et al. |
| 2003/0106378 A1 | 6/2003 | Giannakopoulos et al. |
| 2003/0201255 A1 | 10/2003 | Manetsberger et al. |
| 2003/0206820 A1 | 11/2003 | Keicher et al. |
| 2003/0222066 A1 | 12/2003 | Low et al. |
| 2003/0232512 A1 | 12/2003 | Dickinson et al. |
| 2004/0003738 A1 | 1/2004 | Imiolek et al. |
| 2004/0003741 A1 | 1/2004 | Iskra et al. |
| 2004/0004303 A1 | 1/2004 | Iskra |
| 2004/0004653 A1 | 1/2004 | Pryor et al. |
| 2004/0005182 A1 | 1/2004 | Gaylo et al. |
| 2004/0026807 A1 | 2/2004 | Andersson et al. |
| 2004/0045941 A1* | 3/2004 | Herzog ................ B23K 26/02 219/121.6 |
| 2004/0056022 A1 | 3/2004 | Meiners et al. |
| 2004/0061260 A1 | 4/2004 | Heugel |
| 2004/0084814 A1 | 5/2004 | Boyd et al. |
| 2004/0094728 A1 | 5/2004 | Herzog et al. |
| 2004/0099996 A1 | 5/2004 | Herzog |
| 2004/0118309 A1 | 6/2004 | Fedor et al. |
| 2004/0121257 A1 | 6/2004 | Kaminsky et al. |
| 2004/0173946 A1 | 9/2004 | Pfeifer et al. |
| 2004/0179808 A1 | 9/2004 | Renn |
| 2004/0197493 A1 | 10/2004 | Renn et al. |
| 2004/0200816 A1 | 10/2004 | Chung et al. |
| 2004/0204785 A1 | 10/2004 | Richardson |
| 2004/0217095 A1 | 11/2004 | Herzog |
| 2004/0222549 A1 | 11/2004 | Sano et al. |
| 2004/0228004 A1 | 11/2004 | Sercel et al. |
| 2004/0262261 A1 | 12/2004 | Fink et al. |
| 2005/0011631 A1 | 1/2005 | Hong |
| 2005/0035285 A1 | 2/2005 | Tan et al. |
| 2005/0116391 A1* | 6/2005 | Lindemann ........... B29C 64/357 264/497 |
| 2005/0133527 A1 | 6/2005 | Dullea et al. |
| 2005/0142024 A1 | 6/2005 | Herzog |
| 2005/0156991 A1 | 7/2005 | Renn |
| 2005/0163917 A1 | 7/2005 | Renn |
| 2005/0186716 A1 | 8/2005 | Kasumi |
| 2005/0207901 A1 | 9/2005 | Klobucar et al. |
| 2005/0258570 A1 | 11/2005 | Kong et al. |
| 2005/0278933 A1 | 12/2005 | Macke, Jr. et al. |
| 2005/0287031 A1 | 12/2005 | Macke, Jr. et al. |
| 2006/0000814 A1 | 1/2006 | Gu et al. |
| 2006/0003095 A1 | 1/2006 | Bullen et al. |
| 2006/0019232 A1 | 1/2006 | Fischer et al. |
| 2006/0054079 A1 | 3/2006 | Withey et al. |

(56) References Cited

U.S. PATENT DOCUMENTS

| | | |
|---|---|---|
| 2006/0111807 A1 | 5/2006 | Gothait et al. |
| 2006/0118532 A1 | 6/2006 | Chung et al. |
| 2006/0156978 A1 | 7/2006 | Lipson et al. |
| 2006/0180300 A1 | 8/2006 | Lenehan et al. |
| 2006/0181700 A1 | 8/2006 | Andrews et al. |
| 2006/0187326 A1 | 8/2006 | Spencer |
| 2006/0192322 A1 | 8/2006 | Abe et al. |
| 2006/0208396 A1 | 9/2006 | Abe et al. |
| 2006/0211158 A1 | 9/2006 | Arai et al. |
| 2006/0214335 A1 | 9/2006 | Cox et al. |
| 2006/0228248 A1 | 10/2006 | Larsson |
| 2006/0228897 A1 | 10/2006 | Timans et al. |
| 2006/0249485 A1 | 11/2006 | Partanen et al. |
| 2006/0280866 A1 | 12/2006 | Marquez et al. |
| 2007/0001342 A1 | 1/2007 | Oberhofer et al. |
| 2007/0003656 A1 | 1/2007 | Labossiere et al. |
| 2007/0019028 A1 | 1/2007 | Renn et al. |
| 2007/0023977 A1 | 2/2007 | Braun et al. |
| 2007/0035069 A1 | 2/2007 | Wust et al. |
| 2007/0051704 A1 | 3/2007 | Husmann et al. |
| 2007/0052836 A1 | 3/2007 | Yamada et al. |
| 2007/0057412 A1 | 3/2007 | Weiskopf et al. |
| 2007/0122562 A1 | 5/2007 | Adams |
| 2007/0142914 A1 | 6/2007 | Jones et al. |
| 2007/0154634 A1 | 7/2007 | Renn |
| 2007/0175875 A1 | 8/2007 | Uckelmann et al. |
| 2007/0176312 A1 | 8/2007 | Clark et al. |
| 2007/0183918 A1 | 8/2007 | Monsheimer et al. |
| 2007/0196561 A1 | 8/2007 | Philippi et al. |
| 2007/0241482 A1 | 10/2007 | Giller et al. |
| 2007/0290409 A1 | 12/2007 | Brice et al. |
| 2008/0006334 A1 | 1/2008 | Davidson et al. |
| 2008/0013299 A1 | 1/2008 | Renn |
| 2008/0014457 A1 | 1/2008 | Gennaro et al. |
| 2008/0026338 A1 | 1/2008 | Cinader et al. |
| 2008/0060330 A1 | 3/2008 | Davidson et al. |
| 2008/0131540 A1 | 6/2008 | Perret et al. |
| 2008/0138515 A1 | 6/2008 | Williams |
| 2008/0151951 A1 | 6/2008 | Elliott et al. |
| 2008/0204748 A1 | 8/2008 | Nomaru et al. |
| 2008/0206460 A1 | 8/2008 | Rhoades et al. |
| 2008/0208268 A1 | 8/2008 | Bartic et al. |
| 2008/0257867 A1 | 10/2008 | Malshe et al. |
| 2009/0004380 A1 | 1/2009 | Hochsmann et al. |
| 2009/0017220 A1 | 1/2009 | Muller et al. |
| 2009/0025638 A1 | 1/2009 | Inoue |
| 2009/0035411 A1 | 2/2009 | Seibert et al. |
| 2009/0039570 A1 | 2/2009 | Clark |
| 2009/0042050 A1 | 2/2009 | Matteazzi et al. |
| 2009/0045553 A1 | 2/2009 | Weidinger et al. |
| 2009/0047165 A1 | 2/2009 | Syvanen et al. |
| 2009/0059235 A1 | 3/2009 | Qu et al. |
| 2009/0061077 A1 | 3/2009 | King et al. |
| 2009/0069301 A1 | 3/2009 | Milburn et al. |
| 2009/0090298 A1 | 4/2009 | King et al. |
| 2009/0114151 A1 | 5/2009 | Renn et al. |
| 2009/0152771 A1 | 6/2009 | Philippi et al. |
| 2009/0185178 A1 | 7/2009 | Miyoshi et al. |
| 2009/0206065 A1 | 8/2009 | Kruth et al. |
| 2009/0206522 A1 | 8/2009 | Hein et al. |
| 2009/0257672 A1 | 10/2009 | Sullender |
| 2009/0314391 A1 | 12/2009 | Crump et al. |
| 2010/0006228 A1 | 1/2010 | Abe et al. |
| 2010/0012630 A1 | 1/2010 | Leuterer |
| 2010/0044547 A1 | 2/2010 | Higashi et al. |
| 2010/0125356 A1 | 5/2010 | Shkolnik et al. |
| 2010/0138028 A1 | 6/2010 | Tasker et al. |
| 2010/0140550 A1 | 6/2010 | Keller et al. |
| 2010/0163405 A1 | 7/2010 | Ackelid |
| 2010/0173096 A1 | 7/2010 | Kritchman et al. |
| 2010/0174392 A1 | 7/2010 | Fink et al. |
| 2010/0215856 A1 | 8/2010 | Kritchman |
| 2010/0233012 A1 | 9/2010 | Higashi et al. |
| 2010/0242843 A1 | 9/2010 | Peretti et al. |
| 2010/0305743 A1 | 12/2010 | Larsson |
| 2010/0323050 A1 | 12/2010 | Kumagai et al. |
| 2011/0029093 A1 | 2/2011 | Bojarski et al. |
| 2011/0042031 A1 | 2/2011 | Furlong et al. |
| 2011/0046916 A1 | 2/2011 | Yu et al. |
| 2011/0052927 A1 | 3/2011 | Martinoni et al. |
| 2011/0061591 A1 | 3/2011 | Stecker |
| 2011/0106290 A1 | 5/2011 | Hoevel et al. |
| 2011/0123383 A1 | 5/2011 | Fuwa et al. |
| 2011/0133367 A1 | 6/2011 | Weidinger et al. |
| 2011/0135840 A1 | 6/2011 | Doye et al. |
| 2011/0165339 A1 | 7/2011 | Skoglund et al. |
| 2011/0165340 A1 | 7/2011 | Baumann |
| 2011/0168091 A1 | 7/2011 | Baumann et al. |
| 2011/0187713 A1 | 8/2011 | Pershing et al. |
| 2011/0190904 A1 | 8/2011 | Lechmann et al. |
| 2011/0221100 A1 | 9/2011 | Wesselky et al. |
| 2011/0223349 A1 | 9/2011 | Scott |
| 2011/0259862 A1 | 10/2011 | Scott et al. |
| 2011/0278773 A1 | 11/2011 | Bokodi et al. |
| 2011/0287185 A1 | 11/2011 | Felstead et al. |
| 2011/0291331 A1 | 12/2011 | Scott |
| 2011/0293771 A1 | 12/2011 | Oberhofer et al. |
| 2012/0000893 A1 | 1/2012 | Broude et al. |
| 2012/0010741 A1 | 1/2012 | Hull et al. |
| 2012/0013256 A1 | 1/2012 | McDermott |
| 2012/0013710 A1 | 1/2012 | Ehrlich et al. |
| 2012/0052145 A1 | 3/2012 | Chen et al. |
| 2012/0090734 A1 | 4/2012 | Heinlein |
| 2012/0100031 A1 | 4/2012 | Ljungblad et al. |
| 2012/0106150 A1 | 5/2012 | Vaes et al. |
| 2012/0107496 A1 | 5/2012 | Thoma |
| 2012/0119399 A1* | 5/2012 | Fruth ................ B29C 67/0077 264/39 |
| 2012/0126457 A1 | 5/2012 | Abe et al. |
| 2012/0130525 A1 | 5/2012 | Tsai et al. |
| 2012/0133928 A1 | 5/2012 | Urano et al. |
| 2012/0134386 A1 | 5/2012 | Bender et al. |
| 2012/0139166 A1 | 6/2012 | Abe et al. |
| 2012/0145806 A1 | 6/2012 | Yang |
| 2012/0155606 A1 | 6/2012 | Simon et al. |
| 2012/0164322 A1 | 6/2012 | Teulet |
| 2012/0186779 A1 | 7/2012 | Tan et al. |
| 2012/0211926 A1 | 8/2012 | Larsson et al. |
| 2012/0213615 A1 | 8/2012 | Sakaue |
| 2012/0223059 A1 | 9/2012 | Ackelid |
| 2012/0228492 A1 | 9/2012 | Franzen |
| 2012/0228807 A1 | 9/2012 | Teulet |
| 2012/0231175 A1 | 9/2012 | Tan |
| 2012/0231576 A1 | 9/2012 | King et al. |
| 2012/0234671 A1 | 9/2012 | Ackelid |
| 2012/0235548 A1 | 9/2012 | Cordes et al. |
| 2012/0251378 A1 | 10/2012 | Abe et al. |
| 2012/0267347 A1 | 10/2012 | Arjakine et al. |
| 2012/0308781 A1 | 12/2012 | Abe et al. |
| 2012/0318777 A1 | 12/2012 | Kwok et al. |
| 2013/0016400 A1 | 1/2013 | Yamashita |
| 2013/0064706 A1 | 3/2013 | Schwarze et al. |
| 2013/0080866 A1 | 3/2013 | Ogilvie et al. |
| 2013/0089642 A1 | 4/2013 | Lipson et al. |
| 2013/0093866 A1 | 4/2013 | Ohlhues et al. |
| 2013/0101746 A1 | 4/2013 | Keremes et al. |
| 2013/0112366 A1 | 5/2013 | Mottin et al. |
| 2013/0112672 A1 | 5/2013 | Keremes et al. |
| 2013/0134637 A1 | 5/2013 | Wiesner et al. |
| 2013/0162643 A1 | 6/2013 | Cardle |
| 2013/0168902 A1 | 7/2013 | Herzog et al. |
| 2013/0171019 A1 | 7/2013 | Gessler et al. |
| 2013/0180959 A1 | 7/2013 | Weston et al. |
| 2013/0186558 A1 | 7/2013 | Comb et al. |
| 2013/0206058 A1* | 8/2013 | Mauck ................ H01L 51/56 118/300 |
| 2013/0218531 A1 | 8/2013 | Deichmann et al. |
| 2013/0228302 A1 | 9/2013 | Rickenbacher et al. |
| 2013/0256953 A1 | 10/2013 | Teulet |
| 2013/0270750 A1 | 10/2013 | Green |
| 2013/0272746 A1 | 10/2013 | Hanson et al. |
| 2013/0277891 A1 | 10/2013 | Teulet |
| 2013/0280547 A1 | 10/2013 | Brandl et al. |
| 2013/0287933 A1 | 10/2013 | Kaiser et al. |

(56) References Cited

U.S. PATENT DOCUMENTS

| | | |
|---|---|---|
| 2013/0300035 A1 | 11/2013 | Snis |
| 2013/0300286 A1 | 11/2013 | Ljungblad et al. |
| 2013/0312928 A1 | 11/2013 | Mercelis et al. |
| 2013/0329098 A1 | 12/2013 | Lim et al. |
| 2013/0330470 A1 | 12/2013 | Gersch et al. |
| 2013/0341313 A1 | 12/2013 | Himmelsbach et al. |
| 2014/0000836 A1 | 1/2014 | Xu et al. |
| 2014/0034626 A1 | 2/2014 | Illston |
| 2014/0035182 A1 | 2/2014 | Boyer et al. |
| 2014/0049779 A1 | 2/2014 | Tin et al. |
| 2014/0049964 A1 | 2/2014 | McClure et al. |
| 2014/0065194 A1 | 3/2014 | Yoo et al. |
| 2014/0086654 A1 | 3/2014 | Kojima |
| 2014/0086780 A1 | 3/2014 | Miller et al. |
| 2014/0123458 A1 | 5/2014 | Fearon et al. |
| 2014/0147328 A1 | 5/2014 | Abe et al. |
| 2014/0150992 A1 | 6/2014 | Koontz et al. |
| 2014/0154088 A1 | 6/2014 | Etter et al. |
| 2014/0157579 A1 | 6/2014 | Chhabra et al. |
| 2014/0163717 A1 | 6/2014 | Das et al. |
| 2014/0176127 A1 | 6/2014 | Kogej et al. |
| 2014/0241615 A1 | 8/2014 | Shroff et al. |
| 2014/0246809 A1 | 9/2014 | Hofmann et al. |
| 2014/0251481 A1 | 9/2014 | Kroll et al. |
| 2014/0252687 A1 | 9/2014 | El-Dasher et al. |
| 2014/0265045 A1 | 9/2014 | Cullen et al. |
| 2014/0271221 A1 | 9/2014 | Soucy et al. |
| 2014/0271328 A1 | 9/2014 | Burris et al. |
| 2014/0271965 A1 | 9/2014 | Ferrar |
| 2014/0287080 A1 | 9/2014 | Scott et al. |
| 2014/0288890 A1 | 9/2014 | Khainson et al. |
| 2014/0301883 A1 | 10/2014 | Wiesner et al. |
| 2014/0302187 A1 | 10/2014 | Pawlikowski et al. |
| 2014/0314609 A1 | 10/2014 | Ljungblad et al. |
| 2014/0314964 A1 | 10/2014 | Ackelid |
| 2014/0329953 A1 | 11/2014 | Paternoster |
| 2014/0332507 A1 | 11/2014 | Fockele et al. |
| 2014/0335313 A1 | 11/2014 | Chou et al. |
| 2014/0348691 A1 | 11/2014 | Ljungblad et al. |
| 2014/0348692 A1 | 11/2014 | Bessac et al. |
| 2014/0348969 A1 | 11/2014 | Scott |
| 2014/0361464 A1 | 12/2014 | Holcomb |
| 2014/0363585 A1 | 12/2014 | Pialot et al. |
| 2014/0370323 A1 | 12/2014 | Ackelid |
| 2014/0374935 A1 | 12/2014 | Flitsch et al. |
| 2014/0377117 A1 | 12/2014 | Herrmann et al. |
| 2015/0004046 A1 | 1/2015 | Graham et al. |
| 2015/0014281 A1 | 1/2015 | Trimmer et al. |
| 2015/0017013 A1 | 1/2015 | Tozzi et al. |
| 2015/0021815 A1 | 1/2015 | Albrecht et al. |
| 2015/0021832 A1 | 1/2015 | Yerazunis et al. |
| 2015/0034606 A1 | 2/2015 | Blackmore |
| 2015/0037599 A1 | 2/2015 | Blackmore |
| 2015/0048528 A1 | 2/2015 | Barton |
| 2015/0049082 A1 | 2/2015 | Coffey et al. |
| 2015/0050463 A1 | 2/2015 | Nakano et al. |
| 2015/0054191 A1 | 2/2015 | Ljungblad |
| 2015/0060042 A1 | 3/2015 | Shilpiekandula et al. |
| 2015/0061170 A1 | 3/2015 | Engel et al. |
| 2015/0061195 A1 | 3/2015 | Defelice et al. |
| 2015/0064047 A1 | 3/2015 | Hyde et al. |
| 2015/0064048 A1 | 3/2015 | Bessac et al. |
| 2015/0071809 A1 | 3/2015 | Nordkvist et al. |
| 2015/0076739 A1 | 3/2015 | Batchelder |
| 2015/0084240 A1 | 3/2015 | Shuck et al. |
| 2015/0088295 A1 | 3/2015 | Hellestam et al. |
| 2015/0090074 A1 | 4/2015 | Etter et al. |
| 2015/0091200 A1 | 4/2015 | Mech et al. |
| 2015/0093720 A1 | 4/2015 | Beeby et al. |
| 2015/0097307 A1 | 4/2015 | Batchelder et al. |
| 2015/0097308 A1 | 4/2015 | Batchelder et al. |
| 2015/0110910 A1 | 4/2015 | Hartmann et al. |
| 2015/0115490 A1 | 4/2015 | Reinarz |
| 2015/0139849 A1 | 5/2015 | Pialot, Jr. et al. |
| 2015/0142153 A1 | 5/2015 | Chun et al. |
| 2015/0145169 A1 | 5/2015 | Liu et al. |
| 2015/0145177 A1 | 5/2015 | El-Siblani et al. |
| 2015/0158249 A1 | 6/2015 | Goto |
| 2015/0165525 A1 | 6/2015 | Jonasson |
| 2015/0165545 A1 | 6/2015 | Goehler et al. |
| 2015/0165681 A1 | 6/2015 | Fish et al. |
| 2015/0165683 A1 | 6/2015 | Cheverton et al. |
| 2015/0165684 A1 | 6/2015 | Deane et al. |
| 2015/0174658 A1 | 6/2015 | Ljungblad |
| 2015/0174822 A1 | 6/2015 | Huang et al. |
| 2015/0177158 A1 | 6/2015 | Cheverton |
| 2015/0178286 A1 | 6/2015 | Dhollander et al. |
| 2015/0185454 A1 | 7/2015 | Kalkbrenner et al. |
| 2015/0197060 A1 | 7/2015 | Carr et al. |
| 2015/0198052 A1 | 7/2015 | Pavlov et al. |
| 2015/0210013 A1 | 7/2015 | Teulet et al. |
| 2015/0246485 A1 | 9/2015 | Guenster et al. |
| 2015/0251355 A1 | 9/2015 | Rehme |
| 2015/0258609 A1 | 9/2015 | Teulet |
| 2015/0268099 A1 | 9/2015 | Craig et al. |
| 2015/0283610 A1 | 10/2015 | Ljungblad et al. |
| 2015/0283611 A1 | 10/2015 | Takezawa et al. |
| 2015/0283613 A1 | 10/2015 | Backlund et al. |
| 2015/0283761 A1 | 10/2015 | Maeda et al. |
| 2015/0298211 A1 | 10/2015 | Abe et al. |
| 2015/0298397 A1 | 10/2015 | Chen et al. |
| 2015/0306667 A1 | 10/2015 | Yao |
| 2015/0306820 A1 | 10/2015 | Colin et al. |
| 2015/0321422 A1 | 11/2015 | Boyer |
| 2015/0328839 A1 | 11/2015 | Willis et al. |
| 2015/0331402 A1 | 11/2015 | Lin et al. |
| 2015/0336330 A1 | 11/2015 | Herzog |
| 2015/0367415 A1 | 12/2015 | Buller et al. |
| 2015/0367416 A1 | 12/2015 | Buller et al. |
| 2015/0367418 A1 | 12/2015 | Buller et al. |
| 2015/0367419 A1 | 12/2015 | Buller et al. |
| 2015/0367447 A1 | 12/2015 | Buller et al. |
| 2015/0367453 A1 | 12/2015 | Herzog |
| 2015/0367574 A1 | 12/2015 | Araie et al. |
| 2015/0375456 A1 | 12/2015 | Cheverton et al. |
| 2016/0001401 A1 | 1/2016 | Dimter et al. |
| 2016/0022336 A1 | 1/2016 | Bateman |
| 2016/0026337 A1 | 1/2016 | Wassvik et al. |
| 2016/0026889 A1 | 1/2016 | Parkhomenko et al. |
| 2016/0052057 A1 | 2/2016 | Xu |
| 2016/0052212 A1 | 2/2016 | Schmidt |
| 2016/0054115 A1 | 2/2016 | Snis |
| 2016/0054121 A1 | 2/2016 | Snis |
| 2016/0059310 A1 | 3/2016 | Junker et al. |
| 2016/0059352 A1 | 3/2016 | Sparks et al. |
| 2016/0067740 A1 | 3/2016 | Voris et al. |
| 2016/0067778 A1 | 3/2016 | Liu |
| 2016/0067779 A1 | 3/2016 | Dautova et al. |
| 2016/0082666 A1 | 3/2016 | De Pena et al. |
| 2016/0082668 A1 | 3/2016 | Perret et al. |
| 2016/0090848 A1 | 3/2016 | Engeli et al. |
| 2016/0107263 A1 | 4/2016 | Koerber |
| 2016/0114431 A1 | 4/2016 | Cheverton et al. |
| 2016/0114432 A1 | 4/2016 | Ferrar et al. |
| 2016/0114531 A1 | 4/2016 | Chuang et al. |
| 2016/0114535 A1 | 4/2016 | Kritchman et al. |
| 2016/0121399 A1 | 5/2016 | Buller et al. |
| 2016/0121548 A1 | 5/2016 | Nauka et al. |
| 2016/0129502 A1 | 5/2016 | Varetti |
| 2016/0129631 A1 | 5/2016 | Chen et al. |
| 2016/0136730 A1 | 5/2016 | McMurtry et al. |
| 2016/0136896 A1 | 5/2016 | Wighton |
| 2016/0144574 A1 | 5/2016 | Eilken et al. |
| 2016/0151833 A1 | 6/2016 | Tsao |
| 2016/0151860 A1 | 6/2016 | Engeli et al. |
| 2016/0154906 A1 | 6/2016 | Schmidt et al. |
| 2016/0159010 A1 | 6/2016 | Perez et al. |
| 2016/0179064 A1 | 6/2016 | Arthur et al. |
| 2016/0184891 A1 | 6/2016 | Mironets |
| 2016/0185048 A1 | 6/2016 | Dave et al. |
| 2016/0187272 A1 | 6/2016 | Ishii et al. |
| 2016/0193696 A1 | 7/2016 | McFarland et al. |
| 2016/0193785 A1 | 7/2016 | Bell et al. |
| 2016/0193790 A1 | 7/2016 | Shuck et al. |

(56) References Cited

U.S. PATENT DOCUMENTS

| | | |
|---|---|---|
| 2016/0207109 A1 | 7/2016 | Buller et al. |
| 2016/0214175 A1 | 7/2016 | Nordstrom |
| 2016/0221264 A1 | 8/2016 | Doherty et al. |
| 2016/0228987 A1 | 8/2016 | Baudimont et al. |
| 2016/0236279 A1 | 8/2016 | Ashton et al. |
| 2016/0236414 A1 | 8/2016 | Reese et al. |
| 2016/0236419 A1 | 8/2016 | Griffin et al. |
| 2016/0241885 A1 | 8/2016 | Ström et al. |
| 2016/0243721 A1* | 8/2016 | Tew ........................ B33Y 40/00 |
| 2016/0246908 A1 | 8/2016 | Komzsik |
| 2016/0250717 A1 | 9/2016 | Kruger et al. |
| 2016/0258045 A1 | 9/2016 | Carter, Jr. et al. |
| 2016/0271698 A1 | 9/2016 | Schmidt |
| 2016/0271884 A1 | 9/2016 | Herzog |
| 2016/0271885 A1 | 9/2016 | Shi et al. |
| 2016/0279706 A1 | 9/2016 | Domrose et al. |
| 2016/0284123 A1 | 9/2016 | Hare et al. |
| 2016/0288254 A1 | 10/2016 | Pettit et al. |
| 2016/0297006 A1 | 10/2016 | Buller et al. |
| 2016/0297007 A1 | 10/2016 | Buller et al. |
| 2016/0299996 A1 | 10/2016 | Huang |
| 2016/0303687 A1 | 10/2016 | Ljungblad |
| 2016/0311025 A1 | 10/2016 | Kaneko |
| 2016/0318129 A1 | 11/2016 | Hu et al. |
| 2016/0320771 A1 | 11/2016 | Huang |
| 2016/0321384 A1 | 11/2016 | Pal et al. |
| 2016/0326880 A1 | 11/2016 | Slavens et al. |
| 2016/0332384 A1 | 11/2016 | De Pena et al. |
| 2016/0339639 A1 | 11/2016 | Chivel |
| 2016/0361874 A1 | 12/2016 | Park et al. |
| 2017/0001371 A1 | 1/2017 | Sobue et al. |
| 2017/0001379 A1 | 1/2017 | Long |
| 2017/0008126 A1 | 1/2017 | Long et al. |
| 2017/0014902 A1 | 1/2017 | Tanaka et al. |
| 2017/0015066 A1 | 1/2017 | Herrmann et al. |
| 2017/0021420 A1 | 1/2017 | Buller et al. |
| 2017/0021455 A1 | 1/2017 | Dallarosa et al. |
| 2017/0036404 A1 | 2/2017 | Rengers et al. |
| 2017/0056975 A1 | 3/2017 | Carter et al. |
| 2017/0066052 A1 | 3/2017 | Abe et al. |
| 2017/0066084 A1 | 3/2017 | Ladewig et al. |
| 2017/0087769 A1 | 3/2017 | Lancaster-Larocque et al. |
| 2017/0090461 A1 | 3/2017 | Chong et al. |
| 2017/0100885 A1 | 4/2017 | Desimone et al. |
| 2017/0102689 A1 | 4/2017 | Khajepour et al. |
| 2017/0106603 A1 | 4/2017 | Pobihun |
| 2017/0123222 A1 | 5/2017 | Demuth et al. |
| 2017/0136574 A1 | 5/2017 | Zenzinger et al. |
| 2017/0136703 A1 | 5/2017 | Hayes et al. |
| 2017/0144248 A1 | 5/2017 | Yoshimura et al. |
| 2017/0144374 A1 | 5/2017 | Ono et al. |
| 2017/0144874 A1 | 5/2017 | Huebinger et al. |
| 2017/0145586 A1 | 5/2017 | Xiao |
| 2017/0157704 A1 | 6/2017 | Ladewig et al. |
| 2017/0157845 A1 | 6/2017 | Bihari et al. |
| 2017/0165752 A1 | 6/2017 | Buller et al. |
| 2017/0165754 A1 | 6/2017 | Buller et al. |
| 2017/0165792 A1 | 6/2017 | Buller et al. |
| 2017/0173883 A1 | 6/2017 | Gray et al. |
| 2017/0216917 A1 | 8/2017 | Zhang et al. |
| 2017/0225198 A1 | 8/2017 | Nevarez et al. |
| 2017/0232515 A1 | 8/2017 | Demuth et al. |
| 2017/0239719 A1 | 8/2017 | Buller et al. |
| 2017/0239720 A1 | 8/2017 | Levin et al. |
| 2017/0239721 A1 | 8/2017 | Buller et al. |
| 2017/0239752 A1 | 8/2017 | Buller et al. |
| 2017/0239891 A1 | 8/2017 | Buller et al. |
| 2017/0239892 A1 | 8/2017 | Buller et al. |
| 2017/0246810 A1 | 8/2017 | Gold |
| 2017/0252975 A1 | 9/2017 | Park et al. |
| 2017/0259337 A1 | 9/2017 | Furukawa |
| 2017/0259502 A1 | 9/2017 | Chapiro et al. |
| 2017/0259504 A1 | 9/2017 | Lin et al. |
| 2017/0266878 A1 | 9/2017 | Furukawa |
| 2017/0266887 A1 | 9/2017 | Roviaro et al. |
| 2017/0274589 A1 | 9/2017 | Wu et al. |
| 2017/0282245 A1 | 10/2017 | Yasuda et al. |
| 2017/0282294 A1 | 10/2017 | Uchida |
| 2017/0291372 A1 | 10/2017 | Milshtein et al. |
| 2017/0297110 A1 | 10/2017 | Echigo et al. |
| 2017/0304894 A1 | 10/2017 | Buller |
| 2017/0304944 A1 | 10/2017 | Symeonidis et al. |
| 2017/0305140 A1 | 10/2017 | Wüst et al. |
| 2017/0320265 A1 | 11/2017 | Baumann et al. |
| 2017/0333994 A1 | 11/2017 | Schmitt et al. |
| 2017/0334024 A1 | 11/2017 | Buller et al. |
| 2017/0341143 A1 | 11/2017 | Abe et al. |
| 2017/0341183 A1 | 11/2017 | Buller et al. |
| 2017/0341299 A1 | 11/2017 | Kniola et al. |
| 2017/0341307 A1 | 11/2017 | Vilajosana et al. |
| 2017/0348771 A1 | 12/2017 | Kawada et al. |
| 2017/0355146 A1 | 12/2017 | Buller et al. |
| 2017/0355147 A1 | 12/2017 | Buller et al. |
| 2017/0368753 A1 | 12/2017 | Yang et al. |
| 2018/0001553 A1 | 1/2018 | Buller et al. |
| 2018/0001556 A1 | 1/2018 | Buller et al. |
| 2018/0001557 A1 | 1/2018 | Buller et al. |
| 2018/0015670 A1 | 1/2018 | Gu et al. |
| 2018/0021855 A1 | 1/2018 | De Lajudie et al. |
| 2018/0029126 A1 | 2/2018 | Ng et al. |
| 2018/0029298 A1 | 2/2018 | Takaya et al. |
| 2018/0056391 A1 | 3/2018 | Buller et al. |
| 2018/0056392 A1 | 3/2018 | Ichijo |
| 2018/0071986 A1 | 3/2018 | Buller et al. |
| 2018/0093373 A1 | 4/2018 | Niederberger |
| 2018/0093416 A1 | 4/2018 | Prexler et al. |
| 2018/0093418 A1 | 4/2018 | Lappas et al. |
| 2018/0093419 A1 | 4/2018 | Lappas et al. |
| 2018/0095450 A1 | 4/2018 | Lappas et al. |
| 2018/0099454 A1 | 4/2018 | Hümmeler et al. |
| 2018/0104892 A1 | 4/2018 | Herzog et al. |
| 2018/0111193 A1 | 4/2018 | Romano et al. |
| 2018/0111194 A1 | 4/2018 | Buller et al. |
| 2018/0111195 A1 | 4/2018 | Romano et al. |
| 2018/0111196 A1 | 4/2018 | Brezoczky et al. |
| 2018/0111197 A1 | 4/2018 | Romano et al. |
| 2018/0111198 A1 | 4/2018 | Vitanov et al. |
| 2018/0111319 A1 | 4/2018 | Brezoczky et al. |
| 2018/0111320 A1 | 4/2018 | Zhao et al. |
| 2018/0117845 A1 | 5/2018 | Buller et al. |
| 2018/0126460 A1 | 5/2018 | Murphree et al. |
| 2018/0126461 A1 | 5/2018 | Buller et al. |
| 2018/0126462 A1 | 5/2018 | Murphree et al. |
| 2018/0126629 A1 | 5/2018 | Staal et al. |
| 2018/0126650 A1 | 5/2018 | Murphree et al. |
| 2018/0133635 A1 | 5/2018 | Hofmann et al. |
| 2018/0133801 A1 | 5/2018 | Buller et al. |
| 2018/0133956 A1 | 5/2018 | Buller et al. |
| 2018/0133975 A1 | 5/2018 | Zhao et al. |
| 2018/0141126 A1 | 5/2018 | Buller et al. |
| 2018/0154442 A1 | 6/2018 | Milshtein et al. |
| 2018/0154443 A1 | 6/2018 | Milshtein et al. |
| 2018/0178286 A1 | 6/2018 | Martin et al. |
| 2018/0178292 A1 | 6/2018 | Berggren et al. |
| 2018/0185915 A1 | 7/2018 | Beauchamp et al. |
| 2018/0185961 A1 | 7/2018 | Meidani et al. |
| 2018/0186079 A1 | 7/2018 | Vilajosana et al. |
| 2018/0186080 A1 | 7/2018 | Milshtein et al. |
| 2018/0186081 A1 | 7/2018 | Milshtein et al. |
| 2018/0186082 A1 | 7/2018 | Randhawa et al. |
| 2018/0207721 A1 | 7/2018 | Schlick et al. |
| 2018/0207722 A1 | 7/2018 | Feldmann et al. |
| 2018/0236550 A1 | 8/2018 | Herzog et al. |
| 2018/0236714 A1 | 8/2018 | Thelakkadan et al. |
| 2018/0244034 A1 | 8/2018 | Sutcliffe et al. |
| 2018/0250744 A1 | 9/2018 | Symeonidis et al. |
| 2018/0250745 A1 | 9/2018 | Spink et al. |
| 2018/0250746 A1 | 9/2018 | Symeonidis et al. |
| 2018/0250771 A1 | 9/2018 | Brown et al. |
| 2018/0250772 A1 | 9/2018 | Symeonidis et al. |
| 2018/0250773 A1 | 9/2018 | Symeonidis et al. |
| 2018/0250774 A1 | 9/2018 | Symeonidis et al. |
| 2018/0281236 A1 | 10/2018 | Elgar et al. |
| 2018/0281237 A1 | 10/2018 | Frechman et al. |

(56) References Cited

U.S. PATENT DOCUMENTS

| | | |
|---|---|---|
| 2018/0281282 A1 | 10/2018 | Elgar et al. |
| 2018/0281283 A1 | 10/2018 | Frechman et al. |
| 2018/0281284 A1 | 10/2018 | Elgar et al. |
| 2018/0297114 A1 | 10/2018 | Preston et al. |
| 2018/0318928 A1 | 11/2018 | Christiansen et al. |
| 2018/0319150 A1 | 11/2018 | Buller et al. |
| 2018/0326488 A1 | 11/2018 | Lappas et al. |
| 2018/0361509 A1 | 12/2018 | Reznik |
| 2019/0061002 A1 | 2/2019 | Symeonidis |
| 2019/0118286 A1 | 4/2019 | Sugatani et al. |
| 2019/0143412 A1 | 5/2019 | Buller et al. |
| 2019/0230248 A1 | 7/2019 | Mizes et al. |
| 2019/0232429 A1 | 8/2019 | Buller et al. |
| 2019/0366638 A1 | 12/2019 | Buller et al. |
| 2020/0004255 A1 | 1/2020 | Buller |
| 2020/0139631 A1 | 5/2020 | Buller |
| 2022/0297187 A1 | 9/2022 | Buller et al. |

FOREIGN PATENT DOCUMENTS

| | | |
|---|---|---|
| CN | 101835554 A | 9/2010 |
| CN | 102076456 A | 5/2011 |
| CN | 102695476 A | 9/2012 |
| CN | 103341625 A | 10/2013 |
| CN | 103392153 A | 11/2013 |
| CN | 103561891 A | 2/2014 |
| CN | 103611934 A | 3/2014 |
| CN | 103612393 A | 3/2014 |
| CN | 103629198 A | 3/2014 |
| CN | 103676588 A | 3/2014 |
| CN | 203635913 U | 6/2014 |
| CN | 103917348 A | 7/2014 |
| CN | 204136439 U | 2/2015 |
| CN | 105904729 A | 8/2016 |
| CN | 105921747 A | 9/2016 |
| DE | 4300478 C1 | 8/1994 |
| DE | 19649865 C1 | 2/1998 |
| DE | 19939616 A1 | 3/2001 |
| DE | 102004061836 A1 | 7/2006 |
| DE | 102007029142 A1 | 1/2009 |
| DE | 102004057866 B4 | 6/2010 |
| DE | 102008051478 A1 | 6/2010 |
| DE | 102009015130 A1 | 10/2010 |
| DE | 102009036153 A1 | 2/2011 |
| DE | 102010048335 A1 | 4/2012 |
| DE | 102011112581 A1 | 3/2013 |
| DE | 202013009787 U1 | 12/2013 |
| DE | 102013208651 A1 | 11/2014 |
| DE | 102013223411 A1 | 5/2015 |
| DE | 102014204528 A1 | 9/2015 |
| DE | 102014010932 A1 | 1/2016 |
| DE | 102015005780 A1 | 12/2016 |
| DE | 102015211538 A1 | 12/2016 |
| EP | 0296818 B1 | 4/1993 |
| EP | 1151849 A1 | 11/2001 |
| EP | 1466718 A2 | 10/2004 |
| EP | 1793979 A2 | 6/2007 |
| EP | 1622086 B1 | 9/2008 |
| EP | 1992709 A1 | 11/2008 |
| EP | 2277687 A1 | 1/2011 |
| EP | 2361704 A1 | 8/2011 |
| EP | 2522446 A1 | 11/2012 |
| EP | 2583773 A2 | 4/2013 |
| EP | 2620241 A1 | 7/2013 |
| EP | 2774703 A1 | 9/2014 |
| EP | 2789413 A1 | 10/2014 |
| EP | 2832473 A1 | 2/2015 |
| EP | 2832474 A1 | 2/2015 |
| EP | 2873751 A1 | 5/2015 |
| EP | 2992942 A1 | 3/2016 |
| EP | 3127635 A1 | 2/2017 |
| EP | 3165303 A1 | 5/2017 |
| EP | 3208077 A1 | 8/2017 |
| EP | 3263316 A1 | 1/2018 |
| EP | 3263316 B1 | 2/2019 |
| EP | 3441213 A1 | 2/2019 |
| GB | 1018656 A | 1/1966 |
| GB | 2515287 A | 12/2014 |
| JP | S6237109 A | 2/1987 |
| JP | S6261617 A | 3/1987 |
| JP | H06503764 A | 4/1994 |
| JP | 2001009921 A | 1/2001 |
| JP | 2001277368 A | 10/2001 |
| JP | 2003502184 A | 1/2003 |
| JP | 2003245981 A | 9/2003 |
| JP | 2004143581 A | 5/2004 |
| JP | 2005335203 A | 12/2005 |
| JP | 2006150977 A | 6/2006 |
| JP | 2007111989 A | 5/2007 |
| JP | 2007536130 A | 12/2007 |
| JP | 2008291318 A | 12/2008 |
| JP | 2008302607 A | 12/2008 |
| JP | 2009001900 A | 1/2009 |
| JP | 2009512579 A | 3/2009 |
| JP | 2012502178 A | 1/2012 |
| JP | 2012213971 A | 11/2012 |
| JP | 2014227587 A | 12/2014 |
| JP | 2015017294 A | 1/2015 |
| JP | 2015017295 A | 1/2015 |
| JP | 2016502603 A | 1/2016 |
| JP | 2016540109 A | 12/2016 |
| JP | 2017137563 A | 8/2017 |
| KR | 20160059726 A | 5/2016 |
| KR | 20160076708 A | 7/2016 |
| NO | 317085 B1 | 8/2004 |
| SE | 524467 C2 | 8/2004 |
| TW | 201634234 A | 10/2016 |
| WO | WO-9208592 A1 | 5/1992 |
| WO | WO-9511100 A1 | 4/1995 |
| WO | WO-9511101 A1 | 4/1995 |
| WO | WO-9771837 A1 | 4/1997 |
| WO | WO-9828124 A2 | 7/1998 |
| WO | WO-9933641 A1 | 7/1999 |
| WO | WO-0102160 A1 | 1/2001 |
| WO | WO-0177988 A2 | 10/2001 |
| WO | WO-2004005014 A2 | 1/2004 |
| WO | WO-2004037469 A1 | 5/2004 |
| WO | WO-2006066939 A1 | 6/2006 |
| WO | WO-2008028443 A2 | 3/2008 |
| WO | WO-2008049384 A1 | 5/2008 |
| WO | WO-2008064620 A1 | 6/2008 |
| WO | WO-2008067496 A2 | 6/2008 |
| WO | WO-2008074287 A1 | 6/2008 |
| WO | WO-2008096105 A1 | 8/2008 |
| WO | WO-2008128502 A2 | 10/2008 |
| WO | WO-2009015619 A2 | 2/2009 |
| WO | WO-2009096750 A2 | 8/2009 |
| WO | WO-2010026396 A2 | 3/2010 |
| WO | WO-2010115588 A2 | 10/2010 |
| WO | WO-2013092997 A1 | 6/2013 |
| WO | WO-2013113372 A1 | 8/2013 |
| WO | WO-2013160188 A1 | 10/2013 |
| WO | WO-2013167903 A1 | 11/2013 |
| WO | WO-2013178825 A2 | 12/2013 |
| WO | WO-2013179017 A1 | 12/2013 |
| WO | WO-2013189473 A1 | 12/2013 |
| WO | WO-2014023657 A2 | 2/2014 |
| WO | WO-2014042970 A1 | 3/2014 |
| WO | WO-2014044589 A1 | 3/2014 |
| WO | WO-2014049159 A1 | 4/2014 |
| WO | WO-2014083292 A1 | 6/2014 |
| WO | WO-2014118783 A1 | 8/2014 |
| WO | WO-2014120991 A1 | 8/2014 |
| WO | WO-2014135136 A1 | 9/2014 |
| WO | WO-2014144255 A2 | 9/2014 |
| WO | WO-2014144360 A2 | 9/2014 |
| WO | WO-2014144482 A1 | 9/2014 |
| WO | WO-2014144630 A1 | 9/2014 |
| WO | WO-2014193406 A1 | 12/2014 |
| WO | WO-2015020939 A1 | 2/2015 |
| WO | WO-2015023612 A2 | 2/2015 |
| WO | WO-2015025171 A2 | 2/2015 |
| WO | WO-2015034362 A1 | 3/2015 |
| WO | WO-2015040433 A2 | 3/2015 |

(56) References Cited

FOREIGN PATENT DOCUMENTS

| | | |
|---|---|---|
| WO | WO-2015051915 A1 | 4/2015 |
| WO | WO-2015053946 A1 | 4/2015 |
| WO | WO-2015077077 A1 | 5/2015 |
| WO | WO-2015082677 A1 | 6/2015 |
| WO | WO-2015106836 A1 | 7/2015 |
| WO | WO-2015151865 A1 | 10/2015 |
| WO | WO-2015176709 A1 | 11/2015 |
| WO | WO-2015183796 A1 | 12/2015 |
| WO | WO-2015196149 A1 | 12/2015 |
| WO | WO-2016026852 A1 | 2/2016 |
| WO | WO-2016026853 A1 | 2/2016 |
| WO | WO-2016049621 A1 | 3/2016 |
| WO | WO-2016055523 A1 | 4/2016 |
| WO | WO-2016075025 A1 | 5/2016 |
| WO | WO-2016075026 A1 | 5/2016 |
| WO | WO-2016077250 A1 | 5/2016 |
| WO | WO-2016079494 A2 | 5/2016 |
| WO | WO-2016094827 A1 | 6/2016 |
| WO | WO-2016113253 A1 | 7/2016 |
| WO | WO-2016169768 A1 | 10/2016 |
| WO | WO-2016196223 A1 | 12/2016 |
| WO | WO-2016196382 A1 | 12/2016 |
| WO | WO-2017011456 A1 | 1/2017 |
| WO | WO-2017015217 A2 | 1/2017 |
| WO | WO-2017039858 A1 | 3/2017 |
| WO | WO-2017054842 A1 | 4/2017 |
| WO | WO-2017079091 A1 | 5/2017 |
| WO | WO-2017100695 A1 | 6/2017 |
| WO | WO-2017118569 A1 | 7/2017 |
| WO | WO-2017143077 A1 | 8/2017 |
| WO | WO-2017179001 A1 | 10/2017 |
| WO | WO-2017189982 A1 | 11/2017 |
| WO | WO-2017201120 A1 | 11/2017 |
| WO | WO-2018005439 | 1/2018 |
| WO | WO-2018005439 A1 | 1/2018 |
| WO | WO-2018046349 A1 | 4/2018 |
| WO | WO-2018075741 A1 | 4/2018 |
| WO | WO-2018106586 A1 | 6/2018 |
| WO | WO-2018128695 A2 | 7/2018 |
| WO | WO-2018129089 A1 | 7/2018 |
| WO | WO-2018160807 A1 | 9/2018 |
| WO | WO-2018183396 A1 | 10/2018 |
| WO | WO-2019070644 A2 | 4/2019 |
| WO | WO-2019173000 A1 | 9/2019 |
| WO | WO-2019195062 A1 | 10/2019 |
| WO | WO-2019226463 A1 | 11/2019 |
| WO | WO-2020006468 A1 | 1/2020 |
| WO | WO-2020033124 A1 | 2/2020 |
| WO | WO-2020146416 A2 | 7/2020 |
| WO | WO-2020146416 A3 | 8/2020 |
| WO | WO-2021021469 A1 | 2/2021 |

OTHER PUBLICATIONS

U.S. Appl. No. 16/025,915 Office Action dated Nov. 2, 2020.
U.S. Appl. No. 16/030,795 Office Action dated Dec. 21, 2020.
Adam, et al. Design for additive manufacturing—element transitions and aggregated structures. CIRP Journal of Manufacturing Science and Technology. Nov. 2014; 7:20-28.
Additive Manufacturing Research Group. Loughborough University. Accessed Jul. 29, 2015. 7 pages. http://www.lboro.ac.uk/research/amrg/about/the7categoriesofadditivemanufacturing/powderbedfusion/.
Anusci, Victor. Aerosint Is Developing the First Commercial Multi-powder SLS 3D Printer. 3D Printing Media Network. Web. Published Jan. 28, 2018. 4 pages. URL:< https://www.3dprintingmedia.network/aerosint-multi-powder-sls-3d-printer/>.
Arcam AB (ARCM.ST) (AMAVF). Powder Removal from 3D Structures. Posted Thursday, Apr. 23, 2015 11:23:59 AM. 4 pages. http://investorshub.advfn.com/boards/read_msg.aspx?message_id=113029094.
Arcam EBM at Sirris Belgium. Uploaded Jun. 17, 2010. 2 pages. https://www.youtube.com/watch?v=nR7EtduqVYw&list=PLD7ckJoR_kR6ua0GOMIyJ1mpCKh342iLI.

Barriobero-Vila et al. Inducing Stable α + β Microstructures during Selective Laser Melting of Ti—6Al—4V Using Intensified Intrinsic Heat Treatments. Materials (Basel). vol. 10, No. 3, Mar. 2017, 14 pages.
Bayerlein et al. Validation of modeling assumptions for the buildup simulation of laser beam melting on the basis of the residual stress distribution. Proceedings of ECCOMAS Congress 2016: VII European Congress on Computational Methods in Applied Sciences and Engineering. Crete Island, Greece, Jun. 5, 2016-Jun. 10, 2016. 11 pages.
Bohnet, M. Advances in the Design of Pneumatic Conveyors. International Chemical Engineering, vol. 25, No. 3, Jul. 1985, pp. 387-405.
Bondhus. Crystals, grains, and cooling. Web article. Copyright © 2009 Bondhus Corp. First published Feb. 10, 2005. Accessed Jul. 13, 2016. Printed on Jul. 30, 2018. 1 page. URL: http://bondhus.com/metallurgy/body-3.htm.
Bremen et al. Selective Laser Melting. Laser Technik Journal. vol. 9, No. 2, Apr. 2012. 6 pages.
Calvert, Jack G. Glossary of Atmospheric Chemistry Terms (Recommendations 1990). Pure & Appl.Chem., vol. 62, No. 11, Jan. 1, 1990, pp. 2167-2219.
Cheng, et al. Thermal Stresses Associated with Part Overhang Geometry in Electron Beam Additive Manufacturing: Process Parameter Effects. 25th Annual International Solid Freeform Fabrication Symposium—An Additive Manufacturing Conference, Austin, TX, USA. Aug. 4-6, 2014. 1076-1087.
Childs, et al. Raster scan of selective laser melting of the surface layer of a tool steel powder bed. Proc. IMechE. Jan. 26, 2005; vol. 219, Part B, pp. 379-384.
Childs, et al. Selective laser sintering (melting) of stainless and tool steel powders: experimental modelling. Proc. IMechE. 2005, Published Oct. 18, 2004; vol. 219 Part B, J. Engineering Manufacture, pp. 338-357.
Chivel, et al. On-line temperature monitoring in selective laser sintering/melting. Physics Procedia. Dec. 31, 2010; (5):515-521.
Cloots, et al. Assessing new support minimizing strategies for the additive manufacturing technology SLM. Aug. 16, 2013. sffsymposium.engr.utexas.edu/Manuscripts/2013/2013-50-Cloots.pdf. 13 pages.
Co-pending U.S. Appl. No. 15/855,744, filed Dec. 27, 2017.
Co-pending U.S. Appl. No. 16/137,295, filed Sep. 20, 2018.
Co-pending U.S. Appl. No. 16/248,665, filed Jan. 15, 2019.
Co-pending U.S. Appl. No. 16/253,103, filed Jan. 21, 2019.
Craeghs, et al. Feedback control of layerwise laser melting using optical sensors. Physics Procedia. Dec. 2010; 5:505-514.
Criales, et al. Laser material processing methods: micromachining, laser exfoliation and selective laser melting: prediction modeling of temperature field and melt pool size using finite element modeling of selective laser melting for inconel 625. Atilim University. Metal Forming Center of Excellence, Ankara, Turkey. Nov. 14, 2014. 77 pages.
Dahotre et al. Laser Fabrication and Machining of Materials. Springer; 2008 edition (Nov. 26, 2007).561 pages. DOI: 10.1007/978-0-387-72344-0.
Das et al. Producing metal parts with selective laser sintering/hot isostatic pressing. JOM; Dec. 1998, vol. 50, Issue 12, pp. 17-20.
David et al. Welding: Solidification and microstructure. The Journal of the Minerals, Metals & Materials Society (TMS). Jun. 2003, vol. 55, Issue 6, pp. 14-20.
De Dietrich Process Systems, Inc. Powder Pump™. Product Brochure. Created Jul. 3, 2012. 2 pages.
Direct Manufacturing: ARCAM. Uploaded on Jun. 6, 2011. 2 pages. https://www.youtube.com/watch?v=M_qSnjKN7f8.
EOS. Direct Metal Laser Sintering Published Aug. 22, 2012. https://www.youtube.com/watch?v=cRE-Pzl6uZA.
EP15809160.3 European Search Report dated Aug. 7, 2018.
EP15866668.5 European Search Report dated Aug. 7, 2018.
European Search Report and Search Opinion dated Nov. 30, 2017 for European Patent Application No. EP17178143.8.
Ex Parte Quayle Action dated Apr. 19, 2017 for U.S. Appl. No. 15/374,821.
Extended European Search Report dated Jul. 7, 2017 for European Patent Application No. EP17156707.6.

(56) References Cited

OTHER PUBLICATIONS

*Formlabs* v. *DWS*. Civil Action filed on Jun. 29, 2018 in the United States Court for the Eastern District of Virginia. Case No. 1:18-cv-00810-CMH-IDD. 13 pages.
Gaudin, Sharon. Researcher works to make 3D-printed metals stronger, customizable. Oct. 2014. Accessed online on Mar. 22, 2018. 4 pages. URL:< https://www.computerworld.com/article/2838780/researcher-works-to-make-3d-printed-materials-stronger-customizable.html>.
Ghosh, et al. Selective Laser Sintering: A Case Study of Tungsten Carbide and Cobalt Powder Sintering by Pulsed Nd:YAG Laser. Lasers Based Manufacturing, Dec. 2014, pp. 441-458.
Gibson, et al. Additive Manufacturing Technologies, Springer 2010, Chapter 5, pp. 103-142. ISBN978-1-4419-1119-3 (Print978-1-4419-1120-9 (Online). Published: Dec. 14, 2009.
Gibson, et al. Additive Manufacturing Technologies, Springer 2015. Chapter 5, pp. 107-145. ISBN 978-1-4939-2113-3 (978-1-4939-2112-6; 978-1-4939-2113-3); DOI 10.1007/978-1-4939-2113-3. Published: Nov. 27, 2014.
Gordon et al. Single-pixel phase-corrected fiber bundle endomicroscopy with lensless focussing capability. J Lightwave Technol. Author manuscript; available in PMC Jun. 6, 2016. Published in final edited form as: J Lightwave Technol; Aug. 15, 2015; vol. 33, No. 16, pp. 3419-3425.
Hauser, et al. Further Developments in Process Mapping and modelling in direct metal selective laser melting. Aug. 2004, 15th solid Free Form Fabrication Proceedings. Austin, Texas, pp. 448-459.
Hussein. The development of Lightweight Cellular Structures for Metal Additive Manufacturing. Nov. 2013, thesis of University of Exeter, pp. 1-228.
International Search Report and Written Opinion dated Jan. 9, 2018 for International PCT Patent Application No. PCT/2017/054043.
International Search Report and Written Opinion dated Jan. 16, 2017 for International PCT Patent Application No. PCT/US2016/059781.
International Search Report and Written Opinion dated Feb. 12, 2018 for International PCT Patent Application No. PCT/US2017/057340.
International Search Report and Written Opinion dated Feb. 19, 2016 for International PCT Patent Application No. PCT/US2015/059790.
International Search Report and Written Opinion dated Apr. 5, 2017 for International PCT Patent Application No. PCT/US2016/066000.
International search report and written opinion dated Apr. 11, 2016 for PCT/US2015/065297.
International Search Report and Written Opinion dated May 18, 2017 for International PCT Patent Application No. PCT/US2017/018191.
International Search Report and Written Opinion dated Aug. 30, 2017 for International PCT Patent Application No. PCT/US2017/039422.
International search report and written opinion dated Sep. 20, 2016 for PCT/US2016/034454.
International search report and written opinion dated Oct. 30, 2015 for PCT Application No. US2015/036802.
International search report and written opinion dated Sep. 13, 2016 for PCT Application No. US-2016034857.
IUPAC. "Inert gas". IUPAC Compendium of Chemical Terminology. Published Feb. 24, 2014. http://goldbook.iupac.org/html/l/103027.html.
Kannatey-Asibu Jr, Elijah. Principles of laser materials processing. John Wiley & Sons, 2009, Chapter 10, pp. 231-405. Published: Apr. 20, 2009.
Kannatey-Asibu Jr, Elijah. Principles of laser materials processing. John Wiley & Sons, 2009, Chapter 16, pp. 502-668. Published: Apr. 20, 2009.
Kant et al. An integrated FEM-ANN model for laser bending process with inverse estimation of absorptivity. Mechanics of Advanced Materials and Modern Processes. Dec. 2015, vol. 1, No. 6, 12 pages.

Kopeliovich, Dmitri. Electropolishing. SubsTech: Substances & Technologies. Web Article. Dec. 14, 2013. Printed Jan. 13, 2019. 5 pages. URL: http://www.substech.com/dokuwiki/doku.php?id=electropolishing.
Kruth, et al. Feedback control of selective laser melting. Proceedings of the 3rd International Conference on Advanced Research in Virtual and Rapid Prototyping, Leiria, Portugal, Sep. 2007. 521-527.
Kruth, et al. Selective laser melting of iron-based power. Journal of Materials Processing Technology. Nov. 2004; 149:616-622.
Kumar. Development of an electrophotographic-based layered manufacturing test bed. Project proposal. Department of Mechanical Engineering, University of Florida. 2009. http://www.cis.rit.edu/microgrants/2008/Esterman_proposal.pdf (accessed on Jun. 29, 2015).
Kumar, et al. Designing and slicing heterogenous components for rapid prototyping. Department of Mechanical Engineering, University of Florida. Aug. 2000; 428-436.
Kumar, et al. Electrophotographic Layered Manufacturing. J. Manuf. Sci. Eng 126(3), 571-576 (Sep. 7, 2004) (6 pages) doi:10.1115/1.1765146.
Kumar, et al. Electrophotographic powder deposition for freeform fabrication. Department of Mechanical Engineering, University of Florida. Aug. 1999; 647-654.
Kumar, et al. Electrophotographic printing of part and binder powders. Rapid Prototyping Journal. Jul. 2004; 10(1):7-13.
Kumar, et al. Layered Manufacturing by Electrophotographic Printing. ASME 2003 International Design Engineering Technical Conferences and Computers and Information in Engineering Conference. vol. 2: 29th Design Automation Conference, Parts A and B. Chicago, Illinois, USA, Sep. 2-6, 2003. Paper No. DETC2003/DAC-48724, pp. 205-211; 7 pages.
Kumar, et al. Solid freeform fabrication by electrophotographic printing. Department of Mechanical and Aerospace Engineering, University of Florida. Aug. 2003; 39-49.
Laser Engineered Net Shaping (LENS) 850-R system overview. System features and example application video clips. Published Jun. 3, 2012. https://www.youtube.com/watch?v=mkUVURLkxS4.
Leirvag. Additive Manufacturing for Large Products. Feb. 2013, thesis. Norwegian University of Science and Technology.
Lyckfeldt. Powder rheology of steel powders for additive manufacturing. Swerea IVF. Oct. 24, 2013.
Manfredi, et al. From Powders to Dense Metal Parts: Characterization of a Commercial AlSiMg Alloy Processed through Direct Metal Laser Sintering. Mar. 2013, Materials, vol. 6, pp. 856-869.
Manzhirov, et al. Mathematical Modeling of Additive Manufacturing Technologies. Proc. of the World Congress of Engineering 2014, vol. II. WCE 2014, Jul. 2-4, 2014, London, U.K. 6 pages.
Merriam-Webster. Definition of "reservoir". Retrieved Dec. 21, 2017. 13 pages. URL:< https://merriam-webster.com/dictionary/reservoir>.
Mertens, et al. Optimization fo scan strategies in selective laser melting of aluminum parts with downfacing areas. Journal of Manufacturing Science and Technology. Dec. 2014; 136:061012-1-7.
Morgan, et al. Experimental investigation of nanosecond pulsed Nd:YAG laser re-melted pre-placed powder beds. Rapid Prototyping Journal, Aug. 1, 2001, vol. 7 Issue: 3, pp. 159-172, doi: 10.1108/13552540110395565.
Moridi, et al. Cold spray coating: review of material systems and future perspectives. Surface engineering. Jun. 2014; 36(6):36*-395.
Mumtaz, et al. A method to eliminate anchors/supports from directly laser melted metal powder bed processes. Additive Manufacturing Research Group, Wolfson School of Mechanical Engineering, Loughborough University. Reviewed Aug. 17, 2011. 10 pages.
NETFABB-Professional 5.2, User Manual, Netfabb GmbH 2014, Version: Jul. 29, 2014, Chapter 6: sections 6.1, 6.3, Chapter 7: section 7.7, Chapter 9: section 9.6.
Notice of Allowability dated Oct. 17, 2017 for U.S. Appl. No. 14/744,910.
Notice of allowance dated Jan. 5, 2017 for U.S. Appl. No. 15/085,884.
Notice of Allowance dated Jan. 12, 2018 for U.S. Appl. No. 15/435,120.

(56) References Cited

OTHER PUBLICATIONS

Notice of Allowance dated Jan. 12, 2018 for U.S. Appl. No. 15/435,128.
Notice of Allowance dated Feb. 6, 2018 for U.S. Appl. No. 15/374,821.
Notice of Allowance dated Feb. 16, 2018 for U.S. Appl. No. 15/435,120.
Notice of Allowance dated Feb. 21, 2018 for U.S. Appl. No. 15/435,128.
Notice of Allowance dated Feb. 28, 2018 for U.S. Appl. No. 15/374,821.
Notice of allowance dated Mar. 1, 2016 for U.S. Appl. No. 14/745,108.
Notice of Allowance dated Mar. 16, 2017 for U.S. Appl. No. 15/339,775.
Notice of Allowance dated Mar. 20, 2017 for U.S. Appl. No. 15/339,759.
Notice of allowance dated May 11, 2016 for U.S. Appl. No. 14/744,955.
Notice of allowance dated May 25, 2016 for U.S. Appl. No. 14/744,675.
Notice of allowance dated Jun. 20, 2016 for U.S. Appl. No. 14/744,675.
Notice of Allowance dated Aug. 7, 2017 for U.S. Appl. No. 14/744,910.
Notice of allowance dated Aug. 10, 2016 for U.S. Appl. No. 14/967,118.
Notice of allowance dated Sep. 6, 2016 for U.S. Appl. No. 14/745,032.
Notice of allowance dated Sep. 17, 2015 for U.S. Appl. No. 14/745,081.
Notice of allowance dated Sep. 28, 2015 for U.S. Appl. No. 14/745,081.
Notice of allowance dated Nov. 30, 2015 for U.S. Appl. No. 14/745,081.
Notice of Allowance dated Dec. 8, 2017 for U.S. Appl. No. 15/435,128.
Notice of Allowance dated Dec. 9, 2016 for U.S. Appl. No. 15/188,939.
Notice of Allowance dated Dec. 11, 2017 for U.S. Appl. No. 15/435,120.
Notice of allowance dated Dec. 14, 2015 for U.S. Appl. No. 14/745,081.
Notice of allowance dated Dec. 15, 2015 for U.S. Appl. No. 14/745,081.
Notice of Allowance (second) dated Apr. 6, 2017 for U.S. Appl. No. 15/339,759.
Office Action dated Jan. 2, 2018 for U.S. Appl. No. 15/288,251.
Office action dated Jan. 7, 2016 for U.S. Appl. No. 14/744,859.
Office action dated Jan. 11, 2016 for U.S. Appl. No. 14/745,032.
Office Action dated Jan. 24, 2018 for U.S. Appl. No. 15/615,004.
Office Action dated Jan. 25, 2018 for U.S. Appl. No. 15/634,727.
Office Action dated Feb. 7, 2017 for U.S. Appl. No. 14/744,988.
Office Action dated Feb. 7, 2018 for U.S. Appl. No. 15/614,979.
Office Action dated Feb. 7, 2018 for U.S. Appl. No. 15/719,229.
Office Action dated Feb. 8, 2017 for U.S. Appl. No. 14/744,859.
Office action dated Feb. 10, 2016 for U.S. Appl. No. 14/744,910.
Office Action dated Feb. 14, 2018 for U.S. Appl. No. 15/634,228.
Office action dated Feb. 16, 2016 for U.S. Appl. No. 14/744,955.
Office action dated Mar. 4, 2016 for U.S. Appl. No. 14/744,988.
Office Action dated Mar. 6, 2017 for U.S. Appl. No. 14/744,910.
Office action dated Mar. 7, 2017 for U.S. Appl. No. 15/339,712.
Office Action dated Mar. 7, 2018 for U.S. Appl. No. 15/399,186.
Office action dated Mar. 10, 2016 for U.S. Appl. No. 14/744,675.
Office Action dated Mar. 23, 2017 for U.S. Appl. No. 15/399,186.
Office Action dated Apr. 28, 2017 for U.S. Appl. No. 15/374,616.
Office Action dated Jun. 15, 2017 for U.S. Appl. No. 15/288,251.
Office Action dated Jun. 29, 2016 for U.S. Appl. No. 14/744,859.
Office Action dated Jun. 29, 2016 for U.S. Appl. No. 15/435,128.
Office action dated Jul. 1, 2016 for U.S. Appl. No. 14/745,032.
Office action dated Jul. 3, 2017 for U.S. Appl. No. 15/435,120.
Office action dated Jul. 19, 2016 for U.S. Appl. No. 15/085,884.
Office action dated Jul. 21, 2016 for U.S. Appl. No. 14/744,910.
Office Action dated Jul. 28, 2017 for U.S. Appl. No. 14/744,988.
Office Action dated Aug. 2, 2017 for U.S. Appl. No. 15/435,090.
Office Action dated Aug. 18, 2017 for U.S. Appl. No. 15/374,318.
Office action dated Aug. 25, 2016 for U.S. Appl. No. 14/744,988.
Office Action dated Aug. 25, 2017 for U.S. Appl. No. 15/339,712.
Office action dated Sep. 10, 2015 for U.S. Appl. No. 14/744,675.
Office Action dated Sep. 11, 2017 for U.S. Appl. No. 15/374,821.
Office action dated Sep. 13, 2016 for U.S. Appl. No. 15/188,939.
Office Action dated Sep. 15, 2017 for U.S. Appl. No. 15/374,616.
Office Action dated Sep. 18, 2017 for U.S. Appl. No. 15/634,228.
Office action dated Oct. 2, 2015 for U.S. Appl. No. 14/744,955.
Office Action dated Oct. 19, 2017 for U.S. Appl. No. 15/399,186.
Office action dated Nov. 1, 2016 for U.S. Appl. No. 15/085,884.
Office action dated Nov. 12, 2015 for U.S. Appl. No. 14/745,108.
Office Action dated Nov. 16, 2017 for U.S. Appl. No. 15/634,267.
Office action dated Nov. 18, 2016 for U.S. Appl. No. 15/188,939.
Office Action dated Nov. 27, 2017 for U.S. Appl. No. 15/374,318.
Office Action dated Dec. 8, 2017 for U.S. Appl. No. 15/435,090.
Office Action dated Dec. 15, 2017 for U.S. Appl. No. 15/435,110.
Optomec. LENS 850R 3D Printer for Structural Metals. Optomec. YouTube—Web. Published on Jun. 3, 2012. 3 pages. URL: https://www.youtube.com/watch?v=mkUVURLkxS4.
Papadakis, et al. Numerical computation of component shape distortion manufactured by selective laser melting. Procedia CIRP. Aug. 2014; 18:90-95.
PCT/US2017/060035 International Search Report and Written Opinion dated Jul. 20, 2018.
PCT/US2017/064474 International Search Report and Written Opinion dated Apr. 30, 2018.
PCT/US2018/012250 International Search Report and Written Opinion dated Apr. 30, 2018.
PCT/US2018/020406 International Search Report and Written Opinion dated Jun. 28, 2018.
PCT/US2018/024667 International Search Report and Written Opinion dated Jul. 17, 2018.
Peng et al. Fast prediction of thermal distortion in metal powder bed fusion additive manufacturing: Part 1, a thermal circuit network model. Additive Manufacturing; vol. 22, Aug. 2018, pp. 852-868.
Peng et al. Fast prediction of thermal distortion in metal powder bed fusion additive manufacturing: Part 2, a quasi-static thermo-mechanical model. Additive Manufacturing; vol. 22, Aug. 2018, pp. 869-882.
Proto Labs. Direct Metal Laser Sintering (DMLS). Published Sep. 10, 2014. https://www.protolabs.com/additive-manufacturing/direct-metal-laser-sintering 2 pages.
Rhinehart, R.R. §2.13 Control Theory: Mode-Based Control, in Bela G. Liptak, Instrument Engineers' Handbook, vol. 2: Process Control and Optimization, 209-213. CRC Press; 4 edition (Sep. 29, 2005).ISBN-13: 978-0849310812.
Riecker, et al. 3D multi-material metal printing of delicate structures. EuroPM 2014—AM Technologies, http://www.ifam.fraunhofer.de/content/dam/ifam/de/documents/dd/Publikationen/2014/Euro_PM_2014_Riecker_3D%20Multi-Material_Metal_Printing_of_Delicate_Structures_EPMA.pdf (accessed on Jun. 29, 2015).
RP Photonics Consulting GmbH. Definition of "Optical Intensity". Encyclopedia of Laser Physics and Technology. Jun. 2012. 3 pages. URL: https://www.rp-photonics.com/optical_intensity.html.
Ryan et al. Fabrication methods of porous metals for use in orthopaedic applications. Biomaterials. May 2006; vol. 27, Issue 13, pp. 2651-2670.
Saunders, Marc. Real-time AM monitoring opens up new process control opportunities. Web: LinkedIn. Published on Jan. 3, 2018. 12 pages. URL:<https://www.linkedin.com/pulse/real-time-am-monitoring-opens-new-process-control-marc-saunders/>.
Schott. TIE-19: Temperature Coefficient of the Refractive Index. Technical Information: Advanced Optics. Schott AG. Jul. 2016. 10 pages.
Schott. TIE-19: Temperature Coefficient of the Refractive Index. Technical Information: Advanced Optics. Schott North America, Inc. Jul. 2008. 12 pages.

(56) References Cited

OTHER PUBLICATIONS

Scime et al. Anomaly detection and classification in a laser powder bed additive manufacturing process using a trained computer vision algorithm. Additive Manufacturing. vol. 19, Jan. 2018, pp. 114-126.
Selective Laser Sintering (SLS) Process at Loughborough University. Published May 4, 2015. 2 pages. https://www.youtube.com/watch?v=oO77VKDB89I.
Spears, et al. In-process sensing in selective laser melting (SLM) additive manufacturing. Integrating Materials and Manufacturing Innovation. Feb. 11, 2016; 5:2. DOI: 10.1186/s40192-016-0045-4.
Strano, et al. A new approach to the design and optimisation of support structures in additive manufacturing. Int J Adv Manuf Technol (2013) 66:1247-1254 DOI 10.1007/s00170-012-4403-x. Published online: Aug. 2, 2012.
Stratasys. Direct Manufacturing. Direct Metal Laser Sintering (DMLS). Published Oct. 11, 2013. https://www.stratasysdirect.com/resources/direct-metal-laser-sintering-dmls/ 7 pages.
Thorlabs, Inc. Fiber Optic Reflection/Backscatter Probe Bundles. Web. Copyright 1999-2018. Printed Mar. 28, 2018. 5 pages. URL:< https://www.thorlabs.com/newgrouppage9.cfm?objectgroup_id=7794>.
U.S. Appl. No. 15/339,712 Notice of Allowance dated Jul. 10, 2018.
U.S. Appl. No. 15/339,712 Notice of Allowance dated Jun. 18, 2018.
U.S. Appl. No. 15/339,712 Notice of Allowance dated May 23, 2018.
U.S. Appl. No. 15/374,318 Notice of Allowance dated Apr. 20, 2018.
U.S. Appl. No. 15/374,442 Notice of Allowance dated Oct. 3, 2018.
U.S. Appl. No. 15/374,442 Office Action dated May 21, 2018.
U.S. Appl. No. 15/374,535 Notice of Allowance dated Sep. 24, 2018.
U.S. Appl. No. 15/374,535 Office Action dated Apr. 20, 2018.
U.S. Appl. No. 15/374,616 Office Action dated Aug. 15, 2018.
U.S. Appl. No. 15/374,616 Office Action dated Mar. 26, 2018.
U.S. Appl. No. 15/374,821 Notice of Allowance dated Apr. 4, 2018.
U.S. Appl. No. 15/399,186 Notice of Allowance dated Dec. 20, 2018.
U.S. Appl. No. 15/399,186 Notice of Allowance dated Sep. 17, 2018.
U.S. Appl. No. 15/435,065 Office Action dated Aug. 16, 2018.
U.S. Appl. No. 15/435,078 Office Action dated Aug. 16, 2018.
U.S. Appl. No. 15/435,078 Office Action dated Jan. 10, 2019.
U.S. Appl. No. 15/435,090 Office Action dated May 18, 2018.
U.S. Appl. No. 15/435,110 Notice of Allowance dated Dec. 20, 2018.
U.S. Appl. No. 15/435,110 Notice of Allowance dated Sep. 25, 2018.
U.S. Appl. No. 15/435,110 Office Action dated Apr. 19, 2018.
U.S. Appl. No. 15/479,531 Office Action dated Jan. 9, 2019.
U.S. Appl. No. 15/490,219 Office Action dated Oct. 12, 2018.
U.S. Appl. No. 15/614,979 Office Action dated Jun. 8, 2018.
U.S. Appl. No. 15/614,979 Office Action dated Nov. 5, 2018.
U.S. Appl. No. 15/615,004 Office Action dated Jun. 8, 2018.
U.S. Appl. No. 15/615,004 Office Action dated Oct. 30, 2018.
U.S. Appl. No. 15/634,228 Notice of Allowance dated Nov. 5, 2018.
U.S. Appl. No. 15/634,228 Office Action dated Jun. 14, 2018.
U.S. Appl. No. 15/634,267 Notice of Allowance dated Dec. 28, 2018.
U.S. Appl. No. 15/634,267 Office Action dated Apr. 3, 2018.
U.S. Appl. No. 15/634,267 Office Action dated Sep. 6, 2018.
U.S. Appl. No. 15/634,666 Office Action dated Oct. 18, 2018.
U.S. Appl. No. 15/634,727 Office Action dated May 25, 2018.
U.S. Appl. No. 15/634,727 Office Action dated Sep. 20, 2018.
U.S. Appl. No. 15/719,084 Office Action dated Jul. 12, 2018.
U.S. Appl. No. 15/719,133 Office Action dated Mar. 28, 2018.
U.S. Appl. No. 15/719,133 Office Action dated Sep. 24, 2018.
U.S. Appl. No. 15/719,229 Office Action dated Oct. 5, 2018.
U.S. Appl. No. 15/788,495 Office Action dated Oct. 3, 2018.
U.S. Appl. No. 15/803,686 Office Action dated Sep. 19, 2018.
U.S. Appl. No. 15/803,688 Office Action dated Sep. 20, 2018.
U.S. Appl. No. 15/830,421 Office Action dated Jul. 26, 2018.
U.S. Appl. No. 15/830,421 Office Action dated Nov. 13, 2018.
U.S. Appl. No. 15/830,470 Office Action dated Jul. 5, 2018.
U.S. Appl. No. 15/853,700 Office Action dated Apr. 6, 2018.
U.S. Appl. No. 15/853,700 Office Action dated Sep. 11, 2018.
U.S. Appl. No. 15/855,744 Office Action dated Apr. 27, 2018.
U.S. Appl. No. 15/855,744 Office Action dated Nov. 19, 2018.
U.S. Appl. No. 15/861,548 Office Action dated Sep. 6, 2018.
U.S. Appl. No. 15/861,553 Office Action dated Aug. 7, 2018.
U.S. Appl. No. 15/861,553 Office Action dated Dec. 14, 2018.
U.S. Appl. No. 15/870,561 Office Action dated Jun. 15, 2018.
U.S. Appl. No. 15/870,561 Office Action dated Nov. 19, 2018.
U.S. Appl. No. 15/871,763 Notice of Allowance dated Aug. 15, 2018.
U.S. Appl. No. 15/871,763 Notice of Allowance dated Nov. 5, 2018.
U.S. Appl. No. 15/871,763 Notice of Allowance dated Sep. 17, 2018.
U.S. Appl. No. 15/871,763 Office Action dated Apr. 19, 2018.
U.S. Appl. No. 15/886,544 Office Action dated Aug. 27, 2018.
U.S. Appl. No. 15/893,523 Notice of Allowance dated Jun. 15, 2018.
U.S. Appl. No. 15/893,523 Notice of Allowance dated May 7, 2018.
U.S. Appl. No. 15/909,388 Office Action dated Dec. 14, 2018.
U.S. Appl. No. 15/909,396 Office Action dated Jan. 17, 2019.
U.S. Appl. No. 15/909,406 Office Action dated Aug. 27, 2018.
U.S. Appl. No. 15/909,784 Office Action dated Jan. 18, 2019.
U.S. Appl. No. 15/909,784 Office Action dated Jul. 13, 2018.
U.S. Appl. No. 15/909,806 Office Action dated Aug. 13, 2018.
U.S. Appl. No. 15/909,806 Office Action dated Dec. 26, 2018.
U.S. Appl. No. 15/909,809 Office Action dated Aug. 10, 2018.
U.S. Appl. No. 15/909,826 Notice of Allowance dated Aug. 30, 2018.
U.S. Appl. No. 15/909,826 Office Action dated May 2, 2018.
U.S. Appl. No. 15/937,778 Office Action dated Sep. 21, 2018.
U.S. Appl. No. 15/937,790 Office Action dated Sep. 25, 2018.
U.S. Appl. No. 15/937,798 Office Action dated Oct. 26, 2018.
U.S. Appl. No. 15/937,812 Office Action dated Sep. 7, 2018.
U.S. Appl. No. 15/937,817 Office Action dated Nov. 23, 2018.
Van Der Eijk, et al. Metal printing process: development of a new rapid manufacturing process for metal parts. Proceedings of the World PM 2004 conference held in Vienna. Oct. 17-21, 2004. 5 pages.
Wang et al. Effects of thermal cycles on the microstructure evolution of Inconel 718 during selective laser melting process. Additive Manufacturing. vol. 18, Dec. 2017, pp. 1-14.
Wang, et al. Research on the fabricating quality optimization of the overhanging surface in SLM process. Int J Adv Manuf Technol (2013) 65:1471-1484 DOI 10.1007/s00170-012-4271-4. Published online: Jun. 16, 2012.
Wilkes, et al. Emerald Article: Additive manufacturing of ZrO2—Al2O3 ceramic components by selective laser melting. Rapid Prototyping Journal, vol. 19, Issue 1, Aug. 7, 2012.
Wright, Roger. Wire Technology, Process Engineering and Metallurgy, Ch. 19, Elsevier, 2011, pp. 279-283. Published: Nov. 17, 2010.
Xiao, et al. Numerical Simulation of Direct Metal Laser Sintering of Single-Component Powder on Top of Sintered Layers. Journal of Manufacturing Science and Engineering. vol. 130, Aug. 2008. 10 pages.
Xu et al. In situ tailoring microstructure in additively manufactured Ti—6Al—4V for superior mechanical performance. Acta Materialia. vol. 125, Feb. 15, 2017, pp. 390-400.
Yin. Accurately quantifying process-relevant powder properties for AMPM applications. Freeman Technology. May 2014. 39 pages.
Arnet et al. Extending Laser Bending for the Generation of Convex Shapes. Proc. Instn. Mech. Engrs., vol. 209, Dec. 1, 1995, pp. 433-442.
Ashby, Mike. Teach Yourself: Phase Diagrams and Phase Transformations. 5th Edition, Mar. 2009, Cambridge. 55 pages.
Co-pending U.S. Appl. No. 16/351,030, filed Mar. 12, 2019.
Co-pending U.S. Appl. No. 16/450,853, filed Jun. 24, 2019.
Co-pending U.S. Appl. No. 16/505,520, filed Jul. 8, 2019.

(56) References Cited

OTHER PUBLICATIONS

Co-pending U.S. Appl. No. 16/550,088, filed Aug. 23, 2019.
Co-pending U.S. Appl. No. 16/591,549, filed Oct. 2, 2019.
Co-pending U.S. Appl. No. 16/653,933, filed Oct. 15, 2019.
Co-pending U.S. Appl. No. 16/662,764, filed Oct. 24, 2019.
Co-pending U.S. Appl. No. 16/686,045, filed Nov. 15, 2019.
Co-pending U.S. Appl. No. 16/694,963, filed Nov. 25, 2019.
Co-pending U.S. Appl. No. 16/709,887, filed Dec. 10, 2019.
Co-pending U.S. Appl. No. 16/714,638, filed Dec. 13, 2019.
Co-pending U.S. Appl. No. 16/783,490, filed Feb. 6, 2020.
Co-pending U.S. Appl. No. 16/784,175, filed Feb. 6, 2020.
Co-pending U.S. Appl. No. 16/789,905, filed Feb. 13, 2020.
Co-pending U.S. Appl. No. 16/820,459, filed Mar. 16, 2020.
Co-pending U.S. Appl. No. 16/825,696, filed Mar. 20, 2020.
Co-pending U.S. Appl. No. 16/841,161, filed Apr. 6, 2020.
Co-pending U.S. Appl. No. 16/843,725, filed Apr. 8, 2020.
Co-pending U.S. Appl. No. 16/872,714, filed May 12, 2020.
Co-pending U.S. Appl. No. 16/876,608, filed May 18, 2020.
Co-pending U.S. Appl. No. 16/877,029, filed May 18, 2020.
Co-pending U.S. Appl. No. 16/883,262, filed May 26, 2020.
Co-pending U.S. Appl. No. 16/895,334, filed Jun. 8, 2020.
Co-pending U.S. Appl. No. 16/917,927, filed Jul. 1, 2020.
Co-pending U.S. Appl. No. 16/917,933, filed Jul. 1, 2020.
Co-pending U.S. Appl. No. 16/917,937, filed Jul. 1, 2020.
Co-pending U.S. Appl. No. 16/933,188, filed Jul. 20, 2020.
Co-pending U.S. Appl. No. 17/009,608, filed Sep. 1, 2020.
Co-pending U.S. Appl. No. 17/011,950, filed Sep. 3, 2020.
Co-pending U.S. Appl. No. 17/023,214, filed Sep. 16, 2020.
Co-pending U.S. Appl. No. 63/034,002, filed Jun. 3, 2020.
Doxygen. CGAL 4.11.1—Kinetic Data Structures. User Manual. Web. Published Apr. 8, 2006. 4 pages. URL:< https://doc.cgal.org/latest/Manual/how_to_cite_cgal.html>.
EP16862767.7 European Search Report dated Jun. 26, 2019.
EP16874003.3 Extended European Search Report dated Oct. 10, 2019.
EP17156707.6 EP Office Action dated Apr. 29, 2020.
EP17178143.8 Notice of Opposition dated Nov. 19, 2019.
EP18209400.3 European Search Report dated May 7, 2019.
Everton et al. Review of in-situ process monitoring and in-situ metrology for metal additive manufacturing. Materials and Design 95 (2016) 431-445.
Geiger, et al. The Mechanisms of Laser Forming. Annals of the CIRP, vol. 42, Jan. 1993, pp. 301-304.
Gibson et al. Additive Manufacturing Technologies. Springer. Jan. 2010. 472 pages.
Gu et al. Laser additive manufacturing of metallic components: materials, processes and mechanisms. International Materials Reviews 57(3):133-164 (2012).
Hu, et al. Computer simulation and experimental investigation of sheet metal bending using laser beam scanning. International Journal of Machine Tools and Manufacture, 41, Mar. 2001, pp. 589-607.
Hu et al. Experimental and numerical modeling of buckling instability of laser sheet forming. International Journal of Machine Tools & Manufacture, 42, Oct. 2002, pp. 1427-1439.
integrativemodeling.org. IMP, the Integrative Modeling Platform. Web. Published Jul. 26, 2013. 1 page. URL:< https://integrativemodeling.org/>.
International Search Report and Written Opinion dated Feb. 14, 2017 for International PCT Patent Application No. PCT/US2016/042818.
International Search Report and Written Opinion dated Sep. 20, 2016 for International PCT Patent Application No. PCT/US2016/034454.
International Search Report and Written Opinion dated Oct. 18, 2016 for International PCT Patent Application No. PCT/US2016/041895.
Lü et al. Chapter 6: Metal-Based System via Laser Melting. Laser-Induced Materials and Processes for Rapid Prototyping. Kluwer Acad. Publ., USA, pp. 143-186 (2001).

Maji et al. Finite Element Analysis and Experimental Investigations on Laser Bending of AISI304 Stainless Steel Sheet. Procedia Engineering 64, Dec. 2013, pp. 528-535.
Mumatz, et al. A Method to Eliminate Anchors/Supports from Directly Laser Melted Metal Powder Bed Processes. Aug. 2011, Additive Manufacturing Research Group, Wolfson School of Mechanical Engineering, Loughborough University, pp. 55-64.
Salvati et al. An Investigation of Residual Stress Gradient Effects in FIB-DIC Micro-Ring-Core Analysis. Proceedings of the International MultiConference of Engineers and Computer Scientists 2015 vol. II, IMECS 2015, Hong Kong, Mar. 18-20, 2015. 4 pages.
Sandvik Materials Technology website. Accessed Nov. 14, 2014. http://www.smt.sandvik.com/en/products/metal-powder/additive-manufacturing/.
Shen et al. An analytical model for estimating deformation in laser forming. Computational Materials Science, 37, Oct. 2006, pp. 593-598.
Shen et al. Modelling of laser forming—An review. Computational Materials Science 46, Oct. 2009, pp. 834-840.
Symeonidis, Kimon. The Controlled Diffusion Solidification Process: Fundamentals and Principles. Ph.D. Thesis. Worcester Polytechnic Institute. Apr. 2009. 137 pages.
U.S. Appl. No. 16/195,810 Notice of Allowance dated Apr. 8, 2020.
U.S. Appl. No. 16/195,810 Notice of Allowance dated May 11, 2020.
U.S. Appl. No. 15/435,078 Notice of Allowance dated May 20, 2019.
U.S. Appl. No. 15/436,558 Notice of Allowance dated Aug. 21, 2019.
U.S. Appl. No. 15/436,558 Office Action dated May 23, 2019.
U.S. Appl. No. 15/719,229 Office Action dated May 16, 2019.
U.S. Appl. No. 15/909,396 Office Action dated Aug. 22, 2019.
U.S. Appl. No. 15/188,885 Notice of Allowance dated Jul. 29, 2019.
U.S. Appl. No. 15/188,885 Office Action dated Apr. 9, 2019.
U.S. Appl. No. 15/339,712 Office Action dated Jan. 10, 2018.
U.S. Appl. No. 15/374,616 Notice of Allowance dated Feb. 26, 2019.
U.S. Appl. No. 15/374,616 Notice of Allowance dated Feb. 5, 2019.
U.S. Appl. No. 15/435,078 Notice of Allowance dated Aug. 21, 2019.
U.S. Appl. No. 15/435,078 Notice of Allowance dated Jul. 10, 2019.
U.S. Appl. No. 15/435,078 Notice of Allowance dated Sep. 4, 2019.
U.S. Appl. No. 15/490,219 Notice of Allowance dated Apr. 10, 2019.
U.S. Appl. No. 15/634,228 Notice of Allowance dated Feb. 20, 2019.
U.S. Appl. No. 15/634,727 Notice of Allowance dated Feb. 7, 2019.
U.S. Appl. No. 15/668,662 Office Action dated Oct. 1, 2020.
U.S. Appl. No. 15/719,084 Office Action dated Feb. 8, 2019.
U.S. Appl. No. 15/808,434 Office Action dated Feb. 21, 2020.
U.S. Appl. No. 15/808,777 dated Feb. 6, 2020.
U.S. Appl. No. 15/909,406 Notice of Allowance dated Jan. 29, 2019.
U.S. Appl. No. 15/937,778 Office Action dated Feb. 12, 2019.
U.S. Appl. No. 15/937,790 Office Action dated Jan. 31, 2019.
U.S. Appl. No. 15/937,798 Notice of Allowance dated Jun. 12, 2019.
U.S. Appl. No. 15/937,798 Office Action dated Mar. 7, 2019.
U.S. Appl. No. 15/937,812 Office Action dated Feb. 7, 2019.
U.S. Appl. No. 16/195,810 Office Action dated Dec. 27, 2019.
U.S. Appl. No. 15/374,616 Notice of Allowance dated Apr. 2, 2019.
Wohlfart, Michael. Can you Build a 100 mm Support-free Horizontal Disk? Linkedin. Web article. Published Mar. 11, 2019. 14 pages. URL: https://www.linkedin.com/pulse/can-you-build-100-mm-support-free-horizontal-disk-michael-wohlfart/>.
Betriebsanleitung (Operating Manual). Selective Laser Melting-Anlage. SLM® 125HL. SLM Solutions, pp. 1-6, pp. 43-49, 53, 68, 69, 84-87, and 92 (Jun. 1, 2015). 21 pages total. With English translation.
Co-pending U.S. Appl. No. 16/657,980, inventors Elgar; Yacov et al., filed Oct. 18, 2019.
Co-pending U.S. Appl. No. 16/846,058, inventors Buller; Benyamin et al., filed Apr. 10, 2020.

(56) References Cited

OTHER PUBLICATIONS

Co-pending U.S. Appl. No. 16/853,589, inventor Buller; Benyamin, filed Apr. 20, 2020.
Co-pending U.S. Appl. No. 16/857,453, inventors Buller; Benyamin et al., filed Apr. 24, 2020.
Co-pending U.S. Appl. No. 16/866,949, inventors Milshtein; Erel et al., filed May 5, 2020.
Co-pending U.S. Appl. No. 16/872,646, inventors Buller; Benyamin et al., filed May 12, 2020.
Co-pending U.S. Appl. No. 16/895,390, inventors Buller; Benyamin et al., filed Jun. 8, 2020.
Co-pending U.S. Appl. No. 16/914,756, inventors Symeonidis; Kimon et al., filed Jun. 29, 2020.
Co-pending U.S. Appl. No. 16/927,307, inventors Symeonidis; Kimon et al., filed Jul. 13, 2020.
Co-pending U.S. Appl. No. 16/939,847, inventors Buller; Benyamin et al., filed Jul. 27, 2020.
Co-pending U.S. Appl. No. 17/012,518, inventors Milshtein; Erel et al., filed Sep. 4, 2020.
Co-pending U.S. Appl. No. 17/020,714, inventors Buller; Benyamin et al., filed Sep. 14, 2020.
Co-pending U.S. Appl. No. 17/022,334, inventor Buller; Benyamin, filed Sep. 16, 2020.
Co-pending U.S. Appl. No. 17/023,180, inventors Buller; Benyamin et al., filed Sep. 16, 2020.
Co-pending U.S. Appl. No. 17/063,318, inventors Coulier; Pieter et al., filed Oct. 5, 2020.
Co-pending U.S. Appl. No. 17/570,736, inventors Buller; Benyamin et al., filed Jan. 7, 2022.
Co-pending U.S. Appl. No. 17/581,091, inventors Buller; Benyamin et al., filed Jan. 21, 2022.
Co-pending U.S. Appl. No. 17/695,092, inventors Elgar; Yakov et al., filed Mar. 15, 2022.
Co-pending U.S. Appl. No. 17/699,544, inventors Buller; Benyamin et al., filed Mar. 21, 2022.
Co-pending U.S. Appl. No. 17/849,866, inventors Buller; Benyamin et al., filed Jun. 27, 2022.
Co-pending U.S. Appl. No. 17/861,015, inventors Buller; Benyamin et al., filed Jul. 8, 2022.
Co-pending U.S. Appl. No. 17/876,757, inventors Buller; Benyamin et al., filed Jul. 29, 2022.
Co-pending U.S. Appl. No. 29/653,429, inventors Coulier; Pieter et al., filed Jun. 14, 2018.
EP16862767.7 Extended European Search Report dated Jun. 26, 2019.
EP21185947.5 Extended European Search Report dated Jan. 21, 2022.
Gebhardt. Generative Fertigungsverfahren: Rapid Prototyping—Rapid Tooling—Rapid Manufacturing. Carl Hanser Verlag, München, cover page, inside cover page, and p. 121 (2007). With English translation of p. 121. 5 pages total.
Gibson, et al. Additive Manufacturing Technologies, Springer 2010, ISBN978-1-4419-1119-3 (Print 978-1-4419-1120-9 (Online). Published: Dec. 14, 2009. 472 pages. pp. 27-31, 98-99, 264-267, 295, 382-383.
Hubbard, ed. The Handbook of Surface Imaging and Visualization, cover sheets and pp. 39-40, CRC Press (1995). 4 pages.
International Search Report and Written Opinion for PCT/US2020/042596 dated Nov. 3, 2020.
Kumar. Powder deposition and sintering for a two-powder approach to solid freeform fabrication. Department of Mechanical Engineering, University of Florida. Aug. 1998; 169-173.
Meiners. Direktes Selektives Laser Sintemn einkomponentiger metallischer Werkstoffe. Dissertation. 133 pages (1999). With English translation.
Mercelis. Residual stresses in selective laser sintering and selective laser melting. Rapid Prototyping Journal, vol. 12, Issue 5, pp. 254-265 (2006).
Office Action dated Mar. 7, 2017 for U.S. Appl. No. 15/399,712.
PCT/US2019/032727 International Search Report and Written Opinion dated Sep. 6, 2019.
Sloan, Jeff. Tidal turbine blade toughened for turbulent sea salt, CompositesWorld (Nov. 30, 2012). Retrieved web page archived Jan. 16, 2013. Retrieved on Apr. 9, 2020 from https://web.archive.org/web/20130116115034/https://www.compositesworld.com/articles/tidal-turbine-blade-toughened-for-turbulent-salt-sea. 7 pages.
U.S. Appl. No. 15/803,683 Office Action dated Jun. 19, 2019.
U.S. Appl. No. 15/339,712 Notice of Allowance dated Jul. 24, 2018.
U.S. Appl. No. 15/893,523 Notice of Allowance dated Jul. 25, 2018.
U.S. Appl. No. 16/245,183 Office Action dated Jan. 6, 2021.
U.S. Appl. No. 29/653,429 Office Action dated Apr. 9, 2021.
U.S. Appl. No. 29/653,429 Office Action dated Dec. 15, 2021.
3D Printers. 3D Systems. https://www.3dsystems.com/3d-printers. Web page cached Jun. 23, 2013. 7 pages.
Concept Laser M2 Series 5. GE Additive. https://www.ge.com/additive/additive-manufacturing/machines/m2series5. Web page first crawled by Wayback Machine (https://www.ge.com/additive/additive-manufacturing/machines/m2series5) May 29, 2020. Related press release published Nov. 19, 2019 at https://www.ge.com/additive/additive-manufacturing/machines/m2series5. 10 pages.
DMP Factory 350 and DMP Factory 350 Dual. 3D Systems. https://www.3dsystems.com/3d-printers/dmp-factory-350. Web page cached Nov. 13, 2018. 13 pages.
Flashforge Adventurer 3C FDM 3D Printer. https://www.flashforgeshop.com/product/flashforge-adventurer-3c-3d-printer?cID=31. Webpage https://www.flashforgeshop.com/product/flashforge-adventurer-3c-3d-printer?cID=31 cached Nov. 8, 2019. 13 pages.
Glowforge 3D Laser Printer. Glowforge, https://glowforge.com/products. Sub-page first cached May 15, 2019. 17 pages.
RenAM 500 metal additive manufacturing (3D printing) systems. Renishaw. https://www.renishaw.com/en/renam-500-metal-additive-manufacturing-3d-printing-systems--37011. Web page first cached Nov. 17, 2021. 10 pages.
SLM® 280 2.0. SLM Solutions, https://www.slm-solutions.com/products-and-solutions/machines/slm-280/. First cached Nov. 14, 2016. 7 pages.
FIT AG & SLM Solutions (German). Video. SLM Solutions Group AG. https://www.youtube.com/watch?v=xOoRL_IHfcg. Nov. 16, 2016. With English translation of transcript. 10 pages.
Ilschner et al. Werkstoffwissesnschaften und Fertigungstechnik. Springer Verlag (2010). Section 4.7, pp. 77-79. With English machine translation.
Leuders et al. On the mechanical behaviour of titanium alloy TiAl6V4 manufactured by selective laser melting: Fatigue resistance and crack growth performance. International Journal of Fatigue 48 (2013) 300-307. Available online Nov. 29, 2012.
Rehme. Cellular Design for Laser Freeform Fabrication. PhD Thesis. Hamburg University of Technology, CuvillierVerlag, Goettingen, 2010. 303 pages.
Riemer et al. On the fatigue crack growth behavior in 316L stainless steel manufactured by selective laser melting. Engineering Fracture Mechanics 120 (2014) 15-25.
Thijs et al. Fine-structured aluminium products with controllable texture by selective laser melting of pre-alloyed AlSi10Mg powder. Acta Materialia 61 (2013) 1809-1819. Available online Dec. 28, 2012.

* cited by examiner

THREE-DIMENSIONAL PRINTING AND THREE-DIMENSIONAL PRINTERS

CROSS-REFERENCE

This application is a continuation application of U.S. patent application Ser. No. 16/253,103 filed Jan. 21, 2019, which is a continuation application of U.S. patent application Ser. No. 15/634,267 filed Jun. 27, 2017, now U.S. patent Ser. No. 10/252,336 issued on Apr. 9, 2019, which claims priority to U.S. Provisional Patent Application Ser. No. 62/356,465 filed on Jun. 29, 2016, U.S. Provisional Patent Application Ser. No. 62/421,836 filed on Nov. 14, 2016, U.S. Provisional Patent Application Ser. No. 62/472,320 filed on Mar. 16, 2017, and U.S. Provisional Patent Application Ser. No. 62/506,149 filed on May 15, 2017, each of which is entirely incorporated herein by reference.

BACKGROUND

Three-dimensional (3D) printing (e.g., additive manufacturing) is a process for making a 3D object of any shape from a design. The design may be in the form of a data source such as an electronic data source, or may be in the form of a hard copy. The hard copy may be a two-dimensional representation of a 3D object. The data source may be an electronic 3D model. 3D printing may be accomplished through an additive process in which successive layers of material are laid down one on top of another. This process may be controlled (e.g., computer controlled, manually controlled, or both). A 3D printer can be an industrial robot.

3D printing can generate custom parts. A variety of materials can be used in a 3D printing process including elemental metal, metal alloy, ceramic, elemental carbon, or polymeric material. In some 3D printing processes (e.g., additive manufacturing), a first layer of hardened material is formed (e.g., by welding powder), and thereafter successive layers of hardened material are added one by one, wherein each new layer of hardened material is added on a pre-formed layer of hardened material, until the entire designed three-dimensional structure (3D object) is layer-wise materialized.

3D models may be created with a computer aided design package, via 3D scanner, or manually. The manual modeling process of preparing geometric data for 3D computer graphics may be similar to plastic arts, such as sculpting or animating 3D scanning is a process of analyzing and collecting digital data on the shape and appearance of a real object (e.g., real-life object). Based on this data, 3D models of the scanned object can be produced.

A number of 3D printing processes are currently available. They may differ in the manner layers are deposited to create the materialized 3D structure (e.g., hardened 3D structure). They may vary in the material or materials that are used to materialize the designed 3D object. Some methods melt, sinter, or soften material to produce the layers that form the 3D object. Examples for 3D printing methods include selective laser melting (SLM), selective laser sintering (SLS), direct metal laser sintering (DMLS) or fused deposition modeling (FDM). Other methods cure liquid materials using different technologies such as stereo lithography (SLA). In the method of laminated object manufacturing (LOM), thin layers (made inter alia of paper, polymer, or metal) are cut to shape and joined together.

At times, the starting material used for the 3D printing and/or the remainder of the starting material that did not form the 3D object may be susceptible to ambient atmospheric conditions (e.g., oxygen or humidity). At times, it may be desirable to prevent exposure of an operator to the 3D printing starting material and/or remainder. Some embodiments of the present disclosure delineate ways of overcoming such hardship.

In some embodiments, the present disclosure delineates methods, systems, apparatuses, and software that allow modeling of 3D objects with a reduced amount of design constraints (e.g., no design constraints). The present disclosure delineates methods, systems, apparatuses, and software that allow materialization of these 3D object models.

SUMMARY

In an aspect is a method for generating a three-dimensional (3D) object that comprises: (a) engaging a build module with a processing chamber, wherein the build module comprises a platform, wherein the build module is controlled by a first controller and the processing chamber is controlled by a second controller, wherein the first controller is different from the second controller; and (b) printing a 3D object according to a 3D printing method by using the second controller, which 3D object is disposed adjacent to the platform and in the build module.

The build module may be dis-engaged from the processing chamber by using the first controller. The first controller may not control the second controller. The build module may be reversibly sealable by a first shutter. The build module may comprise a first conditioned atmosphere. The processing chamber may be reversibly sealable by a second shutter. The processing chamber may comprise a second conditioned atmosphere. The build module may be reversibly sealable by a first shutter and the processing chamber is reversibly sealable by a second shutter. A load lock volume can be formed in operation (b) between the build module and the processing chamber. The method may further comprise conditioning an atmosphere of the load lock. The method can further comprise removing the first shutter and the second shutter before operation (b). At least one of the conditioning, removing, printing, docking, and inserting may not require human intervention. At times, at least two of the conditioning, removing, printing, docking, and inserting may occur without human intervention. The 3D printing method can comprise additive manufacturing. The 3D printing method can comprise granular 3D printing. The granular 3D printing can comprise using a granular material selected from the group consisting of elemental metal, metal alloy, ceramics, and an allotrope of elemental carbon. The printing can comprise transforming the granular material to form a transformed material to form at least a portion of the 3D object. The transforming can comprise melting or sintering the granular material. The transforming comprises can comprise melting the granular material.

In another aspect is a method for generating a 3D object that comprises: (a) engaging a build module with a load lock area that is connected to a processing chamber comprising a second atmosphere, wherein the build module comprises a platform and a first atmosphere, wherein the load lock area comprises a third atmosphere; and (b) printing a 3D object according to a 3D printing method, which 3D object is disposed adjacent to the platform and in the build module.

The first atmosphere may be substantially an inert atmosphere. The second atmosphere may be substantially an inert atmosphere. The third atmosphere may be substantially an inert atmosphere. At least two of the first atmosphere, second atmosphere, and third atmosphere, may be substantially the same atmosphere. An equilibration channel may equilibrate pressure and/or content within at least one of first atmosphere, second atmosphere or third atmosphere. The equilibration channel may be connected between the build module and the processing chamber. The equilibration channel may be connected between the build module and the load lock area. The equilibration channel may be connected between the processing chamber and the load lock area. The equilibration channel may comprise a valve. The valve may be openable. The valve may be closable.

In another aspect is a method for generating a 3D object that comprises printing a 3D object according to a 3D printing method in a 3D printer, which 3D printer is engaged in 3D printing for at least about eighty percent of the time. The 3D printer can be engaged in 3D printing for at least about ninety percent of the time. The 3D printer can be engaged in 3D printing for at least about ninety-five percent of the time. The 3D printer can be engaged in 3D printing for at least about ninety-eight percent of the time. The 3D printer may print two or more 3D objects before the 3D printer is interrupted. The 3D printer may require a single operator in every twenty-four hours in a seven-day work week. The 3D printing method may comprise granular 3D printing. The 3D printing may comprise using granular material in the granular 3D printing. The 3D printer may have a granular material capacity for at least two successive 3D printing cycles. In some instances, at least one of the two successive 3D printing cycles can comprise printing a plurality of 3D objects in a single 3D printing cycle.

In another aspect, an apparatus for generating a 3D object that comprises: a processing chamber comprising a first controller; a build module comprising a material bed, wherein the build module is controlled by a second controller, wherein the build module engages with the processing chamber, wherein the first controller is different from the second controller; and an energy source that generates an energy beam that transform a portion of the material bed to generate the 3D object by using the second controller.

The first controller may control the engagement of the build module with the processing chamber. In some embodiments, the second controller may control the dis-engagement of the build module from the processing chamber (e.g., after the 3D object has been built). In some embodiments, the first controller may control the dis-engagement of the build module from the processing chamber (e.g., after the 3D object has been built). Printing a 3D object according to a 3D printing method may comprise using the second controller. The 3D object may be disposed adjacent to the platform and in the build module. The build module may comprise a lifting mechanism configured to vertically translate the platform. The lifting mechanism may comprise a drive mechanism or a guide mechanism. The drive mechanism may comprise a lead screw or a scissor jack. The guide mechanism may comprise a rail or a linear bearing.

In another aspect, an apparatus for 3D printing comprises: a first controller that is programmed to perform the following operations: operation (i) direct engaging of a build module with a processing chamber, wherein the build module comprises a material bed, wherein the build module comprises a second controller and the processing chamber is controlled by the first controller, wherein the first controller is different from the second controller; and operation (ii) direct printing of a 3D object according to a 3D printing, which 3D object is disposed in the build module.

In some examples, the second controller may be further programmed to disengage the build module from the processing chamber. In some embodiments, the first controller may be further programmed to disengage the build module from the processing chamber. The first controller may not control the second controller. The first controller may communicate with the second controller. Communicate may comprise emitting a signal from the second controller. Communicate may comprise reading a signal emitted from the second controller, by the first controller.

In another aspect, a computer software product for 3D printing of at least one 3D object, comprising a non-transitory computer-readable medium in which program instructions are stored, which instructions, when read by a computer, cause the computer to perform operations that comprise: operation (a) directing engaging of a build module with a processing chamber, wherein the build module comprises a platform, wherein the build module is controlled by a first controller and the processing chamber is controlled by a second controller, wherein the first controller is different from the second controller; and operation (b) directing printing of a 3D object according to a 3D printing method by using the second controller, which 3D object is disposed adjacent to the platform and in the build module.

In another aspect, a system for forming a 3D object comprises: a processing chamber comprising a first controller that is operatively coupled to the processing chamber; a build module comprising a platform, wherein the build module comprises a second controller, wherein the first controller is different from the second controller, wherein the second controller is operatively coupled to the build module; and wherein the first controller is programmed to perform the following operations: operation (i) engage the build module with the processing chamber, and operation (ii) print a 3D object, which 3D object is disposed in the build module.

In some examples, the first controller may be programmed to disengage the build module from the processing chamber comprising the 3D object. In some embodiments, the second controller may be programmed to disengage the build module from the processing chamber comprising the 3D object.

In another aspect, an apparatus for generating a 3D object, comprises: a processing chamber comprising a first atmosphere; a load-lock (e.g., comprising a partition that defines an internal load lock volume) comprising a second atmosphere that is connected to the processing chamber; a build module comprising a third atmosphere, wherein the build module comprises a material bed, wherein the build module is that reversibly connected to the load-lock; and an energy source that generates an energy beam configured to print a 3D object disposed in the build module.

At least one of the first atmosphere, second atmosphere, and third atmosphere, may be substantially an inert atmosphere. At least two of the first atmosphere, second atmosphere, and third atmosphere, may be substantially similar. At least two of the first atmosphere, second atmosphere, and third atmosphere, may equilibrate with each other.

In another aspect, an apparatus for 3D printing comprises at least one controller that is collectively or separately programmed to perform the following operations: operation (a) engage a build module with a load lock area that is connected to a processing chamber comprising a second atmosphere, wherein the build module comprises a platform and a first atmosphere, wherein the load lock area comprises a third atmosphere; and operation (b) print a 3D object according to a 3D printing method, which 3D object is disposed adjacent to the platform and in the build module.

The build module may comprise a separate controller than the processing chamber, wherein the build module controller may control a disengagement of the build module from the processing chamber.

In another aspect, a computer software product for 3D printing of at least one 3D object, comprising a non-transitory computer-readable medium in which program instructions are stored, which instructions, when read by a computer, cause the computer to perform operations that comprise: operation (a) engaging a build module with a load lock area that is connected to a processing chamber comprising a first atmosphere, wherein the build module comprises a second atmosphere, wherein the load lock area comprises a third atmosphere; and operation (b) printing a 3D object that is disposed adjacent to the platform and in the build module.

In another aspect, a system for forming a 3D object comprises: a processing chamber comprising a first atmosphere; a load lock area comprising a second atmosphere, which load lock area is connected to the processing chamber; a build module that is reversibly connected to the processing chamber, wherein the build module comprises a third atmosphere; and at least one controller operatively coupled to the build module, the load lock area and the processing chamber, which at least one controller is programmed to direct performance of the following operations: operation (i) engage a build module with a load lock area, operation (ii) print the 3D object in the build module, and operation (iii) disengage the build module comprising the 3D object, from the load lock area.

At least two of operation (i), operation (ii), and operation (iii) may be directed by the same controller. At least one controller may be a multiplicity of controllers and wherein at least two of operation (i), operation (ii), and operation (iii) may be directed by different controllers.

In another aspect, a method for generating a 3D object, comprises: (a) engaging a base with a substrate to form a platform comprising engaging a first fixture with a second fixture to restrict at least one degree of movement of the base relative to the substrate, which first fixture is operatively coupled or is part of the base, which second fixture is operatively coupled to or is part of the substrate, wherein the platform comprises an exposed surface of the base that can be used for 3D printing of the 3D object; and (b) printing the 3D object above the platform.

Engaging may be automatically engaging. Fastening the base to the substrate by using a fastener that may be configured to constrain the movement of the base and the substrate may be performed after (a). The entire exposed surface of the base may be used for the 3D printing. The engaging may be reversible. The substrate may be operatively coupled to a stopper. The second fixture may be operatively coupled to or may be part of the stopper. Engaging the base with the substrate may comprise translation of the base relative to the substrate. Translating may comprise aligning. Aligning may comprise guiding the base to engage with the substrate. The substrate may be operatively coupled to a stopper that stops the translation of the base. The first fixture and/or the second fixture may comprise a cross section having a geometrical shape. The first fixture may be a part of a first fixture set comprising a first plurality of fixtures that may be operatively coupled to or may be a part of the base, wherein the second fixture may be a part of a second fixture set comprising a second plurality of fixtures that may be operatively coupled to or may be a part of the substrate, wherein the first fixture set engages with the second fixture set to restrict at least one degree of movement of the base relative to the substrate.

At least two fixtures of the first fixture set may have the same shape. At least two fixtures of the first fixture set may have a different shape. At least two fixtures of the second fixture set may have the same shape. At least two fixtures of the second fixture set may have a different shape. The first fixture may be complementary to the second fixture. Complementary may comprise mirroring. Complementary may comprise matching. The base may have a different horizontal cross-sectional shape than the horizontal cross-sectional shape of the substrate. The base may have a similar horizontal cross-sectional shape than the horizontal cross-sectional shape of the substrate. The first fixture or the second fixture may comprise a protrusion. The first fixture or the second fixture may comprise an indentation. The first fixture or the second fixture may comprise a charge. A first charge of the first fixture may be opposite to a second charge of the second fixture. A fixture may comprise a 3D (3D) shape. A fixture may comprise a dove-tail. Engaging may comprise inserting a portion of the base into a portion of the substrate. Engaging may comprise kinematic coupling. The first fixture and the second fixture may be self-aligning. The first fixture and the second fixture may be self-affixing.

In another aspect, an apparatus for 3D printing of at least one 3D object, comprises: a platform comprising a substrate and a base above which at least a portion of the 3D object is printed; a first fixture that is operatively coupled to or is part of the base, which first fixture comprises: (i) a first protrusion (ii) a first indentation or (iii) a first charge; and a second fixture operatively coupled to or is a part of the substrate, which second fixture comprises: (i) a second protrusion (ii) a second indentation or (iii) a second charge, wherein a coupling of the first protrusion with the second indentation is configured to restrict at least one degree of movement of the base relative to the substrate, wherein a coupling of the second protrusion with the first indentation is configured to restrict at least one degree of movement of the base relative to the substrate, wherein the first charge is opposite to the second charge, and wherein the coupling of the first charge with the second charge is configured to restrict at least one degree of movement of the base relative to the substrate.

A first charge source may generate the first charge, and a second charge source may generate the second charge. The first charge and the second charge may be generated by the same charge source. The first charge and the second charge may be generated by different charge sources. The charge may be a magnetic charge. The charge may be an electric charge. A fastener may be operatively coupled to the platform, which fastener may be configured to fasten the base to the substrate to constrain the movement of the base and the substrate. The coupling may comprise kinematic coupling. The coupling of the first fixture with the second fixture may be self-aligning. The coupling of the first fixture with the second fixture may be self-coupling. The first fixture and the second fixture may attract each other. An aligner may be operatively coupled to the substrate and/or base, which aligner may be configured to guide the engagement of the base with the substrate.

In another aspect, a system for forming at least one 3D object, comprises: a platform comprising a substrate and a base above which at least a portion of the 3D object is printed; a first fixture that is operatively coupled to or is part of the base, which first fixture comprises: (i) a first protrusion (ii) a first indentation or (iii) a first charge; a second fixture that is operatively coupled to or is a part of a substrate, which second fixture comprises: (i) a second protrusion (ii) a second indentation or (iii) a second charge; an energy source that is configured to generate an energy beam that transforms a pre-transformed material to form at least a portion of the 3D object; and at least one controller that is operatively coupled to the base, platform, and energy beam, which at least one controller is collectively or separately programmed to direct performance of the following operations: operation (i) direct engaging the base with the substrate to form the platform, wherein engaging comprises engaging the first fixture with the second fixture to restrict at least one degree of movement of the base relative to the platform, and operation (ii) direct the energy beam to transform the pre-transformed material to print at least a portion of the 3D object.

A material bed may be disposed adjacent to the platform. The material bed may comprise the pre-transformed material. The energy beam may irradiate at least a portion of the pre-transformed material in the material bed to print the at least the portion of the 3D object. A first charge source may generate a first charge and a second charge source may generate a second charge opposite to the first charge. The first charge source and the second charge source may be the same charge source. The first charge source and the second charge source may be different charge sources. The charge may be a magnetic charge. The charge may be an electric charge. A fastener may be operatively coupled to the platform. The fastener can be configured to fasten the base to the substrate. The fastener may constrain the movement of the base relative to the substrate. The first fixture may be a part of a first fixture set comprising a first plurality of fixtures that may be operatively coupled to or may be a part of the base. The second fixture may be a part of a second fixture set comprising a second plurality of fixtures that may be operatively coupled to or may be a part of the substrate. The first fixture set may engage with the second fixture set to restrict at least one degree of movement of the base relative to the substrate. At least two fixtures of the first fixture set may have the same shape. At least two fixtures of the first fixture set may have a different shape. At least two fixtures of the second fixture set may have the same shape. At least two fixtures of the second fixtures set may have a different shape. The first fixture may be complementary to the second fixture. Complementary may comprise mirroring. Complementary may comprise matching. The base may have a different horizontal cross-sectional shape than the horizontal cross-sectional shape of the substrate. The base may have a similar horizontal cross-sectional shape than the horizontal cross-sectional shape of the substrate. The first fixture or the second fixture may comprise a protrusion. The first fixture or the second fixture may comprise an indentation. The first charge of the first fixture may be opposite to the second charge of the second fixture. The first fixture and/or the second fixture may comprise a three-dimensional (3D) shape. The first fixture and/or the second fixture may comprise a dove-tail.

In another aspect, an apparatus for 3D printing of at least one 3D object comprising at least one controller that is collectively or separately programmed to perform the following operations: operation (a) engage a base with a substrate to form a platform comprising engaging a first fixture with a second fixture to restrict at least one degree of movement of the base relative to the substrate, which first fixture is operatively coupled or is part of the base, which second fixture is operatively coupled to or is part of the substrate, wherein at least a portion of the 3D object is printed above the base; and operation (b) direct printing the 3D object above the base.

The at least one controller may be operatively coupled to an energy beam. The at least one controller may be programmed to direct the energy beam to transform the at least a portion of a material bed. The platform may be configured to accommodate the material bed, to form the at least a portion of the 3D object. Operation (a) may be performed automatically. During operation (b), an exposed surface of the base may be completely free for the printing.

In another aspect, a computer software product for 3D printing of at least one 3D object, comprising a non-transitory computer-readable medium in which program instructions are stored, which instructions, when read by a computer, cause the computer to perform operations that comprise: operation (a) direct engagement of a base with a substrate to form a platform comprising engaging a first fixture with a second fixture to restrict at least one degree of movement of the base relative to the substrate, which first fixture is operatively coupled or is part of the base, which second fixture is operatively coupled to or is part of the substrate, wherein the platform comprises an exposed surface of the base that can be used for 3D printing of the 3D object; and operation (b) directing printing of the 3D object above the platform.

The operations may further comprise directing an energy beam to transform the at least a portion of a material bed. The platform may be configured to accommodate the material bed, to form the at least a portion of the 3D object. The energy beam may be operatively coupled to the material bed. During operation (b), an exposed surface of the base may be completely free for the printing.

In another aspect, a method for generating a 3D object, comprises: (a) engaging a first component with a second component, which first component is operatively coupled to or is a part of a build module, which second component is operatively coupled to a processing chamber, wherein the first component is supported by the second component upon engagement, wherein the engagement is configured at least in part to secure the build module to the processing chamber, wherein the build module comprises a platform, and wherein the processing chamber comprises an energy beam; and (b) using the energy beam to print the 3D object above the platform.

Engaging may comprise automatically engaging. Engaging may comprise preserving an atmosphere formed by converging a build module atmosphere with a processing chamber atmosphere. Engaging may comprise reducing an exchange of an ambient atmosphere with an atmosphere formed by converging a build module atmosphere with a processing chamber atmosphere. The build module may be translated to allow engagement of the first component with the second component. At least one controller may control the engaging. The translating may comprise vertically translating. At least one controller may control the translating. At least one controller may control the printing. Engaging may comprise clamping. The engaging may comprise forming a gas tight contact. The gas tight contact may comprise a metal to metal contact. The platform may comprise a material bed. The energy beam may transform at least a portion of the material bed to form the 3D object. Printing the 3D object may comprise irradiating a pre-transformed material with the energy beam to form a transformed material as part of the 3D object. The material bed may comprise a pre-transformed material. The pre-transformed material may comprise an elemental metal, metal alloy, ceramic, allotrope of elemental carbon, polymer, or a resin. The energy beam may be an electromagnetic beam or a charged particle beam.

In another aspect, an apparatus for 3D printing of at least one 3D object, comprises: a build module comprising a first component that is configured to be supported, which first component is operatively coupled to or is a part of the build module, wherein the build module comprises a platform; a processing chamber comprising a second component that is operatively coupled to the processing chamber, which second component is configured to support the first component upon engagement of the first component with the second component, which first component and second component are configured to engage with each other; and an energy source that is configured to generate an energy beam that travels through at least a portion of the processing chamber and is used to print the 3D object above the platform.

The first component may comprise a plurality of segments. The second component may comprise a plurality of parts. The first plurality of parts may comprise one or more pairs. Each pair of the plurality of parts may be operatively coupled to opposing sides of the build module. A part of the plurality of parts may be configured to carry the weight of at least about 100 Kilograms. The first component may be configured at least in part to engage the build module with the processing chamber. The first component may be configured to carry the weight of (i) the build module, (ii) the 3D object, (iii) a material bed in which the 3D object is embedded during printing, or (iv) any combination thereof. The second component may be configured to support the weight of (i) the build module, (ii) the 3D object, (iii) a material bed in which the 3D object is embedded during printing, or (iv) any combination thereof. The first component may be configured to carry the weight of at least about 100 Kilograms. The first component may be configured to carry the weight of at least about 500 Kilograms. The first component may comprise a wheel or an O-ring. The second component may comprise a slanted surface with respect to the: horizon or platform. The first component may comprise an O-ring. The O-ring may be configured to be squeezed to allow a contact between the first component and the second component that is gas-tight. The first component may comprise an O-ring. The O-ring may be configured to be squeezed to allow a contact between the first component and the second component that is a metal-to-metal contact. The first component may comprise metal. The second component may comprise metal. The first component may comprise a first metallic surface. The second component may comprise a second metallic surface that contacts at least a portion of the first metallic surface upon engagement. The second component may be directly operatively coupled to the processing chamber. The second component may be indirectly operatively coupled to the processing chamber. The first component may be directly operatively coupled to the build module. The first component may be indirectly operatively coupled to the build module. The second component may be operatively coupled to a load-lock that is operatively coupled to the processing chamber. The second component may be operatively coupled to the processing chamber through a load-lock. The load lock may be physically coupled to the processing chamber. A translation mechanism may comprise an actuator. The translation mechanism may be configured to translate the build module to facilitate the engagement. The first component and the second component may be interlocking components of an interlocking mechanism. The first component and the second component may be clamping components of a clamping mechanism. The translation mechanism may translate the build module in a vertical manner A contact may be formed on coupling between the first component and the second component. The contact may be gas-tight. The contact may comprise a metal to metal contact.

In another aspect, a system for forming at least one 3D object, comprises: a build module comprising a first component that is configured to be supported, which first component is operatively coupled to or is a part of the build module, wherein the build module comprises a platform; a processing chamber comprising a second component, which second component is configured to support the first component upon engagement of the first component with the second component, which first component and second component are configured to engage with each other, which second component is operatively coupled to the processing chamber; an engagement mechanism, the engagement mechanism configured to secure the build module to the processing chamber; an energy source that is configured to generate an energy beam that tat travels through at least a portion of the processing chamber and is used to print the 3D object above the platform; and at least one controller that is operatively coupled to the engagement mechanism, which at least one controller is collectively or separately programmed to direct performance of the following operations: operation (i) direct engaging the first component with the second component, wherein the first component is supported by the second component upon engagement, wherein the engagement is configured to secure the build module to the processing chamber, and operation (ii) direct using the energy beam to print the 3D object above the platform.

In another aspect, an apparatus for 3D printing of at least one 3D object comprising at least one controller that is collectively or separately programmed to perform the following operations: operation (a) direct engaging a first component with a second component, which first component is operatively coupled to or is a part of a build module, which second component is operatively coupled to a processing chamber, wherein the first component is supported by the second component upon engagement, wherein the engagement is configured to secure the build module to the processing chamber, wherein the build module comprises a platform, and wherein the processing chamber comprises an energy beam; and operation (b) direct using the energy beam to print the 3D object above the platform.

In another aspect, a computer software product for 3D printing of at least one 3D object, comprising a non-transitory computer-readable medium in which program instructions are stored, which instructions, when read by a computer, cause the computer to perform operations comprising: operation (a) directing engaging a first component with a second component, which first component is operatively coupled to or is a part of a build module, which second component is operatively coupled to a processing chamber, wherein the first component is supported by the second component upon engagement, wherein the engagement is configured to secure the build module to the processing chamber, wherein the build module comprises a platform, and wherein the processing chamber comprises an energy beam; and operation (b) directing using the energy beam to print the 3D object above the platform.

In another aspect, apparatus used in 3D printing of at least one 3D object comprises: an energy source configured to generate an energy beam that transforms a pre-transformed material to a transformed material to print the at least one 3D object; a processing chamber in which the energy beam travels to print the at least one 3D object, which processing chamber comprises a first opening, wherein the processing chamber is operatively coupled to the energy source; a processing chamber shutter (e.g., lid) that reversibly shuts the first opening to separate an internal processing chamber environment from an external environment; a platform (e.g., substrate) adjacent to which the at least one 3D object is printed; a build module container comprising the platform (e.g., substrate), which build module comprises a second opening; and a build module shutter that reversibly shuts the second opening to separate an internal environment of the build module from the external environment (e.g., ambient environment), wherein the first opening merges with the second opening during the 3D printing of the at least one 3D object.

The build module shutter may couple to the processing chamber shutter (e.g., to facilitate merging the first opening with the second opening). The build module shutter may couple to the processing chamber automatically, manually, or both automatically and manually. The build module shutter may couple to the processing chamber shutter using a force comprising magnetic, electric, electrostatic, hydraulic, or pneumatic force. The build module shutter can be configured to couple to the processing chamber shutter using a physical engagement. The physical engagement can comprise one or more latches links, or hooks. The processing chamber shutter (e.g., lid) and/or the build module shutter (e.g., lid) can comprise one or more latches, links, or hooks. The build module shutter may comprise a first portion and a second portion. The first portion can be translatable relative to the second portion. The first portion can be translatable relative to the second portion upon exertion of force. The force can comprise magnetic, electric, electrostatic, hydraulic, or pneumatic force. The processing chamber shutter can comprise a pin. The build module shutter can comprise a first portion and a second portion. The pin may facilitate further separation of the first portion from the second portion. The pin can be pushed to further separate the first portion from the second portion. The processing chamber shutter can comprise a first seal. The first seal can reduce (e.g., substantially prevent, practically prevent, or prevent) an atmospheric exchange between the external environment and the internal processing chamber environment. The build module shutter can comprise a second seal. The second seal may reduce (e.g., substantially prevent, practically prevent, or prevent) an atmospheric exchange between the external environment and the internal build module environment. The second seal (and/or the first seal) can be a gas seal. The build module shutter can comprise a first portion and a second portion that is translatable relative to the first portion (e.g., to facilitate engagement or disengagement of the second seal with the build module chamber). The second seal (and/or the first seal) may contact the build module shutter. The second seal (and/or the first seal) can engage with the build module chamber when the first portion and the second portion are close to each other. The second seal (and/or the first seal) can disengage with the build module when the first portion and the second portion are farther from each other. The second seal (and/or the first seal) may engage with the build module chamber when the first portion contacts the second portion. The second seal (and/or the first seal) may disengage with the build module chamber when the first portion and the second portion are separated by a gap. The apparatus may further comprise a translation mechanism comprising a shaft. The translation mechanism can be coupled to the processing chamber shutter and/or to the build module shutter. The translation mechanism can be configured to facilitate translation of the processing chamber shutter and/or to the build module shutter. The translation mechanism may comprise a cam follower. The shaft can be at least a part of the cam follower (e.g., the shaft may be included in the cam follower). The translation mechanism may comprise one or more rotating devices. The rotating devices may comprise wheels, cylinders, or balls.

In another aspect, an apparatus used in 3D printing of at least one 3D object comprises at least one controller that is programmed to perform the following operations: operation (a) direct a build module to engage with a processing chamber, which processing chamber comprises (I) a first opening and (II) a processing chamber shutter that closes the first opening, which build module comprises (i) a second opening and (ii) a build module shutter that closes the second opening, and (iii) a platform (e.g., substrate); operation (b) direct merging of the first opening with the second opening; and operation (c) direct an energy beam to transform a pre-transformed material to a transformed material to print the at least one 3D object by projecting in the processing chamber towards the platform (e.g., substrate).

Direct merging may comprise direct translating the processing chamber shutter and the build module shutter. Direct translating can be away from the first opening and/or second opening. Direct translating can comprise direct engaging with a shaft. Direct translating can comprise direct engaging with a cam follower. Direct merging can comprise direct coupling of the processing chamber shutter with the build module shutter. Direct merging can comprise direct separating a first portion of the build module shutter from a second portion of the build module shutter. Direct separation can comprise direct pushing or repelling the first portion away from the second portion. Direct separation can comprise direct using a physical, magnetic, electronic, electrostatic, hydraulic, or pneumatic force actuator. Direct separation may comprise direct using manual force. Direct separation can comprise direct pushing a pin to separate the first portion from the second portion. The processing chamber shutter can comprise the pin. The first portion can be a lateral portion. The second portion can be a lateral portion. The first portion can be a horizontal portion. The second portion can be a horizontal portion. The first portion can be separated from the second portion by a vertical (separation) gap. Direct coupling can comprise direct latching the build module shutter with the processing chamber shutter. Direct latching can comprise direct translating a portion of (1) the build module shutter and/or (2) the processing chamber shutter. Direct translating can comprise direct rotating, swiveling, or swinging. Direct merging can comprise direct releasing at least one first seal disposed adjacent to the first opening of the processing chamber and the processing chamber shutter. Direct merging can comprise direct releasing at least one second seal disposed adjacent to the second opening of the build module and the build module shutter. Direct merging can comprise direct separating the first portion from the second portion to release at least one second seal that is disposed adjacent to the second opening of the build module and the build module shutter. At least two of operations (a) to (c) may be directed by the same controller. At least two of operations (a) to (c) may be directed by different controllers. The at least one controller can be a plurality of controllers. The plurality of controllers can be operatively coupled.

In another aspect, a method used in 3D printing of at least one 3D object comprises: (a) engaging a build module with a processing chamber, which processing chamber comprises (I) a first opening and (II) a processing chamber shutter that closes the first opening, which build module comprises (i) a second opening and (ii) a build module shutter that closes the second opening, and (iii) a platform (e.g., substrate); (b) merging the first opening with the second opening; and (c) directing an energy beam to transform a pre-transformed material to a transformed material to print the at least one 3D object by projecting the energy beam in the processing chamber towards the platform (e.g., substrate).

The platform may be configured to accommodate (e.g., and/or support) the at least one 3D object, e.g. during the printing. Merging can comprise translating the processing chamber shutter and the build module shutter. Translating can be away from the first opening and/or second opening. Translating can comprise engaging with a shaft. Translating can comprise engaging with a cam follower. Merging can comprise coupling the processing chamber shutter with the build module shutter. Merging can comprise separating a first portion of the build module shutter from a second portion of the build module shutter. Separating can comprise pushing or repelling the first portion away from the second portion. Separating can comprise using a physical, magnetic, electronic, electrostatic, hydraulic, or pneumatic force actuator. Separation may comprise using manual force. Separating can comprise pushing a pin to separate the first portion from the second portion. The processing chamber shutter can comprise the pin. The first portion can be a lateral portion, and wherein the second portion is a lateral portion. The first portion can be a horizontal portion, and wherein the second portion is a horizontal portion. The first portion can be separated from the second portion by a vertical separation gap. Coupling can comprise latching of the build module shutter to the processing chamber shutter, or vice versa. Latching can comprise translating a portion of (1) the build module shutter and/or (2) the processing chamber shutter. Translating can comprise direct rotating, swiveling, and/or swinging. Merging can comprise releasing at least one first seal disposed adjacent to (1) the first opening of the processing chamber and (2) the processing chamber shutter. Merging can comprise releasing at least one second seal disposed (1) adjacent to the second opening of the build module and (2) the build module shutter. Merging can comprise separating the first portion from the second portion to release at least one second seal that is disposed adjacent to the second opening of the build module and the build module shutter.

In another aspect, a computer software product for 3D printing of at least one 3D object, comprises a non-transitory computer-readable medium in which program instructions are stored, which instructions, when read by a computer, cause the computer to perform operations comprising: operation (a) direct a build module to engage with a processing chamber, which processing chamber comprises (I) a first opening and (II) a processing chamber shutter that closes the first opening, which build module comprises (i) a second opening and (ii) a build module shutter that closes the second opening, and (iii) a platform (e.g., substrate); operation (b) direct merging of the first opening with the second opening; and operation (c) direct an energy beam to transform a pre-transformed material to a transformed material to print the at least one 3D object by projecting in the processing chamber towards the platform (e.g., substrate).

In another aspect, an apparatus for 3D printing of one or more 3D objects comprises: an enclosure that is configured to facilitate a plurality of 3D printing cycles from a pre-transformed material, wherein one or more 3D objects are printed during each of the plurality of 3D printing cycles, which enclosure is configured to include a first atmosphere that is different from an ambient atmosphere, which apparatus is configured to exclude at least one component of the ambient atmosphere from contacting (i) the pre-transformed material and/or (ii) the one or more 3D objects, during the plurality of 3D printing cycles.

The apparatus can be configured to exclude at least one component (e.g., a reactive agent) of the ambient atmosphere from the pre-transformed material and/or one or more 3D object, at least during the three-dimensional printing. The at least one component of the ambient atmosphere can be a reactive agent that reacts with the pre-transformed material during the three-dimensional printing to cause detectable material damage and/or structural damage to the three-dimensional object. The apparatus can be configured to exclude the ambient atmosphere from the enclosure (or any of its components such as a build module and/or processing chamber, separately or collectively). Exclude can comprise evacuate or purge (e.g., using a pressurized gas source). The apparatus may further comprise a pump to evacuate the ambient atmosphere. Exclusion can comprise active exclusion (e.g., using a pressurized gas source such as a gas cylinder or a pump). The apparatus can further comprise using a pressured gas source. The pressurized gas source may have a pressure above the enclosure pressure, the build module pressure, or above both the enclosure pressure and the build module pressure. The pressurized gas in the pressurized gas source (e.g., gas cylinder) may be in a liquid state. While excluding the ambient atmosphere, the pressurized gas may change a state of matter (transform from liquid to gas). The reactive agent can be humidity. The reactive agent can be an oxidizing agent. The exclusion can be before, during and/or after the plurality of 3D printing cycles. The exclusion can comprise an active or passive exclusion. The apparatus can further comprise a pressurized gas source that is configured to evacuate the at least one component (e.g., the reactive agent). The apparatus can further comprise a pressurized gas source configured to evacuate the at least one component of the ambient atmosphere. The apparatus can further comprise a sensor configured to monitor a concentration of the reactive agent in the enclosure. The apparatus can be configured to exclude a plurality of components of the ambient atmosphere from contacting (i) the pre-transformed material and/or (ii) the one or more 3D objects, during the plurality of 3D printing cycles. The apparatus can be configured to exclude the ambient atmosphere from contacting (i) the pre-transformed material and/or (ii) the one or more 3D objects, during the plurality of 3D printing cycles. The first atmosphere can have a first pressure that is above ambient pressure at least during the plurality of 3D printing cycles. The apparatus can further comprise a pressurized gas source (e.g., coupled to at least one controller and/or valve) that is configured to maintain the first pressure above the ambient pressure at least during the plurality of 3D printing cycles. The apparatus can further comprise a pressurized gas source configured to maintain the first pressure above the ambient pressure at least during the plurality of 3D printing cycles. The enclosure can comprise a build module and a processing chamber. The build module can comprise a second atmosphere. The processing chamber can comprise a third atmosphere. The build module may comprise a reversibly closable shutter that is configured to maintain in the third atmosphere (i) at a pressure above ambient pressure, (ii) at an inert atmosphere, (iii) as excluding of at least one component present in the ambient atmosphere, or (iv) any combination thereof. The at least one component can be a reactive agent that reacts with the pre-transformed material during the three-dimensional printing. Exclusion can be to below a threshold (e.g., threshold value or time dependent threshold function). The apparatus may further comprise a force source configured to automatically actuate (e.g., close and/or open) the shutter. The force source may be configured to generate a force comprising mechanical, magnetic, pneumatic, hydraulic, electrostatic, or electric force. The force source may comprise manual force. The shutter can be configured to be at least in part manually actuated (e.g., opened and/or closed). The enclosure, processing chamber and/or build module can be configured to maintain a pressure above an ambient pressure during the 3D printing of the one or more 3D objects. The apparatus can further comprise a pressurized gas source (e.g., coupled to at least one controller and/or valve) that is configured to maintain the first atmosphere, second atmosphere, and/or the third atmosphere at a pressure above the ambient pressure at least during the plurality of 3D printing cycles. The apparatus can further comprise a pressurized gas source configured to maintain the first atmosphere, second atmosphere, and/or the third atmosphere at a pressure above the ambient pressure at least during the plurality of 3D printing cycles. The build module and processing chamber can be configured to reversibly engage. Reversible engagement can comprise mechanical, electronic, electrostatic, pneumatic, hydraulic, magnetic, or any combination thereof. Reversibly engagement can comprise manual reversible engagement. The build module can comprise a second atmosphere. The processing chamber can comprise a third atmosphere. Upon engagement of the build module and the processing chamber, the second atmosphere and the third atmosphere can merge to form the first atmosphere. The build module can comprise a platform configured to support the one or more 3D objects and/or the pre-transformed material. The platform can be configured to vertically translate using a translation mechanism comprising an encoder, vertical guide post, vertical screw, horizontal screw, linear motor, bearing, shaft, or bellow. The platform can be configured to be vertically translatable using a translation mechanism comprising an optical encoder, magnetic encoder, air bearing, ball bearing, or a scissor jack. The platform can comprise an actuator configured to facilitate rotation of the platform. The rotation can be about a horizontal and/or a vertical axis. The processing chamber can be configured to facilitate the printing of the one or more 3D objects from the pre-transformed material. The apparatus can further comprise an energy source that is configured to generate an energy beam that transforms the pre-transformed material into a transformed material as part of the 3D printing of the one or more 3D objects. The energy beam can irradiate in the processing chamber to transform the pre-transformed material into the transformed material. The apparatus can further comprise an unpacking station that is configured to facilitate unpacking of the one or more 3D objects from the pre-transformed material. The unpacking station can comprise a fourth atmosphere that is different from the ambient atmosphere. The unpacking station can be configured to facilitate unpacking of the one or more 3D objects after at least one of the plurality of the printing cycles. The unpacking station can comprise a glove-box, or a robotic arm. The one or more 3D objects in the unpacking station can be accessible from two or more spatial directions. The two or more spatial directions can correspond to Cartesian directions (e.g., X, Y, and Z). The cartesian directions can comprise positive or negative Cartesian directions. The two or more spatial direction can correspond to cardinal points (e.g., East, West, North, and South). The build module can be operatively coupled to the unpacking station. The build module can be reversibly coupled to the unpacking station. The apparatus can further comprise a material delivery mechanism configured to deliver the pre-transformed material to the enclosure, which material delivery mechanism comprises an opening, and a fifth atmosphere. The material delivery mechanism can be configured to receive a new pre-transformed material and/or a remainder of the pre-transformed material that was not used for printing of the one or more 3D objects. The apparatus can further comprise a reservoir of the pre-transformed material having a sixth atmosphere. The reservoir can be configured to receive a new pre-transformed material and/or a remainder of the pre-transformed material that was not used for printing of the one or more 3D objects. The first atmosphere, second atmosphere, third atmosphere, fourth atmosphere, fifth atmosphere, and/or sixth atmosphere can be (a) above ambient pressure, (b) inert, (c) different from the ambient atmosphere, and/or (d) non-reactive with the pre-transformed material and/or one or more 3D objects during the plurality of 3D printing cycles. The first atmosphere, second atmosphere, third atmosphere, fourth atmosphere, fifth atmosphere, and/or sixth atmosphere can be non-reactive to a degree that does not cause at least one defect in the material properties and/or structural properties of the one or more 3D objects. The first atmosphere, second atmosphere, third atmosphere, fourth atmosphere, fifth atmosphere, and/or sixth atmosphere can be non-reactive to a detectable degree. At least two of the first atmosphere, second atmosphere, third atmosphere, fourth atmosphere, fifth atmosphere, and/or sixth atmosphere can be detectibly the same. At least two of the first atmosphere, second atmosphere, third atmosphere, fourth atmosphere, fifth atmosphere, and/or sixth atmosphere can differ.

In another aspect, a method for 3D printing of one or more 3D objects comprises: performing a plurality of 3D printing cycles in an enclosure, wherein each of the plurality of 3D printing cycles comprises printing one or more 3D object from a pre-transformed material, which enclosure comprises a first atmosphere that is different from an ambient atmosphere, and which enclosure excludes the ambient atmosphere from contacting the pre-transformed material and/or one or more 3D objects during the plurality of 3D printing cycles.

The first atmosphere can have a pressure that is above ambient pressure. The enclosure can comprise a build module and a processing chamber. The method can further comprise reversibly engaging the build module and processing chamber. The method can further comprise engaging the build module with the processing chamber. The build module can comprise a second atmosphere that is different from the ambient atmosphere. The processing chamber can comprise a third atmosphere that is different from the ambient atmosphere. Subsequent to engaging, the second atmosphere can merge with the third atmosphere. Subsequent to engaging, the second atmosphere can merge with the third atmosphere to form the first atmosphere. The method can further comprise irradiating an energy beam through the processing chamber to transform the pre-transformed material into a transformed material to form the one or more 3D objects. The method can further can comprise transferring the one or more 3D objects from the processing chamber to an unpacking station. One or more 3D object can be enclosed in the build module having a second atmosphere that is different from the ambient atmosphere. The method can further comprise unpacking the at least one 3D object from the pre-transformed material. Unpacking can be in a fourth atmosphere that is different from the ambient atmosphere. The method can further comprise delivering the pre-transformed material to the enclosure as part of at least one of the plurality of 3D printing cycles. Delivering the pre-transformed material can comprise utilizing a material delivery mechanism comprising an opening and a fifth atmosphere that is different from the ambient atmosphere. The first atmosphere, second atmosphere, third atmosphere, fourth atmosphere, fifth atmosphere, and/or sixth atmosphere can be (a) above ambient pressure, (b) inert, (c) different from the ambient atmosphere, and/or (d) non-reactive with the pre-transformed material and/or one or more 3D objects during the plurality of 3D printing cycles. Non-reactive can be to a degree that causes at least one defect in the material properties and/or structural properties of the one or more 3D objects. Non-reactive can be to a detectable degree. At least two of the first atmosphere, second atmosphere, third atmosphere, fourth atmosphere, fifth atmosphere, and/or sixth atmosphere can be detectibly the same. At least two of the first atmosphere, second atmosphere, third atmosphere, fourth atmosphere, fifth atmosphere, and/or sixth atmosphere may differ. The method can further comprise transferring the pre-transformed from a reservoir to the enclosure during at least one of the plurality of 3D printing cycles. Transferring can comprise transferring the pre-transformed material from the reservoir to the enclosure by using a material delivery mechanism. The method can further comprise excluding and/or removing a reactive agent from the pre-transformed material while excluding the ambient atmosphere from contacting the pre-transformed material. The reactive agent can comprise humidity. The reactive agent can be an oxidizing agent.

In another aspect, an apparatus for 3D printing of one or more 3D objects comprises one or more controllers configured to direct performing a plurality of 3D printing cycles in an enclosure, wherein each of the plurality of 3D printing cycles comprises printing one or more 3D object from a pre-transformed material, which enclosure comprises a first atmosphere that is different from an ambient atmosphere, which enclosure excludes the ambient atmosphere from contacting the pre-transformed material and/or one or more 3D objects during the plurality of 3D printing cycles, wherein the one or more controllers are operatively coupled to the enclosure.

The first atmosphere can have a pressure that is above ambient pressure. The enclosure can comprise a build module and a processing chamber. The one or more controllers can be separately or collectively programmed to direct reversible engagement of the build module and the processing chamber, wherein the one or more controllers can be operatively coupled to the build module and to the processing chamber. The one or more controllers can be separately or collectively programmed to direct engagement of the build module with the processing chamber. The build module can comprise a second atmosphere that is different from the ambient atmosphere. The processing chamber can comprise a third atmosphere that is different from the ambient atmosphere. Subsequent to engaging, the second atmosphere can merge with the third atmosphere. Subsequent to the engagement, the second atmosphere can merge with the third atmosphere to form the first atmosphere. The one or more controllers can be separately or collectively programmed to direct irradiation of an energy beam through the processing chamber to transform the pre-transformed material into a transformed material to form the one or more 3D objects. The one or more controller can be operatively coupled to the energy beam. The one or more controllers can be separately or collectively programmed to direct transfer of the one or more 3D objects from the processing chamber to an unpacking station. One or more 3D object can be enclosed in the build module having a second atmosphere that is different from the ambient atmosphere. The one or more controller can be operatively coupled to the unpacking station. The one or more controllers can be separately or collectively programmed to direct unpacking of the at least one 3D object from the pre-transformed material. Unpacking can be in a fourth atmosphere that is different from the ambient atmosphere. The one or more controllers can be separately or collectively programmed to direct delivering of the pre-transformed material to the enclosure as part of at least one of the plurality of 3D printing cycles. Delivering of the pre-transformed material can comprise utilizing a material delivery mechanism comprising an opening and a fifth atmosphere that is different from the ambient atmosphere. The one or more controller can be operatively coupled to the material delivery mechanism. The first atmosphere, second atmosphere, third atmosphere, fourth atmosphere, fifth atmosphere, and/or sixth atmosphere can be (a) inert, (b) different from the ambient atmosphere, (c) above ambient pressure, and/or (d) non-reactive with the pre-transformed material and/or one or more 3D objects during the plurality of 3D printing cycles. Non-reactive can be to a degree that causes at least one defect in the material properties and/or structural properties of the one or more 3D objects. Non-reactive can be to a detectable degree. At least two of the first atmosphere, second atmosphere, third atmosphere, fourth atmosphere, fifth atmosphere, and/or sixth atmosphere can be detectibly the same. At least two of the first atmosphere, second atmosphere, third atmosphere, fourth atmosphere, fifth atmosphere, and/or sixth atmosphere may differ. The one or more controllers may be separately or collectively programed to direct at least one pressurized gas source (e.g., coupled to at least one controller and/or valve) to control (e.g., maintain, or regulate) the first atmosphere, second atmosphere, third atmosphere, fourth atmosphere, fifth atmosphere, and/or sixth atmosphere at a pressure above an ambient pressure. The one or more controller may be operatively coupled to the at least one pressurized gas source. The pressurized gas source may comprise pump or a gas-cylinder. The one or more controllers can be separately or collectively programed to direct at least one sensor to sense a pressure of the first atmosphere, second atmosphere, third atmosphere, fourth atmosphere, fifth atmosphere, and/or sixth atmosphere at a pressure above an ambient pressure, wherein the one or more controllers are operatively coupled to the at least one sensor. The one or more controllers can be separately or collectively programmed to direct transfer of the pre-transformed from a reservoir to the enclosure during at least one of the plurality of 3D printing cycles. The one or more controllers can be separately or collectively programmed to direct transfer of the pre-transformed material from the reservoir to the enclosure by directing a material delivery mechanism. The material delivery mechanism may comprise a material dispenser. The material delivery mechanism and reservoir may be, for example, the one disclosed in Provisional Patent Application Ser. No. U.S. 62/477,848, titled "MATERIAL CONVEYANCE IN THREE-DIMENSIONAL PRINTERS," filed on Mar. 28, 2017, that is incorporated herein by reference in its entirety. The one or more controller can be operatively coupled to the material delivery mechanism. The one or more controllers can be separately or collectively programmed to direct exclusion (e.g., extraction or purging) of a reactive agent from the pre-transformed material while excluding at least one component of the ambient atmosphere from contacting the pre-transformed material. The one or more controllers can be separately or collectively programmed to direct sensing (I) a pressure, (II) a reactive agent, or (III) a temperature, or (IV) any combination thereof, in: (1) the first atmosphere, (2) second atmosphere, (3) third atmosphere, or (4) any combination thereof. The one or more controllers can be operatively coupled to the at least one sensor. The reactive agent can comprise humidity. The reactive agent can be an oxidizing agent. The one or more controllers can include a control scheme comprising open loop, or closed loop control. The one or more controllers can include a control scheme comprising feed forward or feedback control. The one or more controllers can be configured to direct before, after, and/or during the plurality of 3D printing cycles. The one or more controllers can direct transport of the build module to and/or from the processing chamber. A direction of the transport can comprise a horizontal or a vertical direction. The one or more controllers can be programmed to direct using one or more processors.

In another aspect, an apparatus for 3D printing of at least one 3D object comprises: a processing chamber configured to facilitate 3D printing of at least one 3D object, which processing chamber comprises a first atmosphere; and a build module configured to accommodate the at least one 3D object, which build module comprises a second atmosphere, which processing chamber and build module are configured to reversibly engage, wherein the build module is configured to accommodate a positive pressure of the second atmosphere after the 3D printing (e.g., and after the disengagement of the build module from the processing chamber).

The build module can be configured to accommodate a positive pressure of the second atmosphere (i) after the three-dimensional printing of the at least one three-dimensional object and (ii) after the disengagement of the build module from the processing chamber. The build module may be configured to facilitate regulation of (e.g., maintaining) the pressure of the second atmosphere after the printing to accommodate to be the positive pressure. The positive pressure can be a pressure above ambient pressure. Reversible engagement can comprise mechanical, electronic, electrostatic, pneumatic, hydraulic, magnetic, or any combination thereof. Reversible engagement may comprise manual reversible engagement. During the printing, the pressure in the processing chamber and/or build module can be above ambient pressure. During the 3D printing of the at least one 3D object, the processing chamber and/or build module can be configured to maintain a pressure above an ambient pressure. During the 3D printing, the processing chamber and/or build module can be configured to facilitate pressure regulation of the first atmosphere and/or second atmosphere respectively to above ambient pressure. Above ambient pressure can comprise at least 0.3 pound per square inch (PSI) above ambient pressure. The build module and/or processing chamber can be reversibly sealable. The build module and/or processing chamber can be reversibly sealable from the ambient atmosphere. The build module and/or processing chamber can comprise a seal. The seal may comprise a gas tight seal. The build module and/or processing chamber can passively exclude at least one component of the ambient atmosphere (e.g., using a seal). The build module and/or processing chamber can actively exclude at least one component of the ambient atmosphere (e.g., using a pressurized gas source). The first atmosphere and/or second atmosphere (a) can be above ambient pressure, (b) can be inert, (c) can be different from the ambient atmosphere, (d) can be non-reactive with the pre-transformed material and/or one or more 3D objects, (e) can comprise a reactive agent below a threshold value, or (f) any combination thereof, during the plurality of 3D printing cycles. The first atmosphere and/or second atmosphere can be replaced. Replacement of the first atmosphere and/or second atmosphere may be using purging. Replacement may comprise using a pressurized gas source. The apparatus may further comprise a pressurized gas source configured to replace, purge, and/or maintain a pressure and/or composition of the first atmosphere and/or second atmosphere. Replacement of the first atmosphere and/or second atmosphere may be using a pump. The first atmosphere and/or second atmosphere can be non-reactive is to a detectable degree. The first atmosphere and/or second atmosphere can be non-reactive to a degree that does not cause at least one defect in the material properties and/or structural properties of the one or more 3D objects (e.g., during at least one of the plurality of 3D printing cycles). The material properties can comprise cracks or pores. The structural properties can comprise warping, bulging, balling, or bending. The first atmosphere and the second atmosphere can be detectably the same. The first atmosphere and the second atmosphere can differ. The build module can be configured to cool the at least one 3D object. Regulation of a pressure of the second atmosphere can be during cooling of the at least one 3D object. Cooling of the at least one 3D object can be after the 3D printing (e.g., and after disengagement of the build module from the processing chamber). Cooling of the at least one 3D object can be after disengagement of the build module from the processing chamber. Disengagement can be after the 3D printing of the at least one 3D object. The build module can comprise a platform that is configured to vertically translate using a translation mechanism comprising an encoder, vertical guide post, vertical screw, horizontal screw, linear motor, bearing, shaft, or bellow. The platform can be configured to be vertically translatable using a translation mechanism comprising an optical encoder, magnetic encoder, air bearing, ball bearing, or a scissor jack. The apparatus can further comprise an energy source that is configured to generate an energy beam that transforms a pre-transformed material into a transformed material as part of the 3D printing of the at least one 3D object. The energy beam can irradiate in the processing chamber to transform the pre-transformed material into the transformed material. The build module can comprise a reversibly closable shutter that is configured to maintain in the third atmosphere (i) a pressure above ambient pressure, (ii) an inert atmosphere, (iii) exclusion of at least one component present in the ambient atmosphere, or (iv) any combination thereof. The at least one component present in the ambient atmosphere can be a reactive agent, and wherein exclusion comprises keeping the reactive agent below a threshold value in the third atmosphere. The at least one component can be a reactive agent that reacts with the pre-transformed material during the three-dimensional printing. The apparatus may further comprise a force source configured to automatically actuate (e.g., close and/or open) the shutter. The force source can be configured to generate a force comprising mechanical, magnetic, pneumatic, hydraulic, electrostatic, or electric force. The force source may comprise manual force. The shutter can be configured to be at least in part manually actuated (e.g., opened and/or closed).

In another aspect, an apparatus for 3D printing of at least one 3D object comprises at least one controller is configured to direct the following operations: operation (a) engage (i) a processing chamber comprising a first atmosphere with (ii) a build module comprising a second atmosphere, which build module is configured to accommodate the at least one 3D object; operation (b) print the at least one 3D object in an enclosure comprising the processing chamber and the build module; operation (c) disengage the build module from the processing chamber after the 3D printing of the at least one 3D object; and operation (d) regulate a pressure of the second atmosphere after the 3D printing of the at least one 3D object to maintain a positive pressure that is above an ambient pressure.

The first atmosphere and the second atmosphere can be detectably the same. The first atmosphere and the second atmosphere can differ. During the 3D printing, the pressure in the enclosure can be above ambient pressure. The second atmosphere can be merged with the first atmosphere during operation (a) to form a third atmosphere. At least one controller can be programed to direct at least one pressurized gas source (e.g., container such as for example a cylinder) to maintain the first atmosphere (e.g., using at least one valve), second atmosphere, and/or third atmosphere, at a pressure above an ambient pressure. The at least one controller can be operatively coupled to the at least one pressurized gas source. At least one controller can be programed to direct at least one source of pressurized gas (e.g., comprising a gas-cylinder or a pump) to maintain the first atmosphere, second atmosphere, and/or third atmosphere, at a pressure above an ambient pressure. The at least one controller can be operatively coupled to the at least one source of pressurized gas. Direct can be before, after, and/or during the three-dimensional printing. Direct can be before, after, during printing of the at least one 3D object, or any combination thereof. The first atmosphere, the second atmosphere, and/or the third atmosphere can (I) above ambient pressure, (II) inert, (III) different from the ambient atmosphere, and/or (IV) non-reactive with the pre-transformed material (and/or one or more 3D objects), during the plurality of 3D printing cycles. The first atmosphere, the second atmosphere, and/or the third atmosphere can be non-reactive to a degree that does not causes at least one defect in the material properties and/or structural properties of the one or more 3D objects (e.g., during the plurality of 3D printing cycles). The first atmosphere, the second atmosphere, and/or the third atmosphere can be non-reactive to a detectable degree. The first atmosphere, the second atmosphere, and/or the third atmosphere can be different from an ambient atmosphere. At least two of operations (a) to (d) can be directed by the same controller. At least two of operations (a) to (d) can be directed by different controllers. At least one controller can be programmed to direct at least one of operations (a) to (d). At least one controller can include a control scheme comprising open loop, or closed loop control. At least one controller can include a control scheme comprising feed forward or feedback control. At least one controller can be configured to direct before, after, and/or during the plurality of 3D printing cycles. At least one controller can be further programmed to direct sensing (I) a pressure, (II) a reactive agent, a temperature, or (IV) any combination thereof, using at least one sensor. The at least one controller can be operatively coupled to the at least one sensor. The controller may control the amount of reactive agent to be below a threshold (e.g., as disclosed herein). The reactive agent can comprise humidity. The reactive agent can be an oxidizing agent. Operation (d) can be during and/or after operation (c). The at least one controller can be configured to direct reversibly sealing (e.g., seal and un-seal) of the build module and/or processing chamber. The at least one controller can be configured to direct reversibly sealing after the 3D printing and/or before disengaging the build module from the processing chamber. The at least one controller can be configured to direct reversibly sealing after operation (b) and/or before operation (c). The build module can be configured to facilitate reduction in a temperature of the at least one 3D object (e.g., after the 3D printing and/or after disengagement of the build module from the processing chamber). Regulation of the pressure of the second atmosphere in operation (d) can be during the reduction in the temperature of the at least one 3D object. The build module and/or processing chamber can be configured to (I) engage the build module with the processing chamber before the printing and/or (II) disengage the build module from the processing chamber after the printing. The controller can be configured to direct transport of the build module to and/or from the processing chamber. A direction of the transport can comprise a horizontal or a vertical direction. The at least one controller can be programmed to direct an energy beam to irradiate and transform a pre-transformed material into a transformed material as part of the 3D printing of the at least one 3D object. The energy beam can irradiate in the processing chamber to transform the pre-transformed material into the transformed material. The at least one controller can be programmed to direct the energy beam to irradiate and transform along a path that is related to the at least one 3D object. The at least one controller can be programmed to direct using one or more processors.

In another aspect, a method for 3D printing comprises: (a) engaging a processing chamber having a first atmosphere with a build module having a second atmosphere, which build module is configured to accommodate the at least one 3D object; (b) printing the at least one 3D object in an enclosure comprising the processing chamber and the build module; (c) disengaging the build module from the processing chamber after the 3D printing of the at least one 3D object; and (d) regulating a pressure of the second atmosphere after the 3D printing of the at least one 3D object, to maintain a positive pressure that is above an ambient pressure.

The method can further comprise maintaining the positive pressure in the processing chamber and/or build module above ambient pressure during the 3D printing of the at least one 3D object. (d) can be during or after (c). The method can further comprise reversibly sealing the build module and/or processing chamber after the 3D printing of the at least one 3D object. The first atmosphere and/or the second atmosphere can be (a) above ambient pressure, (b) inert, (c) different from the ambient atmosphere, and/or (d) non-reactive with the pre-transformed material and/or one or more 3D objects during the plurality of 3D printing cycles. The non-reactive can be to a degree that causes at least one defect in the material properties and/or structural properties of the one or more 3D objects. The first atmosphere and/or the second atmosphere can be non-reactive to a detectable degree. The first atmosphere and the second atmosphere can be detectably the same. The first atmosphere and the second atmosphere can differ. The method can further comprise reducing a temperature of the at least one 3D object after the 3D printing of the at least one 3D object. Regulating of the pressure of the second atmosphere in (d) can be during reducing the temperature of the at least one 3D object. The method can further comprise transporting the build module to and/or from the processing chamber in a period other than during the 3D printing of the at least one 3D object. The method can further comprise directing an energy beam to transform a pre-transformed material into a transformed material to print the at least one 3D object. The directing can be along a path. The path can be related to the at least one 3D object.

In another aspect, an apparatus for 3D printing of at least one 3D object comprises: an unpacking station configured to facilitate removal of at least a portion of a starting material of the at least one 3D object from the at least one 3D object, which unpacking station comprises a first atmosphere; and a first build module configured to accommodate the at least one 3D object and the starting material, which first build module comprises a second atmosphere, which unpacking station and first build module are configured to reversibly engage, wherein the unpacking station and/or first build module are configured to accommodate a pressure above an ambient pressure at least during the removal.

The unpacking station and/or first build module can be configured to maintain a pressure above an ambient pressure during the removal. During the removal, the unpacking station and/or first build module can be configured to facilitate pressure maintenance of the first atmosphere and/or second atmosphere respectively to above ambient pressure. Above ambient pressure can comprise at least 0.3 pound per square inch (PSI) above ambient pressure. The apparatus may further comprise a pressurized gas source. The pressurized gas source may comprise a pressurized gas-cylinder. The gas cylinder may comprise a liquid that expands into a gas. The starting material can be a pre-transformed material that is transformed to form the at least one 3D object during the 3D printing of the at least one 3D object. The starting material can be included in a remainder of a material bed that did not form the at least one 3D object. The unpacking station can be configured to facilitate removal of the remainder from the at least one 3D object. During the removal, the pressure in the unpacking station and/or first build module can be above ambient pressure. The unpacking station and/or first build module can be reversibly sealable. The unpacking station and/or first build module can comprise an opening. The opening can be reversibly sealable. The unpacking station can comprise a first sealable opening by a first lid that is reversibly removable (e.g., removable and engageable). The first build module can comprise a second sealable opening by a second lid that is reversibly removable. Upon engagement of the unpacking station with the first build module, the first lid and second lid can translate to facilitate (i) merging of the first atmosphere with the second atmosphere, (ii) entrance of the at least one 3D object from the first build module into the unpacking station (iii) merging of the first opening with the second opening, (iv) or any combination thereof. The first lid and the second lid can translate while being engaged. The first lid can engage with the second lid prior to being translated. A first translation direction of the first lid can have a horizontal and/or vertical component. A second translation direction of the second lid can have a horizontal and/or vertical component. The first direction and the second direction can be the same. The first direction and the second direction can differ. The apparatus can further comprise a first actuator configured to translate the first lid, and a second actuator configured to translate the second lid. The first actuator can be different from the second actuator. The first actuator and the second actuator can be the same actuator. The first and/or second actuator can be coupled to a first shaft and/or second shaft, respectively. The first and/or second actuator can be part of a first robot and/or second robot, respectively. The first and/or second actuator can be part of a first pick-and-place system and/or second pick-and-place system, respectively. The first and/or second actuator pick-and-place system can comprise a first and/or second shaft, respectively. The first and/or second actuator can be controlled manually and/or automatically by at least one controller. The first and/or second actuator can be configured to be actuated before, during, and/or after removal of the starting material. The first build module can comprise an actuator that facilitates vertically translate (i) a platform and/or (ii) the at least one 3D object. The unpacking station can comprise a vibrator. The first build module can comprise a platform. The platform can be configured to vertically translate using a translation mechanism comprising an encoder, vertical guide post, vertical screw, horizontal screw, linear motor, bearing, shaft, or bellow. The platform can be configured to vertically translate using a translation mechanism comprising an optical encoder, magnetic encoder, air bearing, ball bearing, or a scissor jack. The platform can be configured to rotate, translate, tilt, and/or vibrate. The platform can be configured to rotate, translate, tilt, and/or vibrate, at least during the removal. The platform can be configured to rotate around a vertical and/or horizontal axis. The first build module can comprise a first removable base that is configured to support the at least one 3D object. The first build module can comprise a platform. The first removable base can be disposed adjacent to the platform. The first base can be configured to translate away from the platform during and/or after the removal. The unpacking station can comprise a second build module that is configured to (I) accommodate the at least one 3D object, (II) reversibly engaging with the unpacking station, (III) accommodate a third atmosphere, (IV) translate to and/or from the unpacking station, or (V) any combination thereof. The second build module can comprise a second base that is configured to accommodate the at least one 3D object after the removal. The second build module can be configured to maintain a pressure above an ambient pressure. The second build module can be configured to facilitate pressure maintenance of the third atmosphere to above ambient pressure. The maintenance of the third atmosphere to above ambient pressure can be during a translation of the second build module to and/or from the unpacking station. The second build module can comprise a third opening that is reversibly sealable by a third lid that is reversibly removable from the third opening (e.g., and to the opening). The apparatus may further comprise one or more valves. The atmosphere in the build module (e.g., first and/or second build module) and/or unpacking station may be replaced prior to entry of a pre-transformed material into the build module and/or unpacking station. The one or more valves may be used to replace (e.g., using suction and/or purging) the atmosphere in the build module (e.g., first and/or second build module) and/or unpacking station. The pressurized gas may be facilitated by a pressurized gas source. The pressurized gas source may comprise a pump or a gas-cylinder. The first atmosphere, the second atmosphere, and the third atmosphere can be (a) above ambient pressure, (b) inert, (c) different from the ambient atmosphere, and/or (d) non-reactive with the pre-transformed material and/or one or more 3D objects during the plurality of 3D printing cycles. The first atmosphere, the second atmosphere, and the third atmosphere can be non-reactive to a degree that does not cause at least one defect in the material properties and/or structural properties of the one or more 3D objects. The first atmosphere, the second atmosphere, and the third atmosphere can be non-reactive to a detectable degree. At least two of the first atmosphere, the second atmosphere, and the third atmosphere, can be detectibly the same. At least two of the first atmosphere, the second atmosphere, and the third atmosphere can differ. The unpacking station can be configured to facilitate contacting and/or manipulating the at least one 3D object from two or more spatial directions. The two or more spatial directions can comprise north, south, east, west, top, and bottom directions. Bottom can be in a direction towards a second platform adjacent to which the one or more 3D objects are disposed. The two or more directions can correspond to Cartesian directions. The Cartesian directions can comprise positive or negative Cartesian directions. The two or more direction can correspond to cardinal points. The contacting can comprise using a live or inanimate operator. The inanimate operator can comprise a shaft or an actuator. The inanimate operator can comprise a robot. The live operator can be a human. The contacting can be directly contacting. The contacting can be indirectly contacting.

In another aspect, an apparatus for 3D printing of at least one 3D object comprises at least one controller that is configured to direct the following operations: Operation (a) reversible engaging of (i) a first build module that accommodates the at least one 3D object and a starting material of the at least one 3D object, with (ii) an unpacking station that comprises a first atmosphere, which build module comprises a second atmosphere; and Operation (b) removing of at least a portion of the starting material of the at least one 3D object from the at least one 3D object, wherein the unpacking station and/or first build module are configured to accommodate a pressure above an ambient pressure at least during the removal.

During removal of the at least the portion of the starting material, the at least one controller can be configured to direct maintaining a pressure above an ambient pressure in the unpacking station and/or first build module. Above ambient pressure can comprise at least 0.3 pound per square inch (PSI) above ambient pressure. The starting material can be a pre-transformed material that is transformed to form the at least one 3D object during the 3D printing of the at least one 3D object. During removal of the at least the portion of the starting material, the pressure in the processing chamber and/or first build module can be above ambient pressure. The unpacking station can comprise a first opening that is reversibly sealable by a first lid. The first build module can comprise a second opening that is reversibly sealable by a second lid (e.g., sealed and become un-sealed by the second lid). Unsealed may comprise opened. The first lid and/or second lid can be translatable. Upon and/or after engagement of the unpacking station with the first build module, the at least one controller can be collectively or separately configured to direct translation of a first lid and/or a second lid to facilitate (I) merging of the first atmosphere with the second atmosphere, (II) entrance of the at least one 3D object from the first build module into the unpacking station (III) merging of the first opening with the second opening, (IV) coupling the first lid with the second lid, (V) translating the first lid and the second lid, or (VI) any combination thereof. The first build module can engage with the unpacking station through a second load lock. The at least one controller can be collectively or separately configured to direct translation of a first lid and/or a second lid while the first build module is engaged with the unpacking station. The first lid can be coupled to the second lid during and/or after engagement of the first build module with the processing chamber. The first lid can be coupled to the second lid prior to the translation. A first translation direction of the first lid can have a horizontal and/or vertical component. A second translation direction of the second lid can have a horizontal and/or vertical component. The first direction and the second direction can be the same. The first direction and the second direction can differ. The at least one controller can be collectively or separately configured to direct an actuator to cause vertical translation of a platform and/or of the at least one 3D object. At least one controller can be collectively or separately configured to direct rotation, horizontal translation, tilting, and/or vibration of the platform. Rotation, translation, tilting, and/or vibration of the platform can be at least during removing of the at least the portion of the starting material. The rotation can be around a vertical and/or horizontal axis. The first build module can comprise a first removable base that is configured to support the at least one 3D object. The first build module can comprise a platform. The first removable base can be disposed adjacent to the platform. The build module can comprise a first base adjacent to which the at least one 3D object is disposed. At least one controller can be collectively or separately configured to direct translation of a first base away from the platform during and/or after the removal. At least one controller can be collectively or separately configured to direct (I) transfer of the at least one 3D object to a second build module, (II) reversible engagement of the second build module with the unpacking station, (III) maintenance of a third atmosphere in the second build module, (IV) translation of the second build module to and/or from the unpacking station, or (V) any combination thereof. Maintenance of the third atmosphere in the second build module can comprise maintenance of an atmosphere that (1) has a pressure above ambient pressure, (2) is inert, (3) is different from the ambient atmosphere, (4) is non-reactive with the pre-transformed material and/or one or more 3D objects during the plurality of 3D printing cycles, (5) comprises a reactive agent below a threshold, or (6) any combination thereof. Maintenance of the pressure of the third atmosphere to above ambient pressure can be during a translation of the second build module to and/or from the unpacking station. At least one controller can be collectively or separately configured to direct removal and/or engagement of a third lid from or with a third opening of the second build module, respectively. At least one controller can be collectively or separately configured to direct removal and/or engagement of a fourth lid from or with a fourth opening of the unpacking station, respectively. At least one controller can be collectively or separately configured to direct engagement of the second build module with the unpacking station. The second build module can engage with the unpacking station by (I) merging the third opening with the fourth opening, (II) coupling the third lid to the fourth lid, (III) translating the third lid and the fourth lid, (IV) merging the first atmosphere and the third atmosphere, (V) translating the at least one 3D object from the unpacking station to the second build module, or (VI) any combination thereof. The second build module can engage with the unpacking station through a first load lock. At least one controller can be collectively or separately configured to direct entrance and/or removal of the at least one 3D object to or from the unpacking station, respectively. At least one controller can be collectively or separately configured to direct entrance and/or removal of a first base to or from the unpacking station respectively. The first base can be part of the first build module. At least one controller can be collectively or separately configured to direct entrance and/or removal of a second base to or from the unpacking station respectively. The second base can be part of the second build module. The first atmosphere, the second atmosphere, and/or the third atmosphere can be (a) above ambient pressure, (b) inert, (c) different from the ambient atmosphere, and/or (d) non-reactive with the pre-transformed material and/or one or more 3D objects during the plurality of 3D printing cycles. The first atmosphere, the second atmosphere, and the third atmosphere can be non-reactive to a degree that does not cause at least one defect in the material properties and/or structural properties of the one or more 3D objects (e.g., which defect is caused during the printing). The first atmosphere, the second atmosphere, and/or the third atmosphere can be non-reactive to a detectable degree. At least two of the first atmosphere, the second atmosphere, and the third atmosphere can be detectibly the same. At least two of the first atmosphere, the second atmosphere, and the third atmosphere can differ. The unpacking station can be configured to facilitate contacting and/or manipulating the at least one 3D object from two or more spatial directions. At least one controller can be collectively or separately configured to direct contacting the at least one 3D object. Direct contacting can comprise directing usage of a shaft or an actuator. Contacting can be indirect and/or direct contacting.

In another aspect, a method for 3D printing of at least one 3D object comprises: (a) reversibly engaging (i) a first build module that accommodates the at least one 3D object and a starting material of the at least one 3D object, with (ii) an unpacking station that comprises a first atmosphere, which build module comprises a second atmosphere; and (b) removing at least a portion of the starting material of the at least one 3D object from the at least one 3D object, wherein the unpacking station and/or first build module are configured to accommodate a pressure above an ambient pressure at least during the removal.

The method can further comprise during the removing, maintaining a pressure above an ambient pressure in the unpacking station and/or first build module. Above ambient pressure can comprise at least half (0.5) a pound per square inch (PSI) above ambient pressure. The starting material can be a pre-transformed material that is transformed to form the at least one 3D object during the 3D printing of the at least one 3D object. During the removing of the at least the portion of the starting material, the pressure in the processing chamber and/or first build module can be above ambient pressure. The unpacking station can comprise a first opening that is reversibly sealable by a first lid. The first build module can comprise a second opening that is reversibly sealable by a second lid, wherein the method further comprises translating the first lid and/or second lid. Translating of the first lid and/or the second lid can be while the first build module is engaged with the unpacking station. Translating of the first lid and/or the second lid can be upon and/or after reversibly engaging the unpacking station with the first build module to facilitate (I) merging of the first atmosphere with the second atmosphere, (II) entrance of the at least one 3D object from the first build module into the unpacking station (III) merging of the first opening with the second opening, (IV) coupling the first lid with the second lid, (V) translating the first lid and the second lid, or (VI) any combination thereof. The first lid can be coupled to the second lid during and/or after engagement of the first build module with the processing chamber. The first lid can be coupled to the second lid prior to translating. The method can further comprise vertically translating a platform and/or the at least one 3D object. The method can further comprise rotating, tilting, horizontally translating and/or vibrating the platform. Rotating, tilting, horizontally translating and/or vibrating the platform can be at least during the removing of the at least the portion of the starting material. Rotating can be around a vertical and/or horizontal axis. The method can further comprise translating a first removable base, wherein the first build module comprises a platform and the first removable base disposed adjacent to the platform adjacent to which the at least one 3D object is disposed. Translating of the first removable base can be during and/or after removing the at least the portion of the starting material. Translating of the first removable base can be away from the platform, unpacking station, and/or at least one 3D object. The method can further comprise (I) transferring the at least one 3D object to a second build module, (II) reversibly engaging of the second build module with the unpacking station, (III) maintaining a third atmosphere in the second build module, and/or (IV) translating the second build module to and/or from the unpacking station Maintaining the third atmosphere in the second build module can comprise maintaining an atmosphere that (1) has a pressure above ambient pressure, (2) is inert, (3) is different from the ambient atmosphere, and/or (4) is non-reactive with the pre-transformed material and/or one or more 3D objects during the plurality of 3D printing cycles Maintaining the pressure of the third atmosphere to above ambient pressure can be during a translation of the second build module to and/or from the unpacking station. The method can further comprise removing and/or engaging of a third lid from or with a third opening of the second build module, respectively. The method can further comprise removing and/or engaging a fourth lid from or with a fourth opening of the unpacking station, respectively. The method can further comprise removing and/or engaging the second build module with the unpacking station. The second build module can engage with the unpacking station by (I) merging the third opening with the fourth opening, (II) coupling the third lid to the fourth lid, (III) translating the third lid and the fourth lid, (IV) merging the first atmosphere and the third atmosphere, (V) translating the at least one 3D object from the unpacking station to the second build module, or (VI) any combination thereof. The second build module can engage with the unpacking station through a first load lock. The method can further comprise entering and/or exiting the at least one 3D object to or from the unpacking station, respectively. The method can further comprise entering and/or exiting a first base to or from the unpacking station respectively. The first base can be part of the first build module. The method can further comprise entering and/or exiting a second base to or from the unpacking station respectively. The second base can be part of the second build module. The method can further comprise contacting and/or manipulating the at least one 3D object from two or more spatial directions. Contacting can comprise using of a shaft or an actuator. Contacting can be indirect and/or direct contacting.

In another aspect, an apparatus used in 3D printing of at least one 3D object comprises a processing chamber which is configured to facilitate printing of the at least one 3D object, which processing chamber comprises a first opening; a processing chamber shutter that is configured to reversibly shut the first opening to separate an internal processing chamber environment from an external environment; a build module container that comprises a second opening; and a build module shutter that is configured to (i) shut the second opening to separate an internal environment of the build module from the external environment, and (ii) shut the second opening to separate an internal environment of the build module from the processing chamber after the 3D printing, and wherein the build module is configured to accommodate the at least one 3D object that is printed by the 3D printing.

The build module shutter may be further configured to maintain in the third atmosphere (i) a pressure above ambient pressure, (ii) an ambient atmosphere, (iii) an exclusion of at least one component present in the ambient atmosphere, or (iv) any combination thereof. The at least one component can be a reactive agent that reacts with the pre-transformed material during the three-dimensional printing. Exclusion can be to below a threshold. The apparatus may further comprise a force source configured to automatically actuate (e.g., close and/or open) the shutter. The shutter may be shut and/or opened (at least in part) manually. For example, the opening and/or closing of the shutter can be performed manually and/or automatically. The force source can be configured to generate a force comprising mechanical, magnetic, pneumatic, hydraulic, electrostatic, or electric force. The force source may comprise manual force. The processing chamber and/or build module container can be configured to maintain a pressure above an ambient pressure during the 3D printing of the at least one 3D object. During the 3D printing of the at least one 3D object, the processing chamber and/or build module can be configured to facilitate pressure maintenance of the first atmosphere and/or the second atmosphere respectively to above ambient pressure. Above ambient pressure can comprise at least 0.3 pound per square inch (PSI) above ambient pressure. Shut can comprise seal (e.g., gas seal). Reversibly shut can comprise reversibly sealable. The build module shutter can be sealable from the ambient atmosphere. The first atmosphere and/or the second atmosphere can be (a) above ambient pressure, (b) inert, (c) different from the ambient atmosphere, (d) non-reactive with the pre-transformed material and/or one or more 3D objects, (e) comprise a reactive agent below a threshold value, or (f) any combination thereof, e.g., during the plurality of 3D printing cycles. The reactive agent (e.g., oxygen or water) can react with the starting material (e.g., pre-transformed material) of the at least one three-dimensional object (e.g., during the printing). The first atmosphere and/or the second atmosphere can be non-reactive to a detectable degree. The first atmosphere and/or the second atmosphere can be non-reactive to a degree that does not cause at least one defect in the material properties and/or structural properties of the one or more 3D objects. The material properties can comprise cracks or pores. The material properties may comprise a reaction product of the material (e.g., pre-transformed or transformed) with a reactive agent. The reaction product may comprise oxides, for example, metal oxides. The material properties may comprise crack propagation defects, material resistance to fatigue, tensile strength, elongation to failure, or embrittlement. The structural properties can comprise warping, bulging, balling, or bending. The internal environments of the processing chamber and of the build module container can be detectably the same. The internal environments of the processing chamber and of the build module container can differ. The build module container can be configured to cool the at least one 3D object. Regulation of a pressure of the internal environments of the build module container can be during the cooling of the at least one 3D object. Cooling of the at least one 3D object can be (i) after the three-dimensional printing, (ii) after disengagement of the build module container from the processing chamber, or (iii) after the three-dimensional printing and after disengagement of the build module container from the processing chamber. Disengagement can be after the 3D printing of the at least one 3D object. The build module container can be configured to reversibly couple to the processing chamber and vice versa. The second opening can be configured to merge with the first opening to facilitate the printing of the 3D printing. (i) the internal processing chamber environment that can be separated by processing chamber shutter and/or (ii) the internal environment of the build module that is separated by the build module shutter: (a) can have a pressure that is above the pressure of the external environment, (b) can be inert, (b) can be not reactive with a starting material of the at least one 3D object, (c) can be different from the external environment, or (d) any combination thereof. The processing chamber can be configured to remain coupled to the build module during the 3D printing. The processing chamber can be configured to separate from the build module after the 3D printing. The processing chamber shutter can be configured to shut before separation from the build module. The processing chamber shutter can be configured to shut before exposure of the first opening to the external atmosphere. The apparatus can further comprise a platform adjacent to which the at least one 3D object is printed. The build module can be configured to accommodate the platform. The platform can be configured to vertically translate. The platform that is configured to vertically translate using a translation mechanism can comprise an encoder, vertical guide post, vertical screw, horizontal screw, linear motor, bearing, shaft, or bellow. The platform can be configured to vertically translate using a translation mechanism comprising an optical encoder, magnetic encoder, gas bearing, wheel bearing, or a scissor jack. The platform can be configured to support the at least one 3D object. The apparatus can further comprise an energy source configured to generate an energy beam that transforms a pre-transformed material to a transformed material to print the at least one 3D object. The processing chamber can be operatively coupled to the energy source. The energy beam can be configured to travel in the processing chamber to print the at least one 3D object. The build module shutter can be configured to couple with the processing chamber shutter to facilitate merging the first opening with the second opening. The build module shutter can be configured to couple with the processing chamber shutter using a mechanism comprising a suction cup or a clipper. The build module shutter can be configured to couple with the processing chamber shutter using a force comprising magnetic, electric, electrostatic, hydraulic, or pneumatic force. The build module shutter may couple to the processing chamber automatically, manually, or both automatically and manually. The build module shutter can be configured to couple with the processing chamber shutter using a physical engagement. The physical engagement can comprise one or more latches links, or hooks. The processing chamber shutter and/or the build module shutter can comprise one or more latches, links, or hooks. The build module shutter can comprise a first portion and a second portion. The first portion can be translatable relative to the second portion. The first portion can be translatable relative to the second portion upon exertion of force. The force can comprise magnetic, electric, electrostatic, hydraulic, or pneumatic force. The force can comprise manual force. The processing chamber shutter can comprise a pin. The build module shutter can comprise a first portion and a second portion. A pin can be configured to facilitate separation of the first portion from the second portion. The pin can be configured to be pushed to further separate the first portion from the second portion. The processing chamber shutter can comprise a first seal. The first seal can reduce an atmospheric exchange between the external (e.g., ambient) environment and the internal processing chamber environment. The build module shutter can comprise a second seal. The second seal can be configured to reduce an atmospheric exchange between the external environment and the internal environment of the build module. The second seal can be a gas seal. The build module shutter can comprise a first portion and a second portion that is translatable relative to the first portion to facilitate engagement or disengagement of the second seal with the build module chamber. The build module shutter can be configured to contact the first seal upon engagement with the processing chamber. The build module container can be configured to engage with the first seal when the first portion and the second portion are close to each other. The build module container can be configured to disengage with the first seal when the first portion and the second portion are relatively farther from each other. The build module container can be configured to disengage with the first seal when the first portion contacts the second portion. The build module container can be configured to disengage from the first seal when the first portion and the second portion are separated by a gap. The gap can be a gaseous gap. The apparatus can further comprise a translation mechanism comprising a shaft. The translation mechanism can be coupled to the processing chamber shutter and/or to the build module shutter. The translation mechanism can be configured to facilitate translation of the processing chamber shutter and/or the build module shutter. The translation mechanism can comprise a cam follower. The shaft can be at least a part of the cam follower. The translation mechanism can comprise one or more rotating devices. The rotating devices can comprise wheels, cylinders, or balls.

In another aspect, an apparatus used in 3D printing of at least one 3D object comprises at least one controller that is configured to perform the following operations: operation (a) direct a build module to engage with a processing chamber, which processing chamber comprises (I) a first opening and (II) a processing chamber shutter that reversibly closes (e.g., shutter that can close and open) the first opening, which build module comprises (i) a second opening and (ii) a build module shutter that reversibly closes (e.g., shutter that can close and open) the second opening, wherein the at least one controller is operatively coupled to the build module, build module shutter, processing chamber, and processing chamber shutter; operation (b) direct an energy beam along a path to transform a pre-transformed material to a transformed material to print the at least one 3D object, wherein the at least one controller is operatively coupled to the energy beam; and operation (c) direct the build module shutter to shut the second opening and separate an internal environment of the build module from the processing chamber after the 3D printing, wherein the build module is configured to accommodate the at least one 3D object that is printed by the 3D printing.

At least one controller can be further configured to perform operation (d) direct merging of the first opening with the second opening before operation (b) and/or after operation (a). An internal environment of the processing chamber can comprise a first atmosphere. The internal environment of the build module can comprise a second atmosphere. The first atmosphere and the second atmosphere can be detectably the same. The first atmosphere and the second atmosphere can differ. During the 3D printing, the pressure in the enclosure can be above ambient pressure. The second atmosphere can be merged with the first atmosphere during operation (a) to form a third atmosphere. At least one controller can be programed to direct at least one pressurized gas source to maintain the first atmosphere, second atmosphere, third atmosphere, at a pressure above an ambient pressure. At least one controller can be operatively coupled to the at least one pressurized gas source. The pressurized gas source may comprise a pump or a gas-cylinder. At least one controller can be programed to direct at least one pressurized gas source to maintain the first atmosphere, second atmosphere, and/or third atmosphere, at a pressure above an ambient pressure. At least one controller can be operatively coupled to the at least one pressurized gas source. The at least one controller can be programed to direct at least one pressurized gas source (e.g., pressurized gas generator) to maintain the first atmosphere, second atmosphere, and/or third atmosphere, at a pressure above an ambient pressure. The at least one controller can be operatively coupled to the at least one pressurized gas source. Direct can be before, after, and/or during the three-dimensional printing. The first atmosphere, the second atmosphere, and/or the third atmosphere can be (I) above ambient pressure, (II) inert, (III) different from the ambient atmosphere, (IV) non-reactive with the pre-transformed material and/or one or more 3D objects, (V) comprises a reactive agent below a threshold, or (VI) any combination thereof, during the plurality of 3D printing cycles. The first atmosphere, the second atmosphere, and/or the third atmosphere can be non-reactive to a degree that does not cause at least one defect in the material properties and/or structural properties of the one or more 3D objects. The first atmosphere, the second atmosphere, and/or the third atmosphere can be non-reactive to a detectable degree. The first atmosphere, the second atmosphere, and/or the third atmosphere can be different from an ambient atmosphere. Direct merging can comprise direct translating the processing chamber shutter and the build module shutter. Direct translating can be away from the first opening and/or second opening. Direct translating can comprise direct engaging the processing chamber shutter and/or the build module shutter with a shaft. Direct translating can comprise direct engaging the processing chamber shutter and/or the build module shutter with a cam follower. Direct merging can comprise direct coupling of the processing chamber shutter with the build module shutter. Direct merging can comprise direct separating a first portion of the build module shutter from a second portion of the build module shutter. Direct separating can comprise direct pushing or repelling the first portion away from the second portion. Direct separation can comprise direct using operation of a mechanical, magnetic, electronic, electrostatic, hydraulic, or pneumatic force actuator. Direct separation can comprise manual separation. Direct separation can comprise direct pushing a pin to separate the first portion from the second portion. The processing chamber shutter can comprise the pin. The first portion can be a lateral portion. the second portion can be a lateral portion. The first portion can be a horizontal portion. The second portion can be a horizontal portion. The first portion can be separated from the second portion by a vertical separation gap. Direct coupling can comprise direct latching the build module shutter with the processing chamber shutter. Direct latching can comprise direct translating a portion of (1) the build module shutter and/or (2) the processing chamber shutter. Direct translating can comprise direct rotating, swiveling, or swinging. Direct merging can comprise direct releasing at least one first seal disposed adjacent to the first opening of the processing chamber and the processing chamber shutter. Direct merging can comprise direct releasing at least one second seal disposed adjacent to the second opening of the build module and the build module shutter. Direct merging can comprise direct separating the first portion from the second portion to release at least one second seal that is disposed adjacent to the second opening of the build module and the build module shutter. At least two of operations (a) to (d) can be directed by the same controller. At least two of operations (a) to (d) can be directed by different controllers. At least one controller can be programmed to direct at least one of operations (a) to (d). At least one controller can be programed to perform at least one of operations (a) to (d). At least one controller can include a control scheme comprising open loop, or closed loop control. At least one controller can include a control scheme comprising feed forward or feedback control. At least one controller can be configured to direct before, after, and/or during the plurality of 3D printing cycles.

In another aspect, a method used in 3D printing of at least one 3D object comprises: (a) engaging a build module with a processing chamber, which processing chamber comprises (I) a first opening and (II) a processing chamber shutter that closes the first opening, which build module comprises (i) a second opening and (ii) a build module shutter that closes the second opening, and (iii) a substrate; (b) directing an energy beam to transform a pre-transformed material to a transformed material to print the at least one 3D object by directing it along a path; and (c) shutting the second opening of the build module shutter and separating an internal environment of the build module from an internal environment of the processing chamber after the 3D printing, wherein the build module is configured to accommodate the at least one 3D object that is printed by the 3D printing. The method can further comprise merging the first opening with the second opening after operation (a) and/or before operation (b). The method can further comprise maintaining the pressure in the processing chamber and/or build module above ambient pressure during the 3D printing of the at least one 3D object Maintaining the pressure may comprise using a pressurized gas source. The pressurized gas source may comprise a pump or a gas cylinder. The method can further comprise reversibly shutting the processing chamber after the 3D printing of the at least one 3D object. Shutting can comprise environmentally sealing. The internal environment of the processing chamber can comprise a first atmosphere. The internal environment of the internal environment of the build module can comprise a second atmosphere. The first atmosphere and/or the second atmosphere can be (a) above ambient pressure, (b) inert, (c) different from the ambient atmosphere, and/or (d) non-reactive with the pre-transformed material and/or one or more 3D objects during the plurality of 3D printing cycles. The first atmosphere and/or the second atmosphere can be non-reactive to a degree that does not cause at least one defect in the material properties and/or structural properties of the one or more 3D objects. The first atmosphere and/or the second atmosphere can be non-reactive to a detectable degree. The first atmosphere and the second atmosphere can be detectably the same. The first atmosphere and the second atmosphere can differ. The method can further comprise reducing a temperature of the at least one 3D object after the 3D printing of the at least one 3D object. The method can further comprise regulating of the pressure of the second atmosphere in during reducing the temperature of the at least one 3D object. The method can further comprise transporting the build module to and/or from the processing chamber in a period other than during the 3D printing of the at least one 3D object. The method can further comprise directing an energy beam to transform a pre-transformed material into a transformed material to print the at least one 3D object. The directing can be along a path. The path can be related to the at least one 3D object. The merging can comprise translating the processing chamber shutter and the build module shutter. The translating can be away from the first opening and/or second opening. Translating can comprise engaging the build module shutter and/or processing chamber shutter with a shaft. Translating can comprise engaging the build module shutter and/or processing chamber shutter with a cam follower. Merging can comprise coupling the processing chamber shutter with the build module shutter. Merging can comprise separating a first portion of the build module shutter from a second portion of the build module shutter. Separating can comprise pushing or repelling the first portion away from the second portion. Separating can comprise using a physical, magnetic, electronic, electrostatic, hydraulic, or pneumatic force actuator. Separation can comprise manual separation. Separating can comprise pushing a pin to separate the first portion from the second portion. The processing chamber shutter can comprise the pin. The first portion can be a lateral portion. The second portion can be a lateral portion. The first portion can be a horizontal portion. The second portion can be a horizontal portion. The first portion can be separated from the second portion by a vertical separation gap. Coupling the processing chamber shutter with the build module shutter can comprise latching of the build module shutter to the processing chamber shutter, or vice versa. Latching of the build module shutter to the processing chamber shutter, or vice versa, can comprise translating a portion of (1) the build module shutter and/or (2) the processing chamber shutter. Translating can comprise direct rotating, swiveling, and/or swinging. Merging can comprise releasing at least one first seal disposed adjacent to (1) the first opening of the processing chamber and (2) the processing chamber shutter. Merging can comprise releasing at least one second seal disposed (1) adjacent to the second opening of the build module and (2) the build module shutter. Merging can comprise separating the first portion from the second portion to release at least one second seal that is disposed adjacent to the second opening of the build module and the build module shutter.

In another aspect, a computer software product for 3D printing of at least one 3D object, comprises a non-transitory computer-readable medium in which program instructions are stored, which instructions, when read by a computer, cause the computer to perform operations comprising: operation (a) direct a build module to engage with a processing chamber, which processing chamber comprises (I) a first opening and (II) a processing chamber shutter that closes the first opening, which build module comprises (i) a second opening and (ii) a build module shutter that closes the second opening, and (iii) a substrate; operation (c) direct an energy beam to transform a pre-transformed material to a transformed material to print the at least one 3D object by projecting in the processing chamber towards the substrate; and operation (c) direct the build module shutter to shut the second opening and separate an internal environment of the build module from the processing chamber after the 3D printing, wherein the build module is configured to accommodate the at least one 3D object that is printed by the 3D printing. The computer software product can be further programmed to perform operation (d) direct merging of the first opening with the second opening.

In another aspect, an apparatus for 3D printing of at least one 3D object comprises: an unpacking station configured to facilitate removal of at least a portion of a starting material of the at least one 3D object from the at least one 3D object, which unpacking station comprises a first opening that is reversibly closable and a second opening that is reversibly closable; a first build module configured to accommodate the at least one 3D object, which first build module comprises a third opening that is reversibly closable (e.g., can close and open); and a second build module configured to accommodate the at least one 3D object, which second build module comprises a fourth opening that is reversibly closable, which unpacking station, first build module, and second build module are configured to reversibly engage (e.g., can engage and disengage).

The unpacking station and/or first build module may be configured to accommodate a pressure above an ambient pressure at least during the removal of the starting material. The second build module can be configured to engage with the unpacking station before and/or during the removal. The first build module and/or the second build module can be configured to translate. Translation of first build module and/or the second build module can comprise a vertical or horizontal translation. The unpacking station can be configured to facilitate translation of the at least one 3D object from the first build module to the second build module through the unpacking station. Translation of the at least one 3D object can comprise a vertical or horizontal translation. The unpacking station can be configured to facilitate transfer of the at least one 3D object from the first build module to the second build module thorough the unpacking station without contacting the ambient atmosphere. The unpacking station first build module and/or the second build module can be configured to maintain a pressure above an ambient pressure (e.g., during the removal). The first build module can comprise a first atmosphere, wherein the second build module can comprise a second atmosphere. The unpacking station can comprise a third atmosphere. During the removal, the first build module, the second build module and/or unpacking station can be configured to facilitate pressure maintenance of the first atmosphere, second atmosphere, and/or third atmosphere to above ambient pressure, respectively. Above ambient pressure can comprise at least half (0.5) a pound per square inch (PSI) above ambient pressure. The unpacking station can be configured to engage with the first build module and/or the second build module without being open to the ambient atmosphere. The unpacking station can be configured to engage with the first build module and/or the second build module while maintaining a pressure above ambient atmosphere in the unpacking station (i) during engagement with the first build module and/or the second build module, (ii) that is engaged with the first build module and/or the second build module, or (iii) any combination thereof. The first build module can comprise a first platform that is configured to vertically translate. The second build module can comprise a second platform that is configured to vertically translate. Vertically translate can comprise using a translation mechanism comprising an encoder, vertical guide post, vertical screw, horizontal screw, linear motor, bearing, shaft, or bellow. Vertically translate can comprise using a translation mechanism comprising an optical encoder, magnetic encoder, wheel bearing, air bearing, or a scissor jack. The starting material can be a pre-transformed material that is transformed to form the at least one 3D object during the 3D printing of the at least one 3D object. The starting material can be included in a remainder of a material bed that did not form the at least one 3D object. The unpacking station can be configured to facilitate removal of the remainder from the at least one 3D object. Reversibly closable can be reversibly sealable. The first opening can be reversibly closable by a first lid that is reversibly removable. The second opening can be reversibly closable by a second lid that can be reversibly removable. The third opening can be reversibly closable by a third lid that is reversibly removable. The fourth opening can be reversibly closable by a fourth lid that is reversibly removable. The unpacking station can be configured to engage with the first build module. The unpacking station can be configured to engage with the first build module directly or indirectly. The unpacking station can be configured to engage with the first build module through a first load lock. The first opening can be configured to merge with the third opening. Merging of the first opening with the third opening can facilitate atmospheric exchange between the unpacking station and the first build module. Merging of the first opening with the third opening can facilitate translation of the at least one 3D object between the unpacking station and the first build module. Upon engagement of the unpacking station with the first build module, the first lid and third lid can translate to facilitate (i) merging the atmospheres of the unpacking station and the first build module, (ii) entrance of the at least one 3D object from the first build module into the unpacking station (iii) merging of the first opening with the third opening, (iv) or any combination thereof. The first lid and the third lid can translate while being engaged. The first lid can engage with the third lid prior to being translated. A first translation direction of the first lid can have a horizontal and/or vertical component. A third translation direction of the third lid can have a horizontal and/or vertical component. The first direction and the third direction can be the same. The first direction and the third direction can differ. The apparatus can further comprise a first actuator configured to translate the first lid, and a third actuator configured to translate the third lid. The first actuator can be different from the third actuator. The first actuator and the third actuator can be the same actuator. The first and/or third actuator can be coupled to a first shaft and/or third shaft, respectively. The first and/or third actuator can be part of a first robot and/or third robot, respectively. The first and/or third actuator can be part of a first pick-and-place system and/or third pick-and-place system, respectively. The first and/or third actuator pick-and-place system can comprise a first and/or third shaft, respectively. The first and/or third actuator can be controlled manually and/or automatically by at least one controller. The first and/or third actuator can be controlled before, during, and/or after removal of the starting material. The unpacking station can be configured to engage with the second build module. The unpacking station can be configured to engage with the second build module directly or indirectly. The unpacking station can be configured to engage with the second build module through a second load lock. The second load lock can be the same or different from the first load lock. The second load lock may be similar in shape, features, and/or internal volume to the first load lock. Upon engagement of the unpacking station with the second build module, the second lid and fourth lid can translate to facilitate (i) merging the atmospheres of the unpacking station and the second build module, (ii) entrance of the at least one 3D object from the unpacking station into the second build module (iii) merging of the second opening with the fourth opening, (iv) or any combination thereof. The second lid and the fourth lid can translate while being engaged. The second lid can engage with the fourth lid prior to being translated. A second translation direction of the second lid can have a horizontal and/or vertical component. A fourth translation direction of the fourth lid can have a horizontal and/or vertical component. The second direction and the fourth direction can be the same. The second direction and the fourth direction can differ. The apparatus can further comprise a second actuator configured to translate the second lid, and a fourth actuator configured to translate the fourth lid. The second actuator can be different from the fourth actuator. The second actuator and the fourth actuator can be the same actuator. The second and/or fourth actuator can be coupled to a second shaft and/or fourth shaft, respectively. The second and/or fourth actuator can be part of a second robot and/or fourth robot, respectively. The second and/or fourth actuator can be part of a second pick-and-place system and/or fourth pick-and-place system, respectively. The second and/or fourth actuator pick-and-place system can comprise a second and/or fourth shaft, respectively. The second and/or fourth actuator can be controlled manually and/or automatically by at least one controller. The second and/or fourth actuator can be controlled before, during, and/or after removal of the starting material. The first build module can comprise an actuator that facilitates vertically translation of (i) a first platform and/or (ii) the at least one 3D object. The first build module can comprise an actuator that facilitates vertically translation of (i) a second platform and/or (ii) the at least one 3D object. The unpacking station can comprise a vibrator. The first build module can comprise a first platform. The platform can be configured to rotate, translate, tilt, and/or vibrate. The first platform can be configured to rotate, translate, tilt, vibrate, or any combination thereof, at least during the removal. The first platform can rotate around a vertical and/or horizontal axis. The first build module can comprise a first removable base that is configured to support the at least one 3D object. The first build module can comprise a platform. The first removable base can be disposed adjacent to the platform. The first base can be configured to translate away from the first platform during and/or after the removal. The second build module can be configured to accommodate the first base or a second base that is configured to accommodate the at least one 3D object after the removal. The second base can be configured to translate to the second build module during and/or after the removal. The second build module can comprise a second platform that is configured to vertically translate. The second base can be configured to translate to a second platform disposed in the second build module, during and/or after the removal. The apparatus can further comprise an actuator that is configured to translate the second base from the unpacking station to the second build module. The first base can be configured to translate to the second build module during and/or after the removal. The first base can be configured to translate to the second platform during and/or after the removal. The apparatus can further comprise an actuator that is configured to translate the first base from the unpacking station to the second build module. The apparatus can further comprise an actuator that is configured to translate the first base from the first build module to the unpacking station. The first atmosphere, the second atmosphere, the third atmosphere, or any combination thereof, (a) can be above ambient pressure, (b) can be inert, (c) different from the ambient atmosphere, (d) can be non-reactive with the pre-transformed material and/or one or more 3D objects during the plurality of 3D printing cycles, (e) may comprise a reactive agent below a threshold, or (f) can be any combination thereof. The first atmosphere, the second atmosphere, the third atmosphere can be non-reactive to a degree that does not cause at least one defect in the material properties and/or structural properties of the one or more 3D objects. The first atmosphere, the second atmosphere, the third atmosphere can be non-reactive to a detectable degree. At least two of the first atmosphere, the second atmosphere, and the third atmosphere, fourth can be detectibly the same. At least two of the first atmosphere, the second atmosphere, and the third atmosphere can differ. The unpacking station can be configured to facilitate contacting and/or manipulating the at least one 3D object from two or more spatial directions. The two or more spatial directions can comprise north, south, east, west, top, and bottom directions. Bottom can be in a direction towards a second platform adjacent to which the one or more 3D objects are disposed. The two or more directions can correspond to Cartesian directions. The Cartesian directions can comprise positive or negative Cartesian directions. The two or more direction can correspond to cardinal points. Contacting the at least one 3D object from two or more spatial directions can comprise using a live or inanimate operator. The inanimate operator can comprise a shaft or an actuator. The inanimate operator can comprise a robot. The live operator can be a human. Contacting the at least one 3D object from two or more spatial directions can be directly contacting. Contacting the at least one 3D object from two or more spatial directions can be indirectly contacting.

In another aspect, a method for 3D printing of at least one 3D object comprises: (a) reversibly engaging a first build module with an unpacking station, which first build module comprises the at least one 3D object and a starting material of the at least one 3D object; (b) removing at least a portion of a starting material of the at least one 3D object from the at least one 3D object in the unpacking station; (c) reversibly engaging a second build module with the unpacking station; and (d) evacuating the at least one 3D object from the unpacking station by enclosing it in the second build module.

The method can further comprise translating the at least one 3D object from the first build module to the unpacking station after operation (a) and/or before operation (b). The method can further comprise translating the at least one 3D object from the unpacking station to the second build module after operation (b) and/or before operation (d). Operation (c) can occur before operation (d). Operation (c) can occur before or simultaneously with operation (b) and/or operation (a). The method can further comprise opening a reversibly closable first opening of the unpacking station, and opening a reversibly closable third opening of the build module after operation (a) and/or before operation (b). The method can further comprise opening a reversibly closable second opening of the unpacking station, and opening a reversibly closable fourth opening of the build module after operation (c) and/or before operation (d). The method can further comprise closing a reversibly closable second opening of the unpacking station, and closing a reversibly closable fourth opening of the build module after operation (c) and/or before operation (d), wherein the closing is after the opening. Engaging the second build module with the unpacking station can be before and/or during operation (b). The method can further comprise translating the first build module and/or the second build module to or from the unpacking station. Translating can comprise a vertical or horizontal translation. The method can further comprise translating the at least one 3D object in the unpacking station. Translation of the at least one 3D object can comprise a vertical or horizontal translation. The unpacking station can be configured to facilitate transfer of the at least one 3D object from the first build module to the second build module thorough the unpacking station without contacting the ambient atmosphere. The method can further comprise, during the removal, maintaining a pressure above an ambient pressure in the unpacking station, first build module, second build module, or any combination thereof. The first build module can comprise a first atmosphere. The second build module can comprise a second atmosphere. The unpacking station can comprise a third atmosphere. The method can further comprise, during the removal, maintaining a pressure above an ambient pressure in the first atmosphere, second atmosphere, third atmosphere, or any combination thereof. Above ambient pressure can comprise at least half (0.5) a pound per square inch (PSI) above ambient pressure. Engaging the unpacking station with the first build module and/or the second build module can be without exposing the first atmosphere, second atmosphere, and/or third atmosphere to the ambient atmosphere. Engaging the unpacking station with the first build module and/or the second build module can further comprise maintaining a pressure above ambient atmosphere in the unpacking station (i) during engagement with the first build module and/or the second build module, (ii) that is engaged with the first build module and/or the second build module, or (iii) any combination thereof. The starting material can be a pre-transformed material that is transformed to form the at least one 3D object during the 3D printing of the at least one 3D object. The starting material can be included in a remainder of a material bed that did not form the at least one 3D object. The unpacking station can be configured to facilitate removal of the remainder from the at least one 3D object. Reversibly closable can be reversibly sealable. The first opening can be reversibly closable (e.g., closed and opened) by a first lid that is reversibly removable (e.g., removed and engaged). The second opening can be reversibly closable by a second lid that is reversibly removable. The third opening can be reversibly closable by a third lid that is reversibly removable. The fourth opening can be reversibly closable by a fourth lid that is reversibly removable. Engaging the first build module with the unpacking station can be directly or indirectly. Engaging the first build module with the unpacking station can be through a first load lock. The method can further comprise merging the first opening with the third opening. Merging the first opening with the third opening can comprise facilitating atmospheric exchange between the unpacking station and the first build module. Merging the first opening with the third opening can comprise facilitating translation of the at least one 3D object between the unpacking station and the first build module. Engaging the unpacking station with the first build module can further comprise translating the first lid and third lid to facilitate (i) merging the atmospheres of the unpacking station and the first build module, (ii) maneuvering the at least one 3D object from the first build module into the unpacking station (iii) merging the first opening with the third opening, (iv) or any combination thereof. Engaging the first lid and the third lid can comprise, or can be followed by, translating the first lid and the third lid while being engaged. Engaging the first lid with the third lid can be prior to translating. Engaging the first build module with the unpacking station can comprise translating the first lid and the second lid. A first translation direction of the first lid can have a horizontal and/or vertical component. A third translation direction of the third lid can have a horizontal and/or vertical component. The method can further comprise translating the first lid with a first actuator, and translating the third lid with a third actuator. The method can further comprise controlling the first actuator and/or third actuator manually, automatically, or both manually and automatically, by at least one controller. Controlling the first actuator, the third actuator, or both the first actuator and the third actuator, can be before, during, and/or after removal of the starting material. Engaging the unpacking station with the second build module can be directly or indirectly. Engaging the unpacking station with the second build module can be indirectly through a second load lock. Upon engaging of unpacking station with the second build module, the method can further comprise translating the second lid and fourth lid to facilitate (i) merging the atmospheres of the unpacking station and the second build module, (ii) entering of the at least one 3D object from the unpacking station into the second build module (iii) merging of the second opening with the fourth opening, (iv) or any combination thereof. Translating the second lid and the fourth lid can be while engaging the second lid and the fourth lid. Translating the second lid and the fourth lid can be before engaging the second lid and the fourth lid. A second translation direction of the second lid can have a horizontal and/or vertical component. A fourth translation direction of the fourth lid can have a horizontal and/or vertical component. The second direction and the fourth direction can be the same. The second direction and the fourth direction can differ. The method can further comprise using at least one controller to control translation of the second lid and/or the fourth lid manually, automatically, or any combination thereof. The method can further comprise vertically translating (i) a first platform and/or (ii) the at least one 3D object. The method can further comprise vertically translating (i) a second platform and/or (ii) the at least one 3D object. The method can further comprise manipulating the first platform, the second platform, or the first platform and the second platform to: rotate, translate, tilt, vibrate, or any combination thereof. Manipulating the first platform, the second platform, or the first platform and the second platform, can be during operation (b). Manipulating the first platform, the second platform, or the first platform and the second platform to rotate can comprise rotating around a vertical and/or horizontal axis. The first build module can comprise a first removable base that is configured to support the at least one 3D object. The method can further comprise translating the first base away from the first platform during and/or after the removal. The second build module can be configured to accommodate the first base or a second base that is configured to accommodate the at least one 3D object after evacuating in operation (d). The method can further comprise translating the second base to the second build module during and/or after the removal. The method can further comprise vertically translating the second platform in the second build module. The method can further comprise translating the second base to the second platform during and/or after the removal. The method can further comprise translating the first base to the second build module during and/or after the removal. The method can further comprise vertically translating a second platform in the second build module. The method can further comprise translating the first base configured to translate to a second platform disposed in the second build module, during and/or after the removal. The first atmosphere, second atmosphere, the third atmosphere, or any combination thereof, (a) can be above ambient pressure, (b) can be inert, (c) can be different from the ambient atmosphere, (d) can be non-reactive with the pre-transformed material and/or one or more 3D objects during the plurality of 3D printing cycles, (e) can comprise a reactive agent below a threshold (e.g., as disclosed herein), or (f) can be any combination thereof. The first atmosphere, the second atmosphere, the third atmosphere, or any combination thereof can be non-reactive to a degree that does not cause at least one defect in the material properties and/or structural properties of the one or more 3D objects. The first atmosphere, the second atmosphere, the third atmosphere, or any combination thereof can be non-reactive to a detectable degree. At least two of the first atmosphere, the second atmosphere, and the third atmosphere can be detectibly the same. At least two of the first atmosphere, the second atmosphere, and the third atmosphere can differ. The method can further comprise contacting, manipulating, or both contacting and manipulating the at least one 3D object in the unpacking station from two or more spatial directions. The two or more spatial directions can comprise north, south, east, west, top, and bottom directions. The bottom direction can be in a direction towards a second platform adjacent to which the at least one 3D objects are disposed. The two or more directions can correspond to Cartesian directions. The Cartesian directions can comprise positive or negative Cartesian directions. The two or more direction can correspond to cardinal points. Contacting the at least one 3D object in the unpacking station from two or more spatial directions can comprise using a live or inanimate operator. The inanimate operator can comprise a shaft or an actuator. The inanimate operator can comprise a robot. The live operator can be a human Contacting the at least one 3D object in the unpacking station from two or more spatial directions can be directly contacting. Contacting the at least one 3D object in the unpacking station from two or more spatial directions can be indirectly contacting.

In another aspect, an apparatus for printing at least one 3D object, comprises: a processing chamber that defines a first volume; a build module that defines a second volume, wherein the build module comprises a platform configured to support the at least one 3D object; a load-lock that is (I) configured to facilitate coupling of the processing chamber to the build module or (II) formed on coupling the processing chamber and the build module, wherein the load-lock defines a third volume that is configured to connect the first volume with the second volume; and an energy source that is configured to generate an energy beam that irradiates to facilitate printing the at least one 3D object.

At least one of the first volume, second volume, and third volumes can be configured to support a pressure above ambient pressure at least during the printing of the at least one three-dimensional object. The build module can comprise a first opening and a first shutter that reversibly shuts the first opening. The first shutter can be configured to maintain an atmosphere within the second volume that (i) is non-reactive with a starting material of the at least one three-dimensional object, (ii) is above ambient pressure, (iii) comprises a reactive agent below a threshold value (e.g., as described herein), or (iv) any combination thereof, at a time comprising: (a) after the printing of the at least one three-dimensional object, or (b) before disengagement of the build module from the processing chamber. The first shutter can be configured to maintain an atmosphere within the second volume (1) after the printing of the at least one three-dimensional object, (2) after disengagement of the build module from the processing chamber, or (3) after forming the at least one three-dimensional object and after disengagement of the build module from the processing chamber, which second volume is non-reactive with a starting material of the at least one 3D object Maintain an atmosphere is for a period of at least 1 days, 2 days, 3 days, 5 days or 7 days. At least one of the first, second, and third volumes can be configured to support (i) a non-reactive (e.g., inert) atmosphere, and (ii) a pressure above ambient pressure at least during the printing of the at least one 3D object. Non-reactive can be with a starting material of the at least one 3D object. Non-reactive can be with the remainder of the material bed that did not transform to form the at least one 3D object. A non-reactive atmosphere (as disclosed herein) may comprise a reactive agent below a threshold (e.g., as disclosed herein). At least one of the processing chamber, the build module, and the load lock can be configured to support (i) a non-reactive (e.g., inert) atmosphere, and (ii) a pressure above ambient pressure at least during the printing of the at least one 3D object. The platform can be configured to vertically translate. The platform can be configured to support a material bed in which the at least one 3D object is printed. The build module can be configured to accommodate the material bed and the at least one 3D object (e.g., after the printing). The build module can comprise a first opening and a first shutter that reversibly shuts the first opening. The first shutter can be configured to maintain an atmosphere within the second volume that is (i) non-reactive (e.g., inert), and (ii) above ambient pressure, after the printing of the at least one 3D object, after disengagement of the build module from the processing chamber, or after forming the at least one 3D object and after disengagement of the build module from the processing chamber. Maintain an atmosphere is for a period as disclosed herein (e.g., at least 3 days). The first opening can be configured to facilitate transfer of the at least one 3D object and the material bed through the first opening. The processing chamber can comprise a second opening that is reversibly closable (e.g., close and open) by a second shutter. The second opening can be configured in one side of the load lock. The first opening can engage with the load lock at a second side that opposes the first side. The second opening can be configured to facilitate (i) transfer of the at least one 3D object through the second opening, (ii) transfer of the material bed through the second opening, (iii) printing the at least one 3D object by the energy beam while irradiating through the second opening, or (iv) any combination thereof. At least two of processing chamber, build module, and load lock can be configured to maintain a similar atmosphere. At least two of the processing chamber, build module, and load lock can be configured to allow atmospheres therein to equilibrate with each other. The apparatus may further comprise at least one force source configured to automatically actuate (e.g., close and/or open) the shutters. The at least one force source can be configured to generate a force comprising mechanical, magnetic, pneumatic, hydraulic, electrostatic, or electric force. Any one of the shutters may be closed (or opened) manually, at least in part. The first shutter may be operatively coupled to a first force source. The second shutter may be operatively coupled to a second force source. The first force source and the second force source may be the same force source. The first force source and the second force source may be different. The first force source and the second force source may generate the same force type (e.g., magnetic). The first force source and the second force source may generate different force types. For example, the first force source may generate a pneumatic force and the second force source may generate an electric force (e.g., electricity).

In another aspect, an apparatus for 3D printing, comprises at least one controller that is programmed to perform the following operations: operation (a) direct engaging a build module with a processing chamber through a load lock, wherein the processing chamber comprises a first atmosphere, wherein the build module comprises a platform and a second atmosphere, wherein the load lock comprises a third atmosphere; and operation (b) direct printing the at least one 3D object according to a 3D printing method, which at least one 3D object is disposed adjacent to the platform and in the build module, which three-dimensional printing is conducted at a positive pressure relative to an ambient pressure.

The at least one controller can be configured to control the second atmosphere (i) to be non-reactive with a starting material of the at least one three-dimensional object, (ii) to be above ambient pressure, (iii) to comprise a reactive agent below a threshold value, or (iv) any combination thereof, at a time comprising: (A) after the printing of the at least one three-dimensional object, or (B) before disengagement of the build module from the processing chamber. The threshold value of the reactive agent is disclosed herein (e.g., oxygen level in the build module below 500 ppm, water ingress rate to the build module below 10 micrograms per day). The build module can comprise a first controller of the at least one controller, and the processing chamber comprises a second controller of the at least one controller. The second controller can be separate from the first controller. The first controller may not be in active communication with the second controller. The second controller may not be in active communication with the first controller. The first controller may be in passive communication with the second controller. The second controller may be in passive communication with the first controller. Passive communication may comprise passively receiving signals. Active communication may comprise actively generating signals. The first controller can control a disengagement of the build module from the processing chamber. The second controller can control the printing of the at least one 3D object. The ambient environment can comprise a reactive agent that reacts with a starting material of the 3D printing. The at least one controller can be configured to control a pressure, a temperature, an amount of reactive agent, or any combination thereof in at least one of the first atmosphere, the second atmosphere, and the third atmosphere. The control can be before, during and/or after the printing. At least two of the first atmosphere, the second atmosphere, and the third atmosphere can be controlled by the same controller. At least two of the first atmosphere, the second atmosphere, and the third atmosphere can be controlled by different controllers. At least one of the first atmosphere, second atmosphere, and third atmosphere, (i) can be a non-reactive (e.g., inert) atmosphere, and (ii) can have a pressure above ambient pressure at least during the printing of the at least one 3D object. Non-reactive is described herein. The build module can comprise a first opening and a first shutter that reversibly shuts the first opening. The at least one controller can be configured to direct closure of the first shutter after the printing of the at least one 3D object, before disengagement of the build module from the processing chamber, or after the printing of the at least one 3D object and before disengagement of the build module from the processing chamber. At least one controller can be configured to control the second atmosphere to be above ambient pressure, after the printing of the at least one 3D object, before disengagement of the build module from the processing chamber, or after the printing of the at least one 3D object and before disengagement of the build module from the processing chamber. At least one controller can be configured to control the second atmosphere (i) to be non-reactive (e.g., inert), and (ii) to be above ambient pressure, after the printing of the at least one 3D object, before disengagement of the build module from the processing chamber, or after the printing of the at least one 3D object and before disengagement of the build module from the processing chamber. The processing chamber can comprise a second opening and a second shutter that reversibly shuts the second opening. At least one controller can be configured to direct closure of the second shutter after the printing of the at least one 3D object, before disengagement of the build module from the processing chamber, or after the printing of the at least one 3D object and before disengagement of the build module from the processing chamber. Non-reactive can be with a starting material of the at least one 3D object. Non-reactive can be with the remainder of the material bed that did not transform to form the at least one 3D object. A non-reactive atmosphere (as disclosed herein) may comprise a reactive agent below a threshold (e.g., as disclosed herein). The apparatus may further comprise at least one valve, sensor, or pressurized gas source. The at least one valve, sensor, or pressurized gas source may be coupled to the build module, processing chamber, and/or load lock.

In another aspect, a system for forming a at least one 3D object, comprises: a processing chamber comprising a first atmosphere; a build module that is reversibly connected to the processing chamber, wherein the build module comprises a second atmosphere; a load lock (e.g., comprising a partition that defines an internal load lock volume) comprising a third atmosphere, which load lock (I) is operatively coupled (e.g., connected) to the processing chamber or (II) is formed by engagement between the processing chamber and the build module; and at least one controller that is operatively coupled to the build module, the load lock, and the processing chamber, which at least one controller is programmed to direct performance of the following operations: operation (i) engage a build module with the processing chamber through the load lock, operation (ii) print the at least one 3D object at a pressure above ambient pressure, and operation (iii) disengage the build module comprising the at least one 3D object, from the processing chamber. Reversibly connected comprises the ability to connect and disconnect. The at least one controller may control a disengagement of the build module from the processing chamber (e.g., after the 3D printing). The at least one controller can be configured to control the second atmosphere (1) to be non-reactive with a starting material of the at least one three-dimensional object, (2) to be above ambient pressure, (3) to comprise a reactive agent below a threshold value, or (4) any combination thereof, at a time comprising: (a) after the printing of the at least one three-dimensional object, or (b) before disengagement of the build module from the processing chamber. The build module can comprise a first controller and the processing chamber can comprise a second controller that is separate from the first controller. The first controller can control a disengagement of the build module from the processing chamber. The first controller can be active or passive communication with the second controller (e.g., as disclosed herein). The second controller can be in active or passive communication with the first controller (e.g., as disclosed herein). The first controller and second controller can be separate controllers. The second controller can control the printing of the at least one 3D object. The ambient environment can comprise a reactive agent that reacts with a starting material of the 3D printing. At least one controller can control a pressure, a temperature, an amount of reactive agent, or any combination thereof, in: the first atmosphere, the second atmosphere, the third atmosphere, or any combination thereof (e.g., before, during and/or after the 3D printing). The control can be before, during and/or after the printing. At least two of the first atmosphere, the second atmosphere, and the third atmosphere can be controlled by the same controller. At least two of the first atmosphere, the second atmosphere, and the third atmosphere can be controlled by different controllers. At least one of the first atmosphere, second atmosphere, and third atmosphere, can have a pressure above ambient pressure at least during the printing of the at least one 3D object. At least one of the first atmosphere, second atmosphere, and third atmosphere, (a) can be a non-reactive (e.g., an inert) atmosphere, and (b) can have a pressure above ambient pressure at least during the printing of the at least one 3D object. The build module can comprise a first opening and a first shutter that reversibly shuts the first opening. The at least one controller can be configured to direct closure of the first shutter after the printing of the at least one 3D object, before disengagement of the build module from the processing chamber, or after the printing of the at least one 3D object and before disengagement of the build module from the processing chamber. At least one controller can be configured to control the second atmosphere to be above ambient pressure, after the printing of the at least one 3D object, before disengagement of the build module from the processing chamber, or after the printing of the at least one 3D object and before disengagement of the build module from the processing chamber. At least one controller can be configured to control the second atmosphere (I) to be non-reactive (e.g., inert), and (II) to be above ambient pressure, after the printing of the at least one 3D object, before disengagement of the build module from the processing chamber, or after the printing of the at least one 3D object and before disengagement of the build module from the processing chamber. The processing chamber can comprise a second opening and a second shutter that reversibly shuts the second opening. The at least one controller can be configured to direct closure of the second shutter after the printing of the at least one 3D object, before disengagement of the build module from the processing chamber, or after the printing of the at least one 3D object and before disengagement of the build module from the processing chamber. At least two of operation (i), operation (ii), and operation (iii) can be directed by the same controller. At least one controller can be a multiplicity of controllers and wherein at least two of operation (i), operation (ii), and operation (iii) are directed by different controllers. The control may include a control scheme comprising feedback or feed forward control. The control may include a control scheme comprising open loop or closed loop control. The control may comprise controlling at least one valve, sensor, or pressurized gas source. The valve, sensor, or pressurized gas source may be coupled to the build module, processing chamber, and/or load lock.

In another aspect, a computer software product for 3D printing of at least one 3D object, comprises a non-transitory computer-readable medium in which program instructions are stored, which instructions, when read by a computer, cause the computer to perform operations comprising: operation (a) direct engaging a build module to a processing chamber through a load lock, wherein the processing chamber comprises a first atmosphere, the build module comprises a second atmosphere, and the load lock comprises a third atmosphere; operation (b) direct printing of the at least one 3D object that is disposed adjacent to the platform, wherein the three-dimensional printing is at a pressure above ambient pressure; and operation (c) direct disengaging the build module from the processing chamber, which build module comprises the at least one 3D object.

The operations may further comprise direct controlling the second atmosphere (i) to be non-reactive with a starting material of the at least one three-dimensional object, (ii) to be above ambient pressure, (iii) to comprise a reactive agent below a threshold value, or (iv) any combination thereof, at a time comprising: (a) after the printing of the at least one three-dimensional object, or (b) before disengagement of the build module from the processing chamber. Disengaging can comprise disengaging from the load lock. The build module can comprise a first opening and a first shutter that reversibly shuts the first opening. The operation may comprise direct closure of the first shutter after the printing of the at least one 3D object, before disengagement of the build module from the processing chamber, or after the printing of the at least one 3D object and before disengagement of the build module from the processing chamber. The operation may comprise controlling the second atmosphere (e.g., using feedback loop control) to be above ambient pressure (e.g., by at least 0.3 PSI), after the printing of the at least one 3D object, before disengagement of the build module from the processing chamber, or after the printing of the at least one 3D object and before disengagement of the build module from the processing chamber. The operation may comprise control the second atmosphere (e.g., using feedback loop control) (i) to be non-reactive (e.g., inert), and (ii) to be above ambient pressure, after the printing of the at least one 3D object, before disengagement of the build module from the processing chamber, or after the printing of the at least one 3D object and before disengagement of the build module from the processing chamber. The processing chamber can comprise a second opening and a second shutter that reversibly shuts the second opening. The operations may comprise direct closure of the second shutter after the printing of the at least one 3D object, before disengagement of the build module from the processing chamber, or after the printing of the at least one 3D object and before disengagement of the build module from the processing chamber.

In another aspect, a method for 3D printing, comprises: (a) engaging a build module with a processing chamber through a load lock, wherein the processing chamber comprises a first atmosphere, the build module comprises a second atmosphere, and the load lock comprises a third atmosphere, wherein the build module comprises a platform; and operation (b) printing the at least one 3D object according to a 3D printing method, wherein the printing is at a pressure above ambient pressure, which at least one 3D object is printed adjacent to the platform and in the build module.

The method can further comprise controlling the second atmosphere (i) to be non-reactive with a starting material of the at least one three-dimensional object, (ii) to be above ambient pressure, (iii) to comprise a reactive agent below a threshold value, or (iv) any combination thereof, at a time comprising: (A) after the printing of the at least one three-dimensional object, or (B) before disengagement of the build module from the processing chamber. The method can further comprise vertically translating the platform during the printing. An ambient environment can comprise a reactive agent that reacts with a starting material (e.g., pre-transformed material) of the 3D printing. The method can further comprise controlling a pressure, a temperature, an amount of reactive agent, or any combination thereof, in at least one of: the first atmosphere, the second atmosphere, and the third atmosphere. Controlling can be before, during and/or after the printing. Two of the first atmosphere, the second atmosphere, and the third atmosphere can be controlled by the same controller. Each of the controllers can be in active or passive communication with the other (e.g., as disclosed herein). Two of the first atmosphere, the second atmosphere, and the third atmosphere can be controlled by different controllers. At least one of the first atmosphere, second atmosphere, and third atmosphere, (i) can be a non-reactive (e.g., inert) atmosphere, (ii) can have a pressure above ambient pressure at least during the printing of the at least one 3D object, (iii) can comprise a reactive agent below a threshold value, or (iv) any combination thereof. The build module can comprise a first opening and a first shutter that reversibly shuts the first opening. The method can further comprise closing the first shutter after the printing of the at least one 3D object, before disengagement of the build module from the processing chamber, or after the printing of the at least one 3D object and before disengagement of the build module from the processing chamber. The method can further comprise controlling the second atmosphere (i) to be non-reactive (e.g., as disclosed herein), (ii) to be above ambient pressure, (iii) to be non-reactive and above ambient pressure, (iv) to comprise a reactive agent below a threshold value, or (v) any combination thereof; after the printing of the at least one 3D object, before disengagement of the build module from the processing chamber, or after the printing of the at least one 3D object and before disengagement of the build module from the processing chamber. The processing chamber can comprise a second opening and a second shutter that reversibly shuts the second opening. The method can further comprise closing the second shutter after the printing of the at least one 3D object, before disengagement of the build module from the processing chamber, or after the printing of the at least one 3D object and before disengagement of the build module from the processing chamber.

In another aspect, a build module for enclosing at least one 3D object, the build module comprises: a partition that defines an internal volume, the internal volume configured to store the at least one 3D object in an internal atmosphere; a platform configured to support the at least one 3D object, which platform is controllably translatable; an opening within the partition, the opening having a shape and size suitable for passing the at least one 3D object therethrough; and a shutter configured to close the opening and form a separation between the internal atmosphere and an ambient atmosphere, wherein, when the shutter is closed, the build module is configured to (i) maintain the internal atmosphere at a positive pressure for at least 24 hours, (ii) maintain an oxygen concentration of at most 300 ppm within the internal atmosphere for at least 24 hours, (iii) prevent no more than 1000 micrograms of water per day from ingressing (e.g., entering) to the internal atmosphere, or (iv) any combination thereof.

The platform can be configured to facilitate 3D printing. The internal volume can be further configured to store a starting material for the at least one 3D object. The starting material can comprise a particulate material. The particulate material can be selected from at least one member of the group consisting of an elemental metal, a metal alloy, a ceramic, an allotrope of elemental carbon, a polymer, and a resin. The build module can further comprise a lifting mechanism that is configured to move the at least one 3D object within the internal volume. The lifting mechanism can be configured to move the at least one 3D object in accordance with a vertical axis. The lifting mechanism can comprise an actuator configured to facilitate movement of the at least one 3D object. The lifting mechanism can comprise a drive mechanism or a guide mechanism. The drive mechanism can comprise a lead screw or a scissor jack. The guide mechanism can comprise a rail or a linear bearing. The platform can be coupled with the lifting mechanism. The platform can comprise a substrate configured to support the at least one 3D object. The platform can comprise a base that is detachably coupled with the substrate. The at least one three-dimensional object can be formed using three-dimensional printing, wherein the internal atmosphere is non-reactive with the pre-transformed material at least during the three-dimensional printing. The internal volume can comprise the pre-transformed material and the at least one three-dimensional object. The build module can further comprise at least one oxygen sensor configured to detect a concentration of the oxygen within the internal atmosphere. The stored pre-transformed material may not deteriorate to a detectable degree during the storage. The build module can be configured to store the pre-transformed material such that the stored pre-transformed material can be recycled and used in printing a subsequent three-dimensional object. The stored pre-transformed material can be used without causing defects in material properties or physical properties of a subsequently printed 3D object. The build module can be configured to be stored at an ambient temperature. Separation can comprise a gas-tight seal. The build module can further comprise at least one moisture sensor configured to detect liquid water or vapor water concentration within the internal atmosphere. The build module can further comprise an opening port that is configured to allow gas to pass to and/or from the internal volume. The build module can be configured to maintain an atmosphere for a period of at least three days. The build module can further comprise at least one sensor configured to detect qualities of the internal atmosphere within the internal volume. The qualities can comprise pressure, temperature, types or amounts of reactive agent, or any combination thereof. The build module can further comprise at least one controller configured to control qualities of the internal atmosphere within the internal volume. The qualities can comprise pressure, temperature, types or reactive agents, amounts of reactive agent, or any combination thereof. The build module can further comprise a coupling mechanism that is configured to operatively couple the build module to a processing chamber. The at least one three-dimensional objects formed by three-dimensional printing in an enclosure can comprise the build module and the processing chamber. When the shutter is closed, the build module can be configured to maintain an oxygen concentration of at most 150 ppm within the internal atmosphere.

In another aspect, a method of storing a pre-transformed material within a build module, the method comprises: coupling the build module to a processing chamber to form an enclosure; printing the at least one three-dimensional object using three-dimensional printing in the enclosure; translating the at least one three-dimensional object into an internal volume of the build module, wherein the internal volume is defined by a wall of the build module; and closing an opening of the build module using a shutter to form a separation between an internal atmosphere within the internal volume and an ambient atmosphere wherein, when the shutter is closed, the build module (i) is maintaining the internal atmosphere at a positive pressure for at one day (e.g., 24 hours), (ii) is maintaining an oxygen concentration of no more than 300 ppm within the internal atmosphere for at least one day, (iii) prevents no more than 1000 micrograms of water per day from ingressing within the internal atmosphere, or (iv) any suitable combination of (i), (ii), and (iii).

Closing the build module can comprise enclosing (I) a remainder of a material bed used for the three-dimensional printing, and (II) the at least one three-dimensional object, within the internal volume. When the shutter is closed, the build module (i) can maintain the internal atmosphere at a positive pressure for at least three days, (ii) can maintain an oxygen concentration of no more than 300 ppm within the internal atmosphere for at least three days, or (iii) can maintain the internal atmosphere at a positive pressure for at least three days and maintains an oxygen concentration of no more than 300 ppm within the internal atmosphere for at least three days. The material bed can comprise a particulate material. The particulate material can be selected from at least one member of the group consisting of an elemental metal, a metal alloy, a ceramic, an allotrope of elemental carbon, a polymer, and a resin. Coupling the build module to the processing chamber can comprise using a coupling mechanism. Coupling the build module to the processing chamber can be through a load lock. Printing the at least one three-dimensional object can comprise lifting the at least one three-dimensional object using a lifting mechanism in the build module. The build module can be reversibly attachable to the processing chamber. The method can further comprise printing a subsequent at least one three-dimensional object using at least a portion of the remainder. Closing the opening can comprise sealing the opening. The sealing can comprise forming a gas-tight seal. Translating the at least one three-dimensional object and the remainder of the powder bed in the build module can comprise moving the at least one three-dimensional object and the remainder within the internal volume using a lifting mechanism. Moving the at least one three-dimensional object and the remainder can comprise moving in accordance with a vertical axis. The method can further comprise controlling at least one characteristic of the internal volume of the build module by coupling the build module to a pressurized gas source. At least one characteristic can comprise pressure, temperature, types of a reactive agent, amount of the reactive agent, or rate of ingress of the reactive agent into the build module. The reactive agent can comprise water or oxygen. The method can further comprise controlling at least one characteristic of the internal atmosphere within the internal volume. At least one characteristic can comprise pressure, temperature, types of the reactive agent, amounts of the reactive agent, or rate of ingress of the reactive agent into the build module. The coupling can be before the printing. The method can further comprise, after the build module is closed, transiting the build module. The transiting can comprise using a motorized vehicle, manually transiting, transiting using a conveyor, transiting using a robot, or any combination thereof. The internal volume can be maintained at the positive pressure during the printing, the transiting, the closing, or any combination thereof. The coupling can be manually and/or automatically controlled. Closing the opening of the build module can operatively decouple the build module from the processing chamber. The positive pressure can be provided by a pressurized gas source operatively coupled to the build module. The pressurized gas source can comprise a pump or a compressed gas cylinder. The positive pressure can be controlled by at least one gas-valve between the pressurized gas source and the internal volume of the build module. The method can further comprise, after the build module can be closed, transiting the build module. The build module can be detached from the pressurized gas source during the transiting. The method can further comprise, after the build module can be closed, transiting the build module. The build module can be operatively coupled to the pressurized gas source during the transiting.

In another aspect, a system used in 3D printing of at least one 3D object comprises any combination of the apparatuses disclosed herein.

In another aspect, a system used in 3D printing of at least one 3D object comprises any combination of the apparatuses and the computer software disclosed herein.

In another aspect, a computer software product for 3D printing of at least one 3D object, comprising a non-transitory computer-readable medium in which program instructions are stored, which instructions, when read by a computer, cause the computer to perform any of the methods disclosed herein.

In another aspect, a computer software product for 3D printing of at least one 3D object, comprising a non-transitory computer-readable medium in which program instructions are stored, which instructions, when read by a computer, cause the computer to direct operations of any of the apparatuses disclosed herein.

Another aspect of the present disclosure provides systems, apparatuses, controllers, and/or non-transitory computer-readable medium (e.g., software) that implement any of the methods disclosed herein.

In another aspect, an apparatus for printing one or more 3D objects comprises a controller that is programmed to direct a mechanism used in a 3D printing methodology to implement (e.g., effectuate) any of the method disclosed herein, wherein the controller is operatively coupled to the mechanism.

In another aspect, a computer software product, comprising a non-transitory computer-readable medium in which program instructions are stored, which instructions, when read by a computer, cause the computer to direct a mechanism used in the 3D printing process to implement (e.g., effectuate) any of the method disclosed herein, wherein the non-transitory computer-readable medium is operatively coupled to the mechanism.

Another aspect of the present disclosure provides a non-transitory computer-readable medium comprising machine-executable code that, upon execution by one or more computer processors, implements any of the methods disclosed herein.

Another aspect of the present disclosure provides a computer system comprising one or more computer processors and a non-transitory computer-readable medium coupled thereto. The non-transitory computer-readable medium comprises machine-executable code that, upon execution by the one or more computer processors, implements any of the methods disclosed herein.

In some embodiments, the term "3D object" may refer to one or more 3D objects.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF DRAWINGS

The novel features of the invention(s) are set forth with particularity in the appended claims. A better understanding of the features and advantages of the present invention(s) will be obtained by reference to the following detailed description that sets forth illustrative embodiments, in which the principles of the invention(s) are utilized, and the accompanying drawings or figures (also "Fig." and "Figs." herein), of which:

Figure 1:
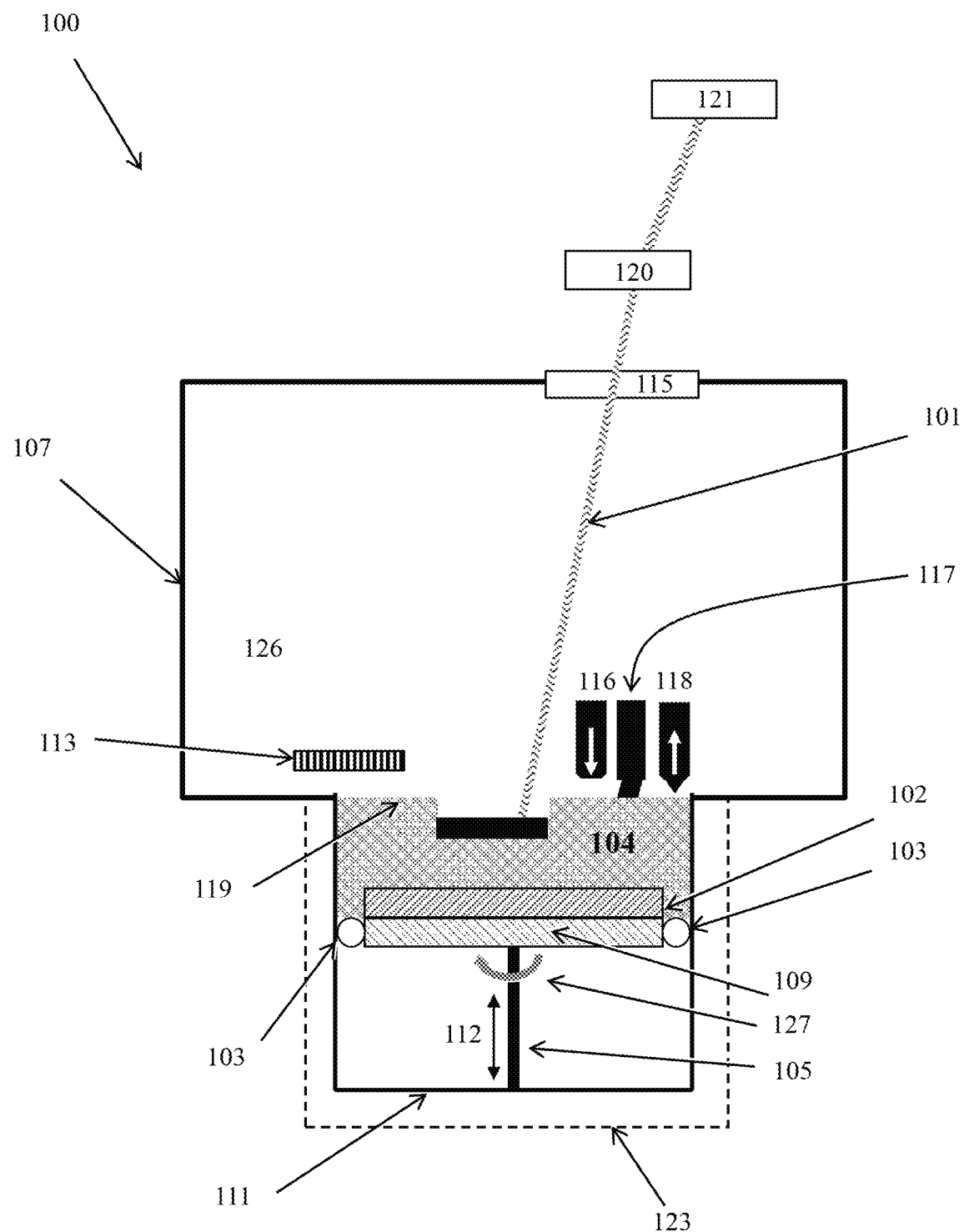
FIG. 1 schematically illustrates a vertical cross section of a three-dimensional (3D) printing system and its components.

The figures and components therein may not be drawn to scale. Various components of the figures described herein may not be drawn to scale.

DETAILED DESCRIPTION

While various embodiments of the invention(s) have been shown, and described herein, it will be obvious to those skilled in the art that such embodiments are provided by way of example only. Numerous variations, changes, and substitutions may occur to those skilled in the art without departing from the invention(s). It should be understood that various alternatives to the embodiments of the invention(s) described herein might be employed.

Terms such as "a", "an" and "the" are not intended to refer to only a singular entity, but include the general class of which a specific example may be used for illustration. The terminology herein is used to describe specific embodiments of the invention(s), but their usage does not delimit the invention(s).

When ranges are mentioned, the ranges are meant to be inclusive, unless otherwise specified. For example, a range between value 1 and value 2 is meant to be inclusive and include value 1 and value 2. The inclusive range will span any value from about value 1 to about value 2. The term "adjacent" or "adjacent to," as used herein, includes 'next to', 'adjoining', 'in contact with', and 'in proximity to.' When "and/or" is used in a sentence such as X and/or Y, the phrase means: X, Y, or any combination thereof.

The term "operatively coupled" or "operatively connected" refers to a first mechanism that is coupled (or connected) to a second mechanism to allow the intended operation of the second and/or first mechanism.

Performing a reversible first operation is understood herein to mean performing the first operation and being capable of performing the opposite of that first operation (e.g., which is a second operation). For example, when a controller directs reversibly opening a shutter, that shutter can also close and the controller can optionally direct a closure of that shutter.

The present disclosure provides three-dimensional (3D) printing apparatuses, systems, software, and methods for forming a 3D object. For example, a 3D object may be formed by sequential addition of material or joining of pre-transformed material to form a structure in a controlled manner (e.g., under manual or automated control). Pre-transformed material, as understood herein, is a material before it has been transformed during the 3D printing process. The transformation can be effectuated by utilizing an energy beam and/or flux. The pre-transformed material may be a material that was, or was not, transformed prior to its use in a 3D printing process. The pre-transformed material may be a starting material for the 3D printing process.

In some embodiments, a 3D printing process, the deposited pre-transformed material is fused, (e.g., sintered or melted), bound or otherwise connected to form at least a portion of the desired 3D object. Fusing, binding or otherwise connecting the material is collectively referred to herein as "transforming" the material. Fusing the material may refer to melting, smelting, or sintering a pre-transformed material. Melting may comprise liquefying the material (i.e., transforming to a liquefied state). A liquefied state refers to a state in which at least a portion of a transformed material is in a liquid state. Melting may comprise liquidizing the material (i.e., transforming to a liquidus state). A liquidus state refers to a state in which an entire transformed material is in a liquid state. The apparatuses, methods, software, and/or systems provided herein are not limited to the generation of a single 3D object, but are may be utilized to generate one or more 3D objects simultaneously (e.g., in parallel) or separately (e.g., sequentially). The multiplicity of 3D object may be formed in one or more material beds (e.g., powder bed). In some embodiments, a plurality of 3D objects is formed in one material bed.

In some embodiments, 3D printing methodologies comprise extrusion, wire, granular, laminated, light polymerization, or powder bed and inkjet head 3D printing. Extrusion 3D printing can comprise robo-casting, fused deposition modeling (FDM) or fused filament fabrication (FFF). Wire 3D printing can comprise electron beam freeform fabrication (EBF3). Granular 3D printing can comprise direct metal laser sintering (DMLS), electron beam melting (EBM), selective laser melting (SLM), selective heat sintering (SHS), or selective laser sintering (SLS). Powder bed and inkjet head 3D printing can comprise plaster-based 3D printing (PP). Laminated 3D printing can comprise laminated object manufacturing (LOM). Light polymerized 3D printing can comprise stereo-lithography (SLA), digital light processing (DLP), or laminated object manufacturing (LOM). 3D printing methodologies can comprise Direct Material Deposition (DMD). The Direct Material Deposition may comprise, Laser Metal Deposition (LMD, also known as, Laser deposition welding). 3D printing methodologies can comprise powder feed, or wire deposition.

In some embodiments, the 3D printing methodologies differ from methods traditionally used in semiconductor device fabrication (e.g., vapor deposition, etching, annealing, masking, or molecular beam epitaxy). In some instances, 3D printing may further comprise one or more printing methodologies that are traditionally used in semiconductor device fabrication. 3D printing methodologies can differ from vapor deposition methods such as chemical vapor deposition, physical vapor deposition, or electrochemical deposition. In some instances, 3D printing may further include vapor deposition methods.

In some embodiments, the deposited pre-transformed material within the enclosure is a liquid material, semi-solid material (e.g., gel), or a solid material (e.g., powder). The deposited pre-transformed material within the enclosure can be in the form of a powder, wires, sheets, or droplets. The material (e.g., pre-transformed, transformed, and/or hardened) may comprise elemental metal, metal alloy, ceramics, or an allotrope of elemental carbon. The allotrope of elemental carbon may comprise amorphous carbon, graphite, graphene, diamond, or fullerene. The fullerene may be selected from the group consisting of a spherical, elliptical, linear, and tubular fullerene. The fullerene may comprise a buckyball, or a carbon nanotube. The ceramic material may comprise cement. The ceramic material may comprise alumina, zirconia, or carbide (e.g., silicon carbide, or tungsten carbide). The ceramic material may include high performance material (HPM). The ceramic material may include a nitride (e.g., boron nitride or aluminum nitride). The material may comprise sand, glass, or stone. In some embodiments, the material may comprise an organic material, for example, a polymer or a resin (e.g., 114 W resin). The organic material may comprise a hydrocarbon. The polymer may comprise styrene or nylon (e.g., nylon 11). The polymer may comprise a thermoplastic material. The organic material may comprise carbon and hydrogen atoms. The organic material may comprise carbon and oxygen atoms. The organic material may comprise carbon and nitrogen atoms. The organic material may comprise carbon and sulfur atoms. In some embodiments, the material may exclude an organic material. The material may comprise a solid or a liquid. In some embodiments, the material may comprise a silicon-based material, for example, silicon based polymer or a resin. The material may comprise an organosilicon-based material. The material may comprise silicon and hydrogen atoms. The material may comprise silicon and carbon atoms. In some embodiments, the material may exclude a silicon-based material. The powder material may be coated by a coating (e.g., organic coating such as the organic material (e.g., plastic coating)). The material may be devoid of organic material. The liquid material may be compartmentalized into reactors, vesicles, or droplets. The compartmentalized material may be compartmentalized in one or more layers. The material may be a composite material comprising a secondary material. The secondary material can be a reinforcing material (e.g., a material that forms a fiber). The reinforcing material may comprise a carbon fiber, Kevlar®, Twaron®, ultra-high-molecular-weight polyethylene, or glass fiber. The material can comprise powder (e.g., granular material) and/or wires. The bound material can comprise chemical bonding. Transforming can comprise chemical bonding. Chemical bonding can comprise covalent bonding. The pre-transformed material may be pulverous. The printed 3D object can be made of a single material (e.g., single material type) or multiple materials (e.g., multiple material types). Sometimes one portion of the 3D object and/or of the material bed may comprise one material, and another portion may comprise a second material different from the first material. The material may be a single material type (e.g., a single alloy or a single elemental metal). The material may comprise one or more material types. For example, the material may comprise two alloys, an alloy and an elemental metal, an alloy and a ceramic, or an alloy and an elemental carbon. The material may comprise an alloy and alloying elements (e.g., for inoculation). The material may comprise blends of material types. The material may comprise blends with elemental metal or with metal alloy. The material may comprise blends excluding (e.g., without) elemental metal or including (e.g., with) metal alloy. The material may comprise a stainless steel. The material may comprise a titanium alloy, aluminum alloy, and/or nickel alloy.

In some cases, a layer within the 3D object comprises a single type of material. In some examples, a layer of the 3D object may comprise a single elemental metal type, or a single alloy type. In some examples, a layer within the 3D object may comprise several types of material (e.g., an elemental metal and an alloy, an alloy and a ceramic, an alloy, and an elemental carbon). In certain embodiments, each type of material comprises only a single member of that type. For example: a single member of elemental metal (e.g., iron), a single member of metal alloy (e.g., stainless steel), a single member of ceramic material (e.g., silicon carbide or tungsten carbide), or a single member of elemental carbon (e.g., graphite). In some cases, a layer of the 3D object comprises more than one type of material. In some cases, a layer of the 3D object comprises more than member of a type of material.

In some examples the material bed, platform, or both material bed and platform comprise a material type which constituents (e.g., atoms) readily lose their outer shell electrons, resulting in a free-flowing cloud of electrons within their otherwise solid arrangement. In some examples, the powder, the base, or both the powder and the base comprise a material characterized in having high electrical conductivity, low electrical resistivity, high thermal conductivity, or high density. The high electrical conductivity can be at least about $1*10^5$ Siemens per meter (S/m), $5*10^5$ S/m, $1*10^6$ S/m, $5*10^6$ S/m, $1*10^7$ S/m, $5*10^7$ S/m, or $1*10^8$ S/m. The symbol "*" designates the mathematical operation "times." The high electrical conductivity can be between any of the afore-mentioned electrical conductivity values (e.g., from about $1*10^5$ S/m to about $1*10^8$ S/m). The thermal conductivity, electrical resistivity, electrical conductivity, electrical resistivity, and/or density can be measured at ambient temperature (e.g., at R.T., or 20° C.). The low electrical resistivity may be at most about $1*10^{-5}$ ohm times meter ($\Omega$*m), $5*10^{-6}$ $\Omega$*m, $1*10^{-6}$ $\Omega$*m, $5*10^{-7}$ $\Omega$*m, $1*10^{-7}$ $\delta$*m, $5*10^{-8}$ or $1*10^{-8}$ $\Omega$*m. The low electrical resistance can be between any of the afore-mentioned values (e.g., from about $1\times10^{-5}$ $\Omega$*m to about $1\times10^{-8}$ $\Omega$*m). The high thermal conductivity may be at least about 10 Watts per meter times Kelvin (W/mK), 15 W/mK, 20 W/mK, 35 W/mK, 50 W/mK, 100 W/mK, 150 W/mK, 200 W/mK, 205 W/mK, 300 W/mK, 350 W/mK, 400 W/mK, 450 W/mK, 500 W/mK, 550 W/mK, 600 W/mK, 700 W/mK, 800 W/mK, 900 W/mK, or 1000 W/mK. The high thermal conductivity can be between any of the afore-mentioned thermal conductivity values (e.g., from about 20 W/mK to about 1000 W/mK). The high density may be at least about 1.5 grams per cubic centimeter (g/cm$^3$), 1.7 g/cm$^3$, 2 g/cm$^3$, 2.5 g/cm$^3$, 2.7 g/cm$^3$, 3 g/cm$^3$, 4 g/cm$^3$, 5 g/cm$^3$, 6 g/cm$^3$, 7 g/cm$^3$, 8 g/cm$^3$, 9 g/cm$^3$, 10 g/cm$^3$, 11 g/cm$^3$, 12 g/cm$^3$, 13 g/cm$^3$, 14 g/cm$^3$, 15 g/cm$^3$, 16 g/cm$^3$, 17 g/cm$^3$, 18 g/cm$^3$, 19 g/cm$^3$, 20 g/cm$^3$, or 25 g/cm$^3$. The high density can be any value between the afore mentioned values (e.g., from about 1 g/cm$^3$ to about 25 g/cm$^3$).

The elemental metal can be an alkali metal, an alkaline earth metal, a transition metal, a rare-earth element metal, or another metal. The alkali metal can be Lithium, Sodium, Potassium, Rubidium, Cesium, or Francium. The alkali earth metal can be Beryllium, Magnesium, Calcium, Strontium, Barium, or Radium. The transition metal can be Scandium, Titanium, Vanadium, Chromium, Manganese, Iron, Cobalt, Nickel, Copper, Zinc, Yttrium, Zirconium, Platinum, Gold, Rutherfordium, Dubnium, Seaborgium, Bohrium, Hassium, Meitnerium, Ununbium, Niobium, Iridium, Molybdenum, Technetium, Ruthenium, Rhodium, Palladium, Silver, Cadmium, Hafnium, Tantalum, Tungsten, Rhenium, or Osmium. The transition metal can be mercury. The rare-earth metal can be a lanthanide or an actinide. The antinode metal can be Lanthanum, Cerium, Praseodymium, Neodymium, Promethium, Samarium, Europium, Gadolinium, Terbium, Dysprosium, Holmium, Erbium, Thulium, Ytterbium, or Lutetium. The actinide metal can be Actinium, Thorium, Protactinium, Uranium, Neptunium, Plutonium, Americium, Curium, Berkelium, Californium, Einsteinium, Fermium, Mendelevium, Nobelium, or Lawrencium. The other metal can be Aluminum, Gallium, Indium, Tin, Thallium, Lead, or Bismuth. The material may comprise a precious metal. The precious metal may comprise gold, silver, palladium, ruthenium, rhodium, osmium, iridium, or platinum. The material may comprise at least about 40%, 50%, 60%, 70%, 80%, 90%, 95%, 97%, 98%, 99%, 99.5% or more precious metal. The powder material may comprise at most about 40%, 50%, 60%, 70%, 80%, 90%, 95%, 97%, 98%, 99%, 99.5% or less precious metal. The material may comprise precious metal with any value in between the afore-mentioned values. The material may comprise at least a minimal percentage of precious metal according to the laws in the particular jurisdiction.

The metal alloy can comprise iron based alloy, nickel based alloy, cobalt based alloy, chrome based alloy, cobalt chrome based alloy, titanium based alloy, magnesium based alloy, or copper based alloy. The alloy may comprise an oxidation or corrosion resistant alloy. The alloy may comprise a super alloy (e.g., Inconel). The super alloy may comprise Inconel 600, 617, 625, 690, 718 or X-750. The alloy may comprise an alloy used for aerospace applications, automotive application, surgical application, or implant applications. The metal may include a metal used for aerospace applications, automotive application, surgical application, or implant applications. The super alloy may comprise IN 738 LC, IN 939, Rene 80, IN 6203 (e.g., IN 6203 DS), PWA 1483 (e.g., PWA 1483 SX), or Alloy 247.

The metal alloys can be Refractory Alloys. The refractory metals and alloys may be used for heat coils, heat exchangers, furnace components, or welding electrodes. The Refractory Alloys may comprise a high melting points, low coefficient of expansion, mechanically strong, low vapor pressure at elevated temperatures, high thermal conductivity, or high electrical conductivity.

In some embodiments, the material (e.g., alloy or elemental) comprises a material used for applications in industries comprising aerospace (e.g., aerospace super alloys), jet engine, missile, automotive, marine, locomotive, satellite, defense, oil & gas, energy generation, semiconductor, fashion, construction, agriculture, printing, or medical. The material may comprise an alloy used for products comprising, devices, medical devices (human & veterinary), machinery, cell phones, semiconductor equipment, generators, engines, pistons, electronics (e.g., circuits), electronic equipment, agriculture equipment, motor, gear, transmission, communication equipment, computing equipment (e.g., laptop, cell phone, tablet), air conditioning, generators, furniture, musical equipment, art, jewelry, cooking equipment, or sport gear. The material may comprise an alloy used for products for human or veterinary applications comprising implants, or prosthetics. The metal alloy may comprise an alloy used for applications in the fields comprising human or veterinary surgery, implants (e.g., dental), or prosthetics.

In some examples, the alloy includes a high-performance alloy. The alloy may include an alloy exhibiting at least one of excellent mechanical strength, resistance to thermal creep deformation, good surface stability, resistance to corrosion, and resistance to oxidation. The alloy may include a face-centered cubic austenitic crystal structure. The alloy may comprise Hastelloy, Inconel, Waspaloy, Rene alloy (e.g., Rene-80, Rene-77, Rene-220, or Rene-41), Haynes alloy, Incoloy, MP98T, TMS alloy, MTEK (e.g., MTEK grade MAR-M-247, MAR-M-509, MAR-M-R41, or MAR-M-X-45), or CMSX (e.g., CMSX-3, or CMSX-4). The alloy can be a single crystal alloy.

In some instances, the iron-based alloy can comprise Elinvar, Fernico, Ferroalloys, Invar, Iron hydride, Kovar, Spiegeleisen, Staballoy (stainless steel), or Steel. In some instances, the metal alloy is steel. The Ferroalloy may comprise Ferroboron, Ferrocerium, Ferrochrome, Ferromagnesium, Ferromanganese, Ferromolybdenum, Ferronickel, Ferrophosphorus, Ferrosilicon, Ferrotitanium, Ferrouranium, or Ferrovanadium. The iron-based alloy may include cast iron or pig iron. The steel may include Bulat steel, Chromoly, Crucible steel, Damascus steel, Hadfield steel, High speed steel, HSLA steel, Maraging steel, Maraging steel (M300), Reynolds 531, Silicon steel, Spring steel, Stainless steel, Tool steel, Weathering steel, or Wootz steel. The high-speed steel may include Mushet steel. The stainless steel may include AL-6XN, Alloy 20, celestrium, marine grade stainless, Martensitic stainless steel, surgical stainless steel, or Zeron 100. The tool steel may include Silver steel. The steel may comprise stainless steel, Nickel steel, Nickel-chromium steel, Molybdenum steel, Chromium steel, Chromium-vanadium steel, Tungsten steel, Nickel-chromium-molybdenum steel, or Silicon-manganese steel. The steel may be comprised of any Society of Automotive Engineers (SAE) grade such as 440F, 410, 312, 430, 440A, 440B, 440C, 304, 305, 304L, 304L, 301, 304LN, 301LN, 2304, 316, 316L, 316LN, 317L, 2205, 409, 904L, 321, 254SMO, 316Ti, 321H, 17-4, 15-5, 420 or 304H. The steel may comprise stainless steel of at least one crystalline structure selected from the group consisting of austenitic, superaustenitic, ferritic, martensitic, duplex and precipitation-hardening martensitic. Duplex stainless steel may be lean duplex, standard duplex, super duplex, or hyper duplex. The stainless steel may comprise surgical grade stainless steel (e.g., austenitic 316, martensitic 420 or martensitic 440). The austenitic 316 stainless steel may include 316L or 316LVM. The steel may include 17-4 Precipitation Hardening steel (also known as type 630 is a chromium-copper precipitation hardening stainless steel, or 17-4PH steel). The stainless steel may comprise 360L stainless steel.

In some examples, the titanium-based alloys include alpha alloys, near alpha alloys, alpha and beta alloys, or beta alloys. The titanium alloy may comprise grade 1, 2, 2H, 3, 4, 5, 6, 7, 7H, 8, 9, 10, 11, 12, 13, 14, 15, 16, 16H, 17, 18, 19, 20, 21, 2, 23, 24, 25, 26, 26H, 27, 28, 29, 30, 31, 32, 33, 34, 35, 36, 37, 38 or higher. In some instances, the titanium base alloy includes $TiAl_6V_4$ or $TiAl_6Nb_7$.

In some examples, the Nickel based alloy includes Alnico, Alumel, Chromel, Cupronickel, Ferronickel, German silver, Hastelloy, Inconel, Monel metal, Nichrome, Nickel-carbon, Nicrosil, Nisil, Nitinol, Hastelloy X, Cobalt-Chromium or Magnetically "soft" alloys. The magnetically "soft" alloys may comprise Mu-metal, Permalloy, Supermalloy, or Brass. The Brass may include nickel hydride, stainless or coin silver. The cobalt alloy may include Megallium, Stellite (e.g. Talonite), Ultimet, or Vitallium. The chromium alloy may include chromium hydroxide, or Nichrome.

In some examples, the aluminum-based alloy includes AA-8000, Al—Li (aluminum-lithium), Alnico, Duralumin, Hiduminium, Kryron Magnalium, Nambe, Scandium-aluminum, or, Y alloy. The magnesium alloy may be Elektron, Magnox or T-Mg—Al—Zn (Bergman phase) alloy. At times, the material excludes at least one aluminum-based alloy (e.g., $AlSi_{10}Mg$).

In some examples, the copper based alloy comprises Arsenical copper, Beryllium copper, Billon, Brass, Bronze, Constantan, Copper hydride, Copper-tungsten, Corinthian bronze, Cunife, Cupronickel, Cymbal alloys, Devarda's alloy, Electrum, Hepatizon, Heusler alloy, Manganin, Molybdochalkos, Nickel silver, Nordic gold, Shakudo or Tumbaga. The Brass may include Calamine brass, Chinese silver, Dutch metal, Gilding metal, Muntz metal, Pinchbeck, Prince's metal, or Tombac. The Bronze may include Aluminum bronze, Arsenical bronze, Bell metal, Florentine bronze, Guanin, Gunmetal, Glucydur, Phosphor bronze, Ormolu, or Speculum metal. The elemental carbon may comprise graphite, Graphene, diamond, amorphous carbon, carbon fiber, carbon nanotube, or fullerene. The copper alloy may be a high-temperature copper alloy (e.g., GRCop-84).

In some embodiments, the pre-transformed (e.g., powder) material (also referred to herein as a "pulverous material") comprises a solid comprising fine particles. The powder may be a granular material. The powder can be composed of individual particles. At least some of the particles can be spherical, oval, prismatic, cubic, or irregularly shaped. At least some of the particles can have a fundamental length scale (e.g., diameter, spherical equivalent diameter, length, width, or diameter of a bounding sphere). The fundamental length scale (abbreviated herein as "FLS") of at least some of the particles can be from about 1 nanometers (nm) to about 1000 micrometers (microns), 500 microns, 400 microns, 300 microns, 200 microns, 100 microns, 50 microns, 40 microns, 30 microns, 20 microns, 10 microns, 1 micron, 500 nm, 400 nm, 300 nm, 200 nm, 100 nm, 50 nm, 40 nm, 30 nm, 20 nm, 10 nm, or 5 nm. At least some of the particles can have a FLS of at least about 1000 micrometers (microns), 500 microns, 400 microns, 300 microns, 200 microns, 100 microns, 50 microns, 40 microns, 30 microns, 20 microns, 10 microns, 1 micron, 500 nm, 400 nm, 300 nm, 200 nm, 100 nm, 50 nm, 40 nm, 30 nm, 20 nm, 10 nm, 5 nanometers (nm) or more. At least some of the particles can have a FLS of at most about 1000 micrometers (microns), 500 microns, 400 microns, 300 microns, 200 microns, 100 microns, 50 microns, 40 microns, 30 microns, 20 microns, 10 microns, 1 micron, 500 nm, 400 nm, 300 nm, 200 nm, 100 nm, 50 nm, 40 nm, 30 nm, 20 nm, 10 nm, 5 nm or less. In some cases, at least some of the powder particles may have a FLS in between any of the afore-mentioned FLSs.

In some embodiments, the pre-transformed material is composed of a homogenously shaped particle mixture such that all of the particles have substantially the same shape and FLS magnitude within at most about 1%, 5%, 8%, 10%, 15%, 20%, 25%, 30%, 35%, 40%, 50%, 60%, 70%, or less distribution of FLS. In some cases, the powder can be a heterogeneous mixture such that the particles have variable shape and/or FLS magnitude. In some examples, at least about 30%, 40%, 50%, 60%, or 70% (by weight) of the particles within the powder material have a largest FLS that is smaller than the median largest FLS of the powder material. In some examples, at least about 30%, 40%, 50%, 60%, or 70% (by weight) of the particles within the powder material have a largest FLS that is smaller than the mean largest FLS of the powder material.

In some examples, the size of the largest FLS of the transformed material (e.g., height) is greater than the average largest FLS of the powder material by at least about 1.1 times, 1.2 times, 1.4 times, 1.6 times, 1.8 times, 2 times, 4 times, 6 times, 8 times, or 10 times. In some examples, the size of the largest FLS of the transformed material is greater than the median largest FLS of the powder material by at most about 1.1 times, 1.2 times, 1.4 times, 1.6 times, 1.8 times, 2 times, 4 times, 6 times, 8 times, or 10 times. The powder material can have a median largest FLS that is at least about 1 μm, 5 μm, 10 μm, 20 μm, 30 μm, 40 μm, 50 μm, 100 μm, or 200 μm. The powder material can have a median largest FLS that is at most about 1 μm, 5 μm, 10 μm, 20 μm, 30 μm, 40 μm, 50 μm, 100 μm, or 200 μm. In some cases, the powder particles may have a FLS in between any of the FLS listed above (e.g., from about 1 μm to about 200 μm, from about 1 μm to about 50 μm, or from about 5 μm to about 40 μm).

In another aspect provided herein is a method for generating a 3D object comprising: a) depositing a layer of pre-transformed material in an enclosure (e.g., to form a material bed such as a powder bed); b) providing energy (e.g., using an energy beam) to at least a portion of the layer of pre-transformed material according to a path for transforming the at least a portion of the layer of pre-transformed material to form a transformed material as at least a portion of the 3D object; and c) optionally repeating operations a) to b) to generate the 3D object. The method may further comprise after operation b) and before operation c): allowing the transformed material to harden into a hardened material that forms at least a portion of the 3D object. The enclosure may comprise at least one chamber. The enclosure (e.g., the chamber) may comprise a building platform (e.g., a substrate and/or base). The 3D object may be printed adjacent to (e.g., above) the building platform.

In another aspect provided herein is a system for generating a 3D object comprising: an enclosure for accommodating at least one layer of pre-transformed material (e.g., powder); an energy (e.g., energy beam) capable of transforming the pre-transformed material to form a transformed material; and a controller that directs the energy to at least a portion of the layer of pre-transformed material according to a path (e.g., as described herein). The transformed material may be capable of hardening to form at least a portion of a 3D object. The system may comprise an energy source, an optical system, a temperature control system, a material delivery mechanism (e.g., a recoater, or a layer dispensing mechanism), a pressure control system, an atmosphere control system, an atmosphere, a pump, a nozzle, a valve, a sensor, a central processing unit, a display, a chamber, or an algorithm. The chamber may comprise a building platform. The system for generating a 3D object and its components may be any 3D printing system such as, for example, the one described in Patent Application serial number PCT/US15/36802 filed on Jun. 19, 2015, titled "APPARATUSES, SYSTEMS AND METHODS FOR THREE-DIMENSIONAL PRINTING" or in Provisional Patent Application Ser. No. 62/317,070 filed Apr. 1, 2016, titled "APPARATUSES, SYSTEMS AND METHODS FOR EFFICIENT THREE-DIMENSIONAL PRINTING", both of which are entirely incorporated herein by references. The FLS (e.g., width, depth, and/or height) of the material bed can be at least about 50 millimeters (mm), 60 mm, 70 mm, 80 mm, 90 mm, 100 mm, 200 mm, 250 mm, 280 mm, 400 mm, 500 mm, 800 mm, 900 mm, 1 meter (m), 2 m or 5 m. The FLS (e.g., width, depth, and/or height) of the material bed can be at most about 50 millimeters (mm), 60 mm, 70 mm, 80 mm, 90 mm, 100 mm, 200 mm, 250 mm, 280 mm, 400 mm, 500 mm, 800 mm, 900 mm, 1 meter (m), 2 m or 5 m. The FLS of the material bed can be between any of the afore-mentioned values (e.g., from about 50 mm to about 5 m, from about 250 mm to about 500 mm, from about 280 mm to about 1 m, or from about 500 mm to about 5 m).

Figure 2:
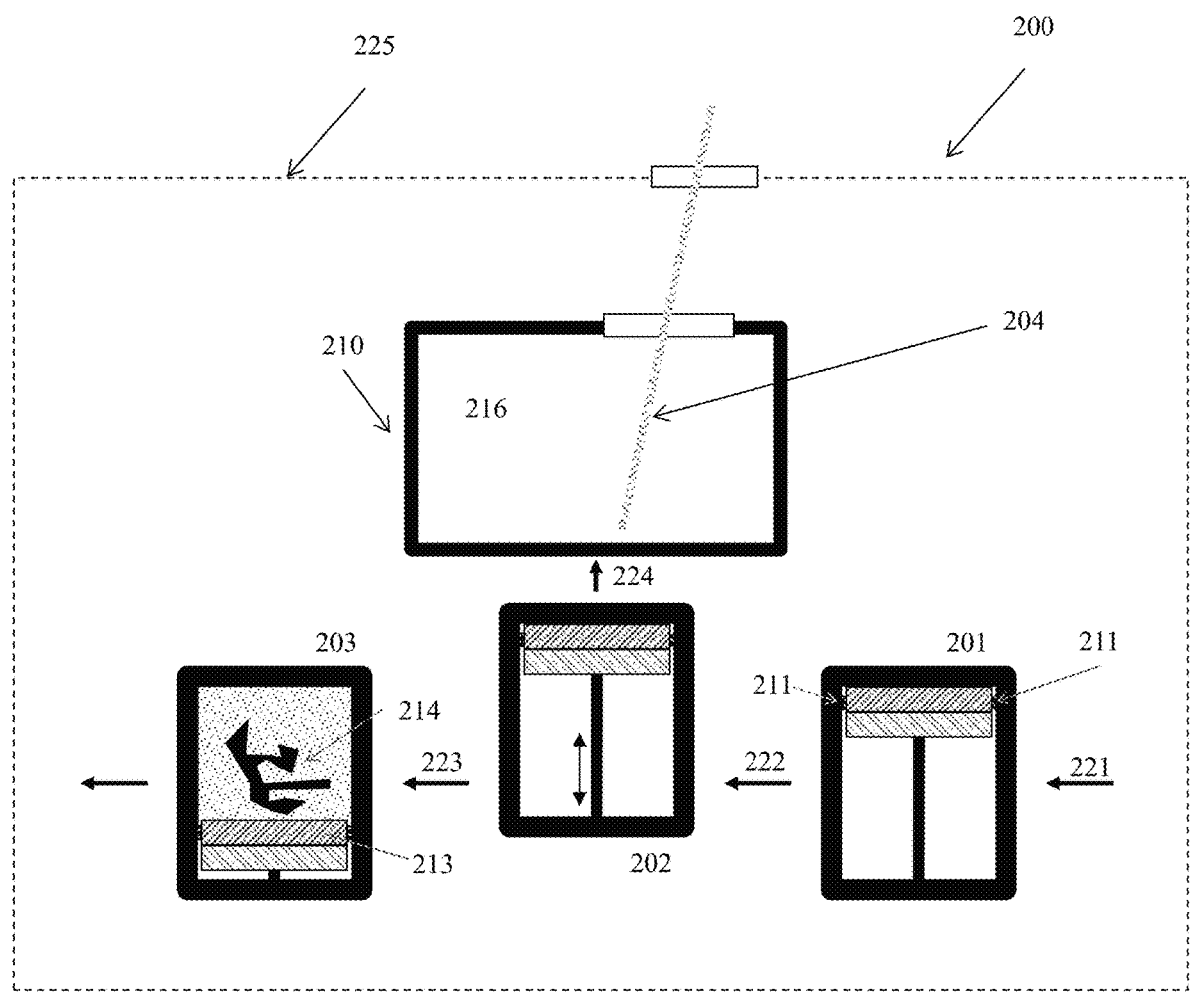
FIG. 2 schematically illustrates a vertical cross section of a 3D printing system and its components.

In some embodiments, the 3D printing system (e.g., FIG. 1, 100) comprises a chamber (e.g., FIG. 1, 107, comprising an atmosphere 126; FIG. 2, 216). The chamber may be referred herein as the "processing chamber." The processing chamber may comprise an energy beam (e.g., FIG. 1, 101; FIG. 2, 204) generated by an energy source (e.g., FIG. 1, 121). The energy beam may be directed towards an exposed surface (e.g., 119) of a material bed (e.g., FIG. 1, 104). The 3D printing system may comprise one or more modules (e.g., FIGS. 2, 201, 202, and 203). The one or more modules may be referred herein as the "build modules." At times, at least one build module (e.g., FIG. 1, 123) may be situated in the enclosure comprising the processing chamber (e.g., FIG. 1, comprising an atmosphere 126). At times, at least one build module may engage with the processing chamber (e.g., FIG. 1). At times, at least one build module may not engage with the processing chamber (e.g., FIG. 2). At times, a plurality of build modules (e.g., FIGS. 2, 201, 202, and 203) may be situated in an enclosure (e.g., FIG. 2, 200) comprising the processing chamber (e.g., FIG. 2, 210). The build module may reversibly engage with (e.g., couple to) the processing chamber. The engagement of the build module with the processing chamber may be controlled (e.g., by a controller, such as for example by a microcontroller). The control may be automatic and/or manual. The engagement of the build module with the processing chamber may be reversible. In some embodiments, the engagement of the build module with the processing chamber may be permanent. The FLS (e.g., width, depth, and/or height) of the processing chamber can be at least about 50 millimeters (mm), 60 mm, 70 mm, 80 mm, 90 mm, 100 mm, 200 mm, 250 mm, 280 mm, 400 mm, 500 mm, 800 mm, 900 mm, 1 meter (m), 2 m, or 5 m. The FLS of the processing chamber can be at most about 50 millimeters (mm), 60 mm, 70 mm, 80 mm, 90 mm, 100 mm, 200 mm, 250 mm, 400 mm, 500 mm, 800 mm, 900 mm, 1 meter (m), 2 m, or 5 m. The FLS of the processing chamber can be between any of the afore-mentioned values (e.g., 50 mm to about 5 m, from about 250 mm to about 500 mm, or from about 500 mm to about 5 m).

In some embodiments, at least one of the build modules is operatively coupled to at least one controller. The controller may be its own controller. The controller may comprise a control circuit. The controller may comprise programmable control code. The controller may be different than the controller controlling the 3D printing process and/or the processing chamber. The controller controlling the 3D printing process and/or the processing chamber may comprise a different control circuit than the control circuit of the build module controller. The controller controlling the 3D printing process and/or the processing chamber may comprise a different programmable control code than the programmable control code of the build module controller. The build module controller may communicate the engagement of the build module to the processing chamber. Communicating may comprise emitting signals to the processing chamber controller. The communication may cause initialization of the 3D printing. The communication may cause one or more load lock shutters to alter their position (e.g., to open). The build module controller may monitor sensors (e.g., position, motion, optical, thermal, spatial, gas, gas composition or location) within the build module. The build module controller may control (e.g., adjust) the active elements (e.g., actuator, atmosphere, elevator mechanism, valves, opening/closing ports, seals) within the build module based on the sensed measurements. The translation facilitator may comprise an actuator. The actuator may comprise a motor. The translation facilitator may comprise an elevation mechanism. The translation mechanism may comprise a gear (e.g., a plurality of gears). The gear may be circular or linear. The translation facilitator may comprise a rack and pinion mechanism, or a screw. The translation facilitator (e.g., build module delivery system) may comprise a controller (e.g., its own controller). The controller of the translation facilitator may be different than the controller controlling the 3D printing process and/or the processing chamber. The controller of the translation facilitator may be different than the controller of the build module. The controller of the translation facilitator may comprise a control circuit (e.g., its own control circuit). The controller of the translation facilitator may comprise a programmable control code (e.g., its own programmable code). The build module controller and/or the translation facilitator controller may be a microcontroller. At times, the controller of the 3D printing process and/or the processing chamber may not interact with the controller of the build module and/or translation facilitator. At times, the controller of the build module and/or translation facilitator may not interact with the controller of the 3D printing process and/or the processing chamber. For example, the controller of the build module may not interact with the controller of the processing chamber. For example, the controller of the translation facilitator may not interact with the controller of the processing chamber. The controller of the 3D printing process and/or the processing chamber may be able to interpret one or more signals emitted from (e.g., by) the build module and/or translation facilitator. The controller of the build module and/or translation facilitator may be able to interpret one or more signals emitted from (e.g., by) the processing chamber. The one or more signals may be electromagnetic, electronic, magnetic, pressure, or sound signals. The electromagnetic signals may comprise visible light, infrared, ultraviolet, or radio frequency signals. The electromagnetic signals may comprise a radio frequency identification signal (RFID). The RFID may be specific for a build module, user, entity, 3D object model, processor, material type, printing instruction, 3D print job, or any combination thereof.

In some embodiments, the build module controller controls an engagement of the build module with the processing chamber and/or load-lock. In some embodiments, the build module controller controls a dis-engagement (e.g., release and/or separation) of the build module with the processing chamber and/or load-lock. In some embodiments, the processing chamber controller may control the engagement of the build module with the processing chamber and/or load-lock. The processing chamber controller may control a dis-engagement (e.g., release, and/or separation) of the build module with the processing chamber and/or load-lock. In some embodiments, the load-lock controller may control the engagement of the build module with the processing chamber and/or load-lock. The load-lock controller may control a dis-engagement (e.g., release, and/or separation) of the build module with the processing chamber and/or load-lock. In some embodiments, the 3D printer comprises one controller that is a build module controller, a processing chamber controller, or a load-lock controller. In some embodiments, the 3D printer comprises at least two controllers selected from the group consisting of: a build module controller, a processing chamber controller, and a load-lock controller.

In some embodiments, when a plurality of controllers are configured to direct a plurality of operations; at least two operations of the plurality of operations can be directed by the same controller of the plurality of controllers. In some embodiments, when a plurality of controllers are configured to direct a plurality of operations; at least two operations of the plurality of operations can be directed by different controllers of the plurality of controllers.

In some embodiments, the build module controller controls the translation of the build module, sealing status of the build module, atmosphere of the build module, engagement of the build module with the processing chamber, exit of the build module from the enclosure, entry of the build module into the enclosure, or any combination thereof. Controlling the sealing status of the build module may comprise opening or closing of the build module shutter. The build chamber controller may be able to interpret signals from the 3D printing controller and/or processing chamber controller. The processing chamber controller may be the 3D printing controller. For example, the build module controller may be able to interpret and/or respond to a signal regarding the atmospheric conditions in the load lock. For example, the build module controller may be able to interpret and/or respond to a signal regarding the completion of a 3D printing process (e.g., when the printing of a 3D object is complete). The build module may be connected to an actuator. The actuator may be translating or stationary. In some embodiments, the actuator may be coupled to a portion of the build module. For examples, the actuator may be coupled to a bottom surface of the build module. In some examples, the actuator may be coupled to a side surface of the build module (e.g., front, and/or back of the build module). The controller of the build module may direct the translation facilitator (e.g., actuator) to translate the build module from one position to another (e.g., arrows 221-224 in FIG. 2), when translation is possible. The translation facilitator (e.g., actuator) may translate the build module in a vertical direction, horizontal direction or at an angle (e.g., planar and/or compound). In some examples, the build module may be heated during translation. The translation facilitator may be a build module delivery system. The translation facilitator may be autonomous. The translation facilitator may operate independently of the 3D printer (e.g., mechanisms directed by the 3D printing controller). The translation facilitator (e.g., build module delivery system) may comprise a controller and/or a motor. The translation facilitator may comprise a machine or a human. The translation is possible, for example, when the destination position of the build module is empty. The controller of the 3D printing and/or the processing chamber may be able to sense signals emitted from the controller of the build module. For example, the controller of the 3D printing and/or the processing chamber may be able to sense a signal from the build module that is emitted when the build module is docked into engagement position with the processing chamber. The signal from the build module may comprise reaching a certain position in space, reaching a certain atmospheric characteristic threshold, opening, or shutting the build platform closing, or engaging or disengaging (e.g., docking or undocking) from the processing chamber. The build module may comprise one or more sensors. For example, the build module may comprise a proximity, movement, light, sounds, or touch sensor.

In some embodiments, the build module is included as part of the 3D printing system. In some embodiments, the build module is separate from the 3D printing system. The build module may be independent (e.g., operate independently) from the 3D printing system. For example, the build module may comprise its own controller, motor, elevator, build platform, valve, channel, or shutter. In some embodiments, one or more conditions differ between the build module and the processing chamber, and/or among the different build modules. The difference may comprise different pre-transformed materials, atmospheres, platforms, temperatures, pressures, humidity levels, oxygen levels, gas (e.g., inert), traveling speed, traveling method, acceleration speed, or post processing treatment. For example, the relative velocity of the various build modules with respect to the processing chamber may be different, similar, or substantially similar. The build platform may undergo different, similar, or substantially similar post processing treatment (e.g., further processing of the 3D object and/or material bed after the generation of the 3D object in the material bed is complete).

In some embodiments, at least one build module translates relative to the processing chamber. The translation may be parallel or substantially parallel to the bottom surface of the build chamber. The bottom surface of the build chamber is the one closest to the gravitational center. The translation may be at an angle (e.g., planar or compound) relative to the bottom surface of the build chamber. The translation may use any device that facilitates translation (e.g., an actuator). For example, the translation facilitator may comprise a robotic arm, conveyor (e.g., conveyor belt), rotating screw, or a moving surface (e.g., platform). The translation facilitator may comprise a chain, rail, motor, or an actuator. The translation facilitator may comprise a component that can move another. The movement may be controlled (e.g., using a controller). The movement may comprise using a control signal and source of energy (e.g., electricity). The translation facilitator may use electricity, pneumatic pressure, hydraulic pressure, or human power.

In some embodiments, the 3D printing system comprises multiple build modules. The 3D printing system may comprise at least 1, 2, 3, 4, 5, 6, 7, 8, 9, or 10 build modules. FIG. 2 shows an example of three build modules (e.g., 201, 202, and 203) and one processing chamber 210.

In some embodiments, at least one build module (e.g., 201, 202, and 203) engages (e.g., 224) with the processing chamber to expand the interior volume of the processing chamber. At times, the build module may be connected to, or may comprise an autonomous guided vehicle (AGV). The AGV may have at least one of the following: a movement mechanism (e.g., wheels), positional (e.g., optical) sensor, and controller. The controller (e.g., build module controller) may enable self-docking of the build module (e.g., to a docking station) and/or self-driving of the AGV. The self-docking of the build module (e.g., to the processing chamber) and/or self-driving may be to and from the processing chamber. The build module may engage with (e.g., couple to) the processing chamber. The engagement may be reversible. The engagement of the build module with the processing chamber may be controlled (e.g., by a controller). The controller may be separate from a controller that controls the processing chamber (or any of its components). In some embodiments, the controller of the processing chamber may be the same controller that controls the build module. The control may be automatic, remote, local, and/or manual. The engagement of the build module with the processing chamber may be reversible. In some embodiments, the engagement of the build module with the processing chamber may be permanent. The controller (e.g., of the build module) may control the engagement of the build module with a load lock mechanism (e.g., that is coupled to the processing chamber). Control may comprise regulate, monitor, restrict, limit, govern, restrain, supervise, direct, guide, manipulate, or modulate.

Figure 3:
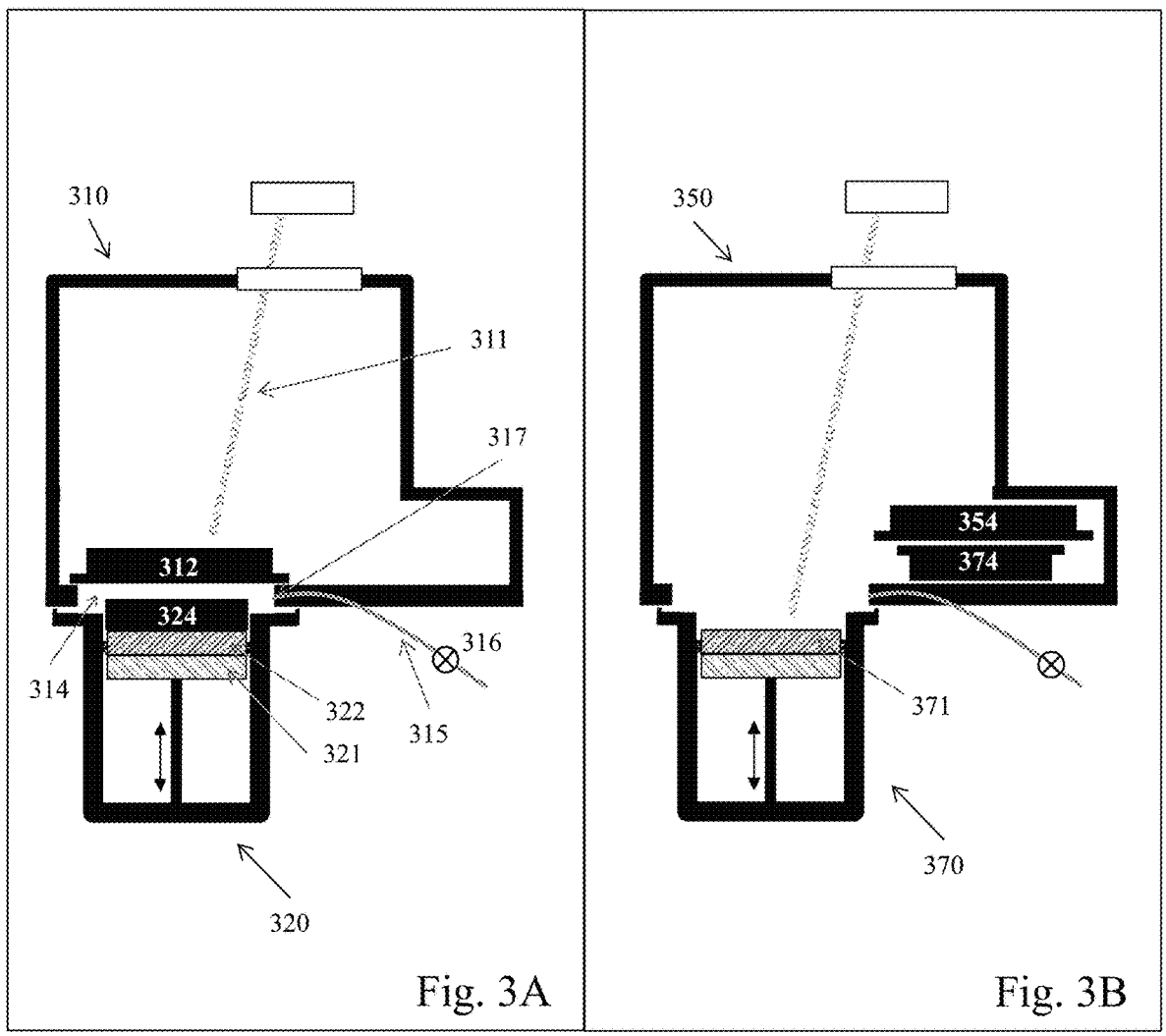
FIGS. 3A-3B schematically illustrate vertical cross sections of 3D printing systems and their components.

In some embodiments, during at least a portion of the 3D printing process, the atmospheres of at least two of the processing chamber, build module, and enclosure may merge. The merging may be through a load lock environment (e.g., FIG. 3, 314). At times, during at least a portion of the 3D printing process, the atmospheres of the chamber and enclosure may remain separate. During at least a portion of the 3D printing process, the atmospheres of the build module and processing chamber may be separate. The build module may be mobile or stationary. The build module may comprise an elevator. The elevator may be connected to a platform (e.g., building platform). The elevator may be reversibly connected to at least a portion of the platform (e.g., to the base). The elevator may be irreversibly connected to at least a portion of the platform (e.g., to the substrate). The platform may be separated from one or more walls (e.g., side walls) of the build module by a seal (e.g., FIG. 2, 211; FIG. 1, 103). The seal may be impermeable or substantially impermeable to gas. The seal may be permeable to gas. The seal may be flexible. The seal may be elastic. The seal may be bendable. The seal may be compressible. The seal may comprise rubber (e.g., latex), Teflon, plastic, or silicon. The seal may comprise a mesh, membrane, sieve, paper (e.g., filter paper), cloth (e.g., felt), or brush. The mesh, membrane, paper and/or cloth may comprise randomly and/or non-randomly arranged fibers. The paper may comprise a HEPA filter. The seal may be permeable to at least one gas, and impermeable to the pre-transformed (e.g., and to the transformed) material. The seal may not allow a pre-transformed (e.g., and to the transformed) material to pass through.

Figure 19:
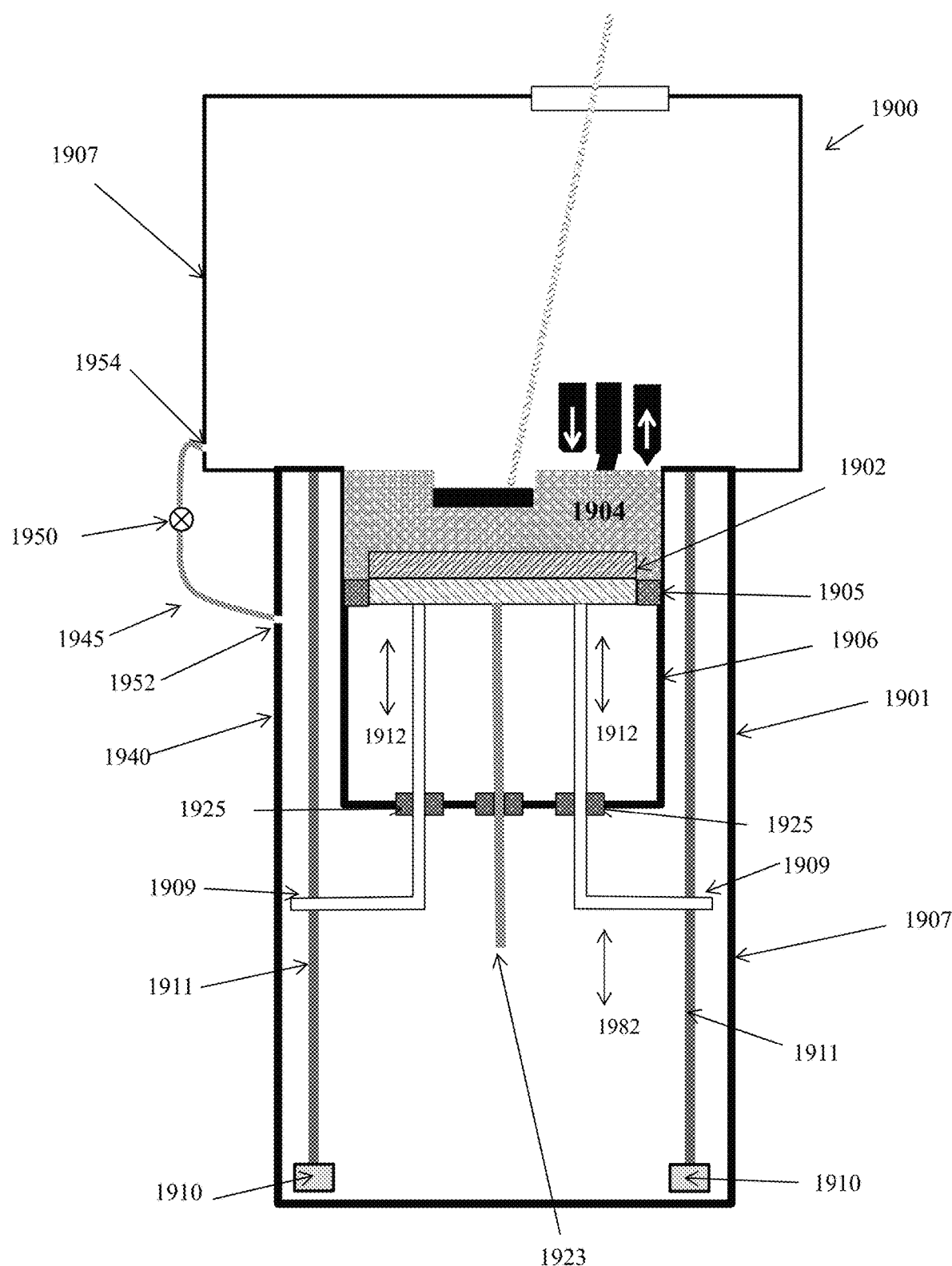
FIG. 19 schematically illustrates a vertical cross section of a 3D printing system and its components.

In some embodiments, the platform is separated from the elevator by a seal (e.g., FIG. 19, 1905). The seal may be attached to the moving platform (e.g., while the walls of the build platform are devoid of a seal). The seal may be attached to the (e.g., vertical) walls of the build platform (e.g., while the platform is devoid of a seal). In some embodiments, both the platform and the walls of the enclosure comprise a seal. The platform seal may be placed laterally (e.g., horizontally) between one or more walls (e.g., side walls) of the build module. The platform seal may be connected to the bottom plane of the platform. The platform seal may be permeable to gas. The platform seal may be impermeable to particulate material (e.g., powder). The platform seal may not permeate particulate material into the elevator mechanism. The platform seal may be flexible. The platform seal may be elastic. The platform seal may be bendable. The platform seal may be compressible. The platform seal may comprise a polymeric material (e.g., nylon, polyurethane), Teflon, plastic, rubber (e.g., latex), or silicon. The platform seal may comprise a mesh, membrane, sieve, paper (e.g., filter paper), cloth (e.g., felt, or wool), or brush. The mesh, membrane, paper and/or cloth may comprise randomly and/or non-randomly arranged fibers. The paper may comprise a HEPA filter.

In some embodiments, the build module comprises multiple (e.g., two) chambers. The two chambers may be an internal chamber and an external chamber. FIG. 19 shows an example of an internal chamber having a wall 1906, and an external chamber having a wall 1907, which internal chamber is enclosed within the external chamber. At times, the bottom plane of the at least one of the two chambers (e.g., the internal chamber) may comprise at least one seal (e.g., FIG. 19, 1925). The bottom seal may allow a gas to pass through. The internal seal may be permeable to a gas, but not to a pre-transformed or transformed material. For example, the internal seal may be permeable to a gas, but not to a particulate material. The bottom seal may be placed laterally (e.g., horizontally) between one or more walls (e.g., side walls) of the internal chamber. The bottom seal may be placed through a wall (e.g., side walls) of the internal chamber. The bottom seal may be placed within an opening in a wall (e.g., side walls) of internal chamber. The bottom seal may allow a gas to circulate and/or equilibrate between the internal chamber and external chamber. The bottom seal may hinder passage of pre-transformed or transformed material from the first chamber to the second chamber (e.g., comprising one or more bearings and/or motors). The bottom seal may serve as protectors of the elevation mechanism. The bottom seal may be connected to the bottom plane of the internal chamber. The bottom seal may be placed beneath the platform. Beneath may be closer to the gravitational center. The bottom seal may not allow permeation of pre-transformed (e.g., particulate) material into the elevator mechanism (e.g., the motor 1910 or screw 1911). The bottom seal may (e.g., substantially) hold the atmosphere of the build module inert. Substantially may be relative to its effect on the 3D printing. Substantially may be imposing a negligible effect on the 3D printing. The bottom seal may (e.g., substantially) facilitate in maintenance of the atmosphere of the build module. The bottom seal may be flexible. The bottom seal may be elastic. The bottom seal may be bendable. The bottom seal may be compressible. The bottom seal may comprise a polymer material (e.g., wool, nylon), Teflon, plastic, rubber (e.g., latex) or silicon. The bottom seal may comprise a mesh, membrane, sieve, paper (e.g., filter paper), cloth (e.g., felt), or brush. The bottom seal may comprise any material that the platform seal comprises. The material of the bottom seal can be (e.g., substantially) identical of different than the one of the platform seal. The build module and/or processing chamber may comprise an openable shutter. For example, the build module and processing chamber may each comprise a separate openable shutter. The shutter may be a seal, door, blockade, stopple, stopper, plug, piston, cover, roof, hood, block, stopple, obstruction, lid, closure, or a cap. The shutter may be opened upon engagement of the build module with the processing chamber. The internal chamber may comprise one or more openings. The openings may allow the shaft and/or encoder to pass through. The openings may be sealed by a seal (e.g., a gas permeable seal). FIG. 19 shows example of an internal chamber (e.g., 1906) comprising multiple openings at its bottom that allow the encoder 1923 and the shafts 1909 to pass through, which openings comprise (e.g., gas) seals 1925.

Figure 24:
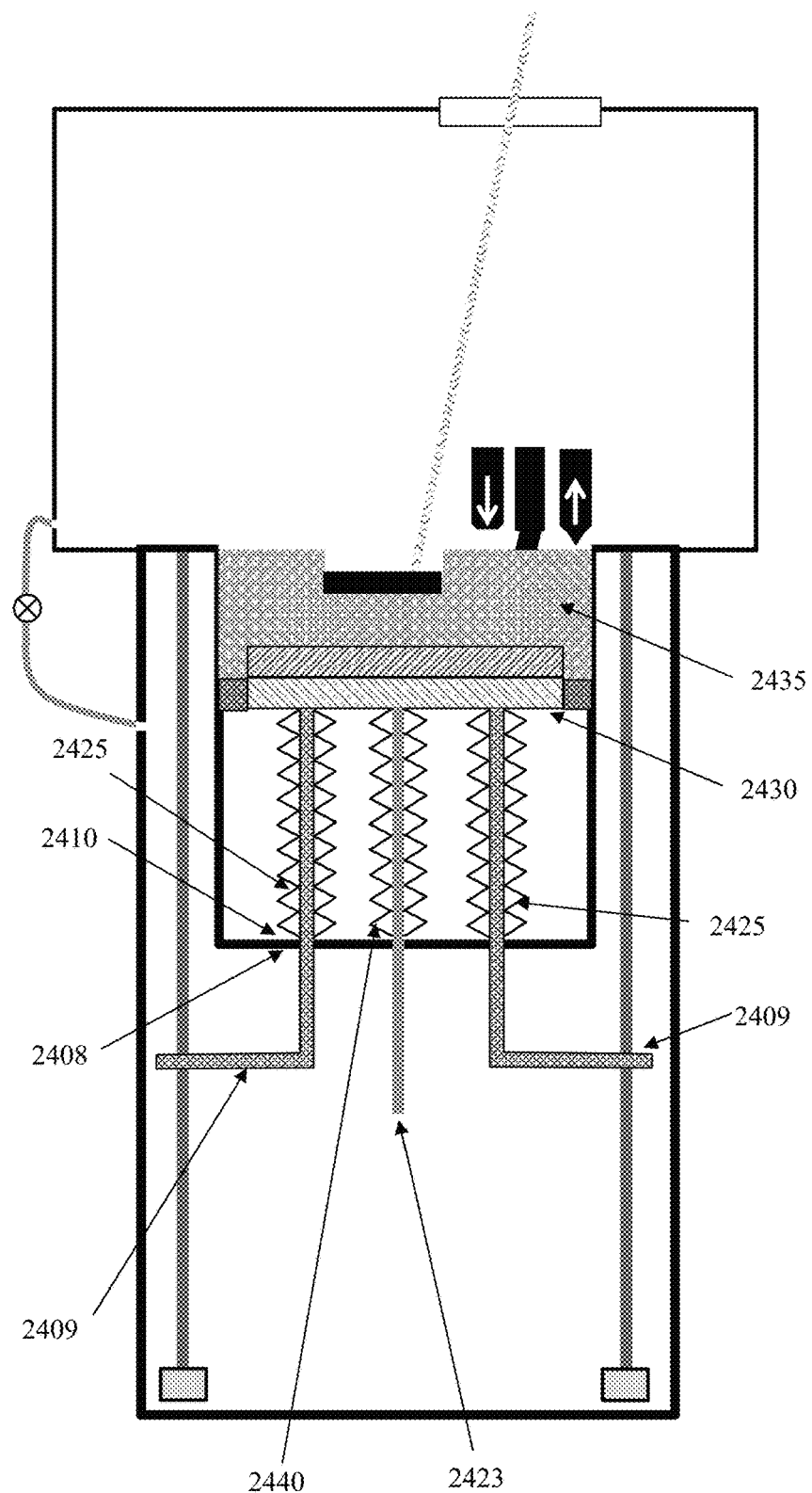
FIG. 24 schematically illustrates a vertical cross section of a 3D printing system and its components.

In some examples, the shafts (e.g., FIG. 24, 2409) and/or the encoder (e.g., FIG. 24, 2423) are engulfed by a seal (e.g., FIG. 24, 2425, 2440). At times, the seal may engulf a portion of the encoder and/or the shaft (e.g., engulf a horizontal cross section of the encoder and/or shaft). At times, the seal may engulf the entire shaft and/or encoder. The seal may comprise a bellow, bearing, gas flow, diaphragm, cloth, or mesh. The seal may be expandable and/or contractible. The seal may be elastic. The seal may be compressible (e.g., on pressure, or as a result of the elevator operation). The seal may be extensible. The seal may return to its original shape and/or size when released (e.g., from pressure, or vacuum). The seal may compress and/or expand relative (e.g., proportionally) to the amount of translation of the elevator mechanism (e.g., the shaft and/or the encoder). The seal may compress and/or expand relative to the amount of pressure applied (e.g., within the build module). The seal may reduce (e.g., prevent) permeation of pre-transformed (e.g., particulate) material from one side of the seal to the opposing side of the seal. The seal may facilitate protection of the elevation mechanism (e.g., comprising a guide, rail, bearing, or actuator (e.g., motor)), by reducing (e.g., blocking) permeation of the pre-transformed material through the seal.

In some examples, a portion of the shaft (e.g., FIG. 24, 2409) is engulfed by a seal (e.g., FIG. 24, 2425). In some examples, the seal may engulf the circumference of a vertical cross section of the shaft (e.g., cylindric section of a cylindrical shaft). The seal may comprise at least one elastic vessel. The seal can be compressed (e.g., when pressure is applied), or extended (e.g., under vacuum). The seal can be a metal seal (e.g., comprising elemental metal or metal alloy). The seal may comprise a bellow. The bellow may comprise formed (e.g., cold formed, or hydroformed), welded (e.g., edge-welded, or diaphragm) or electroformed bellow. The Bellow may be a mechanical bellow. The material of the bellow may comprise a metal, rubber, polymeric, plastic, latex, silicon, composite material, or fiberglass. The material of the bellow may be any material mentioned herein (e.g., comprising stainless steel, titanium, nickel, or copper). The material may have high plastic elongation characteristic, high-strength, and/or be resistant to corrosion. The seal may comprise a flexible element (e.g., a spring, wire, tube, or diaphragm). The seal may be (e.g., controllably) expandable and/or contractible. The control may be before, during, and/or after operation of the shaft, encoder, and/or a component of the elevation mechanism. The control may be manual and/or automatic (e.g., using at least one controller). The seal may be elastic. The seal may be extendable and/or compressible (e.g., on pressure, or as a result of the elevator operation). The seal may comprise pneumatic, electric, and/or magnetic elements. The seal may comprise gas that can be compressed and/or expanded. The seal may be extensible. The seal may return to its original shape and/or size when released (e.g., from positive pressure, or vacuum). The seal may extend and/or contract as a consequence of the movement of the shaft and/or encoder. The seal may extend and/or contract as a consequence of the operation of the actuator. The seal may compress and/or expand relative (e.g., proportionally) to the amount of translation of the elevation mechanism (e.g., translation facilitated by the shaft). The seal may compress and/or expand relative to the amount of pressure applied (e.g., within the build module). The seal may reduce the amount of (e.g., prevent) permeation of particulate material from one side of the seal (e.g., 2410) to its opposite side (e.g., 2408). The seal may protect the actuator(s), by blocking permeation of the particulate material to the area where the actuators reside. FIG. 24 shows an example of a vertical cross section of a platform comprising a substrate 2430 that is operatively coupled to a plurality of shafts (e.g., 2409), which shafts can move upwards and/or downwards, which platform is able to move upwards. In the example shown in FIG. 24, a shaft 2409 is engulfed by at least one bellow (shown as a vertical cross section, comprising 2425). The seal may reduce (e.g., prevent) migration of a pre-transformed (or transformed) material and/or debris through a partition (e.g., wall) that separates the platform from the actuator (e.g., motor) of the shaft and/or encoder (e.g., 2423), and/or guide (e.g., railing). The seal may reduce (e.g., hinder) migration of a pre-transformed (or transformed) material and/or debris from the material bed (e.g., 2435) towards the actuator (e.g., motor) and/or guide (e.g., railing). The seal (e.g., 2430) may facilitate confinement of pre-transformed (or transformed) material and/or debris in one side of the partition (e.g., 2410). The seal may facilitate separation between the pre-transformed (or transformed) material and/or debris and the actuator and/or railing that facilitates movement of the platform. The seal may facilitate proper operation of the actuator and/or railing, by reducing the amount of (e.g., preventing) pre-transformed (or transformed) material and/or debris from reaching (e.g., and clogging) them. The seal (e.g., 2430) may reduce an amount of (e.g., prevent) pre-transformed (or transformed) material and/or debris from crossing the partition. The seal may facilitate cleaning the shaft and/or encoder from pre-transformed material and/or debris.

In some embodiments, the 3D printing system comprises a load-lock mechanism. The load-lock mechanism may be operatively coupled to a processing chamber and/or a build module. FIG. 3A shows an example of a processing chamber (e.g., FIG. 3A, 310) and a build module (e.g., FIG. 3A, 320). The processing chamber comprises the energy beam (e.g., FIG. 3A, 311). The build module comprises a build platform comprising a substrate (e.g., FIG. 3A, 321), a base (e.g., FIG. 3A, 322), and an elevator shaft (e.g., FIG. 3A, 323; FIG. 19, 1909; and FIG. 24, 2409) that allows the platform to move vertically up and down. The elevator shaft may comprise a single shaft (e.g., FIG. 3A, 323). The elevator shaft may comprise a plurality of shafts (e.g., FIG. 19, 1909; and FIG. 24, 2409). In some embodiments, as a part of the load-lock mechanism, the build module (e.g., FIG. 3A, 320) may comprise a shutter (e.g., FIG. 3A, 324). In some embodiments, as a part of the load-lock mechanism, the processing chamber (e.g., FIG. 3A, 310) may comprise a shutter (e.g., FIG. 3A, 312). The shutter may be openable (e.g., by the build module controller, the processing chamber controller, or the load lock controller). The shutter may be removable (e.g., by the build module controller, the processing chamber controller, or the load lock controller). The removal of the shutter may comprise manual or automatic removal. The build module shutter may be opened while being connected to the build module. The processing chamber shutter may be opened while being connected to the processing chamber (e.g., through connector). The shutter connector may comprise a hinge, chain, or a rail. In an example, the shutter may be opened in a manner similar to opening a door or a window. The shutter may be opened by swiveling (e.g., similar to opening a door or a window held on a hinge). The shutter may be opened by its removal from the opening which it blocks. The removal may be guided (e.g., by a rail, arm, pulley, crane, or conveyor). The guiding may be using a robot. The guiding may be using at least one motor and/or gear. The shutter may be opened while being disconnected from the build module. For example, the shutter may be opened similar to opening a lid. The shutter may be opened by shifting or sliding (e.g., to a side). FIG. 3B shows an example where the shutter (FIG. 3B, 374) of the build module (FIG. 3B, 370) is open in a way that is disconnected from the build module. FIG. 3B shows an example where the shutter (FIG. 3B, 354) of the processing chamber (FIG. 3B, 350) is open in a way that is disconnected from the processing chamber.

Figure 33:
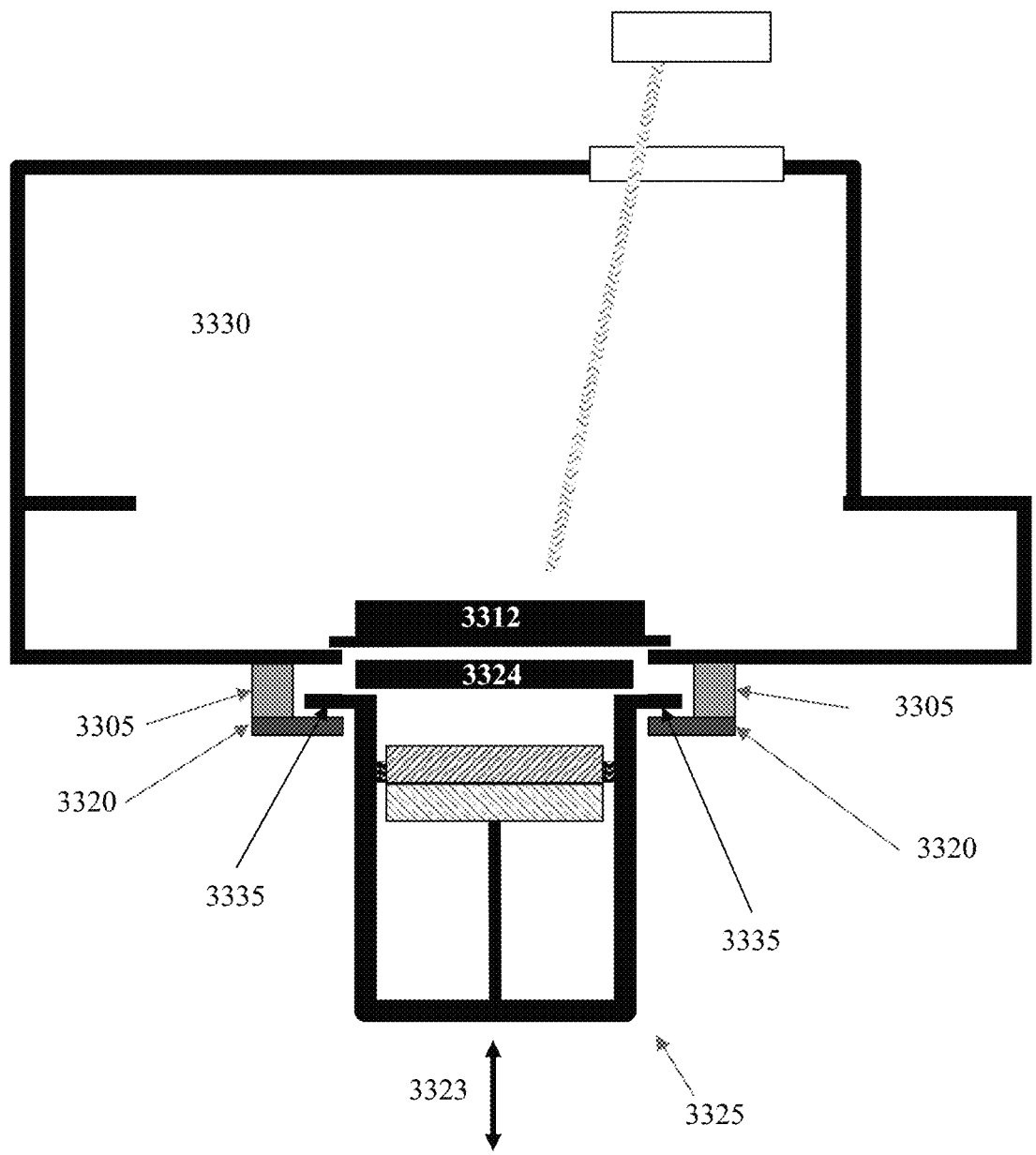
FIG. 33 schematically illustrates a vertical cross-section of components of a 3D printing system.

In some embodiments, the 3D printing system (e.g., 3D printer) comprises a secondary locking mechanism (e.g., also referred to herein as a "secondary locker"). The secondary locker may facilitate engagement and/or locking of the build module (e.g., FIG. 33, 3325) to the processing chamber (e.g., comprising atmosphere 3330) and/or to the load lock. The secondary locker may brace, band, clamp, or clasp the build module to the load lock and/or processing chamber. The secondary locker may hold the build module together with the (i) processing chamber and/or (ii) load lock. The secondary locker may comprise a clamping station. The secondary locker may comprise a docking station. The secondary locker may comprise a first supporting component (e.g., a first shelf, e.g., 3320)), and a second supported component (e.g., a second shelf, e.g., 3335). The supporting components may move laterally (e.g., horizontally). The supporting components may rotate about an axis (e.g., vertical axis). The supporting components may move (e.g., laterally or about an axis to facilitate engagement (e.g., clamping) of the build module with the processing chamber. The build module may comprise the supported component (e.g., 3335) of the secondary locker. The supported component may be a fixture (e.g., first fixture). The supporting component may be a hook. The processing chamber and/or load lock may comprise the supporting component (e.g., 3320) of the secondary locker. The supporting component may be a fixture (e.g., second fixture). The build module may engage the supported component coupled thereto, with the supporting component that is coupled to the processing chamber, which engagement may facilitate engagement of the build module with the processing chamber. The build module may engage the supported component coupled thereto, with the supporting component of the load lock. The engagement may facilitate coupling of the build module with the load lock. At least one component of the secondary locker may be coupled to the load-lock. At least one component of the secondary locker may be positioned adjacent to the load lock, and/or to the processing chamber. At least one component of the secondary locker may be positioned adjacent to the load lock. For example, at least one component of the secondary locker may be coupled to a bottom surface of the load-lock. For example, at least one component of the secondary locker (e.g., supporting structure, e.g., shelf or hook) may be coupled to at a bottom surface of the processing chamber. The secondary locker may facilitate securing the build module to the processing chamber and/or load-lock. The secondary locker may be (e.g., controllably) engaged (e.g., latched). The secondary locker may be disengaged (e.g., un-latched). The components of the secondary locker may engage and/or disengage before, or after the 3D printing. The control may be manual and/or automatic. The control may comprise one or more controllers that are operatively coupled to at least one component of the secondary locker. The secondary lock may be formed (e.g., the supporting and supported components engaged) before and/or after the load-lock is formed. The secondary locker may be un-locked (e.g., unlatch, or de-clamp) before and/or after the load-lock is released. The secondary locker may comprise an interlocking mechanism (e.g., a clamping mechanism). The interlocking mechanism may comprise a screw, nut, cam lock, kinematic coupling, or an interlocking wedge and cavity mechanism. The interlocking mechanism may include a clamping mechanism. The clamping mechanism may be any clamping mechanism described herein. A first (e.g., supported) component of the interlocking mechanism may be coupled to a portion of the external engagement mechanism and/or build module. A second (e.g., supporting) component of the interlocking mechanism may be coupled to the processing chamber and/or load lock (e.g., a bottom surface of the load-lock). In some embodiments, the first component and the second component of the secondary locker may be coupled (e.g., interlocked, clamped, connected, fastened, locked, latched, or clasped) to facilitate engagement of the build module with the processing chamber and/or load-lock. FIG. 33 shows an example of a secondary locker that facilitates engagement of the processing chamber with the build module. A portion of the external engagement mechanism (e.g., a translation facilitator, 3323) may translate the build module (e.g., 3325) to engage with the processing chamber (e.g., comprising atmosphere 3330). The engagement of the build module with the processing chamber may be facilitated by the external engagement mechanism (e.g., as described herein). The external engagement mechanism may comprise an actuator. The translation of the build module towards the processing chamber may be detected by one or more detectors (e.g., disposed along the way). The temperature within the build module (e.g., during the translation and/or engagement) may be controller and/or altered. For example, the build module temperature may be cooled and/or heated (e.g., during the translation and/or engagement with the processing chamber and/or load lock). The actuator may be controlled (e.g., manually and/or by a controller) before, during and/or after the 3D printing. The external engagement mechanism may be external to the build module. The engagement of the build module with the processing chamber may form the load-lock. The load lock may comprise a bottom shutter of the processing chamber (e.g., 3312) a shutter of the build module (e.g., 3324), the secondary locker, and an optional supporting structure (e.g., 3305). The supporting structure may couple (e.g., physically) the supporting component of the secondary locker to the processing chamber. The secondary locker may be secured using an interlocking mechanism. The first component of the secondary locker (e.g., 3320) may be complementary to the second component of the secondary locker (e.g., 3335). The supporting structure (e.g., 3305) and/or first component of the secondary locker (3320) may be translatable (e.g., rotatable). For example, the supporting structure may rotate about a vertical axis to cause the first component that is attached thereto, to rotate (e.g., towards the build module). For example, the first component may translate (e.g., horizontally) towards or away from the build module. The translation of the supporting structure and/or first component may facilitate latching the build module to the processing chamber and/or load lock. The second component (e.g., 3335), may comprise a cavity, or a protrusion (e.g., FIG. 34A, 3422). The contact of the first component (e.g., 3461) with the second component (e.g., 3460) may be (e.g., substantially) gas tight. The contact of the first component with the second component may allow exchange of an atmosphere in the load lock and/or processing chamber. The contact may be between two (e.g., smooth, or flat) surfaces. For example, the contact may be a metal to metal contact. The metal may comprise elemental metal or metal alloy. The secondary locker may comprise bearing. In some embodiments, the supported and/or supporting component may comprise a compressible material. The compressible material may comprise an O-ring, ball, or slab. The compressible material may be compressed upon engagement of the supported component with the supporting component, to allow a tight engagement (e.g., gas tight engagement).

In some embodiments, the build module engages with the processing chamber. The engagement may comprise engaging the supported component with the supporting component. The supported component (e.g., first fixture) may be operatively coupled to the build module. The supported component may be able to carry the weight of the build module, 3D object, material bed, or any combination thereof. The supporting component (e.g., second fixture) may be operatively coupled to the processing chamber. The supporting component may be operatively coupled to the processing chamber through the load lock. For example, the supporting component may be directly coupled to the processing chamber. For example, the supporting component may be directly coupled to the load lock that is coupled to the processing chamber. The supported component may be able to support a weight of the build module, 3D object, material bed, or any combination thereof. The supporting component may be able to support a weight of at least about 10 kilograms (Kg), 50 Kg, 100 Kg, 500 Kg, 1000 Kg, 1500 Kg, 2000 Kg, 2500 Kg, 3000 Kg, or 5000 Kg. The supporting component may be able to support the weight of at most about 500 Kg, 1000 Kg, 1500 Kg, 2000 Kg, 2500 Kg, 3000 Kg, or 5000 Kg. The supporting component may be able to support a weight of any weight value between the afore mentioned weight values (e.g., from about 10 Kg to about 5000 Kg, from about 10 Kg to about 500 Kg, from about 100 Kg to about 2000 Kg, or from about 1000 Kg to about 5000 Kg). The supported component may be able to carry a weight having any of the weight values that the supporting component is able to support. In some embodiments, the supported component comprises a plurality of parts (e.g., even number of parts). In some embodiments, the supporting component comprises a plurality of parts (e.g., even number of parts). At times, the two parts in a pair of parts of the supported component are disposed at opposing sides of the build module (e.g., FIG. 33, 3335). The parts of the supporting component are disposed in a manner that facilitates coupling of the supported component part(s) with the supporting component part(s).

In some embodiments, the engagement of the supported component with the supported component is eased. The ease may be facilitated by including a slanted surface in the supporting and/or supported component. The ease may be facilitated by including a rolling surface (e.g., a wheel or ball) in the supporting and/or supported component. In some examples, at least a part of the supporting component comprises a slanted surface, and at least a part of the supported component comprises the rolling surface. In some examples, at least a part of the supported component comprises a slanted surface, and at least a part the supporting component comprises a rolling surface. For example, the supporting component comprises a slanted surface, and the supported component comprises a rolling surface. For example, the supported component comprises a slanted surface, and the supporting component comprises a rolling surface. For example, a first part of the supported component comprises a slanted surface, and a complementary first part of the supporting component comprises a rolling surface; a second part of the supporting component comprises a slanted surface, and a complementary second part of the supported component comprises a rolling surface.

In some embodiments, the build module, processing chamber, and/or enclosure comprises one or more seals. The seal may be a sliding seal or a top seal. For example, the build module and/or processing chamber may comprise a sliding seal that meets with the exterior of the build module upon engagement of the build module with the processing chamber. For example, the processing chamber may comprise a top seal that faces the build module and is pushed upon engagement of the processing chamber with the build module. For example, the build module may comprise a top seal that faces the processing chamber and is pushed upon engagement of the processing chamber with the build module. The seal may be a face seal, or compression seal. The seal may comprise an O-ring.

In some embodiments, the build module, processing chamber, and/or enclosure are sealed, sealable, or open. The atmosphere of the build module, processing chamber, and/or enclosure may be regulated. The build module may be sealed, sealable, or open. The processing chamber may be sealed, sealable, or open. The enclosure may be sealed, sealable, or open. The build module, processing chamber, and/or enclosure may comprise a valve and/or a gas opening port. The valve and/or a gas opening port may be below, or above the building platform. The valve and/or a gas opening port may be disposed at the horizontal plane of the build platform. The valve and/or a gas opening port may be disposed at the adjacent to the build platform. The valve and/or a gas opening port may be disposed between the processing chamber and the build module. FIG. 3A shows an example of a channel 315 that allows a gas to pass through, which channel has an opening port 317 disposed between the processing chamber 310 and the build module 320. FIG. 3A shows an example of a valve 316 that is disposed along the channel 315. The valve may allow at least one gas to travel through. The gas may enter or exit through the valve. For example, the gas may enter or exit the build module, processing chamber, and/or enclosure through the valve. In some embodiments, the atmosphere of the build module, processing chamber, and/or enclosure may be individually controlled. In some embodiments, the atmosphere of at least two of the build module, processing chamber, and enclosure may be separately controlled. In some embodiments, the atmosphere of at least two of the build module, processing chamber, and enclosure may be controlled in concert (e.g., simultaneously). In some embodiments, the atmosphere of at least one of the build module, processing chamber, or enclosure may be controlled by controlling the atmosphere of at least one of the build module, processing chamber, or enclosure in any combination or permutation. In some examples, the atmosphere in the build module is not controllable by controlling the atmosphere in the processing chamber.

Figure 34:
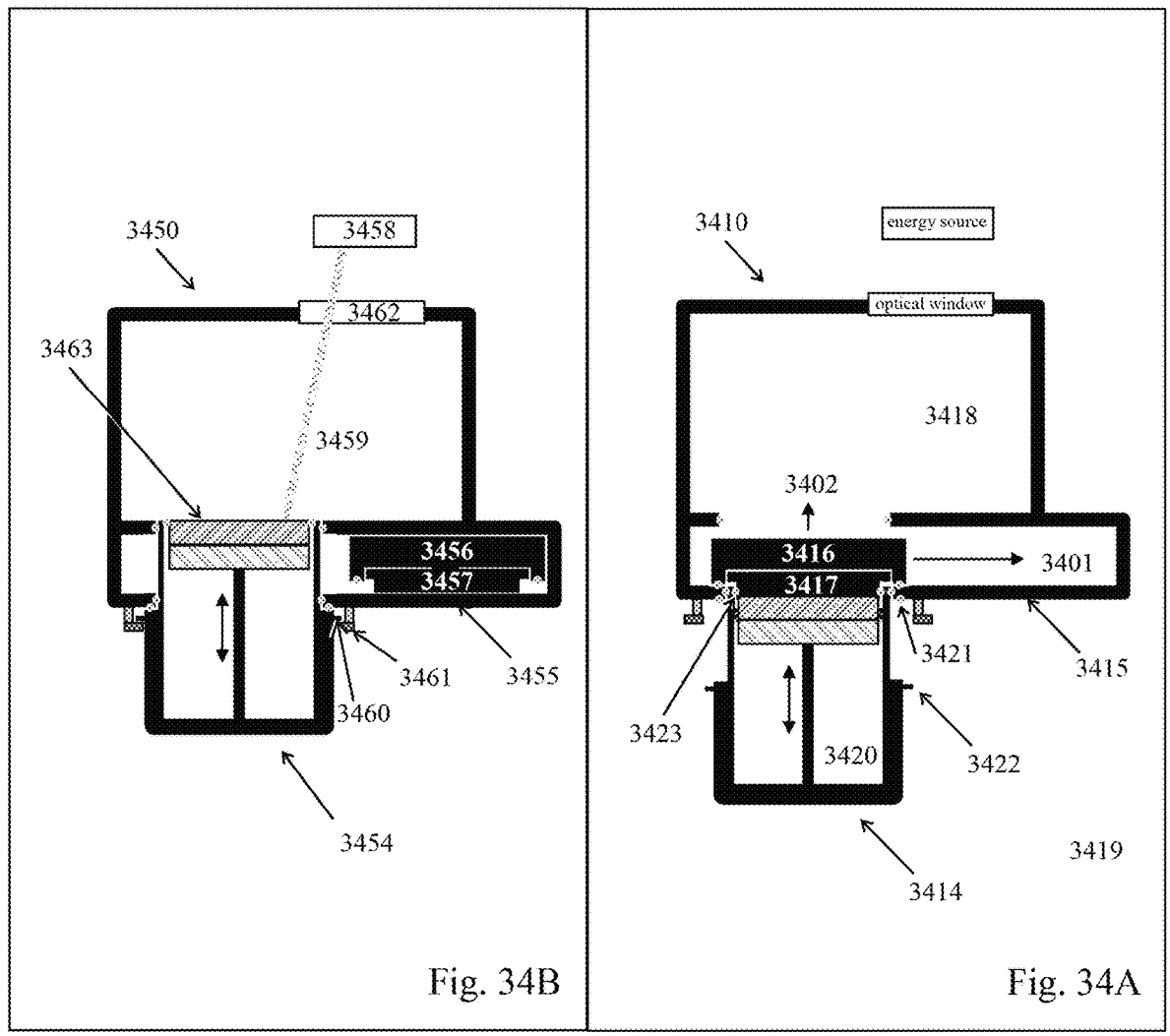
FIGS. 34A-34B schematically illustrate vertical cross sections of components of 3D printing systems.

In some embodiments, the processing chamber comprises a removable shutter. The processing chamber may comprise an opening (e.g., a processing chamber opening) which can be closed by the processing chamber shutter. The processing chamber shutter may be reversibly removable from the processing chamber opening. The processing chamber opening may face the gravitational center, and/or the build module. The processing chamber opening may face a direction opposing the optical window (e.g., FIG. 34B, 3462, e.g., through which the energy beam irradiates into the processing chamber). The removable shutter can be controllably and/or reversibly removable (e.g., from the processing chamber opening). Control may comprise any controller disclosed herein. The processing chamber shutter may separate (e.g., and isolate) the interior of the processing chamber from an ambient (e.g., external) atmosphere. FIG. 34A, 3416 shows an example of a processing chamber shutter, that separates an interior environment 3418 of the processing chamber 3410 from an external environment 3419. In some embodiments, the build module comprises a build module shutter (e.g., 3417) that separates (e.g., isolates) an interior environment 3420 of the build module 3414 from an external environment 3419. The separation of environments may facilitate maintaining less reactive, oxygen depleted, humidity depleted, and/or inert atmosphere in the interior of the processing chamber and/or build module. The build module shutter may engage with the processing chamber shutter. The build module may comprise an opening (e.g., a build module opening) which can be closed by the build module shutter. The build module shutter may be reversibly removable from the build module opening. The build module opening may face a direction opposite to the gravitational center. The build module opening may face the processing chamber. The build module opening may face a direction of the optical window (e.g., FIG. 34B, 3462. The engagement of the build module with the processing chamber may be reversible and/or controlled (e.g., manually and/or using a controller). In some embodiments, the build module shutter may engage with the processing chamber shutter. The engagement of these shutters may facilitate merging the processing chamber atmosphere with the build module atmosphere. The engagement of these shutters may facilitate merging the build module opening with the processing chamber opening. The merging of the shutters may facilitate irradiation of the energy beam (e.g., 3459) through the processing chamber (e.g., 3450) onto a material bed that is supported by a platform, or onto the platform (e.g., 3463). The platform may originate from the build module (e.g., 3454). The engagement of the build module shutter (e.g., 3457) with the processing chamber shutter (e.g., 3456) may be reversible and/or controlled (e.g., manually and/or using a controller). The engagement of the shutters may facilitate removal of both shutter collectively. In some examples, the shutters may not engage. The removal (e.g., by translation) of the build module shutter and the processing chamber shutter may be in the same direction or in different directions. The translation may be to any direction (e.g., any of the six spatial directions). The direction may comprise a Cartesian direction. The direction may comprise a cardinal direction. The direction may be horizontal (e.g., 3401) or vertical (e.g., 3402). The direction may be lateral. In some examples, the shutters may be removed (e.g., from a position where they shut the opening) separately. FIG. 34B shows an example where the shutters 3456 and 3457 are engaged and are removed from their shut-positions, to allow merging of the processing chamber environment with the build module environment, to facilitate 3D printing.

Figure 35:
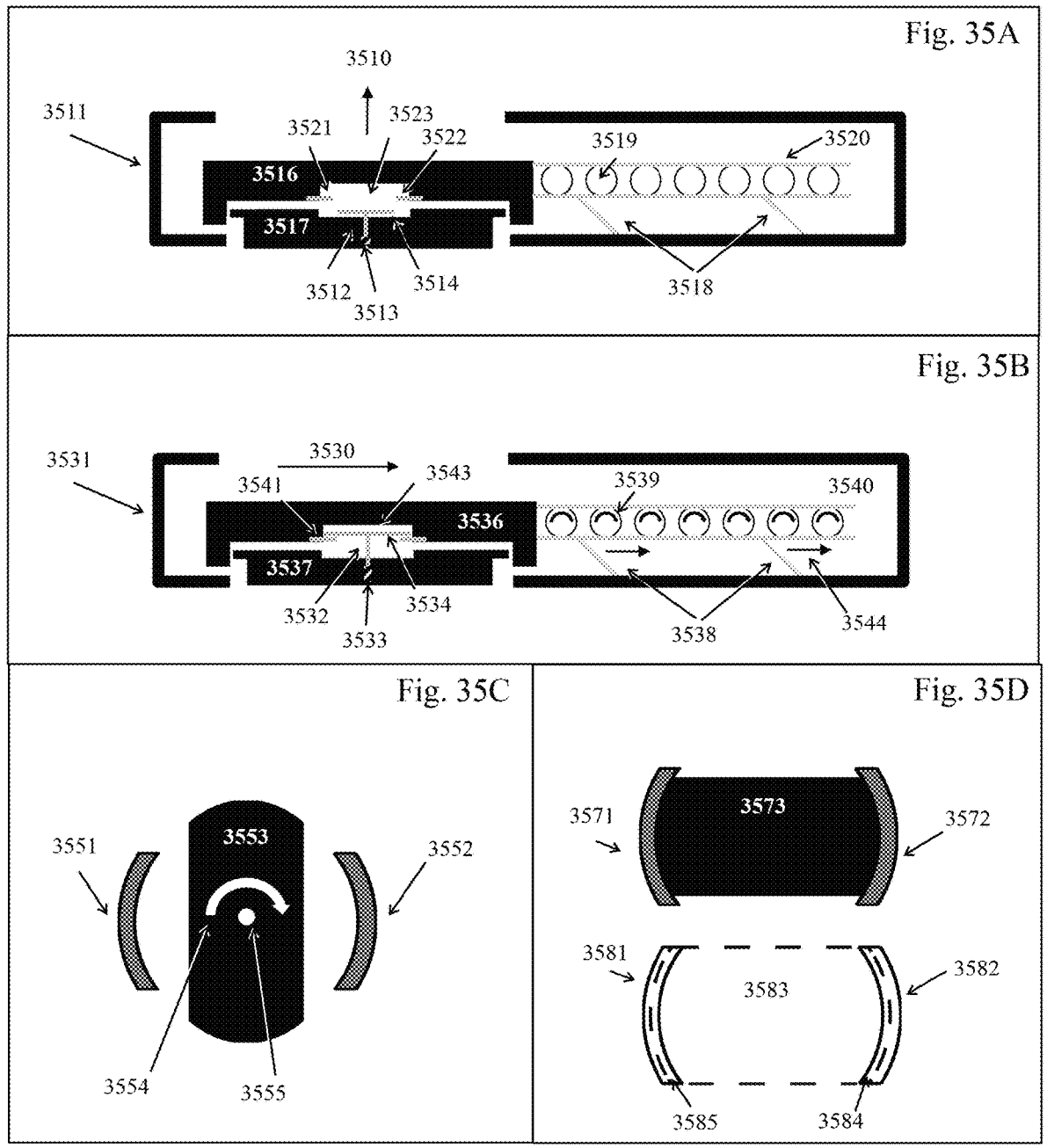
FIGS. 35A-35D schematically illustrates various views of components of a 3D printing system.

In some embodiments, one shutter (e.g., lid) comprises an engaging mechanism that engages with a second shutter (e.g., lid). The one shutter may be the processing chamber shutter, and the second shutter may be the build module shutter, or vice versa. In some embodiments, both the one shutter and the second shutter comprise engaging mechanisms that engages with the pairing shutter. For example, the processing chamber shutter (e.g., lid) and the build module shutter comprise engaging mechanisms that engage with each other. The engagement may be controllable and/or reversible. Control may be manual and/or automatic. The engagement mechanism may comprise physical, magnetic, electrostatic, electronic, or hydraulic force. For example, the engagement mechanism may comprise a physical force. The engagement mechanism may comprise a latching configuration in which at least one portion of the one shutter engages with at least one portion of the second shutter to facilitate their mutual translation in a direction. For example, the engagement mechanism may comprise a latching configuration in which at least one portion of the processing chamber shutter engages with at least one portion of the build module shutter to facilitate their mutual translation in a direction. The latching mechanism may comprise a stationary portion on the one shutter, and a rotating portion on the second shutter. The latching mechanism may comprise movable portions on both pairing shutters (e.g., which move towards each other, e.g., in opposing directions). The movement (e.g., rotation) may facilitate pairing (e.g., engagement) of the shutters. The engagement mechanism may comprise a continuous or non-continuous (e.g., 3551 and 3552) ledge. The engagement mechanism may comprise rotating or non-rotating (e.g., stationary) ledge (e.g. latch). In some embodiments, at least a portion of a shutter may translate (e.g., rotate) to facilitate engagement of the two shutters. For example, the slab (e.g., 3553) may translate (e.g., rotate) to facilitate engagement of the shutters. For example, the shutter may translate (e.g., rotate) to facilitate engagement of the two shutters. For example, the build module (e.g., along with its shutter) may translate (e.g., rotate) to facilitate engagement of the shutters. In some embodiments, the ledges (e.g., latches) are stationary. In some embodiments, the ledges are movable. For example, the ledges may swing (e.g., about a vertical center, or off the vertical center of their vertical portion) to facilitate engagement of the shutters. The shutter may be in any orientation. The shutter may be sensitive to its position in space (e.g., using one or more positional sensors). FIG. 35A shows a side view example of a build module shutter 3517 and a processing chamber shutter 3516 as part of a 3D printer (e.g., comprising 3511); the build module shutter 3517 comprises a spring 3513 that (e.g., controllably) pushes a pin 3512 upwards in the direction 3510, which pin 3512 is connected to a slab 3514. The spring may be released by removing a pin and/or using an actuator. The pin may be rotatable (e.g., along the vertical axis, which rotation may be controllable. In the example shown in FIG. 35A, the processing chamber shutter 3516 comprises a depression 3523 that can accommodate the slab 3514. The processing chamber shutter in the example shown in FIG. 35A, comprises two ledges 3521 and 3522 that can support the slab 3514 upon engagement. The ledges may be able to support the weight of the build module shutter 3517. FIG. 35B shows a side view example of a build module shutter 3537 and a processing chamber shutter 3536 as part of a 3D printer (e.g., comprising 3531); the build module shutter 3537 comprises a spring 3533 that (e.g., controllably) retracts a pin 3532 downwards (in a direction opposing the direction 3510), which pin 3532 is connected to a slab 3534. In the example shown in FIG. 35B, the processing chamber shutter 3536 comprises a depression 3543 that accommodates the slab 3534 as it engages with the ledges 3541 and 3542. FIG. 35C shows a top view example of the rotatable slab 3553, which may (e.g., controllably) rotate 3554 about the vertical axis 3555, to engage with the two ledges 3551 and 3552. FIG. 35D shows a top view examples of a slab 3573, which engages with two ledges 3571 and 3572 such that a portion of the slab overlaps with the ledges. The overlap is schematically illustrated with a transparent slab 3583 that has a partially overlapping area with the area of the ledges 3581 and 3582, which overlapping areas 3585 and 3584. The respective movement may facilitate engagement and/or disengage with a (e.g., stationary) of the one shutter with the second shutter. The rotation of one shutter portion with respect to the other shutter portion may be along a vertical axis. At least one ledge (e.g., all the ledges) may be an integral part of the shutter; may be removable and/or may be replaceable. In some embodiments, a portion (e.g., slab) of one shutter may be attracted to the second shutter. Attraction may comprise a mechanical, magnetic, electronic, electrostatic, pneumatic (e.g., gas pressure and/or vacuum suction), or hydraulic force. The mechanical force may comprise a spring. The electronic force may comprise an actuator. The magnetic force may comprise a magnet.

In some embodiments, the first shutter and/or second shutter are operatively coupled to a mechanism that facilitates movement away from the processing cone. The processing cone is the area where the energy beam can translate (e.g., travel) during the 3D printing. For example, the movement may be to a side (e.g., FIG. 35B, 3530) of the processing cone. In some examples, the first shutter and/or second shutter are configured to travel along a shaft (e.g., rail, and/or bar). FIG. 35A shows an example of a rail 3520 which is coupled to the processing chamber shutter 3516. The rail may comprise one or more rotating devices (e.g., wheels, cylinders, and/or balls), which facilitate (e.g., smooth, e.g., reduced friction) translation of one or more shutters (e.g., along the direction 3530). The direction may be a lateral (e.g., horizontal) direction. FIG. 35B shows an example of engagement in sideways motion (e.g., along 3530), as the rotating devices rotate 3539. The shaft may be coupled to one or more linkages (e.g., 3518). The linkages may pivot. The linkages may comprise a hinge. The one or more linkages may facilitate movement of the shaft in a direction (e.g., 3544). The linkages may facilitate lateral (e.g., horizontal) and/or vertical movement of the shaft. For example, the linkages may, facilitate converting the lateral shaft movement to a vertical movement. The one or more linkages may swivel (e.g., to facilitate movement in a direction, e.g., 3544). The shaft can actuate lateral translation of the one or more shutters. The shaft may be guide. The shaft may comprise a cam follower or track follower. The shaft may comprise one or more bearings (e.g., roller bearing, or needle bearing). The shaft may comprise a mating part. The shaft may comprise a stud or a yoke. The stud may comprise an eccentric stud. The shaft may comprise a reducing friction element (e.g., rotating device). The shaft may be crowned or cylindrical. The shaft (or its mating part) may comprise a slot. The shaft may comprise a bushing. The shaft may be adjustable (e.g., during installation), for example, to reduce (e.g., eliminate) backlash. For instance, the bushing may facilitate adjustment of the shaft (e.g., during installation), for example, to reduce (e.g., eliminate) backlash.

In some embodiments, the build module translates in an upwards direction following engagement with the processing chamber. FIG. 34A shows the beginning of an engagement process of the build module 3414 with the processing chamber 3410. FIG. 34B shows continuation of the engagement process, in which the shutters (e.g., 3456 and 3457) are removed to remove the separation between the build module and the processing chamber, the build module translates (e.g., vertically) towards the energy source 3458, to a (e.g., preferred) position where the energy beam 3459 can facilitate printing the 3D object. The movement of the one or more shutters and/or build module may be controlled (e.g. in real time). The control may comprise sensing signals from one or more sensors. The atmosphere in the build module and/or processing chamber can be maintained (e.g., as different from the ambient atmosphere) throughout the engagement process of the processing chamber with the build module (e.g., through usage of one or more seals). The sensors and/or seals are represented in FIG. 34A by small circles (e.g., 3421). The seal may be a gas tight seal. The seal may be a physical barrier (e.g., and not gas tight).

The engagement of the two shutters described herein may be utilized when engaging the build module with the processing chamber and/or with the unpacking station. The engagement of the shutter may form a load lock (e.g., the load lock may be formed between the shutters). The engagement of the two shutters may be used when engaging the build module with a load lock. The engagement of the two shutters can be controlled (e.g., manually and/or automatically using a controller) before, during and/or after the 3D printing.

In some embodiments, the shutter may comprise one or more components (e.g., segments, or portions). At least one of the shutter components may be (e.g., controllably) translatable. For example, the build module shutter may comprise two horizontal sections that are separable (e.g., upon exertion of pressure, e.g., FIG. 36B, 3631 and 3634). The pressure can be effectuated by an actuator (e.g., pneumatic, electric, magnetic, or hydraulic actuator). For example, the processing chamber shutter (e.g., 3612) may comprise at least one (e.g., vertical) translatable pin (e.g., 3610). For example, the processing chamber shutter may comprise at least one (e.g., vertical) translatable pin. For example, the processing chamber may comprise at least one latch (e.g., 3635). The latch may be swiveling and/or contractible. The latch may be a hook. In some examples, the pairing of the shutters comprises translating one or more translatable components of at least one of the pairing shutters. For example, the pairing of the shutters may comprise forcing the horizontal components of the build module shutter (e.g., 3631 and 3634) to separate, e.g., by pushing the translatable pin (e.g., 3630) of the build module. The (e.g., vertical) gap and/or structural void between the processing chamber shutter and the build module shutter may constitute a load lock.

Figure 36:
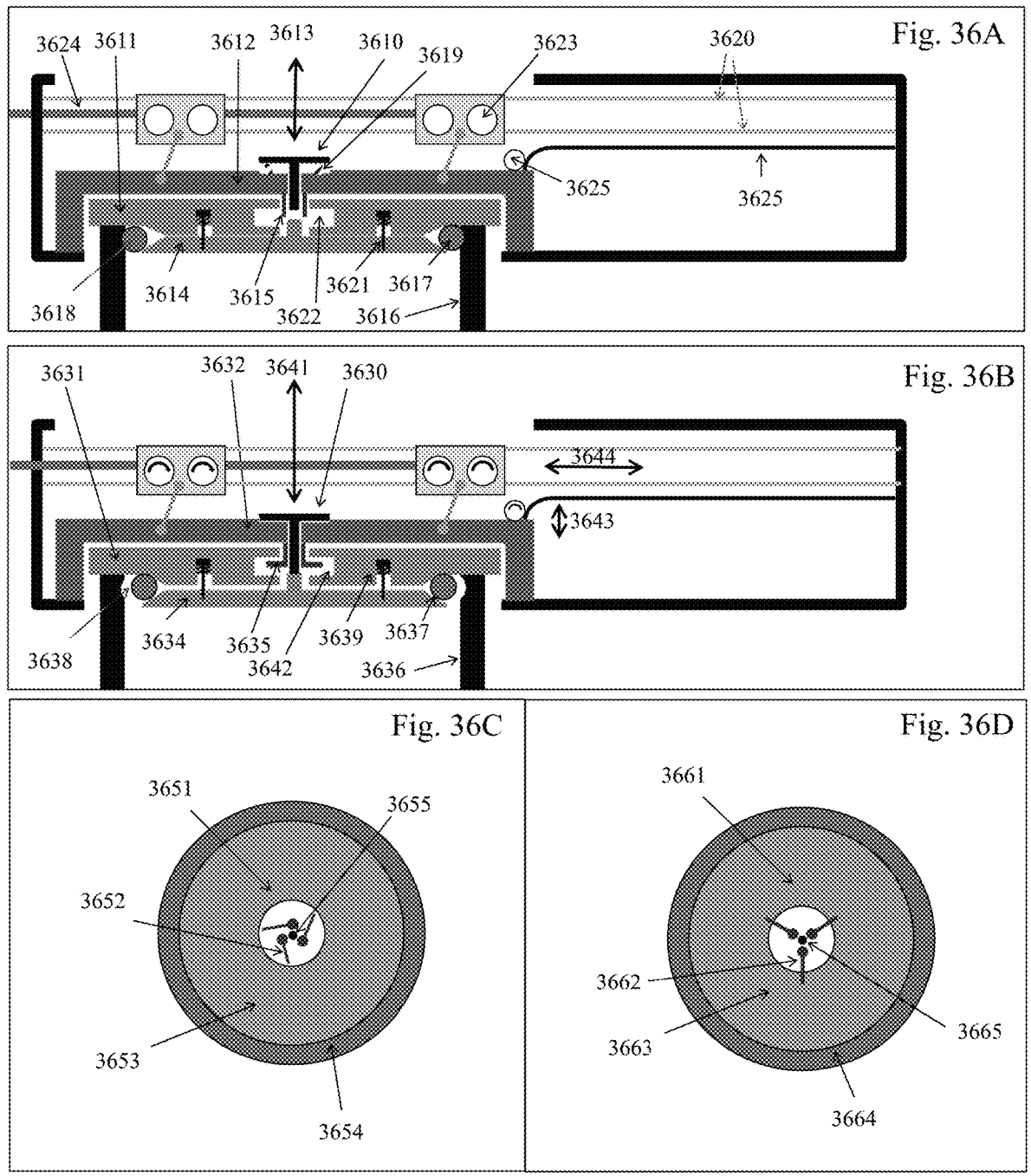
FIGS. 36A-36D schematically illustrates various views of components of a 3D printing system.

In some embodiments, the build module shutter couples to, or comprise, a seal (e.g., FIG. 34A, 3423). The seal may be formed from a flexible (elastic, contractible) material. For example, the seal may comprise a polymeric material, or a resin. For example, the seal may comprise rubber or latex. The seal may (e.g., horizontally) surround the build module. Horizontally surrounding of the build module shutter may facilitate separating the internal environment of the build module from the external environment. For example, the seal may be a ring (e.g., O-ring, or doughnut shaped ring). The seal may separate the interior of the build module from the external environment. The seal may be gas tight. The seal may reduce gas exchange between the external environment and the interior environment of the build module. In one configuration, the shutter may press the seal against a wall for (e.g., substantially) preserve an interior environment. For example, in one configuration of the build module shutter, the build module shutter seal may be (e.g., laterally) pressed towards the build module walls to (e.g., substantially) preserve the build module interior environment. The lateral (e.g., horizontal) pressure of the seal towards the walls may withstand a pressure of at least 1.1, 1.2, 1.3, 1.4, 1.5, 1.8. or 2.0 PSI above ambient pressure (e.g., atmospheric pressure). The pairing of the shutters may facilitate contraction of a seal. For example, the pairing of the shutters may comprise forcing separation of the horizontal components of the build module shutter to separate, and allow contraction of a seal (e.g., 3617 and 3618). The contraction of the seal may facilitate separation of the build module shutter (e.g., 3417) from the build module container (e.g., FIG. 34A, 3414). FIG. 36A shows a vertical cross section of portions of a build module body (e.g., wall 3616) that is enclosed by a shutter that includes horizontal portions 3611 and 3614 held in close proximity; the portions are aligned and held by pins (e.g., 3621). In the example shown in FIG. 36A, the pins are coupled to springs. The build module shutter can comprise at least one seal (shown as cross sections 3618 and 3617). The seal can surround the shutter. For example, the seal can be ring shaped. In the example shown in FIG. 36A, the seal is pressed towards the walls (e.g., 3616) of the build module when the horizontal portions of the seals are held together. At least one horizontal shutter portion edge may be slanted. The slanting edge may contact the seal. An alteration of the vertical position of the slanted edge with respect to the seal may facilitate lateral movement of the seal. The seal may tend to move to one lateral direction (e.g., as it contracts). The vertical movement of the slanted edge may force the seal to move in a second lateral direction opposite to the one direction. FIG. 36A shows an example of a slanted edge of the horizontal shutter portion 3614 that meets the seal 3618, and a slanted edge of the horizontal shutter portion 3611 that meets the seal 3618. In the example shown in FIG. 36A, the two horizontal shutter portions having the slanted edges are in close proximity, which forces the seal towards the build module wall. FIG. 36B shows an example of a slanted edge of the horizontal shutter portion 3634 that meets the seal 3638, and a slanted edge of the horizontal shutter portion 3631 that meets the seal 3638. In the example shown in FIG. 36B, the two horizontal shutter portions having the slanted edges are pushed away from each other which allows the seal to contract away from the build module wall 3636. FIG. 36A shows a vertical cross sectional example of a processing chamber shutter 3612 that comprises a vertically translatable 3613 pin 3610 that is supported by springs (e.g., 3619). The processing chamber shutter shown in FIG. 36A comprises (e.g., controllable) swiveling latches (e.g., 3615). In the example shown in FIG. 36A, the pin 3610 is not pushed towards the build module shutter. The pin can be vertically translatable (e.g., 3613). FIG. 36B shows a vertical cross sectional example of a processing chamber shutter 3632 that comprises a vertically translatable 3641 pin 3630 that is compressed towards the build module shutter. FIG. 36A shown an example of a translation mechanism that includes railing 3620, one or more rotating devices (e.g., 3623), a shaft 3624, cam guide (e.g., track) 3625, and a cam follower 3626; which translation mechanism is coupled to the processing chamber shutter 3612 by one or more linkages. The one or more linkages may swivel, pivot, revolve, and/or swing. The one or more linkages may facilitate translation of the shutter(s) along the rail. The translation mechanism may comprise a shaft, rotating device, rail, cam follower, cam guide, or a linkage. The linkage may be coupled to at least a portion of the processing chamber shutter and/or the build module shutter. The shaft may push the one or more rotating devices to facilitate translation of the shutter(s). For example, the shaft may push the one or more rotating devices (e.g., revolving devices) along the rail to facilitate (e.g., lateral) translation of the shutter(s) along the rail. The translation of the shutter(s) may be guided by a cam guide and/or cam follower. The translation mechanism may be configured to translate the shutter(s) vertically (e.g., 3643) and/or horizontally (e.g., 3644). The translation mechanism may be configured to translate the shutter(s) laterally. The translation mechanism may be configured to translate the shutter(s) towards an opening and/or away from an opening. The opening may be of the processing chamber and/or of the build module. The translation mechanism may be coupled to at least one portion of the processing chamber shutter and/or build module shutter. The processing chamber shutter shown in FIG. 36B comprises (e.g., controllable) latches (e.g., 3615) that translate to a position in which they horizontally overlap at least in part with at least a portion of the build module shutter 3631. The latches may be swiveling latches. The translation to the position may be by swiveling, swinging, or rotating (e.g., about a vertical axis). In the example shown in FIG. 36B, a pushing of pin 3630 towards the build module facilitates (vertical) separation of the first build module shutter portion 3631 from the second build module shutter portion 3634. FIG. 36C shows a horizontal view of the build module shutter 3653 (e.g., analogous to 3614 and 3611), the processing chamber shutter 3654 (e.g., analogous to 3612), a pin 3655 (e.g., analogous to 3610) coupled to the processing chamber shutter, a void 3652 within the structure of the build module shutter (e.g., analogous to the void 3622) and three latches that are coupled to the processing chamber (e.g., analogous to 3615), which latches are not engaged with the build module shutter. FIG. 36D shows a horizontal view of the build module shutter 3663 (e.g., analogous to portions 3631 and 3634), the processing chamber shutter 3664 (e.g., analogous to 3632), a void 3662 within the structure of the build module shutter (e.g., analogous to 3642) and three latches that are coupled to the processing chamber, which latches (e.g., analogous to 3635) are engaged with the build module shutter.

In some embodiments, the material bed is of a cylindrical or cuboid shape. The material bed may translate. The translation may be vertical (e.g., FIG. 1, 112). The translation may be rotational. The rotation (e.g., 127) may be about a vertical axis (e.g., 105). The translation of the material bed may be facilitated by a translation of the substrate (e.g., 109). The translation may be controlled (e.g., manually and/or automatically, e.g., using a controller). The translation may be during at least a portion of the 3D printing. For example, the translation may be before using the energy beam (e.g., 101) to transform the pre-transformed material. For example, the translation may be before using the layer dispensing mechanism (e.g., 116, 117, and 118). The rotation may be at any angle. For example, any value of the angle alpha described herein. The translation may be prior to deposition of a layer of pre-transformed material.

In some embodiments, the build module, processing chamber, and/or enclosure comprises a gas equilibration channel. The gas (e.g., pressure and/or content) may equilibrate between at least two of the build module, processing chamber, and enclosure through the gas equilibration channel. At least two of the build module, processing chamber, and enclosure may be fluidly connected through the gas equilibration channel In some embodiments, the gas equilibration may be connected to the processing chamber. The gas equilibration channel may couple to a wall of a build module (e.g., as it docks). In some embodiments, the gas equilibration may be connected to the build module. The gas equilibration channel may couple to a wall of the processing chamber (e.g., as the build module docks). The gas equilibration channel may comprise a valve and/or a gas opening port. The valve and/or a gas opening port may be disposed in the build module below, or above the building platform. The valve and/or a gas opening port may be disposed in the build module at the horizontal plane of the build platform. The valve and/or a gas opening port may be disposed in the build module adjacent to the build platform. The valve and/or a gas opening port may be disposed between the processing chamber and the build module. For example, the gas equilibration channel may be connected to the load-lock. The load lock can comprise a partition (e.g., a wall) that defines an internal volume of the load lock. The gas equilibration channel may couple to the build module (e.g., as the build module docks). For example, the gas equilibration channel may be connected to build module. The gas equilibration channel may couple to the load-lock (e.g., as the build module docks). FIG. 19 shows an example of a gas equilibration channel 1945 that allows a gas to pass through, which channel has an opening port (e.g., FIG. 19, 1954) disposed between the processing chamber having wall 1907 and the build module having wall 1901. FIG. 19 shows an example of a valve 1950 that is disposed along the gas equilibration channel 1945. The valve may allow at least one gas to travel through. The gas may enter or exit through the valve. For example, the gas may enter or exit the build module, processing chamber, and/or enclosure through the valve. The gas equilibration channel shown in the example of FIG. 19, has an opening port 1952 connected to the build module, and an opening port 1954 connected to the processing chamber.

In some embodiments, the gas equilibration channel controls (e.g., maintain) the atmospheric pressure and/or gas content within at least two of the build module, processing chamber, and load-lock area. Control may include closing the opening port and/or valve. For example, control may include opening the opening port and/or valve to perform exchange of atmospheres between the build module and/or the processing chamber. Control may include controlling the flow of gas. The flow of gas may be from the build module to the processing chamber or vice-versa. The flow of gas may be from the build module to the load-lock area or vice-versa Maintaining the gas pressure and/or content may include closing the opening port and/or valve Maintaining may include inserting gas into the build module, processing chamber, and/or load-lock area Maintaining may include inserting gas into the processing chamber. Maintaining may include evacuating gas from the build module, load-lock area, and/or processing chamber. In some embodiments, the atmosphere of the build module, processing chamber, and/or enclosure may be individually controlled. In some embodiments, the atmosphere of at least two of the build module, processing chamber, load-lock area, and enclosure may be separately controlled. In some embodiments, the atmosphere of at least two of the build module, processing chamber, load-lock area, and enclosure may be controlled in concert (e.g., simultaneously). In some embodiments, the atmosphere of at least one of the build module, processing chamber, load-lock area, or enclosure may be controlled by controlling the atmosphere of at least one of the different build module, processing chamber, load-lock area, or enclosure in any combination or permutation. In some examples, the atmosphere in the build module is not controllable by controlling the atmosphere in the processing chamber and/or load-lock area.

Figure 4:
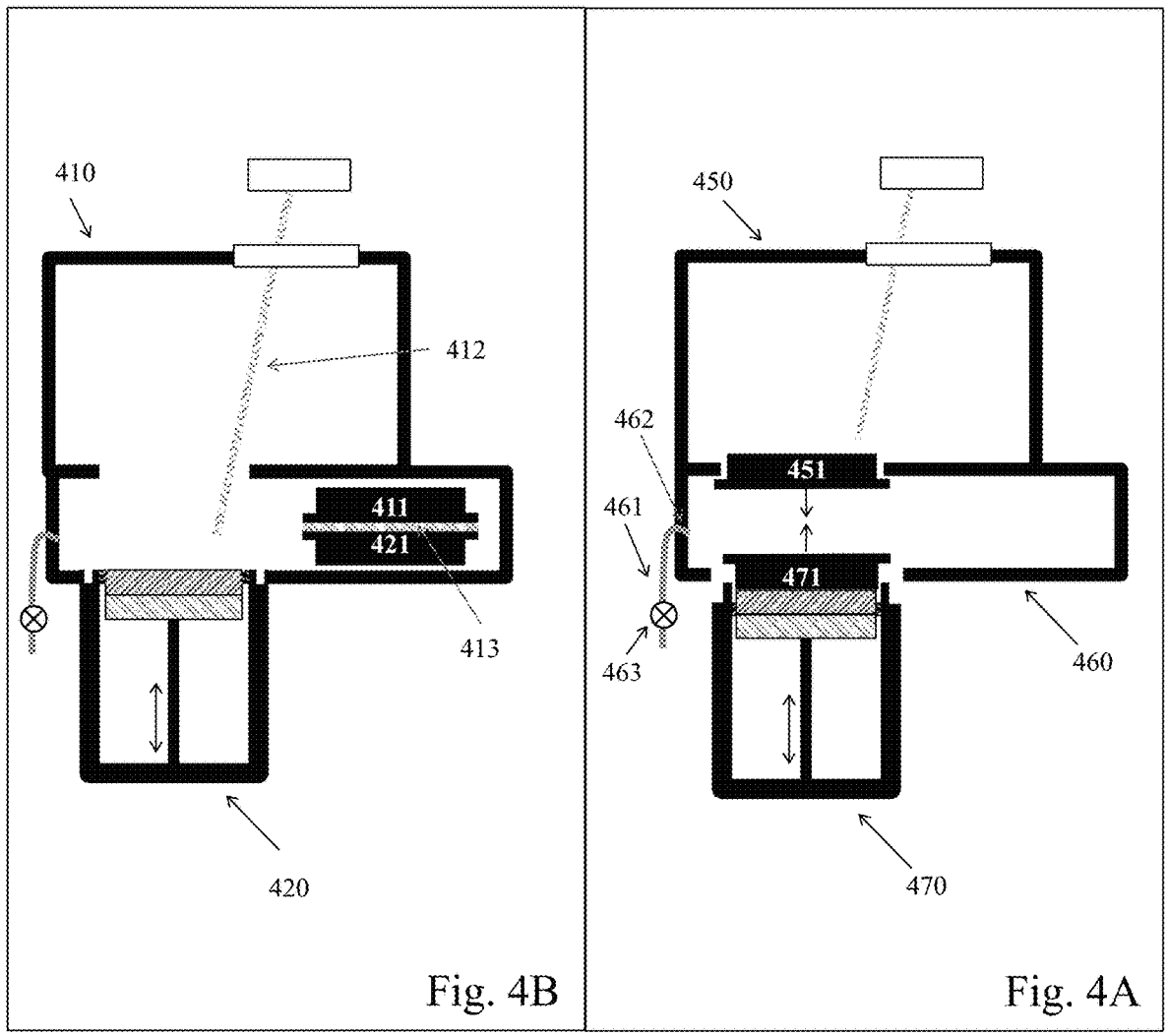
FIGS. 4A-4B schematically illustrate vertical cross sections of 3D printing systems and their components.

In some embodiments, the 3D printing system comprises a load lock. The load lock may be disposed between the processing chamber and the build module. The load lock may be formed by engaging the build module with the processing chamber (e.g., using the load-lock mechanism). The load lock may be sealable. For example, the load lock may be sealed by engaging the build module with the processing chamber (e.g., directly, or indirectly). FIG. 3A shows an example of a load lock 314 that is formed when the build module 320 is engaged with the processing chamber 310. An exchange of atmosphere may take place in the load lock by evacuating gas from the load lock (e.g., through channel 315) and/or by inserting gas (e.g., through channel 315). FIG. 4A shows an example of a load lock 460 that is formed when the build module 470 is engaged with the processing chamber 450. An exchange of atmosphere may take place in the load lock by evacuating gas from the load lock (e.g., through channel 461) and/or by inserting gas (e.g., through channel 461). In some embodiments, the load lock may comprise one or more gas opening ports. At times, the load lock may comprise one or more gas transport channels. At times, the load lock may comprise one or more valves. A gas transport channel may comprise a valve. The opening and/or closing of a first valve of the 3D printing system may or may not be coordinated with the opening and/or closing of a second valve of the 3D printing system. The valve may be controlled automatically (e.g., by a controller) and/or manually. The load lock may comprise a gas entry opening port and a gas exit opening port. In some embodiments, a pressure below ambient pressure (e.g., of 1 atmosphere) is formed in the load lock. In some embodiments, a pressure exceeding ambient pressure (e.g., of 1 atmosphere) is formed in the load lock. At times, during the exchange of load lock atmosphere, a pressure below and/or above ambient pressure if formed in the load lock. At times, a pressure equal or substantially equal to ambient pressure is maintained (e.g., automatically, and/or manually) in the load lock. The load lock, building module, processing chamber, and/or enclosure may comprise a valve. The valve may comprise a pressure relief, pressure release, pressure safety, safety relief, pilot-operated relief, low pressure safety, vacuum pressure safety, low and vacuum pressure safety, pressure vacuum release, snap acting, or modulating valve. The valve may comply with the legal industry standards presiding the jurisdiction. The volume of the load lock may be smaller than the volume within the build module and/or processing chamber. The total volume within the load lock may be at most about 0.1%, 0.5%, 1%, 5%, 10%, 20%, 50%, or 80% of the total volume encompassed by the build module and/or processing chamber. The total volume within the load lock may be between any of the afore-mentioned percentage values (e.g., from about 0.1% to about 80%, from about 0.1% to about 5%, from about 5% to about 20%, from about 20% to about 50%, or from about 50% to about 80%). The percentage may be volume per volume percentage.

In some embodiments, the atmosphere of the build module and/or the processing chamber is fluidly connected to the atmosphere of the load lock. At times, conditioning the atmosphere of the load lock will condition the atmosphere of the build module and/or the processing chamber that is fluidly connected to the load lock. The fluid connection may comprise gas flow. The fluid connection may be through a gas permeable seal and/or through a channel (e.g., a pipe). The channel may be a sealable channel (e.g., using a valve).

In some embodiments, the shutter of the build module engages with the shutter of the processing chamber. The engagement may be spatially controlled. For example, when the shutter of the build module is within a certain gap distance from the processing chamber shutter, the build module shutter engages with the processing chamber shutter. The gap distance may trigger an engagement mechanism. The gap trigger may be sufficient to allow sensing of at least one of the shutters. The engagement mechanism may comprise magnetic, electrostatic, electric, hydraulic, pneumatic, or physical force. The physical force may comprise manual force. FIG. 4A shows an example of a build module shutter 471 that is attracted upwards toward the processing chamber shutter 451, and a processing chamber shutter 451 of processing chamber 450 that is attracted upwards toward the build module shutter 471. FIG. 4B shows an example of a single unit formed from the processing chamber shutter 411 of processing chamber 410 and the build module shutter 421, that is transferred away from the energy beam 412. In the single unit, the processing chamber shutter 411 and the build module shutter 421 are held together by the engagement mechanism 413. Subsequent to the engagement, the single unit may transfer (e.g., relocate, or move) away from the energy beam. For example, the engagement may trigger the transferring (e.g., relocating) of the build module shutter and the processing chamber shutter as a single unit.

In some embodiments, removal of the shutter (e.g., of the build module and/or processing chamber) depends on reaching a certain (e.g., predetermined) level of at atmospheric characteristic comprising a gas content (e.g., relative gas content), gas pressure, oxygen level, humidity, argon level, or nitrogen level. For example, the certain level may be an equilibrium between an atmospheric characteristic in the build chamber and that atmospheric characteristic in the processing chamber.

In some embodiments, the 3D printing process initiates after merging of the build module with the processing chamber. At the beginning of the 3D printing process, the build platform may be at an elevated position (e.g., FIG. 3B, 371). At the end of the 3D printing process, the build platform may be at a vertically reduced position (e.g., FIG. 2, 213). The building module may translate between three positions during a 3D printing run. The build module may enter the enclosure from a position away from the engagement position with the processing chamber (e.g., FIG. 2, 201). The build module may then advance toward (e.g., 222 and 224) the processing chamber (e.g., FIG. 2, 202), and engage with the processing chamber (e.g., as described herein, for example, in FIG. 3B). The layer dispensing mechanism and energy beam will translate and form the 3D object within the material bed (e.g., as described herein), while the platform gradually lowers its vertical position. Once the 3D object printing is complete (e.g., FIG. 2, 214), the build module may disengage from the processing chamber and translate (e.g., 223) away from the processing chamber engagement position (e.g., FIG. 2, 203). Disengagement of the build module from the processing chamber may include closing the processing chamber with its shutter, closing the build module with its shutter, or both closing the processing chamber shutter and closing the build module shutter. Disengagement of the build module from the processing chamber may include maintaining the processing chamber atmosphere to be separate from the enclosure atmosphere, maintaining the build module atmosphere to be separate from the enclosure atmosphere, or maintaining both the processing chamber atmosphere and the build atmosphere separate from the enclosure atmosphere. Disengagement of the build module from the processing chamber may include maintaining the processing chamber atmosphere to be separate from the ambient atmosphere, maintaining the build module atmosphere to be separate from the ambient atmosphere, or maintaining both the processing chamber atmosphere and the build atmosphere separate from the ambient atmosphere. The building platform that is disposed within the build module before engagement with the processing chamber, may be at its top most position, bottom most position, or anywhere between its top most position and bottom most position within the build module.

In some embodiments, the usage of sealable build modules, processing chamber, and/or unpacking chamber allows a small degree of operator intervention, low degree of operator exposure to the pre-transformed material, and/or low down time of the 3D printer. The 3D printing system may operate most of the time without an intermission. The 3D printing system may be utilized for 3D printing most of the time. Most of the time may be at least about 50%, 70%, 80%, 90%, 95%, 96%, 97%, 98%, or 99% of the time. Most of the time may be between any of the afore-mentioned values (e.g., from about 50% to about 99%, from about 80% to about 99%, from about 90% to about 99%, or from about 95% to about 99%) of the time. The entire time includes the time during which the 3D printing system prints a 3D object, and time during which it does not print a 3D object. Most of the time may include operation during seven days a week and/or 24 hours during a day.

In some embodiments, the 3D printing system requires operation of maximum a single standard daily work shift. The 3D printing system may require operation by a human operator working at most of about 8 hours (h), 7 h, 6 h, 5 h, 4 h, 3 h, 2 h, 1 h, or 0.5 h a day. The 3D printing system may require operation by a human operator working between any of the afore-mentioned time frames (e.g., from about 8 h to about 0.5 h, from about 8 h to about 4 h, from about 6 h to about 3 h, from about 3 h to about 0.5 h, or from about 2 h to about 0.5 h a day).

In some embodiments, the 3D printing system requires operation of maximum a single standard work week shift. The 3D printing system may require operation by a human operator working at most of about 50 h, 40 h, 30 h, 20 h, 10 h, 5 h, or 1 h a week. The 3D printing system may require operation by a human operator working between any of the afore-mentioned time frames (e.g., from about 40 h to about 1 h, from about 40 h to about 20 h, from about 30 h to about 10 h, from about 20 h to about 1 h, or from about 10 h to about 1 h a week). A single operator may support during his daily and/or weekly shift at least 1, 2, 3, 4, 5, 6, 7, 8, 9, or 10 3D printers (i.e., 3D printing systems).

In some embodiments, the enclosure and/or processing chamber of the 3D printing system is opened to the ambient environment sparingly. In some embodiments, the enclosure and/or processing chamber of the 3D printing system may be opened by an operator (e.g., human) sparingly. Sparing opening may be at most once in at most every 1, 2, 3, 4, or 5 weeks. The weeks may comprise weeks of standard operation of the 3D printer.

In some embodiments, the 3D printer has a capacity of 1, 2, 3, 4, or 5 full prints in terms of pre-transformed material (e.g., powder) reservoir capacity. The 3D printer may have the capacity to print a plurality of 3D objects in parallel. For example, the 3D printer may be able to print at least 2, 3, 4, 5, 6, 7, 8, 9, or 10 3D objects in parallel.

In some embodiments, the printed 3D object is retrieved soon after terminating the last transformation operation of at least a portion of the material bed. Soon after terminating may be at most about 1 day, 12 hours, 6 hours, 3 hours, 2 hours, 1 hour, 30 minutes, 15 minutes, 5 minutes, 240 seconds (sec), 220 sec, 200 sec, 180 sec, 160 sec, 140 sec, 120 sec, 100 sec, 80 sec, 60 sec, 40 sec, 20 sec, 10 sec, 9 sec, 8 sec, 7 sec, 6 sec, 5 sec, 4 sec, 3 sec, 2 sec, or 1 sec. Soon after terminating may be between any of the afore-mentioned time values (e.g., from about is to about 1 day, from about 1 s to about 1 hour, from about 30 minutes to about 1 day, or from about 20 s to about 240 s).

In some embodiments, the 3D printer has a capacity of 1, 2, 3, 4, or 5 full prints before requiring human intervention. Human intervention may be required for refilling the pre-transformed (e.g., powder) material, unloading the build modules, unpacking the 3D object, or any combination thereof. The 3D printer operator may condition the 3D printer at any time during operation of the 3D printing system (e.g., during the 3D printing process). Conditioning of the 3D printer may comprise refilling the pre-transformed material that is used by the 3D printer, replacing gas source, or replacing filters. The conditioning may be with or without interrupting the 3D printing system. For example, refilling and unloading from the 3D printer can be done at any time during the 3D printing process without interrupting the 3D printing process. Conditioning may comprise refreshing the 3D printer and/or the pre-transformed (e.g., recycled) material. Conditioning may comprise avoiding reactions (e.g., oxidation) of the material (e.g., powder) with agents (e.g., water and/or oxygen). For example, a material (e.g., liquid, or particulate material) may have chromium that oxidizes and forms chromium oxide. The oxidized material may have a high vapor pressure (e.g., low evaporation temperature). To avoid reactions, the material may be conditioned. Conditioning may comprise removal of reactive species (e.g., comprising oxygen and/or water). Types of conditioning may include heating the material (e.g., before recycling or use), irradiating the material (e.g., ablation), flushing the material with an inert gas (e.g., argon). The flushing may be done in an inert atmosphere (e.g., within the processing chamber). The flushing may be done in an atmosphere that is (e.g., substantially) non-reactive with the material (e.g., liquid, or particulate material).

In some embodiments, the 3D printer comprises at least one filter. The filter may be a ventilation filter. The ventilation filter may capture fine powder from the 3D printing system. The filter may comprise a paper filter such as a high-efficiency particulate arrestance (HEPA) filter (a.k.a., high-efficiency particulate arresting or high-efficiency particulate air filter). The ventilation filter may capture spatter. The spatter may result from the 3D printing process. The ventilator may direct the spatter in a desired direction (e.g., by using positive or negative gas pressure). For example, the ventilator may use vacuum. For example, the ventilator may use gas blow.

At times, there is a time lapse (e.g., time delay) between the end of printing in a first material bed, and the beginning of printing in a second material bed. The time lapse between the end of printing in a first material bed, and the beginning of printing in a second material bed may be at most about 60 minutes (min), 40 min, 30 min, 20 min, 15 min, 10 min, or 5 min. The time lapse between the end of printing in a first material bed, and the beginning of printing in a second material bed may be between any of the afore-mentioned times (e.g., from about 60 min to abo 5 min, from about 60 min to about 30 min, from about 30 min to about 5 min, from about 20 min to about 5 min, from about 20 min to about 10 min, or from about 15 min to about 5 min). The speed during which the 3D printing process proceeds is disclosed in Patent Application serial number PCT/US15/36802 that is incorporated herein in its entirety.

In some embodiments, the 3D object is removed from the material bed after the completion of the 3D printing process. For example, the 3D object may be removed from the material bed when the transformed material that formed the 3D object hardens. For example, the 3D object may be removed from the material bed when the transformed material that formed the 3D object is no longer susceptible to deformation under standard handling operation (e.g., human and/or machine handling).

Figure 17:
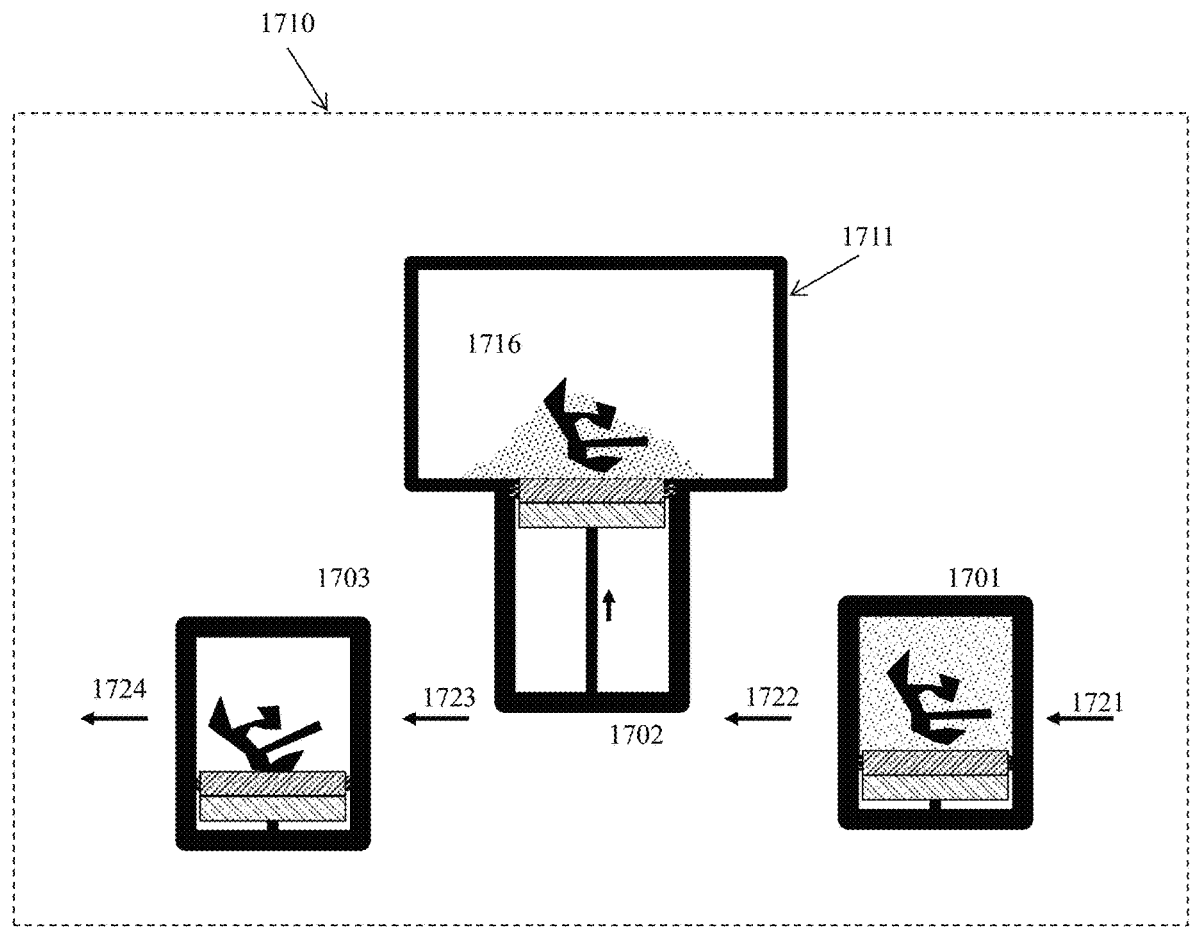
FIG. 17 schematically illustrates a vertical cross section of a 3D object unpacking system.

In some embodiments, the 3D object is removed from the build module inside or outside of the 3D printer (e.g., 3D printer enclosure, e.g., FIG. 2, 225). For example, the 3D object that is disposed within the material bed may be removed outside of the enclosure (e.g., by being enclosed in the build module, e.g., FIG. 2, 203). The 3D object may be removed from the build module to an unpacking station (also referred to herein as "unpacking system"). The unpacking station may be within the 3D printer enclosure, or outside of the 3D printer enclosure. The enclosure of the unpacking station may be different (e.g., separate) from the 3D printer enclosure. FIG. 17 shows an example of an unpacking station comprising an enclosure 1710, an unpacking chamber 1711, and build modules (e.g., 1701, 1702, and 1703) disposed at various positions within the unpacking station enclosure. In some embodiments, the unpacking station enclosure 1710 is absent. The build modules may transition between the various positions (e.g., near numbers 1701, 1702, and 1703) according to arrows 1721, 1722, 1723, and 1724 respectively. The separate enclosure (e.g., 1710), unpacking station (e.g., 1711), and/or build module (e.g., 1701,1702, and/or 1703) may comprise an ambient or a controlled atmosphere. The atmosphere in the separate (e.g., unpacking station) enclosure may be identical, substantially identical, or different from the atmosphere in the build module, processing chamber, and/or enclosure housing the processing chamber (i.e., 3D printer enclosure). The unpacking chamber may comprise a controlled atmosphere. The atmosphere of the unpacking chamber (e.g., 1711) may be controlled separately or together with the atmosphere of the unpacking station enclosure (e.g., 1710). The unpacking chamber may comprise a shutter (e.g., similar to the shutter of the processing chamber). The build modules may dock to the unpacking chamber in a manner similar to the way the build modules dock to the processing chamber (e.g., through a load lock, conditioning the load lock atmosphere to 3D printing atmosphere, and removing the respective shutters; e.g., FIG. 3A, 3B, 4A, or 4B). The docking may be from any direction (e.g., any of the six spatial directions). The direction may comprise a Cartesian direction. The direction may comprise a cardinal direction. The direction may be horizontal or vertical. The direction may be lateral. The material bed comprising the 3D object may be separated from an operator (e.g., human). The unpacking operation may take place without contact of the operator with the pre-transformed material (e.g., remainder). The unpacking operation may take place without contact of the pre-transformed material (e.g., remainder) with the ambient atmosphere. The unpacking station may be sealed prior to engagement, or after an engagement with the build module (e.g., using an unpacking station shutter), for example, to deter atmospheric exchange between the external environment and the interior of the unpacking station. The build module may be sealed prior to engagement of the build module with the unpacking station, for example, to deter atmospheric exchange between the external environment and the interior of the unpacking station. The build module may be sealed prior to disengagement of the build module from the unpacking station (e.g., using a load lock shutter), for example, to deter atmospheric exchange between the external environment and the interior of the unpacking station. To deter atmospheric exchange between the external environment and the interior of the unpacking station may comprise to deter infiltration of one or more reactive agents from the ambient atmosphere. The reactive agent may comprise humidity and/or oxidizing agent (e.g., oxygen). The separate enclosure (e.g., 1710), unpacking station (e.g., 1711), and/or build module (e.g., 1701, 1702, and/or 1703) may comprise an atmosphere having a pressure greater than the ambient pressure. Greater pressure may be a pressure of at least about 0.2 pounds per square inch (PSI), 0.25 PSI, 0.3 PSI, 0.35 PSI, 0.4 PSI, 0.45 PSI, 0.5 PSI, 0.8 PSI, 1.0 PSI, 1.5 PSI, or 2.0 PSI above ambient pressure (e.g., of 14.7 PSI). The ambient pressure may be constant or fluctuating. Greater pressure may be between any of the afore-mentioned values (e.g., from about 0.2 PSI to about 2.0 PSI, from about 0.3 PSA to about 1.5 PSI, or from about 0.4 PSI to about 1.0 PSI above ambient pressure). The 3D object in the build module may be kept at an atmosphere that is different from the external (e.g., ambient) atmosphere from prior to entry to the unpacking station (e.g., 1701), through it unpacking (e.g., 1702), to its exit from the unpacking station (e.g., 1703).

In some embodiments, the atmosphere is exchanged in an enclosure. For example, the atmosphere is exchanged before the pre-transformed material is introduced into that enclosure (e.g., to reduce possibility of a reaction of the pre-transformed material with a reactive agent, and/or to allow recycling of the pre-transformed material). For example, the atmosphere is exchanged in an enclosure before the 3D printing is conducted in that enclosure (e.g., to reduce possibility of a reaction of the pre-transformed material or of a by-product, with a reactive agent). The by-product may comprise evaporated transformed material, or gas borne pre-transformed material. The by-product may comprise soot. The reactive agent may comprise oxygen or humidity. The atmospheric exchange may comprise sucking the atmosphere or purging the atmosphere. The suction or purging may utilize a pump (e.g., pressure or vacuum pump). The atmospheric exchange (e.g., purging) may comprise utilizing a pressurized gas source. The pressurized gas source may comprise a pressurized gas container (e.g., a gas-cylinder). The pressurized gas source may comprise a build module that encloses pressurized atmosphere that has a pressure greater than the pressure in the processing chamber. The pressurized build module may engage with a chamber. The chamber may comprise the processing chamber or the unpacking station. The engagement of the build module with the chamber may comprise merging their atmospheres to have a combined atmosphere pressure that is above ambient pressure. The pressurized gas source may comprise a build module that encloses pressurized atmosphere that has a pressure greater than the pressure in the chamber (e.g., unpacking station or processing chamber). The combined atmosphere may have a pressure greater than the ambient pressure by at least about 0.2 pounds per square inch (PSI), 0.25 PSI, 0.3 PSI, 0.35 PSI, 0.4 PSI, 0.45 PSI, 0.5 PSI, 0.8 PSI, 1.0 PSI, 1.5 PSI, or 2.0 PSI above ambient pressure (e.g., of 14.7 PSI). The combined atmosphere may have a pressure greater than the ambient pressure by any value between any of the afore-mentioned values (e.g., from about 0.2 PSI to about 2.0 PSI, from about 0.3 PSA to about 1.5 PSI, or from about 0.4 PSI to about 1.0 PSI above ambient pressure). The build module, processing chamber, and/or unpacking station may comprise an evacuator of the reactive-agent (e.g., oxygen). The evacuator can be passive or active. The passive evacuator may comprise a scavenger for the reactive-agent (e.g., a desiccating agent). The passive evacuator may comprise a material that (e.g., spontaneously) absorbs and/or reacts with the reactive agent (e.g., to scavenge it from the atmosphere). At least one controller may be coupled to the build module, processing chamber, and/or unpacking station and may control the amount of the reactive agent (e.g., to be below a certain threshold value).

In some embodiments, the build module is designed to maintain the 3D object within an atmosphere suitable for transport. The build module can comprise a boundary (e.g., comprising one or more walls) that define an internal volume that is configured to store the 3D object in an internal atmosphere. During storage, the build module may be resting (e.g., kept in one location), or be in transit (e.g., from one location to another). The build module may be stored in ambient temperature (e.g., room temperature). The build module can comprise an opening within the boundary (e.g., within at least one of the walls) and that is designed to couple with the processing chamber and having a shape and size suitable for passing the 3D object therethrough. The build module can comprise the build module shutter that is configured to close the opening and form a seal between the internal atmosphere maintained within the build module and an ambient atmosphere outside of the build module. The seal and/or material of the build module may deter atmospheric exchange between the internal volume of the build module and the ambient atmosphere. The internal atmosphere may comprise a pressure different (e.g., lower or higher) than the one in the ambient pressure. For example, the internal atmosphere may comprise a pressure above ambient pressure. The internal volume of the build module may comprise a gas that is non-reactive with the pre-transformed material (e.g., before, after, and/or during the printing). The build module may comprise a gas that is non-reactive with a remainder of starting material that did not form the 3D object. The build module internal atmosphere can be (a) above ambient pressure, (b) inert, (c) different from the ambient atmosphere, (d) non-reactive with the pre-transformed material, remainder, and/or one or more 3D objects during the plurality of 3D printing cycles, (e) comprise a reactive agent below a threshold value, or (f) any combination thereof. The 3D object, remainder (e.g., including the pre-transformed material), and/or a new pre-transformed material may be stored in the build module for a period. For example, contents within the internal volume of the build module can be stored in any of atmospheres (a), (b), (c), (d), (e), or (f) supra for a period between processing operations, such as after forming the 3D object and before removing the 3D object from the build module (e.g., when the build module is coupled to the unpacking station). In some cases, the period may be at least about 0.5 day, 1 day, 2 days, 3 days, 4 days, 5 days, 6 days, 7 days, or 10 days. The period may be any period between the afore-mentioned periods (e.g., from about 0.5 day to about 10 days, from about 0.5 day to about 4 days, or from about 2 days to about 7 days). The period may be limited by the reduction rate of the pressure in the build module, and/or the leakage rate of a relative agent (e.g., comprising oxygen or humidity) in the ambient environment into the build module. The amount of reactive species (e.g., reactive agent) may be controlled. The control may be to maintain a level below a threshold value. The threshold value may correspond to a detectable degree of a reaction product of the reactive agent with the pre-transformed material (or remainder) that is detectable. The threshold value may correspond to a detectable degree of a reaction product of the reactive agent with the pre-transformed material (or remainder) that causes at least one detectable defect in the material properties and/or structural properties of the pre-transformed material (or remainder). The reaction product may be generated on the surface of the pre-transformed material (e.g., on the surface of the particles of the particulate material). The reaction may occur following an engagement of the build module with the processing chamber. The reaction may occur during the release of the internal atmosphere of the build chamber into the processing chamber (e.g., followed by the 3D printing). The reaction may occur during the 3D printing. The reaction may cause defects in the material properties (e.g., cracking) and/or structural properties (e.g., warping) of the 3D object (e.g., as described herein). The threshold may correspond to the threshold of the depleted or reduced level of gas disclosed herein. The level of the depleted or reduced level gas may correspond to the level of reactive agent. The depleted or reduced level gas may comprise oxygen or water. The threshold value may correspond to the reactive agent in the internal volume of the build module. The reactive agent may comprise water (e.g., humidity) or oxygen. The threshold value of oxygen may be at most about 5 ppm, 10 ppm, 50 ppm, 100 ppm, 150 ppm, 300 ppm, or 500 ppm. The threshold value of oxygen may be between any of the afore-mentioned values (e.g., from about 5 ppm to about 500 ppm, from about 5 ppm to about 300 ppm, or from about 5 ppm to about 100 ppm). The build module may be configured to accommodate at least about 5 liters, 15 liters, 25 liters, or 30 liters of starting material. The platform may be configured to support at least about 5 liters, 15 liters, 25 liters, or 30 liters of starting material. The build module (in its closed configuration) may be configured to permit accumulation (in the internal volume of the build module) of water weight per liter of starting material for a prolonged period. The build module in its closed state can comprise a closed (e.g., sealed) shutter (e.g., lid). For example, the build module (in its closed configuration) may be configured to permit accumulation (in the internal volume of the build module) of water weight of at most about 10 micrograms (μgr), 50 μgr, 100 μgr, 500 μgr, or 1000 μgr, per liter of starting material (e.g., powder), for a period of at least about 1 days, 2 days, 3 days, 5 days or 7 days. The build module in a closed state may be configured to permit accumulation of water weight between any of the aforementioned values (e.g., from about 10 μgr to about 1000 μgr, from about 10 μgr to about 500 μgr, or from about 100 μgr to about 1000 μgr), per liter of starting material, for a period of at least about 1 days, 2 days, 3 days, 5 days or 7 days. The build module (in its closed configuration) may be configured to limit an ingress (e.g., leakage or flow) of water into the internal volume of the build module. For example, the water may penetrate to the internal volume of the build module from an external water source (e.g., that contacts the build module (e.g., sealing area, seal material, build module shutter material and/or build module boundary material). For example, the water may penetrate to the internal volume of the build module from the ambient environment. The ingress of water into the internal volume of the build module may be at a rate of at most about 10 micrograms per day (μgr/d), 50 μgr/d, 100 μgr/d, 500 μgr/d, or 1000 μgr/d. The ingress of water into the internal volume of the build module may be at a rate between any of the afore-mentioned rates (e.g., from about 10 μgr/d, to about 1000 μrd/d, from about 10 μgr/d, to about 500 μgr/d, or from about 10 μgr/d to about 100 μgr/d). Maintaining a reduced level of reactive agent (e.g., such as by keeping a positive pressure of inert gas in the build module for a prolonged amount of time) can allow the contents of the build module to be kept in any of the atmospheres (a), (b), (c), (d), (e), or (f) supra, for example, with minimal (e.g., without) exposure to an external environment (e.g., ambient air). In some case, the build module is transported using a transit system, which may comprise movement by car, train, boat, or aircraft. The build module can be robotically and/or manually transported. The transportation may comprise transit between cities, states, countries, continents, or global hemispheres. The build module may comprise and/or may be operatively coupled to at least one sensor for detecting certain qualities of the internal atmosphere within the internal volume (e.g., pressure, temperature, types of reactive agent, and/or amounts of reactive agent). The build module may comprise at least one controller that controls (e.g., regulates, maintains, and/or modulates) (i) a level of the reactive agent in the build module, (ii) a pressure level in the build module, (iii) a temperature in the build module, or (iv) any combination thereof. The build module may be configured to allow cooling or heating of the internal volume. A controller may control a temperature alteration of the build module (e.g., internal volume thereof), e.g., to reach a threshold value, e.g., at a certain rate. The rate may be predetermined. The rate may comprise a temperature alteration function (e.g., linear or non-linear). For example, the build module (e.g., its internal volume) may be cooled to a handling temperature. For example, the build module may be heated to a temperature at which water parts from the starting material. For example, the build module may be heated to a pyrolytic temperature. The sensor and controller may be separate units or part of a single detector-controller unit. The build module may comprise at least one opening port that is configured to allow gas to pass to and/or from the internal volume. The opening port can be operatively coupled to a valve, a secondary pressurized gas source (e.g., gas cylinder or valve), or any combination thereof. The build module can comprise mechanisms and/or (e.g., structural) features that facilitate engagement with the processing chamber (e.g., through a load lock). The build module can comprise mechanisms and/or (e.g., structural) features that facilitate 3D printing (e.g., a vertically translatable platform). For example, the build module can comprise a lifting mechanism (e.g., an actuator configured to vertically translate the platform) that is configured to move the 3D object within the internal volume. The lifting mechanism can be configured to move the 3D object in accordance with a vertical axis, as described herein.

Figure 37:
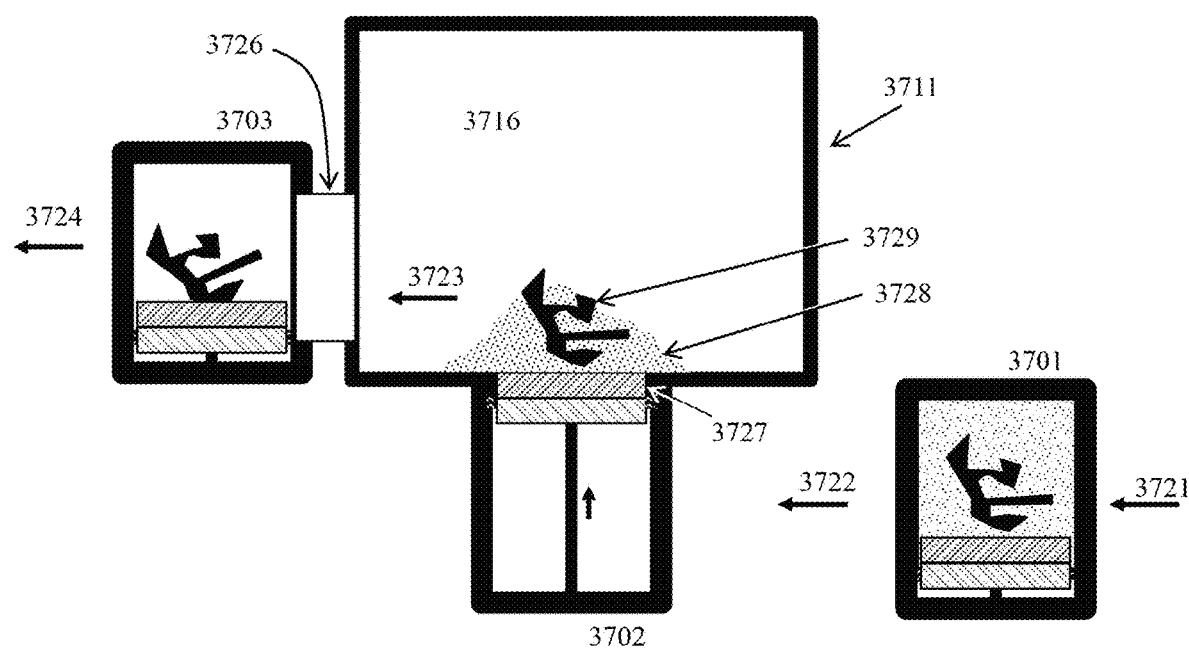
FIG. 37 schematically illustrates a vertical cross section of a 3D object unpacking system.

In some embodiments, the unpacking station can engage with a plurality of build modules (e.g., simultaneously). The plurality of build modules may comprise at least 2, 3, 4, 5, or 6 build modules. The unpacking station may comprise a plurality of reversibly closable openings (e.g., each of which comprises a reversibly removable shutter or lid). A plurality of reversibly closable build modules (e.g., each of which comprises a reversibly removable shutter or lid) may engage with, disengage with the unpacking station simultaneously or sequentially. A plurality of reversibly closable build may dock to the unpacking station at a given time. FIG. 37 shows an example of an unpacking station 3711 onto which two build modules 3702 and 3703 dock. The docking can be directly or indirectly (e.g., through a load lock). At least one of the plurality of build modules (e.g., 3702) can dock directly to the unpacking station. At least one of the plurality of build modules (e.g., 3703) can dock indirectly to the unpacking station (e.g., through a load lock 3726). The unpacking station may comprise a plurality of opening to facilitate simultaneous engagement of a plurality of build modules onto the unpacking station. The plurality of openings may comprise at least 2, 3, 4, 5, or 6 openings. When the build module docks onto the unpacking station, the build module opening may be sealed by a load lock shutter (lid), and the corresponding unpacking station opening may be sealed by an unpacking station shutter. The gaseous volume that is entrapped between the build module shutter and the processing chamber shutter upon their mutual engagement, may be purged, evacuated, and/or exchanged. The gaseous volume may be part of a load lock mechanism. After engagement of the build module with the unpacking station (e.g., and exchange of the entrapped gas between their shutters), the build module shutter and the respective unpacking station shutter may be removed to allow merging of the build module atmosphere with the unpacking station atmosphere (e.g., 3716), travel of the 3D object between the unpacking station and the unpacking station, and/or travel of the base (e.g., 3727) between the unpacking station and the build module.

The removal (e.g., by translation) of the build module shutter and the unpacking station shutter may be in the same direction or in different directions. The translation may be to any direction (e.g., any of the six spatial directions). The direction may comprise a Cartesian direction. The direction may comprise a cardinal direction. The direction may be horizontal or vertical. The direction may be lateral. In some examples, the shutters may be removed (e.g., from a position where they shut the opening) separately. FIG. 37 shows an example of unpacking a remainder (e.g., 3728) of a material bed that was not transformed to form the 3D object, from a 3D object (e.g., 3729). FIG. 37 shows an example in which a sealed first build module (e.g., 3701) comprising a formed 3D object in a material bed approaches (e.g., 3721) from a 3D printer (e.g., comprising a processing chamber) to an unpacking station (e.g., 3711); the first build module docks (e.g., 3702) onto the unpacking station and an actuator translates the 3D object onto the unpacking station where the remainder is separated from the 3D object; the 3D object is then translated into a second build module (e.g., 3703) that docks onto the unpacking station; which second build module subsequently separates from the unpacking station into a destination (e.g., 3724). Before separation of the second build module from the unpacking station, the second build module opening may be shut (e.g., by a shutter), and/or the respective unpacking station opening may be shut (e.g., by a shutter). Such closure of these two openings prior to their disengagement may ensure that upon disengagement of the second build module from the unpacking station, the remainder (e.g., comprising the pre-transformed material) and/or 3D object remain separate from the ambient atmosphere. Upon and/or after engagement of the build module and the unpacking station: (a) the build module shutter may be translated from the build module opening which the shutter reversibly closes, and/or (b) the unpacking station shutter may be translated from the unpacking station opening which the shutter reversibly closes. The translation of the two shutters may be simultaneous or sequential. The translation of the two shutters may be automatic or manual. The translation of the two shutters may be to the same or do different directions. The two shutters may engage with each other before and/or during the translation. The engagement may be using a mechanism comprising actuator, lever, shaft, clipper, or a suction cup. The engagement may include using a power generator that generates electrostatic, magnetic, hydraulic, or pneumatic force. The engagement may include using manual force and/or a robotic arm.

In some embodiments, the 3D object exchanges a base during the unpacking process in the unpacking station. In some embodiments, the 3D object may exchange a plurality of bases during unpacking (e.g., removal of the remainder). In some embodiments, plurality of bases may be present or coupled to an unpacking station (e.g., simultaneously). The plurality of bases may comprise at least 2, 3, 4, 5, or 6 bases. For example, the 3D object may be disposed adjacent to a first base (e.g., 3727) that is in turn disposed in a first build module (e.g., 3702). The 3D object and the first base may be separated from each other in the unpacking station, (e.g., before, during, and/or after the removal of the remainder). The 3D object may be disposed on a second base after its separation from the first base (e.g., in the unpacking station or in the second build module). The second build module may comprise the second base with the 3D object upon separation from the unpacking station (e.g., 3724). At least one of the two bases (e.g., the first base) may be manipulated (e.g., removed, or displaced) using an actuator. For example, at least one of the two bases may be manipulated using a robotic arm and/or manually. For example, at least one of the two bases may be manipulated using a pick-and-place mechanism (e.g., comprising a shaft and/or an actuator). At least two of the plurality of bases (e.g., the first and the second base) may be manipulated by the same mechanism. At least two of the plurality of bases may be manipulated by their own separate respective mechanism.

In some embodiments, when a build module is docked in the unpacking chamber, and the build module shutter and the unpacking chamber shutter are opened (e.g., removed), the vertical translation mechanism (e.g., elevator) may elevate the 3D object with its respective material bed into the unpacking chamber. The unpacking chamber atmosphere may be controlled. The 3D object (e.g., FIG. 18C, 1832) may be removed from the remainder of the material bed that did not transform to form the 3D object (e.g., FIG. 18C, 1833). The removal may be in a controlled (e.g., inert) atmosphere. The removal may be using a human or a machine. The removal may be fully automatic, partially automatic, or manual. The unpacking FIGS. 18A-18C show examples of 3D object removal using manual intervention (e.g., FIG. 18A), or mechanical intervention (e.g., FIG. 18B or 18C). The manual intervention may use a glove box. The machine (e.g., FIG. 18B, 1823) may be situated in the unpacking chamber (e.g., FIG. 18B, 1822). The machine (e.g., FIG. 18C, 1834) may be situated in the unpacking enclosure (e.g., FIG. 18C, 1836). The machine (e.g., FIG. 18C, 1834) may be situated outside of the unpacking chamber (e.g., FIG. 18C, 1835). The machine may be situated outside of the unpacking enclosure. At least one side of the unpacking chamber (e.g., 1812) may merge with at least one respective side of the unpacking station enclosure (e.g., 1811). At times, at least one side of the unpacking chamber (e.g., 1822) may not merge with at least one respective side of the unpacking station enclosure (e.g., 1821). The mechanical intervention may comprise a motor, a tweezer, a hook, a swivel axis, a joint, a crane, or a spring. The mechanical intervention device may comprise a robot. The mechanical intervention device may be controlled by a controller (e.g., locally, or remotely). The remote control may use a remote input device. The remote control may use a remote console device (e.g., a joystick). The controller may use a gaming console device. The controller may use a home video game console, handheld game console, microconsole, a dedicated console, or any combination thereof. The local controller may be directly connected to the unpacking station (e.g., using one or more wires), or through a local network (e.g., as disclosed herein). The local controller may be stationary or mobile. The remote controller may connect to the unpacking station through a network that is not local. The remote controller may be stationary or mobile. The unpacking station (e.g., unpacking chamber) may comprise its own controller. The controller may control (e.g., direct, monitor, and/or regulate) one or more apparatuses in the unpacking process, unpacking temperature, unpacking atmosphere. The apparatuses in the unpacking process may comprise a shutter, mechanical intervention device, pre-transformed material removal device (e.g., powder removal device).

The build module may comprise a first atmosphere, the processing chamber may comprise a second atmosphere, and the unpacking station may comprise a third atmosphere. At least two of the first, second, and third atmosphere may be detectibly the same. At least two of the first, second, and third atmosphere may differ. Differ may be in material (e.g., gaseous) composition and/or pressure. For example, the pressure in the build module may be higher than in the processing chamber (e.g., before their mutual engagement). For example, the pressure in the build module may be higher than in the unpacking station (e.g., before their mutual engagement). For example, the pressure in the build module may be lower than in the unpacking station (e.g., before their mutual engagement). For example, the pressure in the build module may be lower than in the processing chamber (e.g., before their mutual engagement). At least two of the first, second, and third atmosphere (e.g., all three atmospheres) may have a pressure above ambient pressure. The pressure above ambient pressure may deter reactive agents from the ambient atmosphere to penetrate into an enclosure having a positive atmospheric pressure (e.g., whether it is a build module, unpacking station, and/or processing chamber).

In some embodiments, the usage of reversibly closable (e.g., sealable) build modules may facilitate separation of the 3D object and/or any remainder of pre-transformed material that was not used to form the 3D object, from contacting at least one reactive agent in the ambient atmosphere. In some embodiments, the usage of reversibly closable (e.g., sealable) build modules may facilitate separation of a pre-transformed material from contacting at least one reactive agent in the ambient atmosphere.

Figure 23:
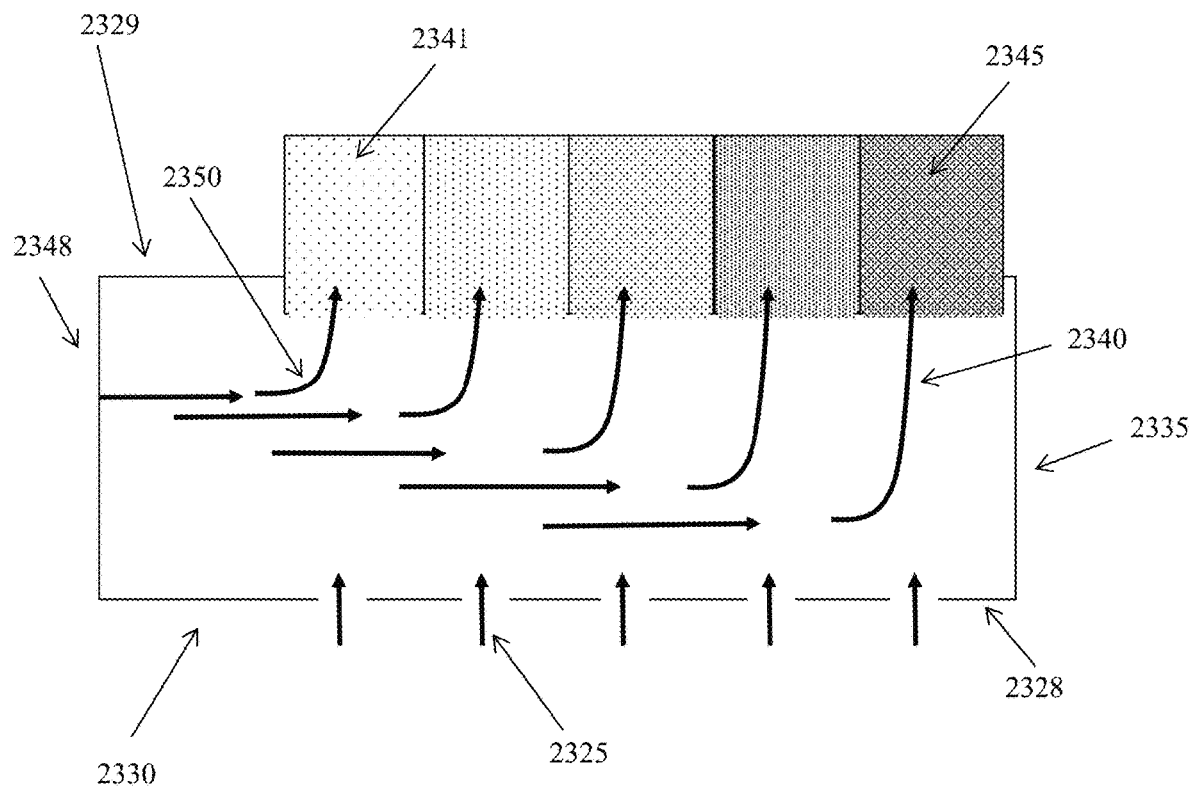
FIG. 23 schematically illustrates a vertical cross section of a component of a 3D printing system.

In some embodiments, material metrology of the 3D object is performed. The material metrology may be performed before, after, and/or during unpacking of the 3D object from the material bed. At times, the material metrology may be performed before, after, and/or during the 3D printing. Material metrology may comprise measuring material morphology, particle size distribution, chemical composition, or material volumes. The material may be sieved before recycling and/or 3D printing. Sieving may comprise passing a (e.g., liquid or particulate) material through a sieve. Sieving may comprise gas classifying the (e.g., liquid or particulate) material. Gas classifying may comprise air-classifying. FIG. 23 illustrates an example gas classifying mechanism. Gas classifying may include transporting a material (e.g., particulate material) through a channel (e.g., FIG. 23, 2330). A first set of gas flow carrying particulate material of various types (e.g., cross sections, or weights) may flow horizontally from a first horizontal side of the channel (e.g., 2348) to a second horizontal side of the channel (e.g., 2335). A second set of gas flow may flow vertically from a first vertical side of the channel (e.g., 2328) to a second vertical side (e.g., 2329). The second vertical side (e.g., FIG. 23, 2329) of the channel may comprise material collectors (e.g., bins, FIG. 23, 2345). As the particulate material flows from the first horizontal direction to the second horizontal direction, the particulate material interacts with the vertical flow set, and gets deflected from their horizontal flow course to a vertical flow course (e.g., 2340). The particulate material may travel (e.g., 2350) to the material collectors, depending on their size and/or weight, such that the lighter and smaller particles collect in the first collator (e.g., 2341), and the heaviest and largest particles collect at the last collector (e.g., 2345). FIG. 23 shows an example of a particle collector set, wherein the lightest shaded collector collects smaller and lighter particles, than the darker shaded collector. Blowing of gas (e.g., air) may allow the classification of the particulate material according to the size and/or weight. The material may be conditioned before use (e.g., re-use) within the enclosure. The material may be conditioned before, or after recycling.

Figure 18:
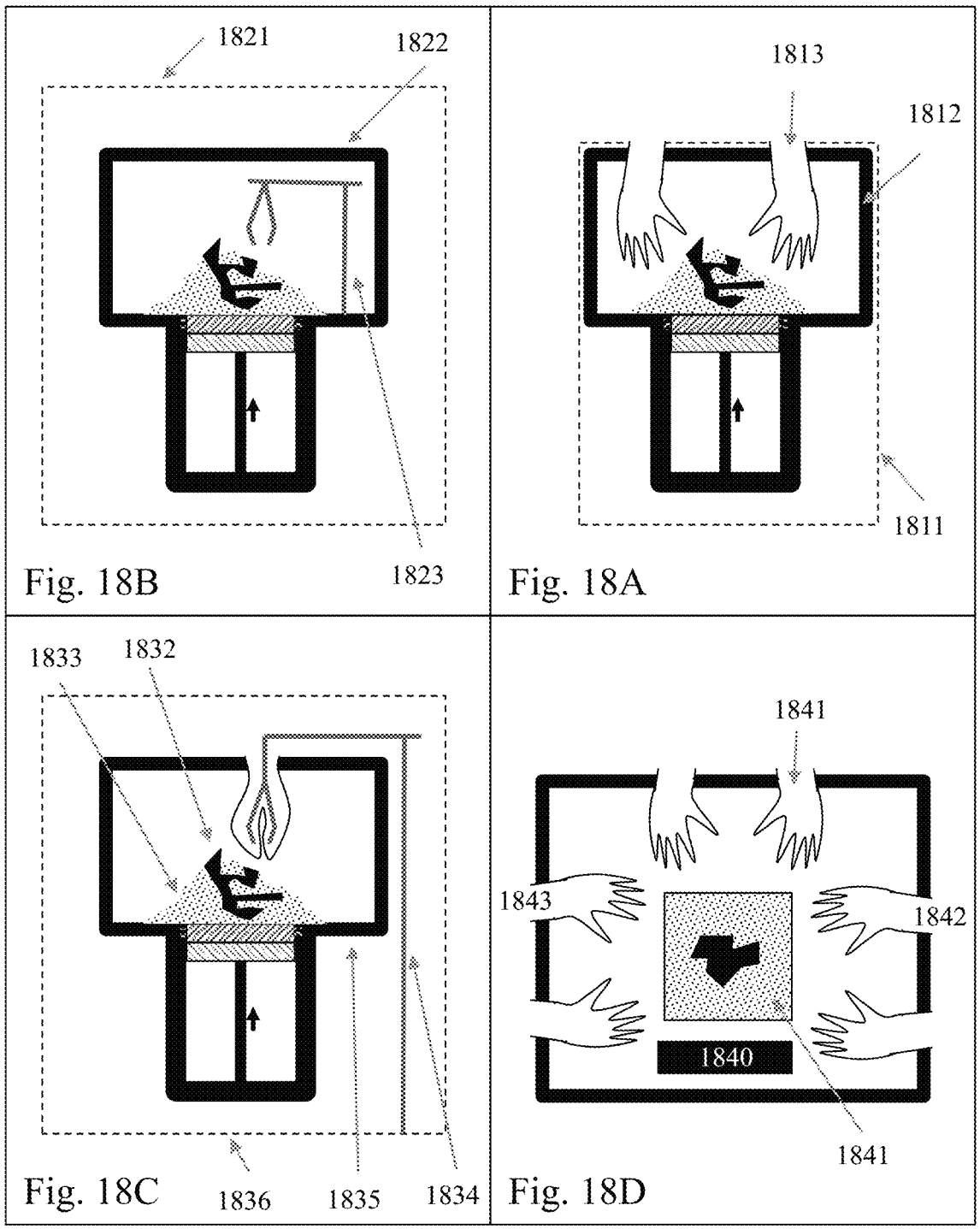
FIGS. 18A-18D schematically illustrate various views of 3D object unpacking systems.

In some embodiments, the pre-transformed material is removed from the 3D object (e.g., within the unpacking chamber) by suction (e.g., vacuum), gas blow, mechanical removal, magnetic removal, or electrostatic removal. Manners of pre-transformed material removal are disclosed, for example, in Patent Application serial number PCT/US15/36802, or in Provisional Patent Application Ser. No. 62/317,070 that are incorporated herein by reference in their entirety. The pre-transformed material may comprise shaking the pre-transformed material (e.g., powder) from the 3D object. The shaking may comprise vibrating. Vibrating may comprise using a motor. Vibrating may comprise using a vibrator or a sonicator. The vibration may comprise ultrasound waves, sound waves, or mechanical force. For example, the 3D object may be disposed on a scaffold that vibrates. The ultrasonic waves may travel through the atmosphere of the unpacking chamber. The ultrasonic waves may travel through the material bed disposed in the unpacking chamber. The scaffold may be tilted at an angle that allows the pre-transformed material to separate from the 3D object. The scaffold may be rotated in a way that allows the pre-transformed material to separate from the 3D object (e.g., a centrifugal rotation). The scaffold may comprise a rough surface that can hold the 3D object (e.g., using friction). The scaffold may comprise hinges that prevent slippage of the 3D object (e.g., during the vibrating operation). The scaffold may comprise one or more holes. The scaffold may comprise a mesh. The one or more holes or mesh may allow the pre-transformed material to pass through, and prevent the 3D object from passing through (e.g., such that the 3D object is held on an opposite side of the mesh from the removed pre-transformed material). FIG. 18, 1840 shows an example of a top view of a scaffold.

In some embodiments, the removal of the pre-transformed material comprises using a modular material removal mechanism. The material removal mechanism may be similar to the one used for leveling the exposed surface of the material bed. The material removal mechanism may be interchangeable between the 3D printing enclosure and the unpacking enclosure. For example, the material removal mechanism may be interchangeable between the processing chamber and the unpacking chamber. For example, the material removal mechanism may be used for at least one of leveling an exposed surface of a material bed, cleaning the processing chamber (e.g., from excess pre-transformed material), and removing the pre-transformed material from the 3D object. The material removal mechanism may remove the pre-transformed material and sieve it.

In some embodiments, the removed pre-transformed material (e.g., the remainder) is conditioned to be used in the 3D printing process. The remainder may be recycled and used in the 3D printing process. The unpacking station may further comprise a unit that allows conditioning of the pre-transformed material that was removed from the 3D object. Conditioning may comprise sieving of the pre-transformed material that was removed from the 3D object. Conditioning may be to allow recycling of the pre-transformed material and usage in a 3D printing cycle. Conditioning may be chemical conditioning (e.g., removal of oxide layer). Conditioning may be physical conditioning (e.g., such as sieving, e.g., removal of transformed material).

In some embodiments, the 3D printing system comprises a recycling mechanism. The recycling mechanism may be housed in a modular chamber and form the recycling module. The recycling module may comprise a pump, or a (e.g., physical, and/or chemical) conditioning mechanism. Physical conditioning may comprise a sieve. The recycling module may be operatively coupled to at least one of (i) the processing chamber (e.g., to the layer dispensing mechanism such as to the material dispensing mechanism) and (ii) the unpacking station. For example, the same recycling module may be coupled to (i) the processing and (ii) the unpacking station. For example, a first recycling module may be coupled to the processing chamber and a second (e.g., different) recycling module may be coupled to the unpacking station. Coupled may be physically connected. The recycling module may be reversibly coupled. The recycling module can be extracted and/or exchanged from the (i) the processing and/or (ii) the unpacking station before, during, or after the 3D printing.

In some examples, while the build module (housing the 3D object) travels outside of the 3D printer enclosure (e.g., between the 3D printer enclosure and the unpacking station enclosure), the build module is sealed. Sealing may be sufficient to maintain the atmosphere within the build module. Sealing may be sufficient to prevent influence of the atmosphere outside of the build module to the atmosphere within the build module. Sealing may be sufficient to prevent exposure of the pre-transformed material (e.g., powder) to reactive atmosphere. Sealing may be sufficient to prevent leakage of the pre-transformed material from the build module. Sufficient may be in the time scale in which the build module transfers from one enclosure to another (e.g., through an ambient atmosphere). Sufficient may be to maintain 3D object surface requirements. Sufficient may be to maintain safety requirements prevailing in the jurisdiction.

In some embodiments, the unpacking station comprises an unpacking chamber. The unpacking chamber may be accessed from one or more directions (e.g., sides) by a person or machine located outside of the unpacking chamber. In some embodiments, in addition to the docking area (e.g., FIG. 18D, 1841), the unpacking chamber may be accessed from at least one, two, three, four, five, or six directions by a person or machine located outside of the unpacking chamber. FIG. 18A shows an unpacking chamber that can be accessed from the top (e.g., 1813). FIG. 18D shows a top view of an unpacking chamber that can be accessed by a person standing outside from three directions (e.g., 1841, 1842, and 1843). In some embodiments, the 3D object may be removed from an opening (e.g., a door) of the unpacking chamber. The removal of the 3D object may be directly from the unpacking chamber (e.g., not through usage of the build module).

In some embodiments, the material bed disposed within the unpacking chamber is translated (e.g., moved). The movement can be effectuated by using a moving 3D plane. The 3D plane may be planar, curved, or assume an amorphous 3D shape. The 3D plane may be a strip, a blade, or a ledge. The 3D plane may comprise a curvature. The 3D plane may be curved. The 3D plane may be planar (e.g., flat). The 3D plane may have a shape of a curving scarf. The term "3D plane" is understood herein to be a generic (e.g., curved) 3D surface. For example, the 3D plane may be a curved 3D surface. Movement of the material bed by a 3D plane is disclosed, for example, in Patent Application Ser. No. 62/317,070 that is incorporated herein by reference in its entirety. The 3D plane may be form a shovel, or squeegee. The 3D plane may be from a rigid or flexible material. The 3D plane may move the material bed from the docking station to a different position in the unpacking chamber. For example, the different position may be on the scaffold.

In some embodiments, the removal of the 3D object from the material bed is manual or automatic. The removal of the 3D object from the material bed may be at least partially automatic. Removal of the 3D object from the build module may comprise removal of the 3D object from the material bed. Removal of the 3D object from the build module may comprise removal of the remainders of the material bed that did not transform to form the 3D object, from the generated 3D object. The removal of substantially all the remainder of the material bed is disclosed in Patent Application serial number PCT/US15/36802 that is incorporated herein in its entirety.

In some cases, unused pre-transformed material (e.g., remainder) surrounds the 3D object in the material bed. The unused pre-transformed material can be substantially removed from the 3D object. Substantial removal may refer to pre-transformed material covering at most about 20%, 15%, 10%, 8%, 6%, 4%, 2%, 1%, 0.5%, or 0.1% of the surface of the 3D object after removal. Substantial removal may refer to removal of all the pre-transformed material that was disposed in the material bed and remained as pre-transformed material at the end of the 3D printing process (e.g., the remainder), except for at most about 10%, 3%, 1%, 0.3%, or 0.1% of the weight of the remainder. Substantial removal may refer to removal of all the remainder except for at most about 50%, 10%, 3%, 1%, 0.3%, or 0.1% of the weight of the printed 3D object. The unused pre-transformed material (e.g., powder) can be removed to permit retrieval of the 3D object without digging through the pre-transformed material. For example, the unused pre-transformed material can be suctioned out of the material bed by one or more vacuum ports built adjacent to the powder bed. After the unused pre-transformed material is evacuated, the 3D object can be removed and the unused pre-transformed material can be re-circulated to a reservoir for use in future 3D prints.

In some embodiments, the 3D object is generated on a mesh substrate. A solid platform (e.g., base or substrate) can be disposed underneath the mesh such that the powder stays confined in the pre-transformed material bed and the mesh holes are blocked. The blocking of the mesh holes may not allow a substantial amount of pre-transformed material to flow through. The mesh can be moved (e.g., vertically or at an angle) relative to the solid platform by pulling on one or more posts connected to either the mesh or the solid platform (e.g., at the one or more edges of the mesh or of the base) such that the mesh becomes unblocked. The one or more posts can be removable from the one or more edges by a threaded connection. The mesh substrate can be lifted out of the material bed with the 3D object to retrieve the 3D object such that the mesh becomes unblocked. Alternatively, the solid platform can be tilted, horizontally moved such that the mesh becomes unblocked. When the mesh is unblocked, at least part of the powder flows from the mesh while the 3D object remains on the mesh.

In some embodiments, the 3D object is built on a construct comprising a first and a second mesh, such that at a first position the holes of the first mesh are completely obstructed by the solid parts of the second mesh such that no powder material can flow through the two meshes at the first position, as both mesh holes become blocked. The first mesh, the second mesh, or both can be controllably moved (e.g., horizontally or in an angle) to a second position. In the second position, the holes of the first mesh and the holes of the second mesh are at least partially aligned such that the pre-transformed material disposed in the material bed can flow through to a position below the two meshes, leaving the exposed 3D object.

In some cases, a cooling gas is directed to the hardened material (e.g., 3D object) for cooling the hardened material during its retrieval. The mesh can be sized such that the unused pre-transformed material will sift through the mesh as the 3D object is exposed from the material bed. In some cases, the mesh can be attached to a pulley or other mechanical device such that the mesh can be moved (e.g., lifted) out of the material bed with the 3D part.

In some cases, the 3D object (i.e., 3D part) is retrieved within at most about 12 hours (h), 6 h, 5 h, 4 h, 3 h, 2 h, 1 h, 30 minutes (min), 20 min, 10 min, 5 min, 1 min, 40 seconds (sec), 20 sec, 10 sec, 9 sec, 8 sec, 7 sec, 6 sec, 5 sec, 4 sec, 3 sec, 2 sec, or 1 sec after transforming of at least a portion of the last powder layer. The 3D object can be retrieved during a time period between any of the afore-mentioned time periods (e.g., from about 12 h to about 1 sec, from about 12 h to about 30 min, from about 1 h to about 1 sec, or from about 30 min to about 40 sec).

In some embodiments, the 3D object is retrieved at a pre-determined (e.g., handling) temperature. In some embodiments, the 3D object is retrieved at a handling (e.g., predetermined) temperature. The 3D object can be retrieved when the 3D object (composed of hardened (e.g., solidified) material) is at a handling temperature that is suitable to permit the removal of the 3D object from the material bed without substantial deformation. The handling temperature can be a temperature that is suitable for packaging of the 3D object. The handling temperature can be at most about 120° C., 100° C., 80° C., 60° C., 40° C., 30° C., 25° C., 20° C., 10° C., or 5° C. The handling temperature can be of any value between the afore-mentioned temperature values (e.g., from about 120° C. to about 20° C., from about 40° C. to about 5° C., or from about 40° C. to about 10° C.). The deformation may include geometric distortion. The deformation may include internal deformation. Internal may be within the 3D object or a portion thereof. The deformation may include a change in the material properties. The deformation may be disruptive (e.g., for the intended purpose of the 3D object). The deformation may comprise a geometric deformation. The deformation may comprise inconsistent material properties. The deformation may occur before, during, and/or after hardening of the transformed material.

The deformation may comprise bending, warping, arching, curving, twisting, balling, cracking, bending, or dislocating. Deviation may comprise deviation from a structural dimension or from desired material characteristic.

In some embodiments, the generated 3D object requires very little or no further processing after its retrieval. Further processing may be post printing processing. Further processing may comprise trimming, as disclosed herein. Further processing may comprise polishing (e.g., sanding). In some cases, the generated 3D object can be retrieved and finalized without removal of transformed material and/or auxiliary support features.

In some embodiments, the generated 3D object is deviated from its intended dimensions. The 3D object (e.g., solidified material) that is generated can have an average deviation value from the intended dimensions (e.g., of a desired 3D object) of at most about 0.5 microns (μm), 1 μm, 3 μm, 10 μm, 30 μm, 100 μm, 300 μm or less. The deviation can be any value between the afore-mentioned values. The average deviation can be from about 0.5 μm to about 300 μm, from about 10 μm to about 50 μm, from about 15 μm to about 85 μm, from about 5 μm to about 45 μm, or from about 15 μm to about 35 μm. The 3D object can have a deviation from the intended dimensions in a specific direction, according to the formula $Dv+L/K_{dv}$, wherein Dv is a deviation value, L is the length of the 3D object in a specific direction, and $K_{dv}$ is a constant. Dv can have a value of at most about 300 μm, 200 μm, 100 μm, 50 μm, 40 μm, 30 μm, 20 μm, 10 μm, 5 μm, 1 μm, or 0.5 μm. Dv can have a value of at least about 0.5 μm, 1 μm, 3 μm, 5 μm, 10 μm, 20 μm, 30 μm, 50 μm, 70 μm, 100 μm, 300 μm or less. Dv can have any value between the afore-mentioned values. For example, Dv can have a value that is from about 0.5 μm to about 300 μm, from about 10 μm to about 50 μm, from about 15 μm to about 85 μm, from about 5 μm to about 45 μm, or from about 15 μm to about 35 μm. $K_{dv}$ can have a value of at most about 3000, 2500, 2000, 1500, 1000, or 500. $K_{dv}$ can have a value of at least about 500, 1000, 1500, 2000, 2500, or 3000. $K_{dv}$ can have any value between the afore-mentioned values. For example, $K_{dv}$ can have a value that is from about 3000 to about 500, from about 1000 to about 2500, from about 500 to about 2000, from about 1000 to about 3000, or from about 1000 to about 2500.

In some embodiments, the generated 3D object (i.e., the printed 3D object) does not require further processing following its generation by a method described herein. The printed 3D object may require reduced amount of processing after its generation by a method described herein. For example, the printed 3D object may not require removal of auxiliary support (e.g., since the printed 3D object was generated as a 3D object devoid of auxiliary support). The printed 3D object may not require smoothing, flattening, polishing, or leveling. The printed 3D object may not require further machining In some examples, the printed 3D object may require one or more treatment operations following its generation (e.g., post generation treatment, or post printing treatment). The further treatment step(s) may comprise surface scraping, machining, polishing, grinding, blasting (e.g., sand blasting, bead blasting, shot blasting, or dry ice blasting), annealing, or chemical treatment. The further treatment may comprise physical or chemical treatment. The further treatment step(s) may comprise electrochemical treatment, ablating, polishing (e.g., electro polishing), pickling, grinding, honing, or lapping. In some examples, the printed 3D object may require a single operation (e.g., of sand blasting) following its formation. The printed 3D object may require an operation of sand blasting following its formation. Polishing may comprise electro polishing (e.g., electrochemical polishing or electrolytic polishing). The further treatment may comprise the use of abrasive(s). The blasting may comprise sand blasting or soda blasting. The chemical treatment may comprise use of an agent. The agent may comprise an acid, a base, or an organic compound. The further treatment step(s) may comprise adding at least one added layer (e.g., cover layer). The added layer may comprise lamination. The added layer may be of an organic or inorganic material. The added layer may comprise elemental metal, metal alloy, ceramic, or elemental carbon. The added layer may comprise at least one material that composes the printed 3D object. When the printed 3D object undergoes further treatment, the bottom most surface layer of the treated object may be different than the original bottom most surface layer that was formed by the 3D printing (e.g., the bottom skin layer).

In some embodiments, the methods described herein are performed in the enclosure (e.g., container, processing chamber, and/or build module). One or more 3D objects can be formed in the enclosure (e.g., simultaneously, and/or sequentially). The enclosure may have a predetermined and/or controlled pressure. The enclosure may have a predetermined and/or controlled atmosphere. The control may be manual or via a control system. The atmosphere may comprise at least one gas. In some embodiments, during the 3D printing, the material bed is at a constant pressure (e.g., without substantial pressure variations).

In some embodiments, the enclosure comprises ambient pressure (e.g., 1 atmosphere), negative pressure (i.e., vacuum) or positive pressure. Different portions of the enclosure may have different atmospheres. The different atmospheres may comprise different gas compositions. The different atmospheres may comprise different atmosphere temperatures. The different atmospheres may comprise ambient pressure (e.g., 1 atmosphere), negative pressure (i.e., vacuum) or positive pressure. The different portions of the enclosure may comprise the processing chamber, build module, or enclosure volume excluding the processing chamber and/or build module. The vacuum may comprise pressure below 1 bar, or below 1 atmosphere. The positively pressurized environment may comprise pressure above 1 bar or above 1 atmosphere. The pressure in the enclosure can be at least about $10^{-7}$ Torr, $10^{-6}$ Torr, $10^{-5}$ Torr, $10^4$ Torr, $10^{-3}$ Torr, 10 Torr, $10^{-1}$ Torr, 1 Torr, 10 Torr, 100 Torr, 1 bar, 2 bar, 3 bar, 4 bar, 5 bar, 10 bar, 20 bar, 30 bar, 40 bar, 50 bar, 100 bar, 200 bar, 300 bar, 400 bar, 500 bar, 1000 bar, or 1100 bar. The pressure in the enclosure can be at least about 100 Torr, 200 Torr, 300 Torr, 400 Torr, 500 Torr, 600 Torr, 700 Torr, 720 Torr, 740 Torr, 750 Torr, 760 Torr, 900 Torr, 1000 Torr, 1100 Torr, or 1200 Torr. The pressure in the enclosure can be between any of the afore-mentioned enclosure pressure values (e.g., from about $10^{-7}$ Torr to about 1200 Torr, from about $10^{-7}$ Torr to about 1 Torr, from about 1 Torr to about 1200 Torr, or from about $10^{-2}$ Torr to about 10 Torr). The chamber can be pressurized to a pressure of at least $10^{-7}$ Torr, $10^{-6}$ Torr, $10^{-5}$ Torr, $10^{-4}$ Torr, $10^{-3}$ Torr, $10^{-2}$ Torr, $10^{-1}$ Torr, 1 Torr, 10 Torr, 100 Torr, 1 bar, 2 bar, 3 bar, 4 bar, 5 bar, 10 bar, 20 bar, 30 bar, 40 bar, 50 bar, 100 bar, 200 bar, 300 bar, 400 bar, 500 bar, or 1000 bar. The chamber can be pressurized to a pressure of at most $10^{-7}$ Torr, $10^{-6}$ Torr, $10^{-5}$ Torr, $10^{-4}$ Torr, $10^{-3}$ Torr, $10^{-2}$ Torr, $10^{-1}$ Torr, 1 Torr, 10 Torr, 100 Torr, 1 bar, 2 bar, 3 bar, 4 bar, 5 bar, 10 bar, 20 bar, 30 bar, 40 bar, 50 bar, 100 bar, 200 bar, 300 bar, 400 bar, 500 bar, or 1000 bar. The pressure in the chamber can be at a range between any of the afore-mentioned pressure values (e.g., from about $10^{-7}$ Torr to about 1000 bar, from about $10^{-7}$ Torr to about 1 Torr, from about 1 Torr to about 100 Barr, from about 1 bar to about 10 bar, from about 1 bar to about 100 bar, or from about 100 bar to about 1000 bar). In some cases, the chamber pressure can be standard atmospheric pressure. The pressure may be measured at an ambient temperature (e.g., room temperature, 20° C., or 25° C.).

In some embodiments, the enclosure includes an atmosphere. The enclosure may comprise a (e.g., substantially) inert atmosphere. The atmosphere in the enclosure may be (e.g., substantially) depleted by one or more gases present in the ambient atmosphere. The atmosphere in the enclosure may include a reduced level of one or more gases relative to the ambient atmosphere. For example, the atmosphere may be substantially depleted, or have reduced levels of water (i.e., humidity), oxygen, nitrogen, carbon dioxide, hydrogen sulfide, or any combination thereof. The level of the depleted or reduced level gas may be at most about 1 ppm, 10 ppm, 50 ppm, 100 ppm, 500 ppm, 1000 ppm, 5000 ppm, 10000 ppm, 25000 ppm, 50000 ppm, or 70000 ppm volume by volume (v/v). The level of the gas (e.g., depleted or reduced level gas, oxygen, or water) may between any of the afore-mentioned levels of gas (e.g., from about 1 ppm to about 500 ppm, from about 10 ppm to about 100 ppm, from about 500 ppm to about 5000 ppm). The reduced level of gas may be compared to the level of gas in the ambient environment. The gas may be a reactive agent. The atmosphere may comprise air. The atmosphere may be inert. The atmosphere may be non-reactive. The atmosphere may be non-reactive with the material (e.g., the pre-transformed material deposited in the layer of material (e.g., powder), or the material comprising the 3D object). The atmosphere may prevent oxidation of the generated 3D object. The atmosphere may prevent oxidation of the pre-transformed material within the layer of pre-transformed material before its transformation, during its transformation, after its transformation, before its hardening, after its hardening, or any combination thereof. The atmosphere may comprise argon or nitrogen gas. The atmosphere may comprise a Nobel gas. The atmosphere can comprise a gas selected from the group consisting of argon, nitrogen, helium, neon, krypton, xenon, hydrogen, carbon monoxide, and carbon dioxide. The atmosphere may comprise hydrogen gas. The atmosphere may comprise a safe amount of hydrogen gas. The atmosphere may comprise a v/v percent of hydrogen gas of at least about 0.05%, 0.1%, 0.2%, 0.3%, 0.4%, 0.5%, 0.6%, 0.7%, 0.8%, 0.9%, 1%, 2%, 3%, 4%, or 5%, at ambient pressure (e.g., and ambient temperature). The atmosphere may comprise a v/v percent of hydrogen gas of at most about 0.05%, 0.1%, 0.2%, 0.3%, 0.4%, 0.5%, 0.6%, 0.7%, 0.8%, 0.9%, 1%, 2%, 3%, 4%, or 5%, at ambient pressure (e.g., and ambient temperature). The atmosphere may comprise any percent of hydrogen between the afore-mentioned percentages of hydrogen gas. The atmosphere may comprise a v/v hydrogen gas percent that is at least able to react with the material (e.g., at ambient temperature and/or at ambient pressure), and at most adhere to the prevalent work-safety standards in the jurisdiction (e.g., hydrogen codes and standards). The material may be the material within the layer of pre-transformed material (e.g., powder), the transformed material, the hardened material, or the material within the 3D object. Ambient refers to a condition to which people are generally accustomed. For example, ambient pressure may be 1 atmosphere. Ambient temperature may be a typical temperature to which humans are generally accustomed. For example, from about 15° C. to about 30° C., from about −30° C. to about 60° C., from about −20° C. to about 50° C., from 16° C. to about 26° C., from about 20° C. to about 25° C. "Room temperature" may be measured in a confined or in a non-confined space. For example, "room temperature" can be measured in a room, an office, a factory, a vehicle, a container, or outdoors. The vehicle may be a car, a truck, a bus, an airplane, a space shuttle, a space ship, a ship, a boat, or any other vehicle. Room temperature may represent the small range of temperatures at which the atmosphere feels neither hot nor cold, approximately 24° C. it may denote 20° C., 25° C., or any value from about 20° C. to about 25° C.

Figure 5:
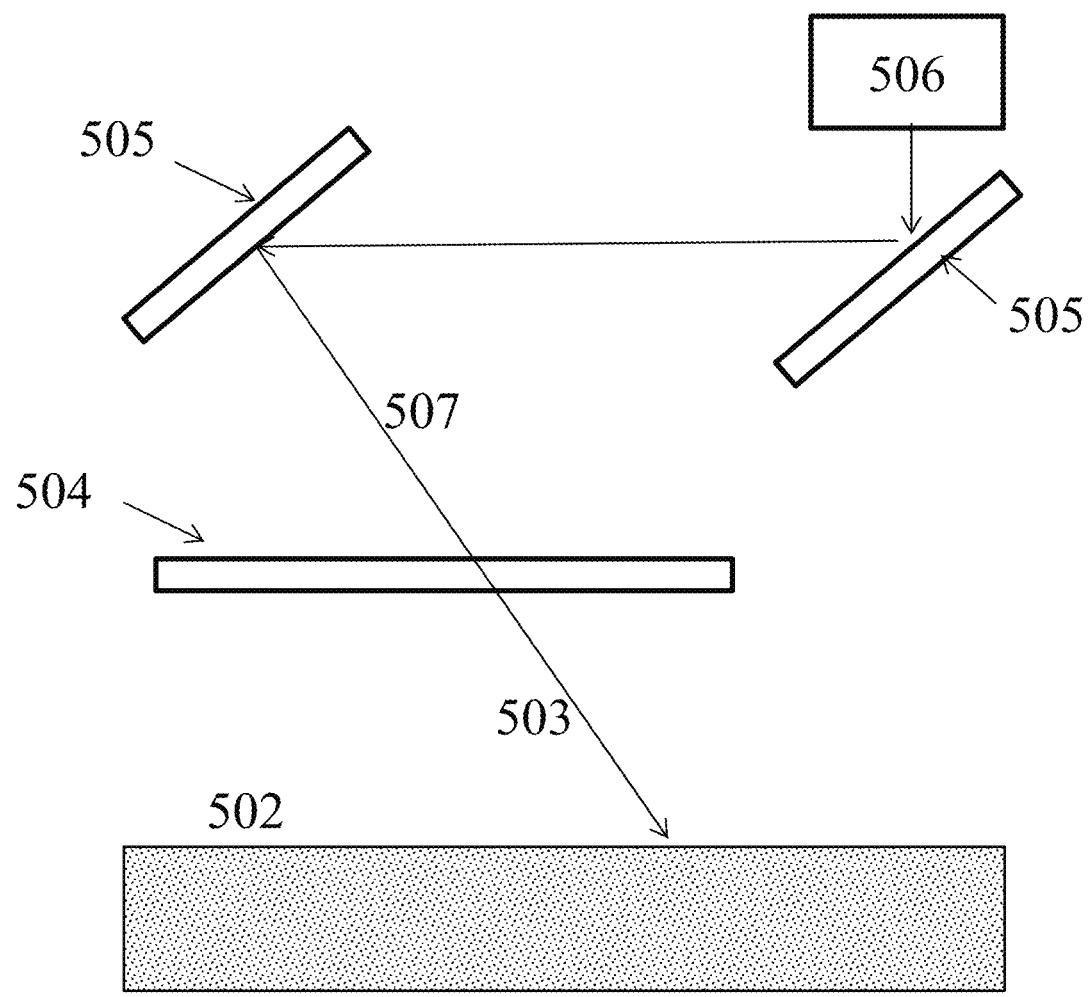
FIG. 5 schematically illustrates a vertical cross section of components in a 3D printing system.

In some embodiments, the pre-transformed material is deposited in an enclosure (e.g., a container). FIG. 1 shows an example of a container. The container can contain the pre-transformed material to form a material bed (e.g., may contain the pre-transformed material without spillage; FIG. 1, 104). The material bed may have a horizontal cross sectional shape, which cross sectional shape may be a geometrical shape (e.g., any geometric shape described herein, for example, triangle, rectangle (e.g., square), ellipse (e.g., circle), or any other polygon). The material may be placed in, or inserted to the container. The material may be deposited in, pushed to, sucked into, or lifted to the container. The material may be layered (e.g., spread) in the container. The container may comprise a substrate (e.g., FIG. 1, 109). The substrate may be situated adjacent to the bottom of the container (e.g., FIG. 1, 111). Bottom may be relative to the gravitational field, or relative to the position of the footprint of the energy beam (e.g., FIG. 1, 101) on the layer of pre-transformed material as part of a material bed. The footprint of the energy beam may follow a Gaussian bell shape. In some embodiments, the footprint of the energy beam does not follow a Gaussian bell shape. The container may comprise a platform comprising a base (e.g., FIG. 1, 102). The platform may comprise a substrate. The base may reside adjacent to the substrate. The pre-transformed material may be layered adjacent to a side of the container (e.g., on the bottom of the container). The pre-transformed material may be layered adjacent to the substrate and/or adjacent to the base. Adjacent to may be above. Adjacent to may be directly above, or directly on. The substrate may have one or more seals (e.g., 103) that enclose the material in a selected area within the container (e.g., FIG. 1, 111). The one or more seals may be flexible or non-flexible. The one or more seals may comprise a polymer or a resin. The one or more seals may comprise a round edge or a flat edge. The one or more seals may be bendable or non-bendable. The seals may be stiff. The container may comprise the base. The base may be situated within the container. The container may comprise the platform, which may be situated within the container. The enclosure, container, processing chamber, and/or building module may comprise an optical window. An example of an optical window can be seen in FIG. 1, 115. The optical window may allow the energy beam (e.g., 101) to pass through without (e.g., substantial) energetic loss. For example, the energy beam FIG. 5, 507 is (e.g., substantially) equal to the energy beam 503 that traveled through the optical window 504. A ventilator may prevent spatter from accumulating on the surface optical window that is disposed within the enclosure (e.g., within the processing chamber) during the 3D printing. An opening of the ventilator may be situated within the enclosure (e.g., comprising atmosphere 126).

In some embodiments, the pre-transformed material is deposited in the enclosure by a material dispensing mechanism (e.g., FIGS. 1, 116, 117 and 118) to form a layer of pre-transformed material within the enclosure. The deposited material may be leveled by a leveling operation. The leveling operation may comprise using a material (e.g., powder) removal mechanism that does not contact the exposed surface of the material bed (e.g., FIG. 1, 118). The leveling operation may comprise using a leveling mechanism that contacts the exposed surface of the material bed (e.g., FIG. 1, 117). The material (e.g., powder) dispensing mechanism may comprise one or more dispensers (e.g., FIG. 1, 116). The material dispensing system may comprise at least one material (e.g., bulk) reservoir. The material may be deposited by a layer dispensing mechanism (e.g., recoater). The layer dispensing mechanism may level the dispensed material without contacting the material bed (e.g., the top surface of the powder bed). The layer dispensing mechanism may include any layer dispensing mechanism and/or a material (e.g., powder) dispenser used in 3D printing such as, for example, the ones disclosed in application number PCT/US15/36802 titled "APPARATUSES, SYSTEMS AND METHODS FOR 3D PRINTING" that was filed on Jun. 19, 2015, or in Provisional Patent Application Ser. No. 62/317,070 that was filed on Apr. 1, 2016, titled "APPARATUSES, SYSTEMS AND METHODS FOR EFFICIENT THREE-DIMENSIONAL PRINTING," both of which are entirely incorporated herein by references.

In some embodiments, the layer dispensing mechanism includes components comprising a material dispensing mechanism, material leveling mechanism, material removal mechanism, or any combination or permutation thereof. The layer dispensing mechanism and any of its components may be any layer dispensing mechanism (e.g., used in 3D printing) such as for example, any of the ones described in Patent Application serial number PCT/US15/36802, or in Provisional Patent Application Ser. No. 62/317,070, both of which are entirely incorporated herein by references.

In some embodiments, the 3D printing system comprises a platform. The platform (also herein, "printing platform" or "building platform") may be disposed in the enclosure (e.g., in the build module and/or processing chamber). The platform may comprise a substrate or a base. The substrate and/or the base may be removable or non-removable. The building platform may be (e.g., substantially) horizontal, (e.g., substantially) planar, or non-planar. The platform may have a surface that points towards the deposited pre-transformed material (e.g., powder material), which at times may point towards the top of the enclosure (e.g., away from the center of gravity). The platform may have a surface that points away from the deposited pre-transformed material (e.g., towards the center of gravity), which at times may point towards the bottom of the container. The platform may have a surface that is (e.g., substantially) flat and/or planar. The platform may have a surface that is not flat and/or not planar. The platform may have a surface that comprises protrusions or indentations. The platform may have a surface that comprises embossing. The platform may have a surface that comprises supporting features (e.g., auxiliary support). The platform may have a surface that comprises a mold. The platform may have a surface that comprises a wave formation. The surface may point towards the layer of pre-transformed material within the material bed. The wave may have an amplitude (e.g., vertical amplitude or at an angle). The platform (e.g., base) may comprise a mesh through which the pre-transformed material (e.g., the remainder) may flow through. The platform may comprise a motor. The platform (e.g., substrate and/or base) may be fastened to the container. The platform (or any of its components) may be transportable. The transportation of the platform may be controlled and/or regulated by a controller (e.g., control system). The platform may be transportable horizontally, vertically, or at an angle (e.g., planar or compound).

In some embodiments, the platform comprises an engagement mechanism. The engagement mechanism may facilitate engagement and/or dis-engagement of a base (e.g., FIG. 1, 102) to a substrate (e.g., FIG. 1, 109). The substrate may comprise a (e.g., horizontal) cross section having a geometrical shape. The geometrical shape can be any geometrical shape described herein, e.g., a polygon, triangle, ellipse (e.g., circle), or rectangle. The substrate may comprise a 3D shape. The 3D shape may form a protrusion or intrusion from the average plane of an exposed surface of the substrate. The 3D shape may comprise a cuboid (e.g., cube), or a tetrahedron. The 3D shape may comprise a polyhedron (e.g., primary parallelohedron), at least a portion of an ellipse (e.g., circle), a cone, or a cylinder. The polyhedron may be a prism (e.g., hexagonal prism), or octahedron (e.g., truncated octahedron). The substrate may comprise a Platonic solid. The substrate may comprise octahedra, truncated octahedron, or a cube. The substrate may comprise convex polyhedra (e.g., with regular faces). The substrate may comprise a triangular prism, hexagonal prism, cube, truncated octahedron, or gyrobifastigium. The substrate may comprise a pentagonal pyramid. FIGS. 29A-29B, 30A-30B and 31A-31B show to view examples of various substrates. A (e.g., horizontal) cross section of the substrate may be (e.g., substantially) rectangular (e.g., 2908, 2920, 3008, or 3020). A (e.g., horizontal) cross section of the substrate may be (e.g., substantially) elliptical. For example, the (e.g., horizontal) cross section of the substrate may be (e.g., substantially) circular (e.g., 3130, or 3155). A (e.g., horizontal) cross section of the substrate may be (e.g., substantially) triangular. A (e.g., horizontal) cross section of the substrate may comprise a polygonal shape. The substrate may comprise a fastener (e.g., 2905, 2945, 3005, 3145, or 3185). The fastener can comprise an interlocking mechanism. The interlocking mechanism may be any interlocking mechanism described herein. For example, the fastener can comprise a clamping mechanism. The fastener may facilitate engagement and/or locking of the substrate to the. The fastener may brace, band, clamp, or clasp the base to the substrate (e.g., as part of the platform). The fastener may hold the base together with the substrate. The fastener may comprise a clamping station. The fastener may comprise a docking station. The substrate may (e.g., optionally) include an aligner (e.g., 3025, 3040, and/or 3045). The substrate may comprise a stopper (e.g., 2930, 2925, 3030, 3140, 3125, 3175, or 3165). The stopper may serve also as the aligner. The aligner may also serve as the stopper. The stopper and the aligner may be the same component. The stopper and the aligner may be separate components. At times, the substrate may be operatively (e.g., physically) coupled to an elevator mechanism (e.g., one or more shafts). The elevator mechanism may comprise the platform (e.g., including the substrate and the base). The platform may have a (e.g., horizontal) cross section comprising a geometric shape (e.g., any geometric shape described herein). The base may be reversibly coupled to the substrate. At times, the base may be an integral portion of the substrate. At times, the base and the substrate may have an identical shape. At times, the substrate and the base may have a different shape. The substrate and/or base may be translatable. For example, the substrate and/or base may translate in a translation direction of the elevation mechanism (e.g., comprising an actuator that facilitates vertical movement of the platform).

In some embodiments, the substrate and the base are separate and are brought together to form the platform. For example, the substrate may be stationary, and the base may be mobile. The base may translate to engage with the substrate. The engagement of the base with the substrate may be reversible, manual, automatic, and/or controlled. The engagement and/or disengagement of the base with the substrate may be before and/or after the 3D printing. The control may be manual and/or automatic (e.g., using a controller). On translation, the aligner(s) may constrain (e.g., facilitate alignment) of the movement of the base with respect to the substrate (e.g., by using a rail, protrusion, and/or intrusion). The aligner may be a guide. On translation, the stopper may constrain the movement of the base with respect to the substrate (e.g., by using a kinematic stopper, a clamping mechanism, a kinematic coupling, and/or a combination thereof). The substrate may comprise one or more stoppers and/or aligners. The stopper may facilitate alignment, position and/or affixing of the base (e.g., during an engaging operation) to the substrate.

Figure 27A:
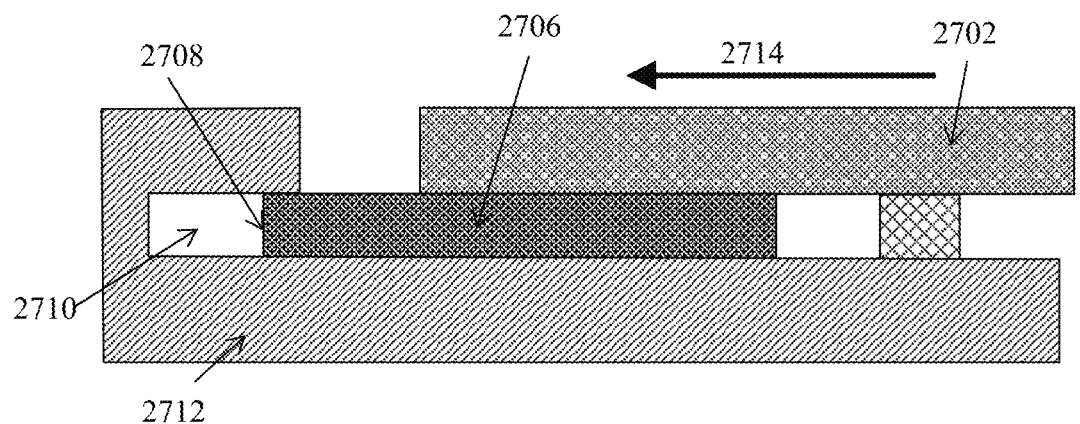
FIGS. 27A-27C schematically illustrate various vertical cross section views of a component of a 3D printing system.
Figure 27B:
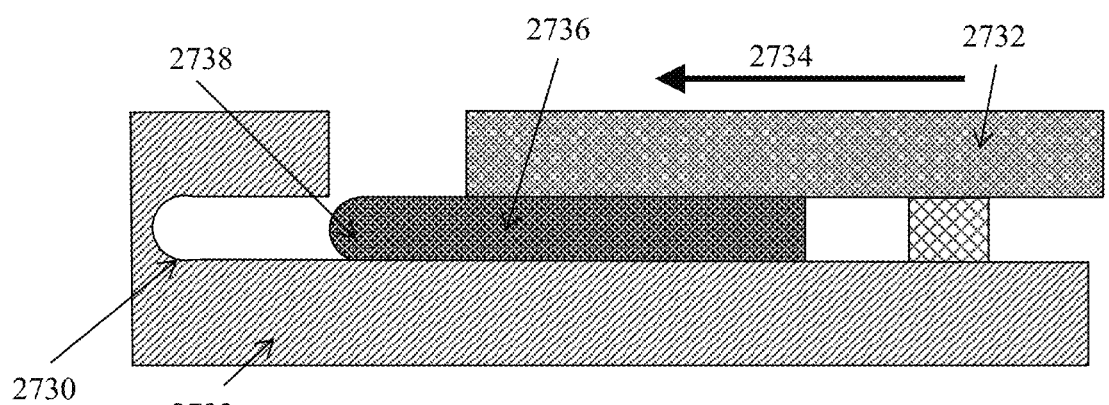
Figure 27C:
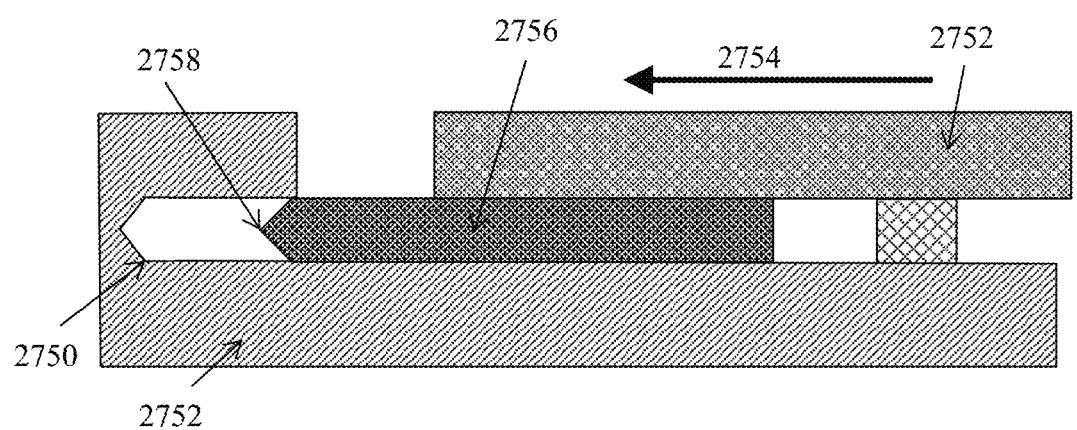

In some embodiments, the stopper has a structure (e.g., geometry) that facilitates self-alignment, and/or self-affixing of the base to the platform (e.g., during the movement of the base relative to the substrate). The stopper and/or aligner may have a rectangular shaped cross section (e.g., 2930, or 2925). The cross section may be horizontal and/or vertical. The stopper and/or aligner may comprise a triangular cross section. The stopper and/or aligner may comprise a first cross section that is rectangular and a second cross section that comprises a triangle. The first cross section may be (e.g., substantially) perpendicular to the second cross section. The stopper and/or aligner may comprise a curvature. For example, a cross section of the stopper and/or aligner may be of an arc shape (e.g., 3175, or 3165). A first stopper may be of a different shape than a second stopper. A first aligner may be of a different shape than a second aligner. A first stopper may be of a same shape as a second stopper. A first aligner may be of a same shape as a second aligner. A stopper may have a different horizontal cross sectional shape than that of the substrate and/or base. At times, the stopper may have a same horizontal cross sectional shape as that of the substrate and/or base. The stopper and/or aligner may have a surface (e.g., material and/or shape thereof) that forms a complementary contact with the base. Complementary may comprise mirroring or matching. The stopper may comprise one or more fixtures. The fixture may comprise a cross section having a geometrical shape (e.g., FIG. 31B, 3180, any geometrical shape described herein, e.g., a polygon). The fixture may have a 3D shape (e.g., any 3D shape described herein). The fixture may be a geometrical shaped indentation, protrusion, or any combination thereof. The stopper may comprise one or more fixtures. The base (e.g., bottom portion thereof) may comprise one or more fixtures. In some examples, at least two of the fixtures may be of a different shape and/or volume. In some examples, at least two of the fixtures may be of the same shape and/or volume. A base fixture may be complementary to a stopper fixture. The stopper may be coupled to the substrate, or may be a part of the substrate. A base fixture may be complementary to a substrate fixture. FIGS. 27A-27C show examples of various fixtures depicted as vertical cross sections. FIG. 27A shows an example of a substrate (e.g., 2712) that includes a fixture having a rectangular cross section (e.g., 2710). The base may comprise an upper portion (e.g., 2702) and a lower portion (e.g., 2706). In some examples, the cross sections of the indentation are different from vertical. For example, the cross section may be horizontal. The two portions may be separate or be portions of one piece. The lower portion of the base may comprise a complementary fixture (e.g., 2708).

Figure 30A:
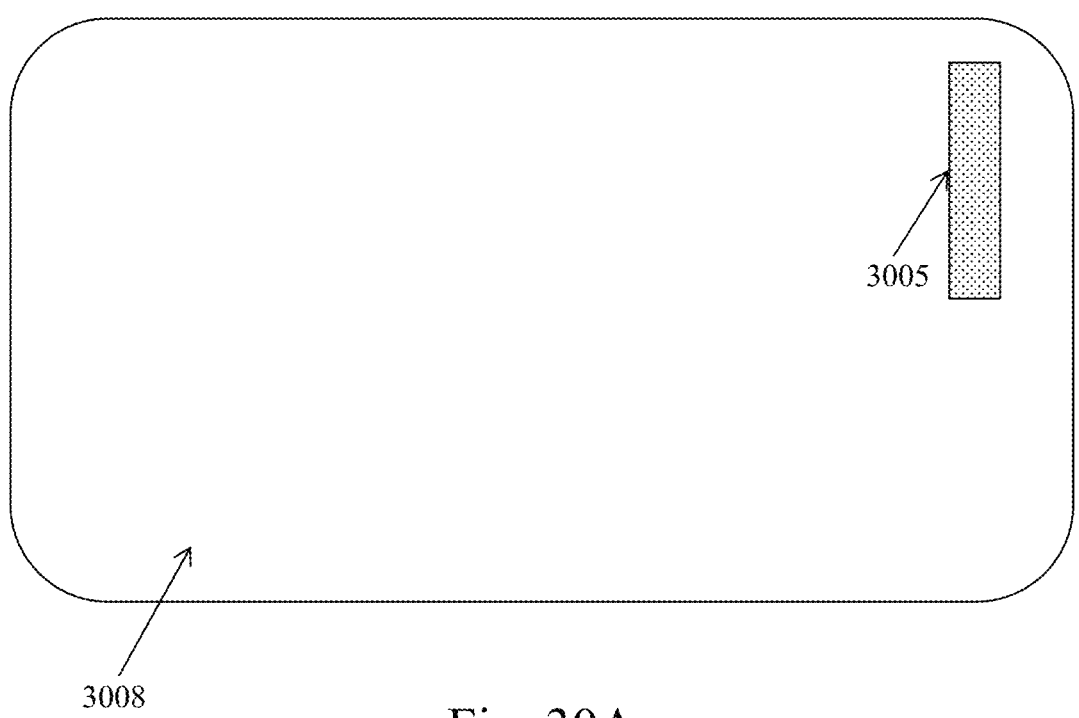
FIGS. 30A-30B schematically illustrate a top view of a component of a 3D printing system.
Figure 30B:
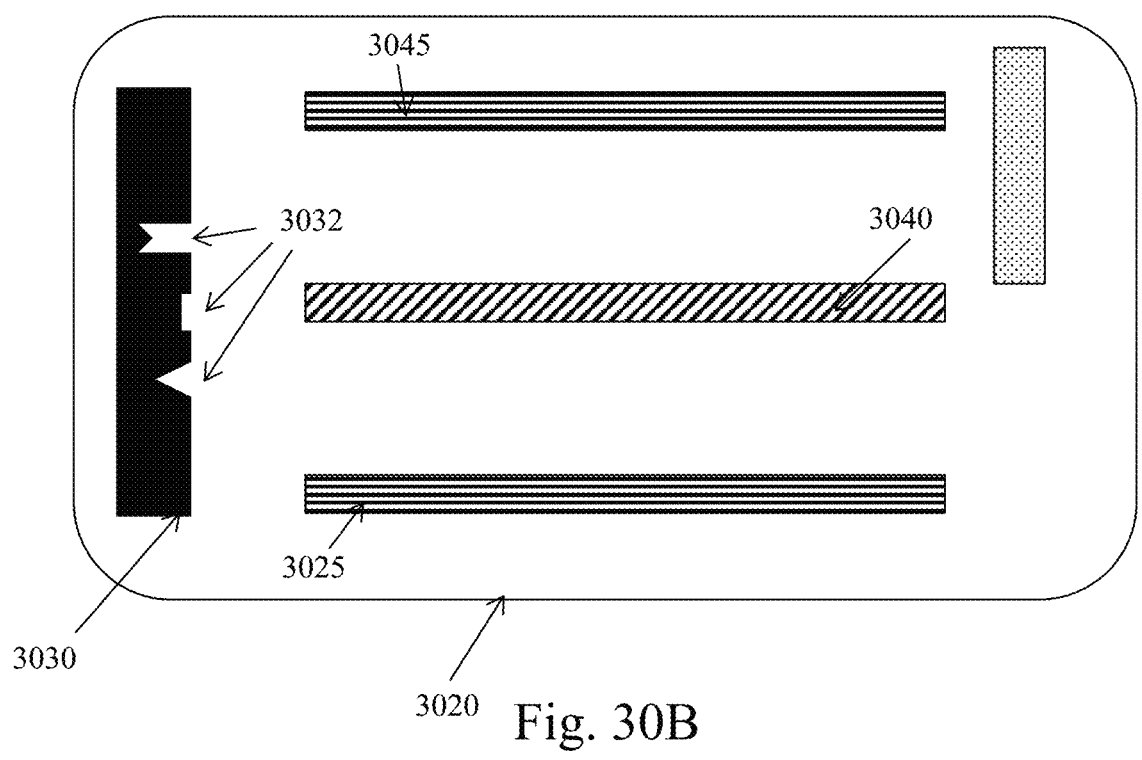
Figure 31A:
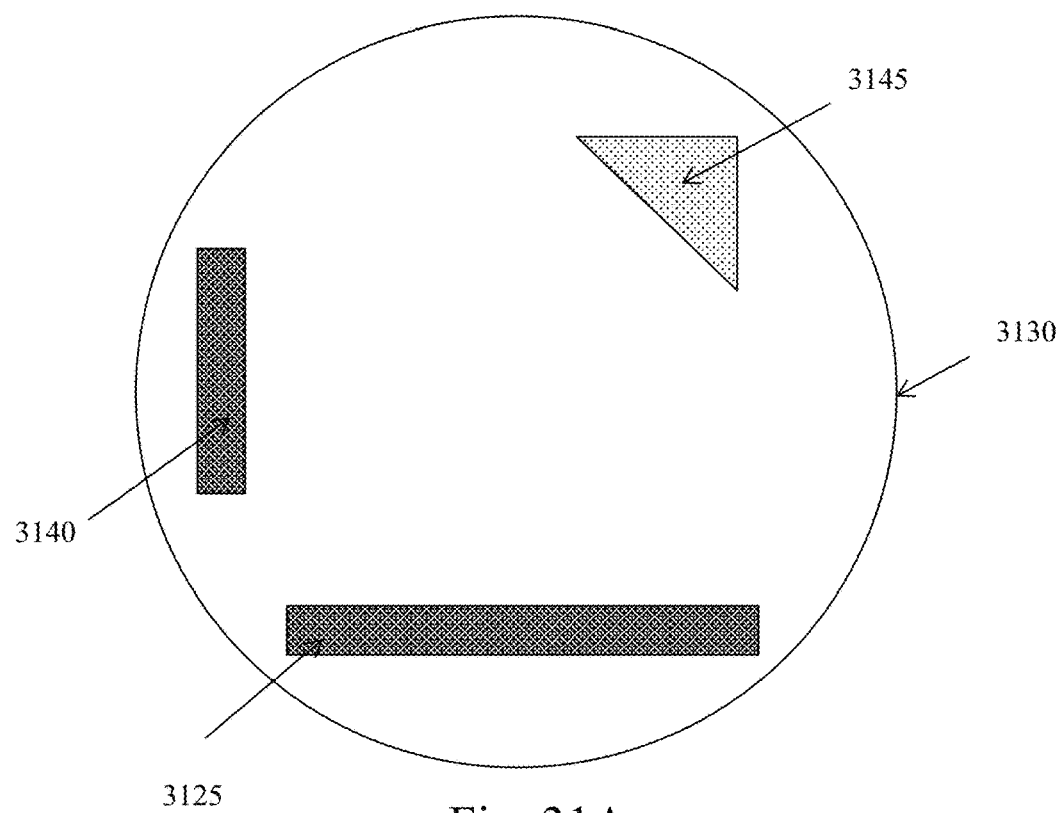
FIGS. 31A-31B schematically illustrate a top view of a component of a 3D printing system.
Figure 31B:
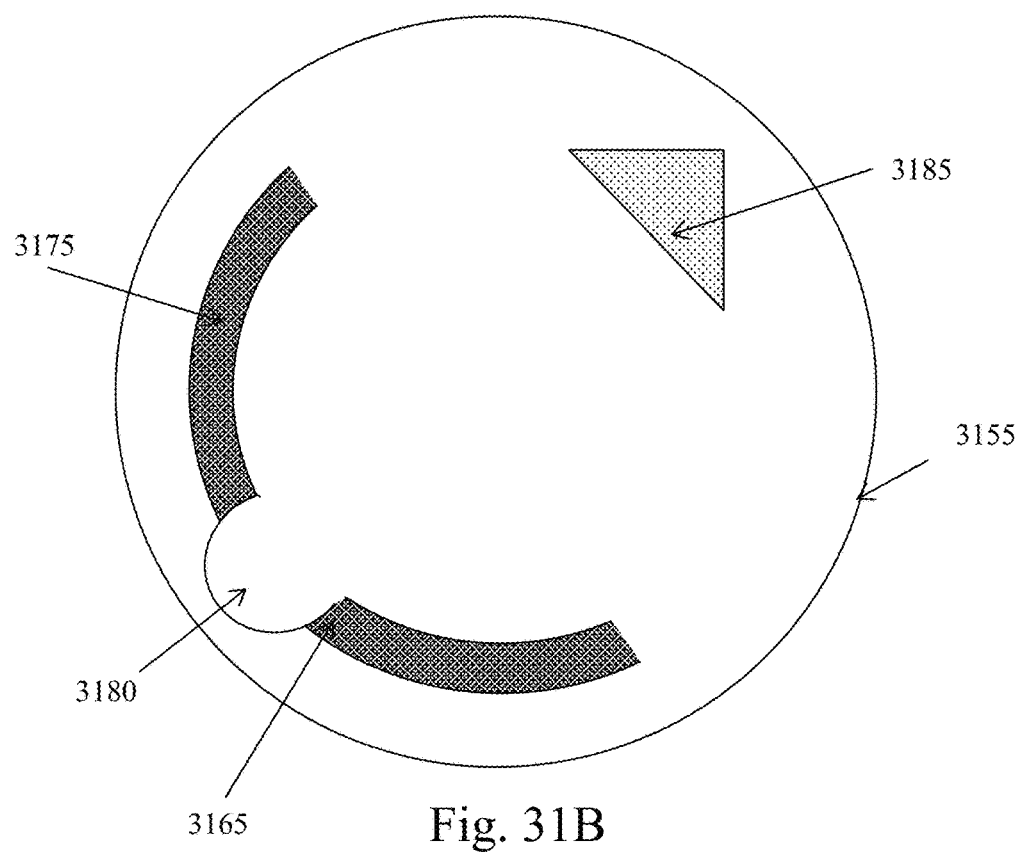

The base may be inserted (e.g., moved) in a lateral direction (e.g., 2714) to engage the base with the substrate (e.g., by mutual engagement of the substrate fixture and the complementary lower base fixture). FIG. 27B show an example of a substrate (e.g., 2732) that include a circular shaped fixture (e.g., 2730). The lower portion of the base (e.g., 2736) includes a complementary fixture (e.g., 2738). The base may be inserted (e.g., moved) in a lateral direction (e.g., 2734) to engage the base with the substrate (e.g., by mutual engagement of the fixture with the lower base portion). FIG. 27C shows an example of a substrate (e.g., 2752) that include a triangular shaped fixture (e.g., 2750). The lower portion of the base (e.g., 2756) includes a complementary fixture (e.g., 2758). The base may be inserted (e.g., moved) in a lateral direction (e.g., 2754) to engage the base with the substrate (e.g., by mutual engagement of the lower base portion fixture with the substrate fixture). The complementary (e.g., mutual) engagement of the fixtures may be through a kinematic coupling. The fixture may comprise a dove-tail. The fixture may comprise a dove-tail complementary shape. The coupling of the fixtures may comprise dove-tail coupling. The fixture (e.g., of the stopper, substrate, and/or base) may comprise a slanted surface (e.g., with respect to an average plane of the bottom surface of the substrate). The fixture (e.g., of the stopper, substrate, and/or base) may comprise a triangle. Bottom may be in the direction of the gravitational center. The stopper may be located adjacent to, or be part of, a wall of the substrate. Multiple stoppers may be located adjacent to a first wall of the substrate. The substrate may (e.g., optionally) comprise an aligner (e.g., a rail, a bar, a lever, a sensor, a mark, an actuator, or a track). The aligner may facilitate alignment (e.g., self-alignment) of the base, when engaging or dis-engaging from the substrate. The aligner may be located adjacent to a stopper. The aligner may be located (e.g., etched, imprinted, ingrained, or affixed) on a top surface of the substrate. The aligner may include an indentation, protrusion, and/or a combination thereof (e.g., as described herein). The aligner may comprise a mechanical, pneumatic, electronic, electrical, magnetic or sensor mechanism. The mechanism may facilitate (e.g., positional) alignment of the base to the substrate. FIG. 30B shows an example of an aligner, depicted as a top view. The aligner may be located on a top surface of the substrate (e.g., 3020). The substrate may include one or more aligners (e.g., 3025, 3040, or 3045). At least two of a plurality of aligners may be the same. For example, a first aligner (e.g., 3025) may be of the same type as a second aligner (e.g., 3045). At least two of a plurality of aligners may be different. For example, a first aligner (e.g., 3025) may be of a different type than the second aligner (e.g., 3040). For example, the first aligner may be a rail through which a lower portion of the base may slide through, and the second aligner may include an indented slider track. The aligners may be located adjacent to a stopper (e.g., 3030). The stopper may comprise one or more fixtures. FIG. 30B shows an example of three different fixtures 3032 in a stopper 3030 that can facilitate kinematic coupling of the stopper with a base plate (e.g., that comprises complementary three fixtures). The base (e.g., lower portion thereof) may be inserted (e.g., slide) through the one or more aligners, when engaging and/or dis-engaging with the stopper. At times, the aligner may include a sensor. The sensor may send a signal to the controller to facilitate alignment In some embodiments, the base is translatable (e.g., to engage (and/or dis-engage) with the substrate and/or stopper). The base may be reversibly and/or controllably connected to the substrate. The base may comprise a geometrical shape (e.g., any geometric shape described herein, for example, triangle, rectangle, ellipse, or polygon). The base may comprise the engagement mechanism. The engagement mechanism may be manual and/or automatic. The engagement mechanism may be controlled. At least a portion of the engagement (and/or dis-engagement) of the base with the substrate may be at an angle (e.g., planar or compound) relative to the bottom surface of the platform. The engagement mechanism may use a device that facilitates the engagement (e.g., an actuator). For example, the engagement mechanism may comprise a robotic arm, a crane, conveyor (e.g., conveyor belt), rotating screw, or a moving surface (e.g., moving base). The engagement and/or disengagement may be manual. The engagement mechanism may comprise a portion of an aligner (e.g., comprising a rail, a bar, a lever, a sensor, a mark, an actuator, or a track) operatively coupled to the substrate (or a part of the substrate) that engages with the base. The engagement mechanism may comprise a portion of an aligner operatively coupled to the base (or a part of the base) that engages with the substrate. The aligner may be disposed on the base and/or on the substrate. In some embodiments, a first portion of the aligner may be coupled to (or be part of) the base, and a complementary portion of the aligner may be coupled to (or be part of) the substrate. The engagement mechanism may comprise a mechanism that can move a platform component (e.g., move the base). The movement may be controlled (e.g., manually, and/or automatically, e.g., using a controller). The movement may include using (i) a control signal and/or (ii) a source of energy (e.g., manual power, electricity, hydraulic pressure, gas pressure, electrostatic force, or magnetic force). The gas pressure may be positive and/or negative as compared to the ambient pressure. Optionally, the movement may comprise using a sensor, or an aligner. The engagement mechanism may use electricity, pneumatic pressure, hydraulic pressure, magnetic power, electrostatic power, human power, or any combination thereof. In some embodiments, the (e.g., entire) top surface of the base may be available for use during the 3D printing (e.g., to build the 3D object). The top surface of the base may be (e.g., entirely) free of a feature (e.g., clamping mechanism, or a bolt) that facilitates engagement of the to the substrate.

Figure 32:
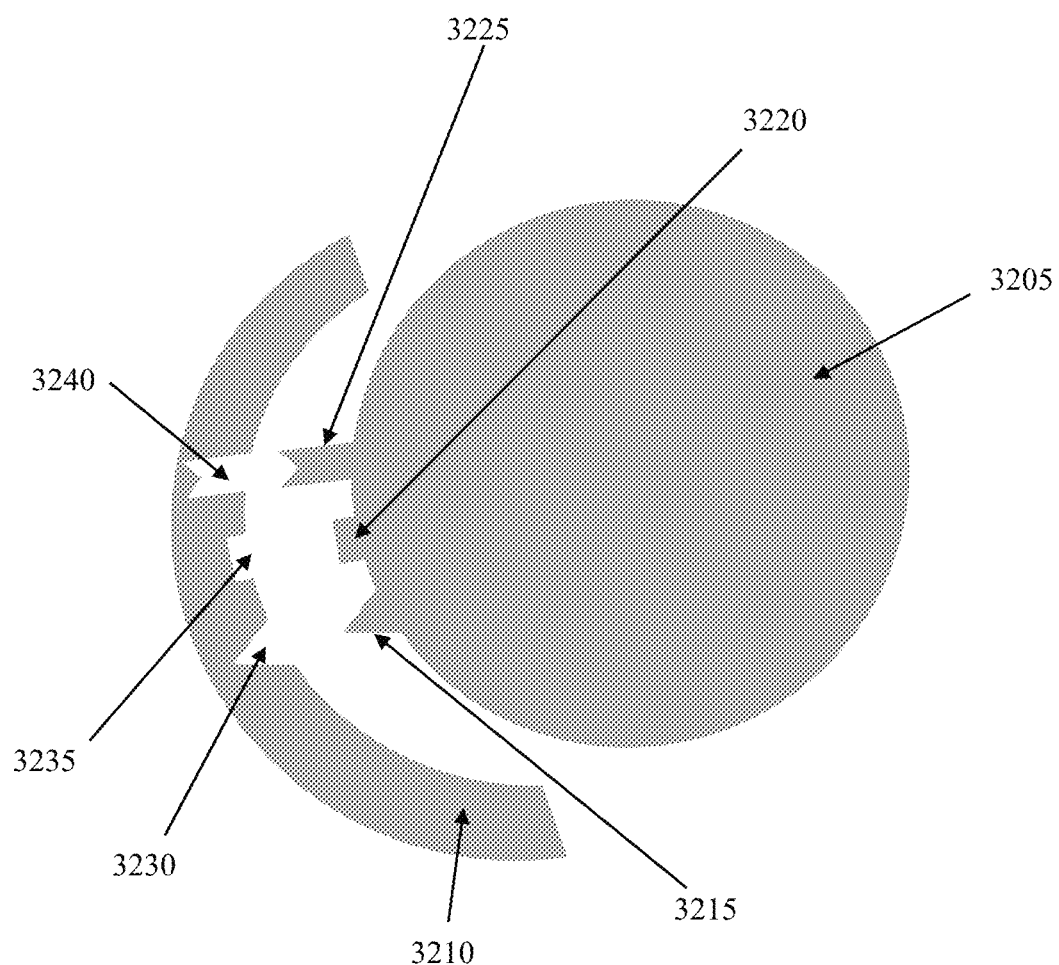
FIG. 32 schematically illustrates a top view of components of a 3D printing system.

In some embodiments, the engagement mechanism comprises a connector. The connector may be located at, or within a lower portion of the base. The connector may be located adjacent to a periphery (e.g., circumference, boundary) of a portion of the base. The connector may comprise one or more fixtures. The connector fixture(s) and the stopper fixture(s) may constrain each other on mutual engagement. The engagement of the complementary fixtures may trigger a signal. The signal may be detectable and/or identifiable. For example, the signal may comprise an electronic, pneumatic, sound, light, or magnetic signal. The signal may comprise an assertion of the engagement of the base with the substrate. FIG. 32 shows an example of a top view of a base (e.g., bottom) portion (e.g., 3205) shown as a horizontal cross section. The base may be circular in shape. The base may comprise a connector including one or more fixtures (e.g., 3215, 3220, or 3225). The connector may be located adjacent to a periphery (e.g., on a portion of the circumference) of the base portion. The base portion coupled fixtures shown in FIG. 32 are protrusions, however, the fixtures can include protrusions and/or indentations. The base may be engaged to a substrate. For example, 3210 shows a portion of a substrate (e.g., a stopper coupled to the substrate). The substrate may comprise one or more fixtures (e.g., 3230, 3235, or 3240). The substrate coupled fixtures shown in FIG. 32 are indentations, however, the fixtures can include protrusions and/or indentations. In some examples, the fixture comprises a charge. The charge may be magnetic or electric. For example, the charge on a base fixture may be of one type, and the complementary fixture on the substrate and/or stopper may be of an opposing change to the one type. For example, the charge on a base fixture may be positive electric charge, and the complementary fixture on the substrate and/or stopper may be negative electric charge. In some examples, the fixtures may be devoid of indentation and/or protrusion. In some examples, the fixtures may be devoid of a charge. In some examples, the fixtures may include (i) an indentation and/or protrusion, (ii) a charge (e.g., magnetic, and/or electric), (iii) or any combination thereof. The fixture of the substrate and/or stopper and the fixture of the base may be complementary. For example, fixture 3225 may be a protrusion that complements with an indentation 3240. For example, fixture 3220 may be a protrusion that complements with an indentation 3235. For example, fixture 3215 may be a protrusion that complements with an indentation 3230. When engaged, the fixtures may (e.g., accurately) fit into the each other. When engaged, the fixtures facilitate (e.g., accurate) positioning of the base relative to the substrate, for example, by constraining the relative movement of the base to the substrate.

In some embodiments, the engagement of the base with the substrate comprises a complementary engagement. The engagement may comprise a dove-tail engagement. The base may be reversibly engaged with the substrate. The base may be accurately engaged with the substrate. The base may repeatedly (e.g., before or after 3D printing) be engaged with the substrate. The base may be controllably engaged (e.g., automatic, and/or manual) with the substrate. The engagement may comprise fitting together. The engagement can comprise at least one protrusion that fits into at least one complementary indentation respectively. For example, the stopper (e.g., located on or coupled to the substrate) may comprise a first fixture and the connector (e.g., located on the base) may comprise a second fixture that is complementary to the first fixture, which fit (e.g., couples) into each other on engagement of the base with the substrate. The fitting may be a kinematic coupling. The fitting into each other on engagement may prevent one or more degrees of freedom. For example, a horizontal and/or vertical degree of freedom of the base relative to the substrate. A fixture within the kinematic coupling may comprise a pentagonal pyramid. The fixture may be an indentation of the 3D shape (e.g., a V-groove is an indentation of a cone). A portion of the ellipse may be a hemisphere. For example, the engagement (e.g., coupling) of the base with the substrate may comprise engagement of one or more (e.g., three) radial v-grooves with one or more complementary hemispheres. One or more may comprise at least 1, 2, 3, 4, or 5. The engagement of the complementary fixtures may comprise at least one (e.g., two, or three) contact point. The contact point may constrain the degree(s) of freedom of the stage. The degree(s) of freedom may comprise at least 1, 2, 3, 4, 5, or 6 degrees of freedom. The degree(s) of freedom may comprise any value between the afore-mentioned degrees of freedom (e.g., from 1 to 6, from 2 to 6, or from 4 to 6). In some examples, the complementary fixtures may not precisely fit into each other. For example, the complementary fixtures may engage with each other, and not precisely fit into each other. In some examples, the complementary fixtures may engage with each other, and restrain at least one degree of freedom of at least one of the stage and the stopper. For example, the first fixture may be a V-groove and its complementary fixture may be a hemisphere. For example, the first fixture may be a tetrahedral dent, and its complementary fixture may be a hemisphere. For example, the first fixture may be a rectangular depression, and its complementary fixture may be a hemisphere. The kinematic coupling may comprise Kelvin or Maxwell coupling.

Figure 28A:
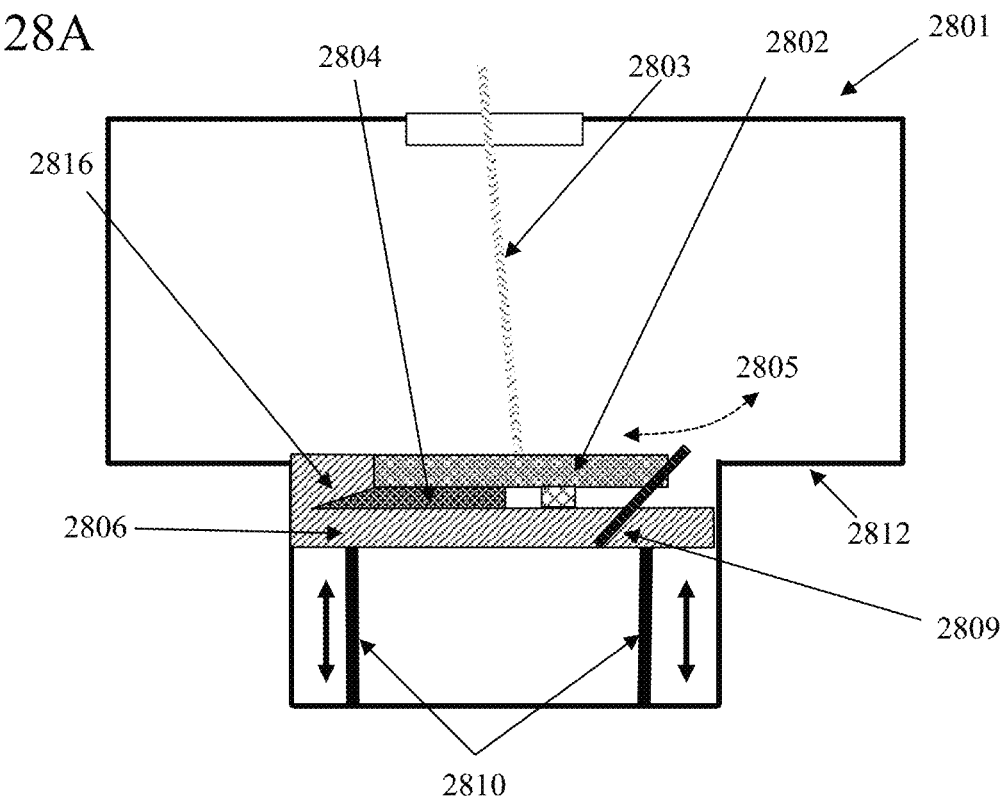
FIG. 28A schematically illustrates a vertical cross section of a 3D printing system and its components.
Figure 28B:
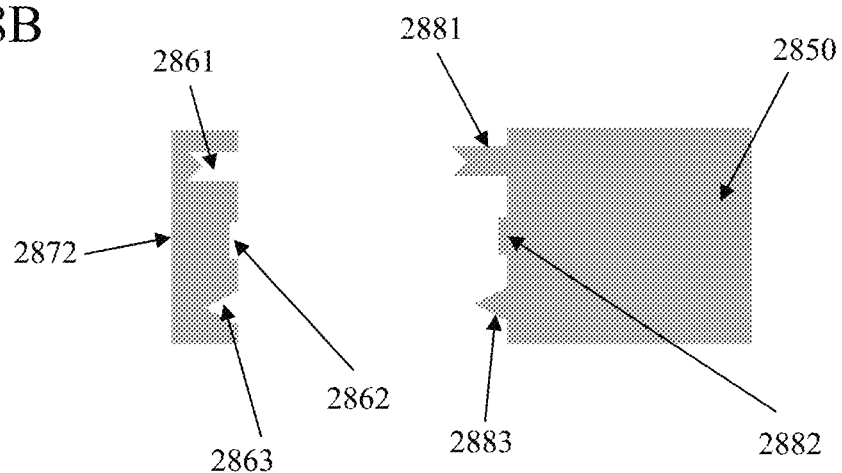
FIG. 28B schematically illustrates a horizontal cross section of components of a 3D printing system.
Figure 29A:
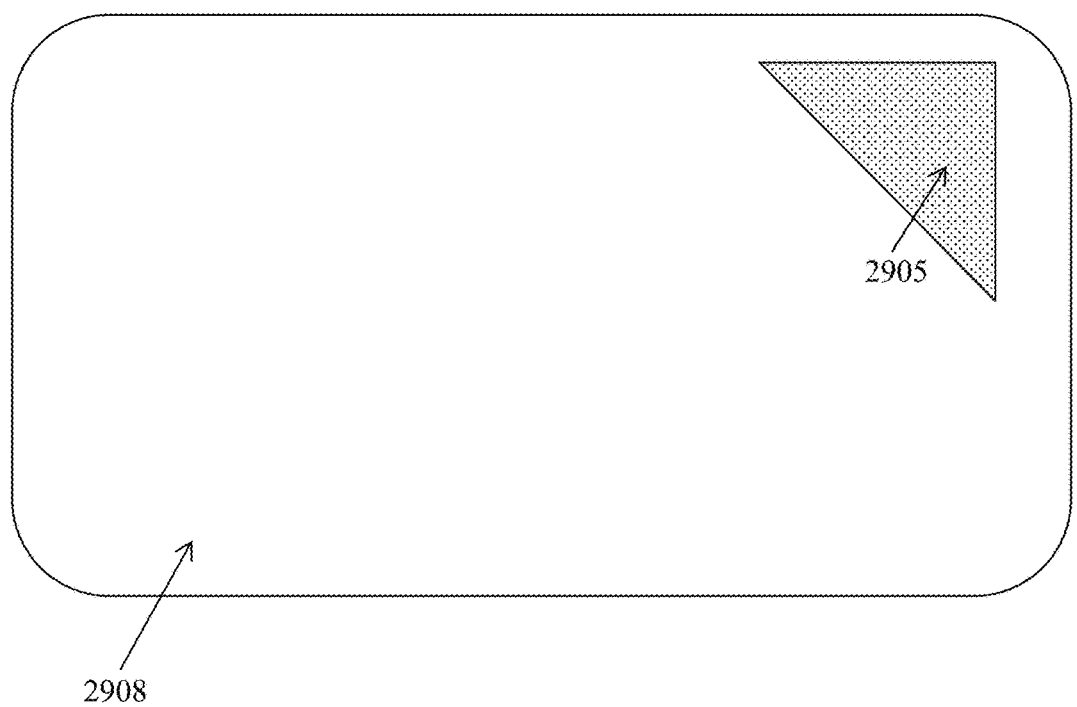
FIGS. 29A-29B schematically illustrate a top view of a component of a 3D printing system.
Figure 29B:
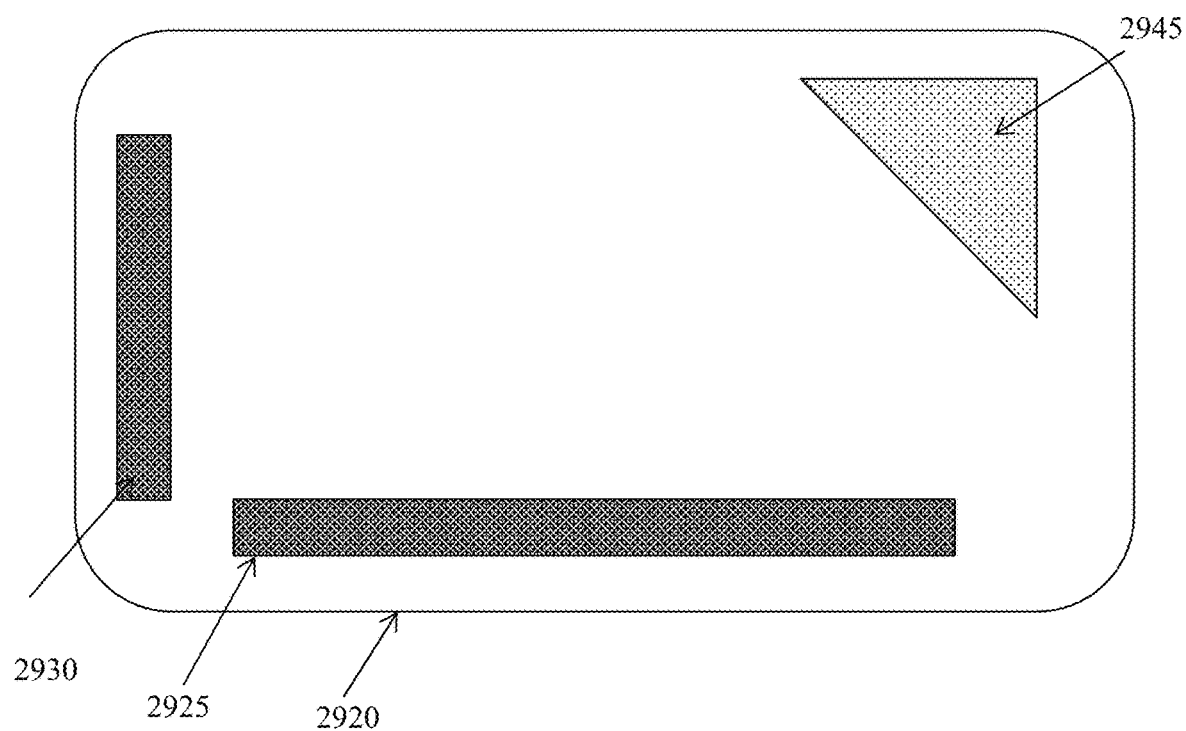

FIG. 28A shows a side view example of a 3D printer comprising an energy beam 2803 that is directed towards a substrate 2806 that is supported a plurality of vertically movable shafts 2810. The enclosure of the 3D printer 2801 comprises the substrate 2806 that resides adjacent to (e.g., above) the shafts. A base comprising an upper portion (e.g., 2802) and a lower portion (e.g., 2804) may engage with the substrate. FIG. 28A shows an example of a lower portion of the base 2804 that engages with the substrate 2806, which engagement is facilitated by dove-tail engagement indentation 2816. The base may be laterally movable (e.g., in the direction of 2805). The substrate 2806 may comprise a fixture (e.g., indentation 2816) that at least restrains a degree of movement of the base by engaging with a complementary fixture of the base (e.g., dovetail triangular tip of 2804). The fixture on the base and/or substrate may comprise an optional pneumatic, electronic, magnetic, auditory, or optical mechanism. FIG. 28B shows a horizontal view of a base 2850 having three (protruding) fixtures (e.g., 2881-2883) that complement three (indentation) fixtures (e.g., 2861-2863) respectively on engagement of the base 2850 with a stopper (or a substrate portion) 2872 (e.g., the stopper may be coupled to the substrate). The base may be horizontally and/or vertically movable. During the engagement of the base with the substrate, the stopper and/or substrate may be stationary. The base and substrate may engage before, after, and/or during the 3D printing (e.g., before the material bed has been deposited, or after the material bed has been removed). The base and substrate may be dis-engaged before, after, and/or during the 3D printing (e.g., before the material bed has been deposited, or after the material bed has been removed). The engagement and/or dis-engagement may be controlled before, after, and/or during the 3D printing (e.g., before the material bed has been deposited, or after the material bed has been removed). The control may be manual and/or automatic (e.g., using a controller).

Figure 25A:
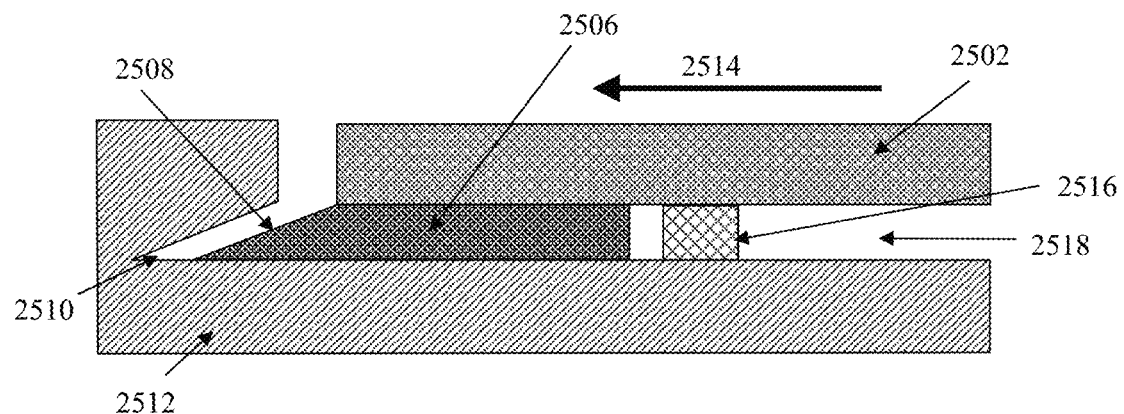
FIGS. 25A-25C schematically illustrate a vertical cross section of components of a 3D printing system.
Figure 25B:
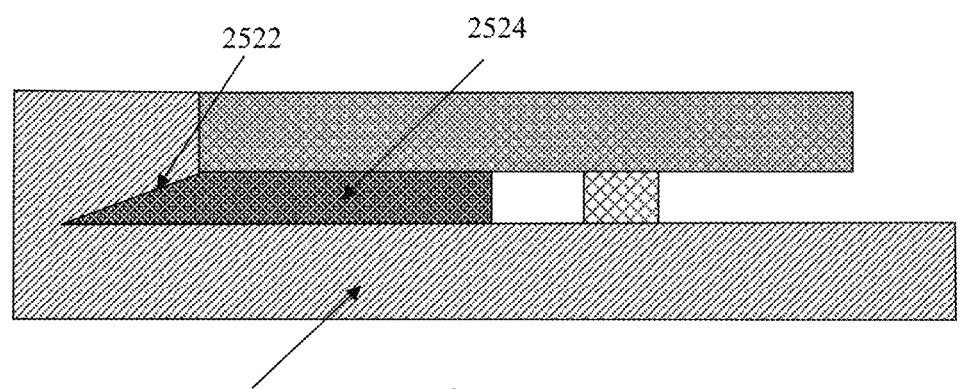
Figure 25C:
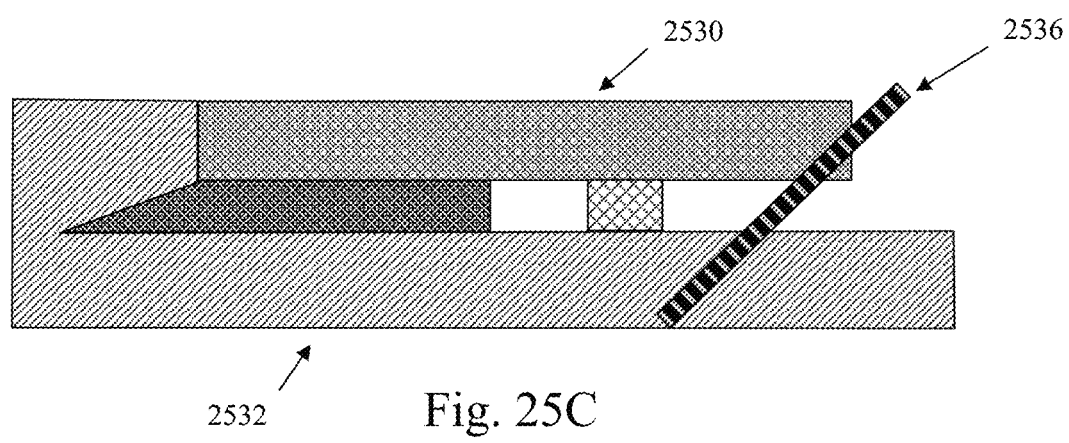

In some embodiments, the base may reversibly couple to the substrate. The coupling may be automatic, the coupling may facilitate the (e.g., entire) top surface of the base plate to be available for 3D printing). FIGS. 25A-25C show side view examples of an engagement of a base with the substrate. FIG. 25A shows an example of a base in the process of engaging its lower portion (e.g., 2506) with a portion of the substrate (e.g., 2512). The base may comprise an upper portion (e.g., 2502). The upper and lower segments of the base may be parts of a single object (e.g., a single block of material). The separation of the upper and lower portions of the base may be for illustrative purposes. In some embodiments, the upper portion and the lower portions of the base are two separate portions that are joined together (e.g., by welding or fastening). The base may be inserted in a lateral direction (e.g., 2514) to engage with the substrate. The base may be inserted in a lateral and/or angular direction to engage with the substrate. The lower portion of the base may comprise a fixture (e.g., 2508). The substrate may comprise a stopper that includes a fixture (e.g., 2510) that is complementary to the base fixture. The stopper fixture and the base fixture may fit (e.g., to prevent one or more degrees of freedom of the base and/or substrate) when engaged. A cavity (e.g., 2518) may be formed between the upper portion of the base and the substrate. The cavity may accommodate at least one component (e.g., 2516). The component may be a sensor or a temperature regulator (e.g., heater and/or cooler). The temperature regulator may (e.g., uniformly) heat the upper portion of the base. The 3D object may be built above (e.g., on) the upper portion of the base. FIG. 25B shows an example of a base comprising a lower portion (e.g., 2524) that is engaged with the substrate (e.g., 2526) using coupling of base and substrate fixtures (e.g., 2522). The engagement may be precise. Precise may include mutually accurate alignment of the fixtures. Precise may include aligned and/or cohesive engagement of the base and substrate/stopper fixtures. FIG. 25C shows an example of fastening (e.g., clamping) the base to the substrate (e.g., following their mutual engagement). The fastener (e.g., clamping mechanism) may comprise a manual fastener (e.g., a rotating screw, 2536). The screw may be inserted (e.g., manually, and/or automatically) to lock the engagement of the base to the substrate. The fastener may not disturb (e.g., touch or take a portion from) the exposed (e.g., upper) surface of the base (e.g., 2530). The fastener may be located at an angle with respect to the average lower surface of the substrate (e.g., 2532). The fastener may be inserted through a portion of the base, and a portion of the substrate. The fastener may optionally penetrate through the cavity. In some embodiments, the clamping mechanism may be adjacent to the fastener.

In some embodiments, the fastener comprises a clamping mechanism. The fastener may constrain (e.g., clamp, lock, tighten, hold, bind, clasp, or grip) the base to the substrate, when engaged. The fastener may release (e.g., unconstrain, free, unlock, or loosen) the base from the substrate and/or stopper, when dis-engaged. The fastener may be automatic and/or manual A manual fastener may comprise human intervention. For example, a manual fastening may comprise a screw, hinge, brace, strap, or lever clamp. The fastener may be a mechanical, pneumatic, hydraulic, vacuum, magnetic, or an electrostatic clamp. The fastener may be inserted (e.g., rotated), through a portion of the engaged base and substrate to constrain their mutual engagement. The fastener may be inserted in a horizontal manner, and/or at an angle (e.g., FIG. 28, 2805). The fastener may be inserted through at least a lower portion of the engaged base and at least an upper portion of the substrate. The clamping mechanism may not be inserted through the top surface of the base. An automatic fastening may not require human intervention. The automatic fastening may include a mechanical, electrical, pneumatic, magnetic, or electrostatic component. The fastening may include a kinematic coupling. The fastening may comprise rotating a base and/or substrate. The fastening may include a click mechanism (e.g., to engage/dis-engage). The fastener may facilitate aligning, positioning, and/or affixing the base and the substrate, when engaged (e.g., during, before and/or after 3D printing). The fastener may be operatively coupled to at least one controller. The controller may receive a signal from the engagement mechanism (e.g., fixture coupling). The controller may receive a signal on engagement of the base to the substrate/stopper. The controller may automatically fasten (e.g., clamp) the base to the substrate/stopper (e.g., in response to the engagement). The controller may receive a signal of print completion, removal of a 3D object, and/or removal of the material bed. The controller may automatically release the fastener (e.g., in response to the completion of print or in response to the removal of the 3D object). The controller may receive an indication (e.g., a click, movement of a base, or movement of a substrate/stopper) to engage and/or dis-engage the base from the substrate/stopper/aligner. The controller may trigger an automatic lock and/or release of the base to the substrate/stopper. The controller may include a processor. The controller may be a controller described herein.

Figure 26A:
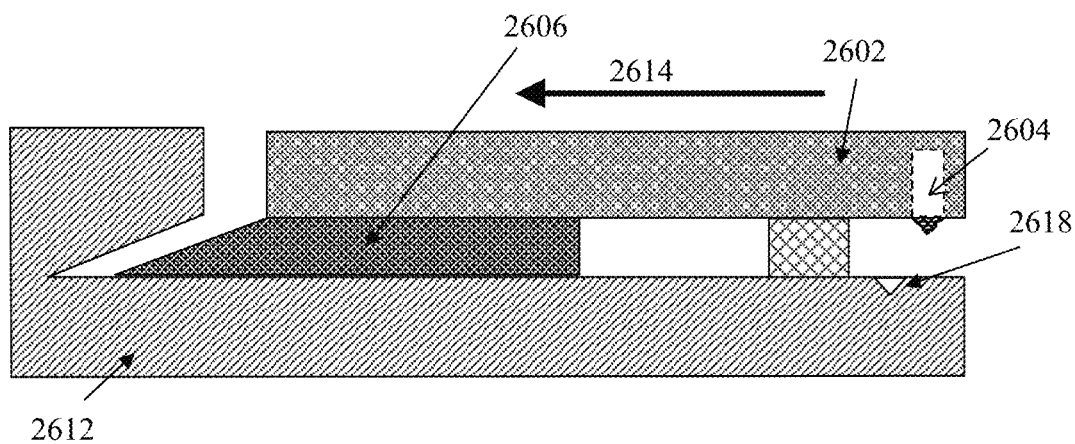
FIGS. 26A-26C schematically illustrate a vertical cross section of components of a 3D printing system.
Figure 26B:
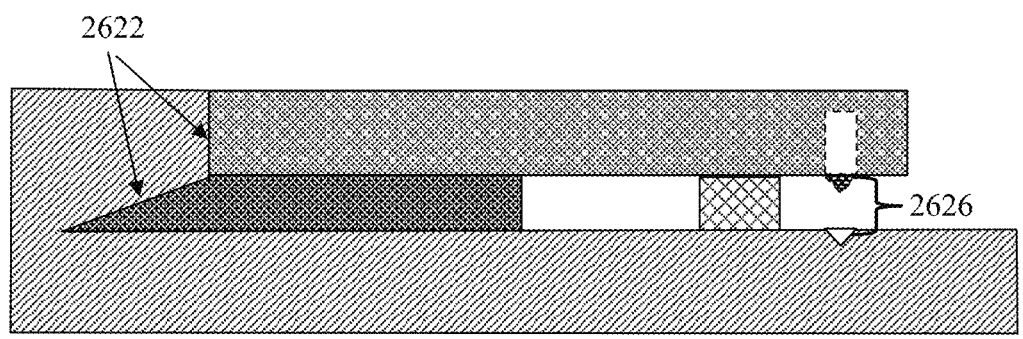
Figure 26C:
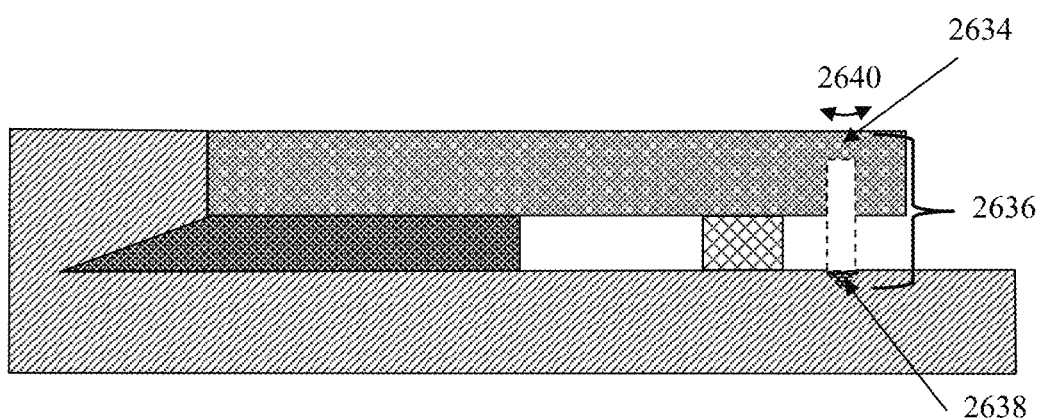

In some embodiments, the fastening between the base and the substrate is automatic. FIGS. 26A-26C show side view examples of an automatic (e.g., electro-mechanical) fasteners. FIG. 26A shows an example of an upper portion of a base (e.g., 2602) and a lower portion of the base (e.g., 2606) in the process of engaging (e.g., 2614) with a portion of the substrate (e.g., 2612). The fastening mechanism (e.g., fastener) may comprise a plurality of parts. A first part of the fastening mechanism (e.g., 2604) may be located on an upper portion of the base. At times, the first portion of the fastening mechanism may be located on a portion adjacent (e.g., laterally) to the base. A second portion of the fastening mechanism (e.g., 2618) may be located on an upper portion of the substrate (e.g., comprising the exposed surface of the substrate). The first and second portion of the fastening mechanism may not be aligned with each other prior to coupling of the substrate and the base. The first and second portion of the fastening mechanism may be in the process of aligning with each other, when the base and the substrate are in the process of engaging with each other (e.g., during the movement 2614 of the base). The first and the second portion of the fastening mechanism may be aligned (e.g., FIG. 26B, 2626) with each other, when the base and the substrate are engaged (e.g., FIG. 26B, 2622). The fastening mechanism may comprise a controller. The controller may be operatively coupled to a sensor. The sensor may sense an engagement of the base with the substrate. The controller may receive an indication (e.g., signal, a rotation of a portion of the fastening mechanism, e.g., FIG. 26C, 2640), from the sensor when the base engages and/or couples with the substrate. The controller may (e.g., optionally) trigger an alignment operation of the first and second portion of the clamping mechanism. The controller may sense an alignment of the first and second portions of the fastening mechanism. The controller may trigger a fastening operation (e.g., locking operation, FIG. 26C, 2636) of the fastening mechanism on/after sensing alignment (e.g., FIG. 26B). The alignment may be automatic and/or manual. The fastening operation may require human intervention. The clamping operation may be automatic (e.g., self-aligning, self-locking, controller directed aligning, controller directed locking, and/or click to lock mechanism). The fastening operation may be directed, modulated, and/or monitored by a controller. The fastening operation may include a kinematic coupling. The fastening operation may include lowering an upper portion of the fastening mechanism (e.g., rotating a screw). The fastening operation may include fitting a third portion of the fastening mechanism (e.g., FIG. 26C, 2634) into a fourth portion of the fastening mechanism (e.g., FIG. 26C, 2638). For example, fitting a bolt into a nut. Optionally, the fastening operation may include rotating the fixture (e.g., FIG. 26C, 2640). The rotating portion may fasten the third and fourth portions with each other (e.g., after alignment of the first and second portions of the fastening mechanism). The third portion may be the same or different from the first portion. The second portion may be the same or different from the fourth portion. For example, the first portion may be a sensor and the second portion may be a detector. For example, the first portion may be a bolt and the second portion may be a nut.

In some embodiments, the platform comprises a cavity (e.g., FIG. 25A, 2518). The platform may be formed by coupling of the base with the substrate. The cavity may be located within a lower portion of the base. The cavity may be formed between a portion of the base (e.g., 2502) and a portion of the substrate (e.g., 2512). The cavity may be located below the base. Below may be towards the center of gravity, or towards the shaft(s). The cavity may be located between a portion of the substrate and a portion of the elevator mechanism (e.g., below a platform). A component (e.g., sensor, a portion of the clamping mechanism, a support, an insulator, an actuator, a temperature controller, or an aligner) may be included within the cavity. The component may be coupled to a lower portion of the base. The component may be coupled to an upper portion (e.g., top surface) of the substrate. The component may be placed (e.g., manually, and/or automatically) within the cavity. The component may be any sensor, controller, and/or fastener, or aligner described herein. For example, the component may be a temperature adjuster (e.g., a heater, cooler). The temperature adjustor/controller/regulator may maintain a uniform temperature across a (e.g., substantial, entire) area of the base and/or the substrate. The component may include an insulator. The insulator may isolate a portion of the elevator mechanism from a (e.g., temperature controlled) portion of the base and/or the substrate.

Figure 20:
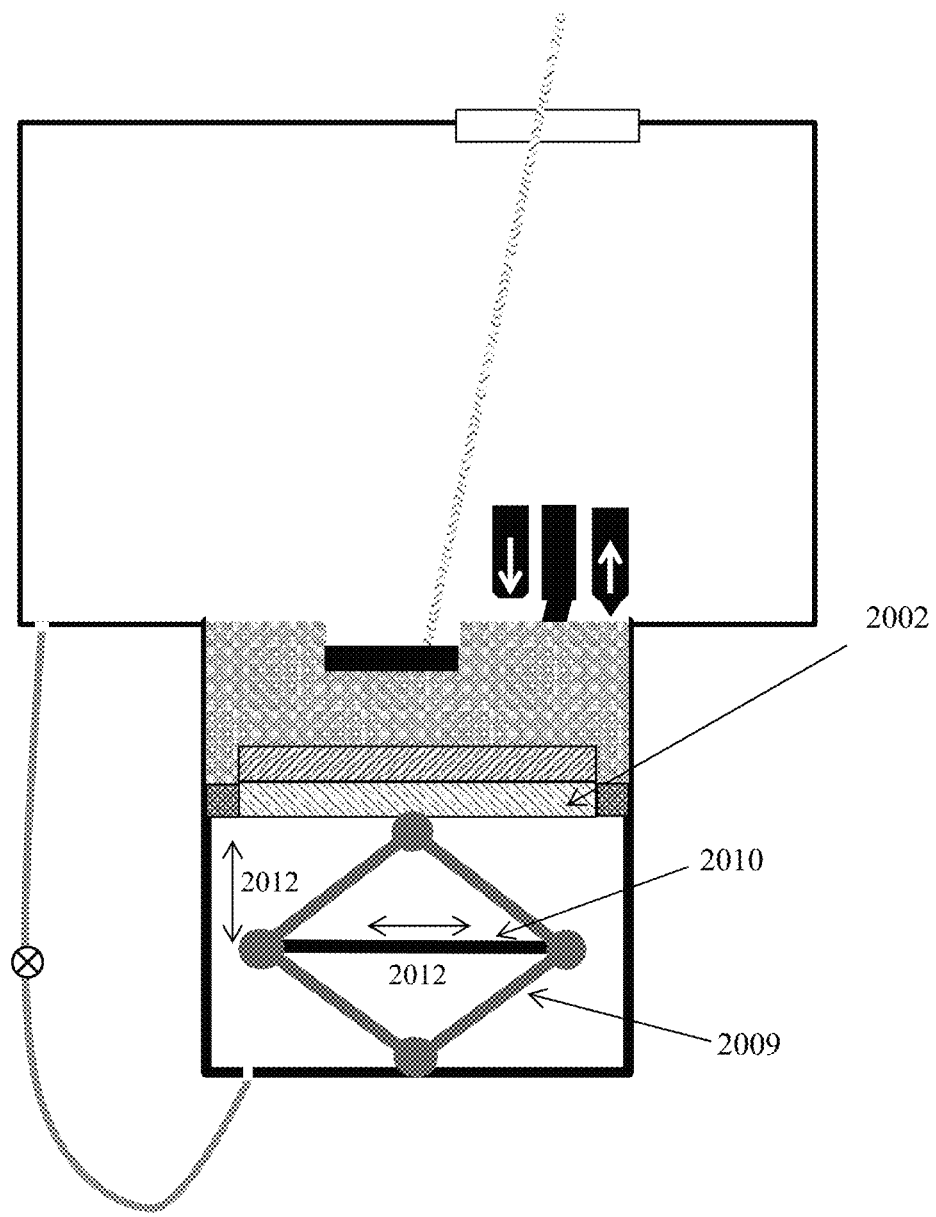
FIG. 20 schematically illustrates a vertical cross section of a 3D printing system and its components.
Figure 21:
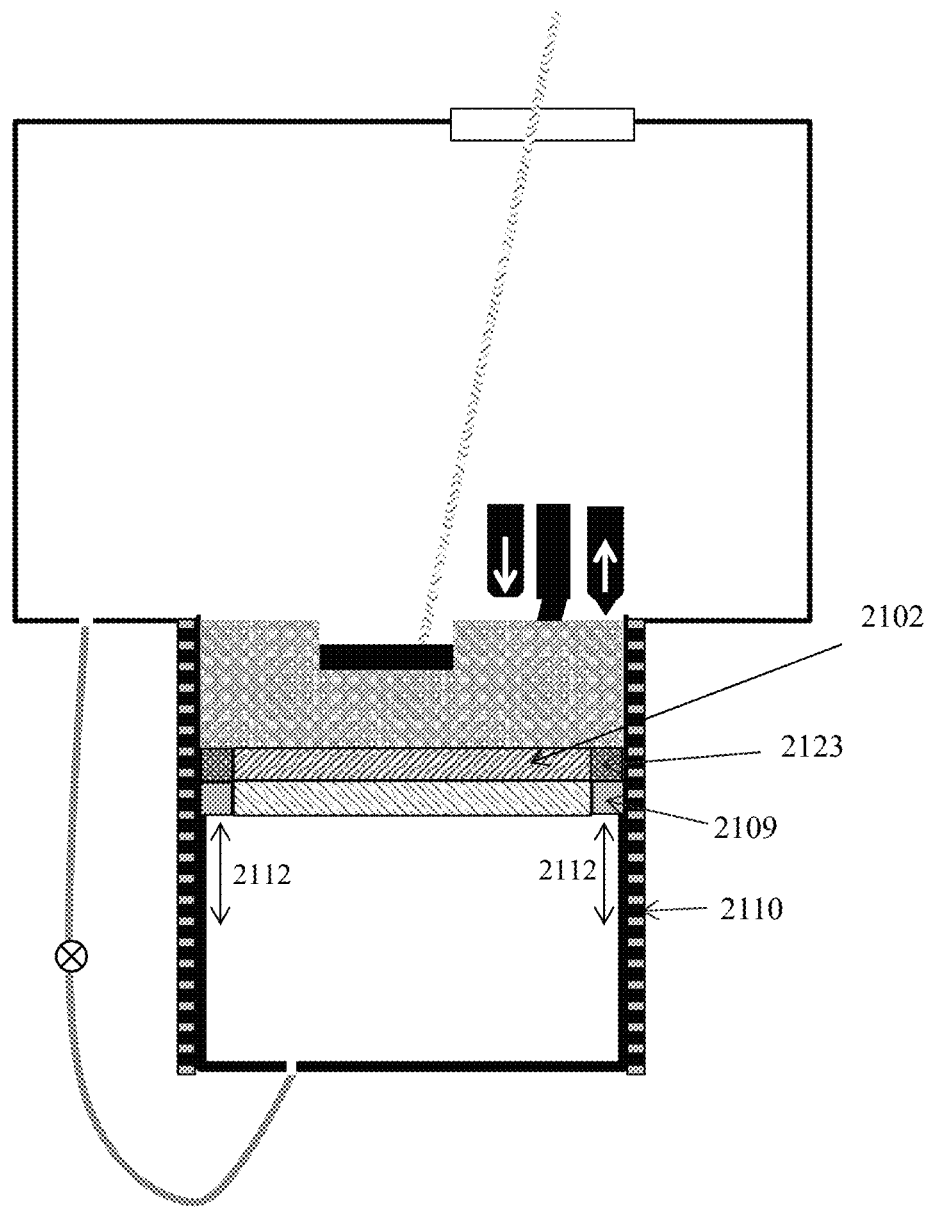
FIG. 21 schematically illustrates a vertical cross section of a 3D printing system and its components.
Figure 22:
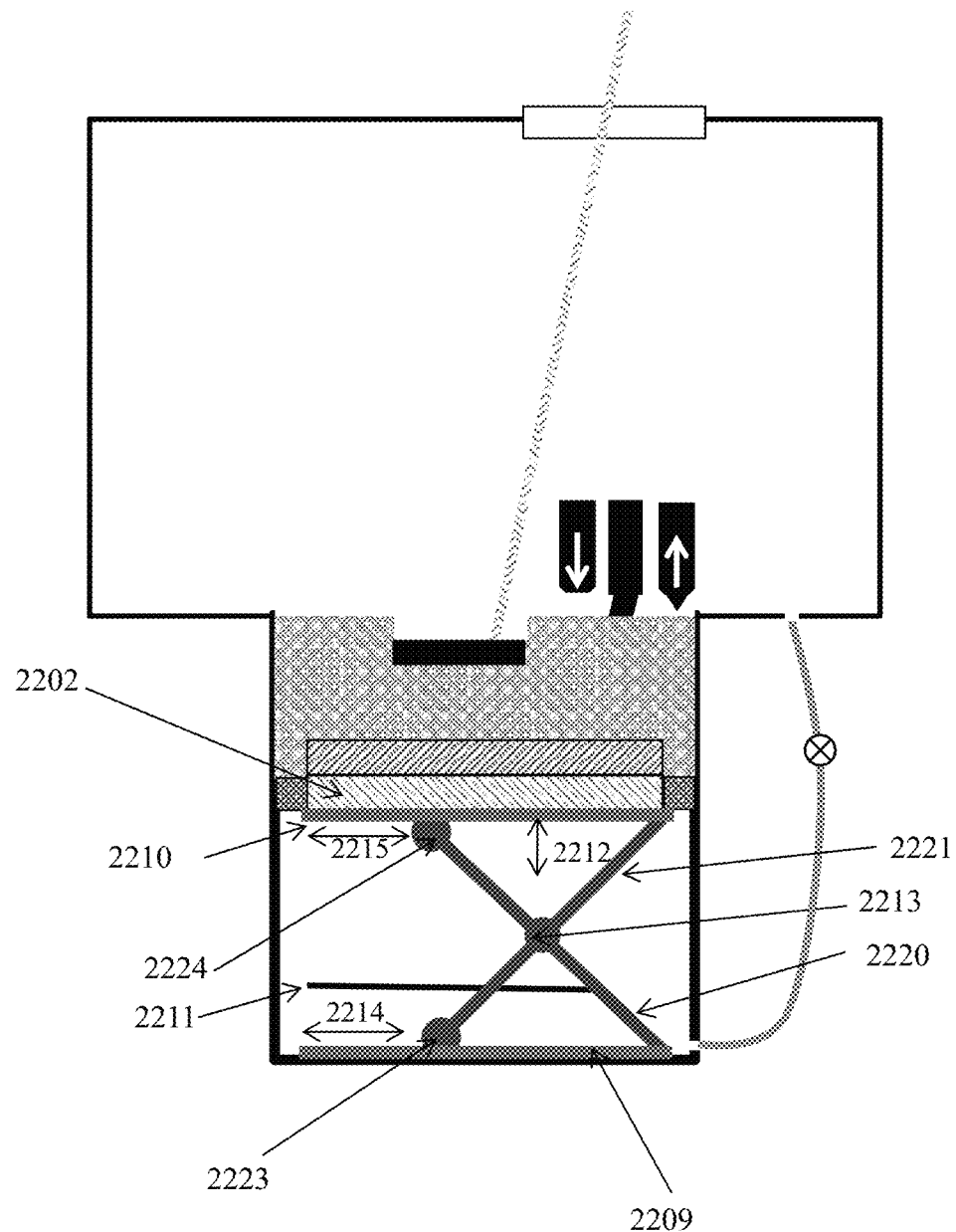
FIG. 22 schematically illustrates a vertical cross section of a 3D printing system and its components.

In some embodiments, the platform is transferable. The platform may be vertically transferable, for example using an actuator. The platform may be transferable using a lifting mechanism. The lifting mechanism may comprise a drive mechanism. The drive mechanism may comprise a (i) lead screw (e.g., with a nut), or (ii) scissor jack. The lead screw (e.g., FIG. 19, 1911) may comprise a nut. The nut may be coupled to a shaft or guide rod (e.g., 1909). A turning of the lead screws and/or nut may allow the shaft (or guide rod) to travel (e.g., vertically 1912). The lead screw can be coupled to an actuator (e.g., a motor, e.g., 1910). The scissor jack (e.g., FIG. 20, 2009) may comprise a horizontal lead screw (e.g., 2010). The scissor jack may comprise a frame to drive the platform (e.g., substrate 2002) up and/or down (e.g., 2012). The actuator may comprise a drive mechanism. The drive mechanism may be a direct drive mechanism. The drive mechanism may comprise one or more guide posts. The guide posts may be guided with bearings (e.g., linear bearings), and/or scissor guide. The drive mechanism may comprise high torque and low inertia. The drive mechanism may comprise a feedback sensor. The feedback sensor may be disposed (e.g., directly) on a rotary part of the drive mechanism. The feedback sensor may facilitate precise angular position sensing. The lifting mechanism may comprise a guide mechanism. The guide mechanism may comprise one or more guide posts. The guide posts may be vertical guide posts (e.g., FIG. 21, 2110). The guide mechanism may comprise one or more (e.g., linear) bearings, columns, or scissor guides. The guide mechanism may comprise a linear motor. The linear motor may comprise a (e.g., linear) array of magnets (e.g., FIG. 21, 2110), and an electro magnet (e.g., 2109). The guide mechanism may comprise a (e.g., motorized) linear slide. The guide mechanism may facilitate vertical guidance (e.g., 2112) of the platform (e.g., base 2102). The guide mechanism may comprise one or more horizontal guide posts (e.g., FIGS. 22, 2209 and 2210). The guide post may be coupled (e.g., connected) to the platform (e.g., substrate) and/or bottom of the build platform. The guide mechanism may comprise one or more bearings (e.g., 2223, or 2224). The guide mechanism may comprise a motor. The guide mechanism may comprise a screw (e.g., 2211). The motor may be connected to the screw. The guide post may comprise a (e.g., linear) slide. The guide mechanism may facilitate vertical guidance (e.g., 2212) of the platform (e.g., base 2202). The guide post may comprise a shaft that is coupled thereto (e.g., shaft 2220 is coupled to the guide post 2209, shaft 2221 is coupled to guide post 2210). Coupled may be connected. The shafts may comprise wheels or bearings (e.g., 2224 or 2223). The wheels or bearings may slide along the guide post horizontally or vertically. FIG. 22 shows an example where the bearings 2223 and 2224 slide horizontally. The shafts may be coupled in at least one position (e.g., 2213). The movement of the shafts along the guide post may cause the platform to alter its vertical position. The guide posts may allow the platform to retain its leveled (e.g., horizontal) position. A movement of the screw (e.g., 2211) may allow the wheels or bearings that are coupled to the shafts to alter their position (e.g., controllably), thus altering the position of the shafts, and subsequently altering the position of the platform. For example, a revolution of the screw (e.g., 2211) may shift the bearings 2223 and 2224 both in a horizontal (e.g., 2215 and 2214) and vertical (e.g., 2212) position, which will subsequently alter the position of the platform vertically. The lifting mechanism may comprise a (e.g., automatic) device that uses error-sensing negative feedback to correct the performance of the lifting mechanism (e.g., servo). The bearing may comprise a ball, dovetail, linear-roller, magnetic, or fluid bearing. The guide mechanism may comprise a rail. The actuator may be controlled by at least one of the build module controller, processing chamber controller, and load lock controller. In some embodiments, a different controller controls the actuator at different times (e.g., attachment or detachment of the build module from the processing chamber and/or the load lock). The lifting (e.g., elevation) mechanism may comprise an encoder (e.g., FIG. 19, 1923). The encoder may facilitate controlling (e.g., monitoring) the (e.g., relative) vertical position of the platform. The encoder may span the (e.g., allowed) motion region of the elevation mechanism. The terms lifting mechanism and elevation mechanism are used herein interchangeably.

In some embodiments, the actuator causes a translation. The actuator may cause a vertical translation (e.g., FIG. 19, 1912). An actuator causing a vertical translation (e.g., an elevation mechanism) is shown as an example in FIG. 1, 105. The up and down arrow next to the indication for vertical translation 1912, signifies a possible direction of movement of the elevation mechanism, or a possible direction of movement effectuated by the elevation mechanism. The elevation mechanism may comprise one or more vertical actuators. The vertical actuators may comprise guide rods. The elevation mechanism (e.g., lifting mechanism) may comprise one or more guide rods. FIG. 1 shows an example of a single guide rod as part of the elevation mechanism for vertical translation 112. The elevation mechanism may comprise at least 2, 3, 4, 5 guide rods (e.g., FIG. 19, 1909). The motor of the multiplicity of guide rods may be synchronized to facilitate a planar movement of the platform up and/or down. The guide rods may be stably connected to the platform (e.g., comprising a base FIG. 19, 1902). The guide rods may facilitate control of the magnitude, direction and/or angle of elevation of the platform. The guide rods may be dense. In some embodiments, the guide rods may be hollow. The guide rods may comprise a channel. The channel may allow electricity and/or gas to run through. The channel may allow electrical cables to run through. The elevation mechanism may comprise hydraulic, magnetic, or electronic force. The guide rods may comprise or be coupled to a nut. The elevation mechanism may comprise one or more lead screws (e.g., 1911). The nut may rotate with respect to the lead screw to allow vertical motion of the platform to which the nut is coupled. The lead screw may rotate with respect to the nut to allow vertical motion of the platform to which the nut is coupled. The lead screws may be coupled to a motor (e.g., 1910). The motor may rotate the lead screws to allow the guide rods to travel up and/or down along the lead screw. The platform (e.g., and forming material bed 1904) may be in a first environment, and the lead screws may be in a second environment. The first environment may be (e.g., substantially) similar or different from the second environment. The first and second environments may be separated from each other by at least one seal (e.g., 1905, 1925). The seal may be a gas seal. The seal may be a seal that prevents a pre-transformed (and a transformed) material to travel through. The seal may be a sieve. The seal may be any seal disclosed herein. In some embodiments, the nut may be motorized.

In some embodiments, the platform is coupled to an encoder. The platform may be coupled to a vertical encoder. The encoder may be a rotary encoder, a shaft encoder, an electro-mechanical encoder, an optical encoder, a magnetic encoder, a capacitive encoder, a gray encoder, an electrical encoder, or a servo motor. One of a side of the encoder may be coupled to a bottom surface of the platform. The opposite side of the encoder may be coupled to a bottom plate of the build module. The encoder may comprise a sensor (e.g., a position sensor, a thermal sensor, a motion sensor, or a weight sensor). The sensor may be any sensor disclosed herein. The sensor may sense a thermal expansion and/or contraction of the platform. The sensor may sense a thermal expansion and/or contraction of the elevator mechanism. The sensor may sense a thermal expansion and/or contraction of the build module. The sensor may sense a weight on the platform. The sensor may sense a position (e.g., absolute, or relative position) of the elevator mechanism. The sensor may sense a motion of the elevator mechanism. The sensed measurement may be received by the encoder. The encoder may direct a controller (e.g., an actuator) to adjust the measurement (e.g., before, during and/or after the 3D printing). For example, the controller may compensate for thermal expansion and/or contraction. The controller may adjust a position of the elevator mechanism based on the load on the platform. The adjustment may be before, during and/or after the 3D printing.

In some embodiments, an encoder is coupled to the build module. The bottom of the build module (e.g., bottom of the elevator mechanism) may be coupled to one or more encoders. In some embodiments, the bottom encoder may be coupled to an external engagement mechanism (e.g., FIG. 19, 1940). The bottom encoders may be any encoder disclosed herein. The bottom encoders may communicate with a controller. The bottom encoders may communicate with the same controller as the vertical encoder. The bottom encoders may be controlled by the same controller as the vertical encoder. The bottom encoders may be controlled by a separate controller (e.g., microcontroller). The bottom encoders may adjust a position of the elevator mechanism, compensate for weight on the platform, and/or compensate for thermal expansion/contraction.

In some embodiments, the build module is comprised within an external engagement mechanism. The external engagement mechanism may include an external chamber (e.g., FIG. 19, 1940). The external engagement mechanism may include an automated guide vehicle (e.g., may comprise wheels, actuator, a conveyor, a joint, or a robotic arm). The external engagement mechanism may convey the build module to engage with the processing chamber. Conveying may be in a vertical (e.g., 1982) and/or horizontal direction. Conveying may be at an angle (e.g., planar or compound). The external engagement mechanism may comprise one or more build modules. The build module may be conveyer before, or after the 3D object is printed. Conveying may include a translation mechanism. The translation mechanism may comprise an actuator (e.g., a motor). The motor may be any motor described herein. The actuator may be any actuator described herein. In some embodiments, the external chamber may be reversibly coupled to the build module. In some examples, the external chamber may be a part of the build module. The build module(s) may be exchangeable. One or more portions (e.g., a build module conveying mechanism, or, a load-lock engaging mechanism) of the external engagement mechanism may be self-locking. The external engagement mechanism may comprise one or more sensors. The one or more sensors may be disposed along the trajectory of the external engagement mechanism. In some examples, the external engagement mechanism may comprise a redundant sensor scheme. The redundant sensor scheme may comprise coupling at least two sensors to a component of the external engagement mechanism. The first sensor may detect a signal of opposite polarity than the second sensor within the redundant sensor scheme. In some examples, at least two of the sensors may be of the same type. In some examples, at least two of the sensors may be of different types. The sensor may be any sensor described herein (e.g., location, temperature, and/or optical sensor). The external engagement mechanism may comprise a safety mechanism. The safety mechanism may include detecting an event. The event may comprise a component failure, a manual interruption during 3D printing, or a manual override signal. The safety mechanism may be activated in response to the event. The safety mechanism may be activated in response to a manual override mechanism. The safety mechanism may include shutting off (e.g., entire or portions of) the control of the external engagement mechanism. The safety mechanism may comprise turning off a power supply to at least one component of the 3D printer. For example, the safety mechanism may include shutting of at least a portion of the external engagement mechanism. Examples of shutting off may comprise (i) activation of a breaker mechanism, (ii) turning off the (e.g., entire) power supply to the 3D printer, or (iii) turning off one or more motors (e.g., turning off a motion component of the external engagement mechanism). The safety mechanism may include preserving and/or recording a state (e.g., system state, or state of one or more sensors) of the external engagement mechanism. The safety mechanism may facilitate restoring a state of at least one component of the 3D printer. For example, the safety mechanism may facilitate restoring a state of the external engagement mechanism. In some examples, the external engagement mechanism comprises an override mechanism. The override mechanism may comprise one or more switches. The switches may be manually and/or automatically activated. The override mechanism may release automated control (e.g., to allow manual control) of at least one component of the 3D printer (e.g., of at least one component of the external engagement mechanism).

In some cases, auxiliary support(s) adhere to the upper surface of the platform. In some examples, the auxiliary supports of the printed 3D object may touch the platform (e.g., the bottom of the enclosure, the substrate, or the base). Sometimes, the auxiliary support may adhere to the platform. In some embodiments, the auxiliary supports are an integral part of the platform. At times, auxiliary support(s) of the printed 3D object, do not touch the platform. In any of the methods described herein, the printed 3D object may be supported only by the pre-transformed material within the material bed (e.g., powder bed, FIG. 1, 104). Any auxiliary support(s) of the printed 3D object, if present, may be suspended adjacent to the platform. Occasionally, the platform may have a pre-hardened (e.g., pre-solidified) amount of material. Such pre-solidified material may provide support to the printed 3D object. At times, the platform may provide adherence to the material. At times, the platform does not provide adherence to the material. The platform may comprise elemental metal, metal alloy, elemental carbon, or ceramic. The platform may comprise a composite material (e.g., as disclosed herein). The platform may comprise glass, stone, zeolite, or a polymeric material. The polymeric material may include a hydrocarbon or fluorocarbon. The platform (e.g., base) may include Teflon. The platform may include compartments for printing small objects Small may be relative to the size of the enclosure. The compartments may form a smaller compartment within the enclosure, which may accommodate a layer of pre-transformed material.

In some embodiments, the energy beam projects energy to the material bed. The apparatuses, systems, and/or methods described herein can comprise at least one energy beam. In some cases, the apparatuses, systems, and/or methods described can comprise two, three, four, five, or more energy beams. The energy beam may include radiation comprising electromagnetic, electron, positron, proton, plasma, or ionic radiation. The electromagnetic beam may comprise microwave, infrared, ultraviolet, or visible radiation. The ion beam may include a cation or an anion. The electromagnetic beam may comprise a laser beam. The energy beam may derive from a laser source. The energy source may be a laser source. The laser may comprise a fiber laser, a solid-state laser, or a diode laser. The energy source may be stationary. The energy source may not translate during the 3D printing.

In some embodiments, the laser source comprises a Nd: YAG, Neodymium (e.g., neodymium-glass), or an Ytterbium laser. The laser may comprise a carbon dioxide laser ($CO_2$ laser). The laser may be a fiber laser. The laser may be a solid-state laser. The laser can be a diode laser. The energy source may comprise a diode array. The energy source may comprise a diode array laser. The laser may be a laser used for micro laser sintering. The energy beam may be any energy beam disclosed in Provisional Patent Application Ser. No. 62/317,070 that is entirely incorporated herein by reference.

In some embodiments, the energy beam (e.g., transforming energy beam) comprises a Gaussian energy beam. The energy beam may have any cross-sectional shape comprising an ellipse (e.g., circle), or a polygon (e.g., as disclosed herein). The energy beam may have a cross section with a FLS (e.g., diameter) of at least about 50 micrometers (µ), 100 µm, 150 µm, 200 µm, or 250 µm. The energy beam may have a cross section with a FLS of at most about 60 micrometers (µ), 100 µm, 150 µm, 200 µm, or 250 µm. The energy beam may have a cross section with a FLS of any value between the afore-mentioned values (e.g., from about 50 µm to about 250 µm, from about 50 µm to about 150 µm, or from about 150 µm to about 250 µm). The power per unit area of the energy beam may be at least about 100 Watt per millimeter square ($W/mm^2$), 200 $W/mm^2$, 300 $W/mm^2$, 400 $W/mm^2$, 500 $W/mm^2$, 600 $W/mm^2$, 700 $W/mm^2$, 800 $W/mm^2$, 900 $W/mm^2$, 1000 $W/mm^2$, 2000 $W/mm^2$, 3000 $W/mm^2$, 5000 W/mm2, 7000 $W/mm^2$, or 10000 $W/mm^2$. The power per unit area of the tiling energy flux may be at most about 110 $W/mm^2$, 200 $W/mm^2$, 300 $W/mm^2$, 400 $W/mm^2$, 500 $W/mm^2$, 600 $W/mm^2$, 700 $W/mm^2$, 800 $W/mm^2$, 900 $W/mm^2$, 1000 $W/mm^2$, 2000 $W/mm^2$, 3000 $W/mm^2$, 5000 $W/mm^2$, 7000 $W/mm^2$, or 10000 $W/mm^2$. The power per unit area of the energy beam may be any value between the afore-mentioned values (e.g., from about 100 $W/mm^2$ to about 3000 $W/mm^2$, from about 100 $W/mm^2$ to about 5000 $W/mm^2$, from about 100 $W/mm^2$ to about 10000 $W/mm^2$, from about 100 $W/mm^2$ to about 500 $W/mm^2$, from about 1000 $W/mm^2$ to about 3000 $W/mm^2$, from about 1000 $W/mm^2$ to about 3000 $W/mm^2$, or from about 500 $W/mm^2$ to about 1000 $W/mm^2$) The scanning speed of the energy beam may be at least about 50 millimeters per second (mm/sec), 100 mm/sec, 500 mm/sec, 1000 mm/sec, 2000 mm/sec, 3000 mm/sec, 4000 mm/sec, or 50000 mm/sec. The scanning speed of the energy beam may be at most about 50 mm/sec, 100 mm/sec, 500 mm/sec, 1000 mm/sec, 2000 mm/sec, 3000 mm/sec, 4000 mm/sec, or 5000 mm/sec. The scanning speed of the energy beam may any value between the afore-mentioned values (e.g., from about 50 mm/sec to about 5000 mm/sec, from about 50 mm/sec to about 3000 mm/sec, or from about 2000 mm/sec to about 5000 mm/sec). The energy beam may be continuous or non-continuous (e.g., pulsing). The energy beam may be modulated before and/or during the formation of a transformed material as part of the 3D object. The energy beam may be modulated before and/or during the 3D printing process.

In some embodiments, the energy beam is generated by an energy source having a power. The energy source (e.g., laser) may have a power of at least about 10 Watt (W), 30 W, 50 W, 80 W, 100 W, 120 W, 150 W, 200 W, 250 W, 300 W, 350 W, 400 W, 500 W, 750 W, 800 W, 900 W, 1000 W, 1500 W, 2000 W, 3000 W, or 4000 W. The energy beam may have a power of at most about 10 W, 30 W, 50 W, 80 W, 100 W, 120 W, 150 W, 200 W, 250 W, 300 W, 350 W, 400 W, 500 W, 750 W, 800 W, 900 W, 1000 W, 1500, 2000 W, 3000 W, or 4000 W. The energy source may have a power between any of the afore-mentioned energy source power values (e.g., from about 10 W to about 100 W, from about 100 W to about 1000 W, or from about 1000 W to about 4000 W). The energy beam may derive from an electron gun. The energy beam may include a pulsed energy beam, a continuous wave energy beam, or a quasi-continuous wave energy beam. The pulse energy beam may have a repetition frequency of at least about 1 Kilo Hertz (KHz), 2 KHz, 3 KHz, 4 KHz, 5 KHz, 6 KHz, 7 KHz, 8 KHz, 9 KHz, 10 KHz, 20 KHz, 30 KHz, 40 KHz, 50 KHz, 60 KHz, 70 KHz, 80 KHz, 90 KHz, 100 KHz, 150 KHz, 200 KHz, 250 KHz, 300 KHz, 350 KHz, 400 KHz, 450 KHz, 500 KHz, 550 KHz, 600 KHz, 700 KHz, 800 KHz, 900 KHz, 1 Mega Hertz (MHz), 2 MHz, 3 MHz, 4 MHz, or 5 MHz. The pulse energy beam may have a repetition frequency of at most about 1 Kilo Hertz (KHz), 2 KHz, 3 KHz, 4 KHz, 5 KHz, 6 KHz, 7 KHz, 8 KHz, 9 KHz, 10 KHz, 20 KHz, 30 KHz, 40 KHz, 50 KHz, 60 KHz, 70 KHz, 80 KHz, 90 KHz, 100 KHz, 150 KHz, 200 KHz, 250 KHz, 300 KHz, 350 KHz, 400 KHz, 450 KHz, 500 KHz, 550 KHz, 600 KHz, 700 KHz, 800 KHz, 900 KHz, 1 Mega Hertz (MHz), 2 MHz, 3 MHz, 4 MHz, or 5 MHz. The pulse energy beam may have a repetition frequency between any of the afore-mentioned repetition frequencies (e.g., from about 1 KHz to about 5 MHz, from about 1 KHz to about 1 MHz, or from about 1 MHz to about 5 MHz).

In some embodiments, the methods, apparatuses and/or systems disclosed herein comprise Q-switching, mode coupling or mode locking to effectuate the pulsing energy beam.

The apparatus or systems disclosed herein may comprise an on/off switch, a modulator, or a chopper to effectuate the pulsing energy beam. The on/off switch can be manually or automatically controlled. The switch may be controlled by the control system. The switch may alter the "pumping power" of the energy beam. The energy beam may be at times focused, non-focused, or defocused. In some instances, the defocus is substantially zero (e.g., the beam is non-focused).

In some embodiments, the energy source(s) projects energy using a DLP modulator, a one-dimensional scanner, a two-dimensional scanner, or any combination thereof. The energy source(s) can be stationary or translatable. The energy source(s) can translate vertically, horizontally, or in an angle (e.g., planar or compound angle). The energy source(s) can be modulated. The energy beam(s) emitted by the energy source(s) can be modulated. The modulator can include an amplitude modulator, phase modulator, or polarization modulator. The modulation may alter the intensity of the energy beam. The modulation may alter the current supplied to the energy source (e.g., direct modulation). The modulation may affect the energy beam (e.g., external modulation such as external light modulator). The modulation may include direct modulation (e.g., by a modulator). The modulation may include an external modulator. The modulator can include an acousto-optic modulator or an electro-optic modulator. The modulator can comprise an absorptive modulator or a refractive modulator. The modulation may alter the absorption coefficient the material that is used to modulate the energy beam. The modulator may alter the refractive index of the material that is used to modulate the energy beam.

In some examples, the energy beam(s), energy source(s), and/or the platform of the energy beam translates. The energy beam(s), energy source(s), and/or the platform of the energy beam array can be translated via a galvanometer scanner, a polygon, a mechanical stage (e.g., X-Y stage), a piezoelectric device, gimbal, or any combination of thereof. The galvanometer may comprise a mirror. The galvanometer scanner may comprise a two-axis galvanometer scanner. The scanner may comprise a modulator (e.g., as described herein). The scanner may comprise a polygonal mirror. The scanner can be the same scanner for two or more energy sources and/or beams. At least two (e.g., each) energy source and/or beam may have a separate scanner. The energy sources can be translated independently of each other. In some cases, at least two energy sources and/or beams can be translated at different rates, and/or along different paths. For example, the movement of a first energy source may be faster as compared to the movement of a second energy source. The systems and/or apparatuses disclosed herein may comprise one or more shutters (e.g., safety shutters), on/off switches, or apertures.

In some examples, the energy beam comprises an energy beam footprint on the target surface. The energy beam (e.g., laser) may have a FLS (e.g., a diameter) of its footprint on the on the exposed surface of the material bed of at least about 1 micrometer (μm), 5 μm, 10 μm, 20 μm, 30 μm, 40 μm, 50 μm, 60 μm, 70 μm, 80 μm, 90 μm, 100 μm, 200 μm, 300 μm, 400 μm, or 500 μm. The energy beam may have a FLS on the layer of it footprint on the exposed surface of the material bed of at most about 1 μm, 5 μm, 10 μm, 20 μm, 30 μm, 40 μm, 50 μm, 60 μm, 70 μm, 80 μm, 90 μm, 100 μm, 200 μm, 300 μm, 400 μm, or 500 μm. The energy beam may have a FLS on the exposed surface of the material bed between any of the afore-mentioned energy beam FLS values (e.g., from about 5 μm to about 500 μm, from about 5 μm to about 50 μm, or from about 50 μm to about 500 μm). The beam may be a focused beam. The beam may be a dispersed beam. The beam may be an aligned beam. The apparatus and/or systems described herein may further comprise a focusing coil, a deflection coil, or an energy beam power supply. The defocused energy beam may have a FLS of at least about 1 mm, 5 mm, 10 mm, 20 mm, 30 mm, 40 mm, 50 mm, or 100 mm. The defocused energy beam may have a FLS of at most about 1 mm, 5 mm, 10 mm, 20 mm, 30 mm, 40 mm, 50 mm, or 100 mm. The energy beam may have a defocused cross-sectional FLS on the layer of pre-transformed material between any of the afore-mentioned energy beam FLS values (e.g., from about 5 mm to about 100 mm, from about 5 mm to about 50 mm, or from about 50 mm to about 100 mm).

The power supply to any of the components described herein can be supplied by a grid, generator, local, or any combination thereof. The power supply can be from renewable or non-renewable sources. The renewable sources may comprise solar, wind, hydroelectric, or biofuel. The powder supply can comprise rechargeable batteries.

In some embodiments, the energy beam comprises an exposure time (e.g., the amount of time that the energy beam may be exposed to a portion of the target surface). The exposure time of the energy beam may be at least 1 microsecond (μs), 5 μs, 10 μs, 20 μs, 30 μs, 40 μs, 50 μs, 60 μs, 70 μs, 80 μs, 90 μs, 100 μs, 200 μs, 300 μs, 400 μs, 500 μs, 800 μs, or 1000 μs. The exposure time of the energy beam may be most about 1 μs, 5 μs, 10 μs, 20 μs, 30 μs, 40 μs, 50 μs, 60 μs, 70 μs, 80 μs, 90 μs, 100 μs, 200 μs, 300 μs, 400 μs, 500 μs, 800 μs, or 1000 μs. The exposure time of the energy beam may be any value between the afore-mentioned exposure time values (e.g., from about 1 μs to about 1000 μs, from about 1 μs to about 200 from about 1 μs to about 500 from about 200 μs to about 500 or from about 500 μs to about 1000 μs).

In some embodiments, the 3D printing system comprises a controller. The controller may control one or more characteristics of the energy beam (e.g., variable characteristics). The control of the energy beam may allow a low degree of material evaporation during the 3D printing process. For example, controlling on or more energy beam characteristics may (e.g., substantially) reduce the amount of spatter generated during the 3D printing process. The low degree of material evaporation may be measured in grams of evaporated material and compared to a Kilogram of hardened material formed as part of the 3D object. The low degree of material evaporation may be evaporation of at most about 0.25 grams (gr.), 0.5 gr, 1 gr, 2 gr, 5 gr, 10 gr, 15 gr, 20 gr, 30 gr, or 50 gr per every Kilogram of hardened material formed as part of the 3D object. The low degree of material evaporation per every Kilogram of hardened material formed as part of the 3D object may be any value between the afore-mentioned values (e.g., from about 0.25 gr to about 50 gr, from about 0.25 gr to about 30 gr, from about 0.25 gr to about 10 gr, from about 0.25 gr to about 5 gr, or from about 0.25 gr to about 2 gr).

The methods, systems and/or the apparatus described herein comprise at least one energy source. In some cases, the system can comprise two, three, four, five, or more energy sources. An energy source can be a source configured to deliver energy to an area (e.g., a confined area). An energy source can deliver energy to the confined area through radiative heat transfer.

The energy source can supply any of the energies described herein (e.g., energy beams). The energy source may deliver energy to a point or to an area. The energy source may include an electron gun source. The energy source may include a laser source. The energy source may comprise an array of lasers. In an example, a laser can provide light energy at a peak wavelength of at least about 100 nanometer (nm), 500 nm, 1000 nm, 1010 nm, 1020 nm, 1030 nm, 1040 nm, 1050 nm, 1060 nm, 1070 nm, 1080 nm, 1090 nm, 1100 nm, 1200 nm, 1500 nm, 1600 nm, 1700 nm, 1800 nm, 1900 nm, or 2000 nm. In an example, a laser can provide light energy at a peak wavelength of at most about 100 nanometer (nm), 500 nm, 1000 nm, 1010 nm, 1020 nm, 1030 nm, 1040 nm, 1050 nm, 1060 nm, 1070 nm, 1080 nm, 1090 nm, 1100 nm, 1200 nm, 1500 nm, 1600 nm, 1700 nm, 1800 nm, 1900 nm, or 2000 nm. In an example, a laser can provide light energy at a peak wavelength between the afore-mentioned peak wavelengths (e.g., from 100 nm to 2000 nm, from 100 nm to 1100 nm, or from 1000 nm to 2000 nm). The energy beam can be incident on the top surface of the material bed. The energy beam can be incident on, or be directed to, a specified area of the material bed over a specified time period. The energy beam can be substantially perpendicular to the top (e.g., exposed) surface of the material bed. The material bed can absorb the energy from the energy beam (e.g., incident energy beam) and, as a result, a localized region of the material in the material bed can increase in temperature. The increase in temperature may transform the material within the material bed. The increase in temperature may heat and transform the material within the material bed. In some embodiments, the increase in temperature may heat and not transform the material within the material bed. The increase in temperature may heat the material within the material bed.

In some embodiments, the energy beam and/or source are moveable such that it can translate relative to the material bed. The energy beam and/or source can be moved by a scanner. The movement of the energy beam and/or source can comprise utilization of a scanner.

In some embodiments, the 3D printing system includes at least two energy beams. At one point in time, and/or (e.g., substantially) during the entire build of the 3D object: At least two of the energy beams and/or sources can be translated independently of each other or in concert with each other. At least two of the multiplicity of energy beams can be translated independently of each other or in concert with each other. In some cases, at least two of the energy beams can be translated at different rates such that the movement of the one is faster compared to the movement of at least one other energy beam. In some cases, at least two of the energy sources can be translated at different rates such that the movement of the one energy source is faster compared to the movement of at least another energy source. In some cases, at least two of the energy sources (e.g., all of the energy sources) can be translated at different paths. In some cases, at least two of the energy sources can be translated at substantially identical paths. In some cases, at least two of the energy sources can follow one another in time and/or space. In some cases, at least two of the energy sources translate substantially parallel to each other in time and/or space. The power per unit area of at least two of the energy beam may be (e.g., substantially) identical. The power per unit area of at least one of the energy beams may be varied (e.g., during the formation of the 3D object). The power per unit area of at least one of the energy beams may be different. The power per unit area of at least one of the energy beams may be different. The power per unit area of one energy beam may be greater than the power per unit area of a second energy beam. The energy beams may have the same or different wavelengths. A first energy beam may have a wavelength that is smaller or larger than the wavelength of a second energy beam. The energy beams can derive from the same energy source. At least one of the energy beams can derive from different energy sources. The energy beams can derive from different energy sources. At least two of the energy beams may have the same power (e.g., at one point in time, and/or (e.g., substantially) during the entire build of the 3D object). At least one of the beams may have a different power (e.g., at one point in time, and/or substantially during the entire build of the 3D object). The beams may have different powers (e.g., at one point in time, and/or (e.g., substantially) during the entire build of the 3D object). At least two of the energy beams may travel at (e.g., substantially) the same velocity. At least one of the energy beams may travel at different velocities. The velocity of travel (e.g. speed) of at least two energy beams may be (e.g., substantially) constant. The velocity of travel of at least two energy beams may be varied (e.g., during the formation of the 3D object or a portion thereof). The travel may refer to a travel relative to (e.g., on) the exposed surface of the material bed (e.g., powder material). The travel may refer to a travel close to the exposed surface of the material bed. The travel may be within the material bed. The at least one energy beam and/or source may travel relative to the material bed.

Figure 15:
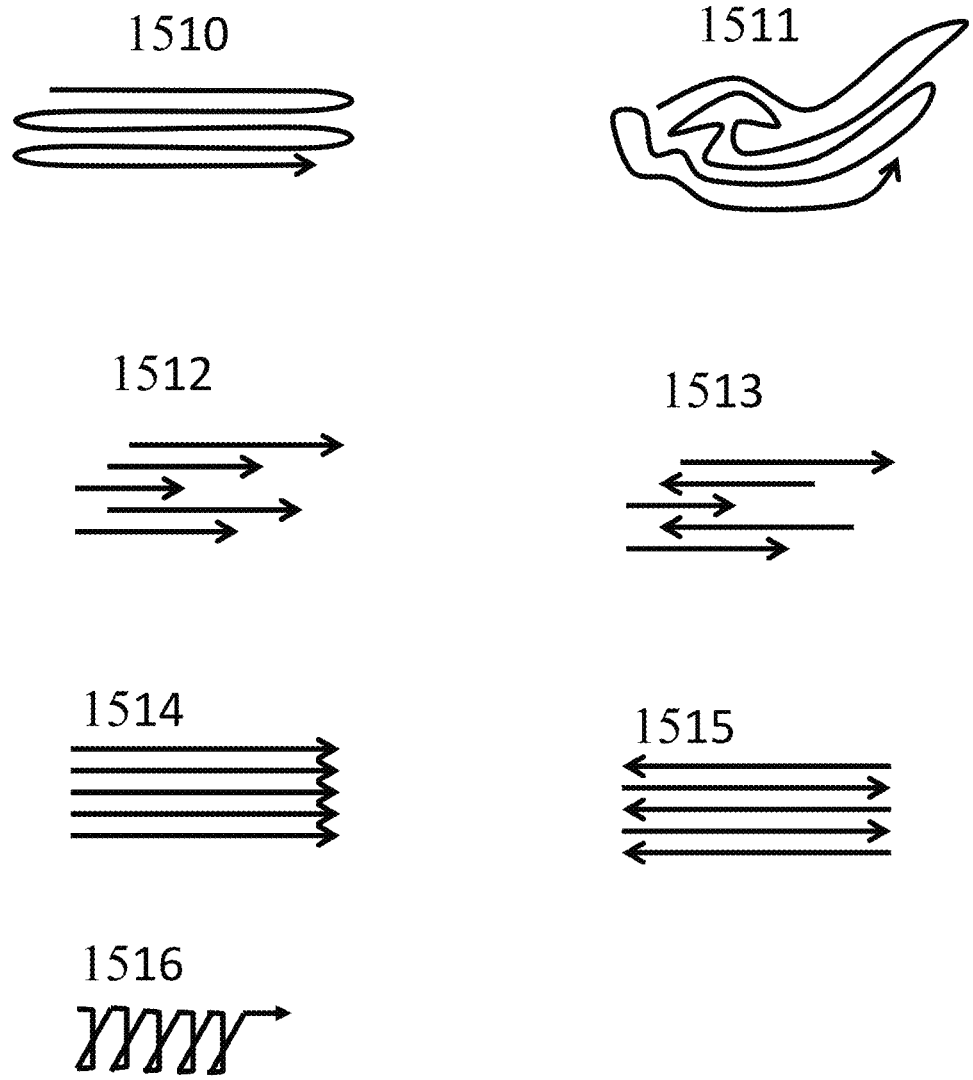
FIG. 15 illustrates various paths.

In some embodiments, the energy (e.g., energy beam) travels in a path. The path may comprise a hatch. The path of the energy beam may comprise repeating a path. For example, the first energy may repeat its own path. The second energy may repeat its own path, or the path of the first energy. The repetition may comprise a repetition of 1, 2, 3, 4, 5, 6, 7, 8, 9, 10 times or more. The energy may follow a path comprising parallel lines. For example, FIG. 15, 1515 or 1514 show paths that comprise parallel lines. The lines may be hatch lines. The distance between each of the parallel lines or hatch lines, may be at least about 1 μm, 5 μm, 10 μm, 20 μm, 30 μm, 40 μm, 50 μm, 60 μm, 70 μm, 80 μm, 90 μm, or more. The distance between each of the parallel lines or hatch lines, may be at most about 1 μm, 5 μm, 10 μm, 20 μm, 30 μm, 40 μm, 50 μm, 60 μm, 70 μm, 80 μm, 90 μm, or less. The distance between each of the parallel lines or hatch lines may be any value between any of the afore-mentioned distance values (e.g., from about 1 μm to about 90 μm, from about 1 μm to about 50 mm, or from about 40 μm to about 90 μm). The distance between the parallel or parallel lines or hatch lines may be substantially the same in every layer (e.g., plane) of transformed material. The distance between the parallel lines or hatch lines in one layer (e.g., plane) of transformed material may be different than the distance between the parallel lines or hatch lines respectively in another layer (e.g., plane) of transformed material within the 3D object. The distance between the parallel lines or hatch lines portions within a layer (e.g., plane) of transformed material may be substantially constant. The distance between the parallel lines or hatch lines within a layer (e.g., plane) of transformed material may be varied. The distance between a first pair of parallel lines or hatch lines within a layer (e.g., plane) of transformed material may be different than the distance between a second pair of parallel lines or hatch lines within a layer (e.g., plane) of transformed material respectively. The first energy beam may follow a path comprising two hatch lines or paths that cross in at least one point. The hatch lines or paths may be straight or curved. The hatch lines or paths may be winding. FIG. 15, 1510 or 1511 show examples of winding paths. The first energy beam may follow a hatch line or path comprising a U-shaped turn (e.g., FIG. 15, 1510). The first energy beam may follow a hatch line or path devoid of U shaped turns (e.g., FIG. 1512).

In some embodiments, the formation of the 3D object includes transforming (e.g., fusing, binding, or connecting) the pre-transformed material (e.g., powder material) using an energy beam. The energy beam may be projected on to a particular area of the material bed, thus causing the pre-transformed material to transform. The energy beam may cause at least a portion of the pre-transformed material to transform from its present state of matter to a different state of matter. For example, the pre-transformed material may transform at least in part (e.g., completely) from a solid to a liquid state. The energy beam may cause at least a portion of the pre-transformed material to chemically transform. For example, the energy beam may cause chemical bonds to form or break. The chemical transformation may be an isomeric transformation. The transformation may comprise a magnetic transformation or an electronic transformation. The transformation may comprise coagulation of the material, cohesion of the material, or accumulation of the material.

In some examples, the methods described herein further comprise repeating the operations of material deposition and material transformation operations to produce a 3D object (or a portion thereof) by at least one 3D printing (e.g., additive manufacturing) method. For example, the methods described herein may further comprise repeating the operations of depositing a layer of pre-transformed material and transforming at least a portion of the pre-transformed material to connect to the previously formed 3D object portion, thus forming at least a portion of a 3D object. The transforming operation may comprise utilizing an energy beam to transform the material. In some instances, the energy beam is utilized to transform at least a portion of the material bed (e.g., utilizing any of the methods described herein).

In some examples, the transforming energy is provided by an energy source. The transforming energy may comprise an energy beam. The energy source can produce an energy beam. The energy beam may include a radiation comprising electromagnetic, electron, positron, proton, plasma, or ionic radiation. The electromagnetic beam may comprise microwave, infrared, ultraviolet, or visible radiation. The ion beam may include a charged particle beam. The ion beam may include a cation, or an anion. The electromagnetic beam may comprise a laser beam. The laser may comprise a fiber, or a solid-state laser beam. The energy source may include a laser. The energy source may include an electron gun. The energy depletion may comprise heat depletion. The energy depletion may comprise cooling. The energy may comprise an energy flux (e.g., energy beam. E.g., radiated energy). The energy may comprise an energy beam. The energy may be the transforming energy. The energy may be a warming energy that is not able to transform the deposited pre-transformed material (e.g., in the material bed). The warming energy may be able to raise the temperature of the deposited pre-transformed material. The energy beam may comprise energy provided at a (e.g., substantially) constant or varied energy beam characteristic. The energy beam may comprise energy provided at (e.g., substantially) constant or varied energy beam characteristic, depending on the position of the generated hardened material within the 3D object. The varied energy beam characteristic may comprise energy flux, rate, intensity, wavelength, amplitude, power, cross-section, or time exerted for the energy process (e.g., transforming or heating). The energy beam cross-section may be the average (or mean) FLS of the cross section of the energy beam on the layer of material (e.g., powder). The FLS may be a diameter, a spherical equivalent diameter, a length, a height, a width, or diameter of a bounding circle. The FLS may be the larger of a length, a height, and a width of a 3D form. The FLS may be the larger of a length and a width of a substantially two-dimensional (2D) form (e.g., wire, or 3D surface).

Figure 14:
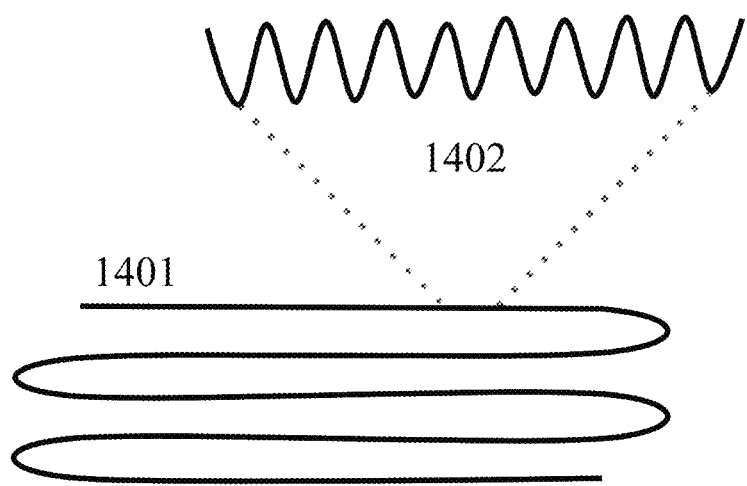
FIG. 14 illustrates a path.

In some examples, the energy beam follows a path. The path of the energy beam may be a vector. The path of the energy beam may comprise a raster, a vector, or any combination thereof. The path of the energy beam may comprise an oscillating pattern. The path of the energy beam may comprise a zigzag, wave (e.g., curved, triangular, or square), or curve pattern. The curved wave may comprise a sine or cosine wave. The path of the energy beam may comprise a sub-pattern. The path of the energy beam may comprise an oscillating (e.g., zigzag), wave (e.g., curved, triangular, or square), and/or curved sub-pattern. The curved wave may comprise a sine or cosine wave. FIG. 14 shows an example of a path 1401 of an energy beam comprising a zigzag sub-pattern (e.g., 1402 shown as an expansion (e.g., blow-up) of a portion of the path 1401). The sub-path of the energy beam may comprise a wave (e.g., sine or cosine wave) pattern. The sub-path may be a small path that forms the large path. The sub-path may be a component (e.g., a portion) of the large path. The path that the energy beam follows may be a predetermined path. A model may predetermine the path by utilizing a controller or an individual (e.g., human). The controller may comprise a processor. The processor may comprise a computer, computer program, drawing or drawing data, statue or statue data, or any combination thereof.

In some embodiments, the path comprises successive lines. The successive lines may touch each other. The successive lines may overlap each other in at least one point. The successive lines may substantially overlap each other. The successive lines may be spaced by a first distance (e.g., hatch spacing). FIG. 15 shows an example of a path 1514 that includes five hatches wherein each two immediately adjacent hatches are separated by a spacing distance. The hatch spacing may be any hatch spacing disclosed in Patent Application serial number PCT/US16/34857 filed on May 27, 2016, titled "THREE-DIMENSIONAL PRINTING AND THREE-DIMENSIONAL OBJECTS FORMED USING THE SAME" that is entirely incorporated herein by reference.

In some examples, the methods, apparatuses, software, and/or systems described herein comprise a 3D printing process (e.g., added manufacturing) including at least one modification. The modification may include changes to the (e.g., a conventional) 3D printing process, 3D model of the desired 3D object, 3D printing instructions, or any combination thereof. The changes may comprise subtraction or addition. The printing instructions may include instruction given to the radiated energy (e.g., energy beam). The instructions can be given to a controller that controls (e.g., regulates) the energy beam and/or energy source. The modification can be in the energy power, frequency, duty cycle, and/or any other modulation parameter. The modification may comprise varying an energy beam characteristic. The modification can include 3D printing process modification. The modification can include a correction (e.g., a geometrical correction) to a model of a desired 3D object. The geometric correction may comprise duplicating a path in a model of the 3D object with a vertical, lateral, or angular (e.g., planer or compound angle) change in position. The modifications may be any modification disclosed in Patent Application serial number PCT/US16/34857 or in Provisional Patent Application Ser. No. 62/325,402 filed on Apr. 20, 2016, titled "METHODS, SYSTEMS, APPARATUSES, AND SOFTWARE FOR ACCURATE THREE-DIMENSIONAL PRINTING," that are both incorporated by reference herein in their entirety. The geometric correction may comprise expanding a path in a model of the 3D object in a vertical, lateral, or angular (e.g., planar or compound angle) position. Angular relocation may comprise rotation. The geometric correction may comprise altering (e.g., expanding or shrinking) a path in a model of the 3D object in a vertical, lateral, or angular (e.g., planer or compound angle) position. The modification can include a variation in a characteristic of the energy (e.g., energy beam) using in the 3D printing process, a variation in the path that the energy travels on (or within) a layer of material (in a material bed) to be transformed and form the 3D object. The layer of material can be a layer of powder material. The modification may depend on a selected position within the generated 3D object, such as an edge, a kink, a suspended structure, a bridge, a lower surface, or any combination thereof. The modification may depend on a hindrance for (e.g., resistance to) energy depletion within the 3D object as it is being generated, or a hindrance for (e.g., resistance to) energy depletion in the surrounding pre-transformed material (e.g., powder material). The modification may depend on a degree of packing of the pre-transformed material within a material bed (e.g., a powder material within a powder bed). For example, the modification may depend on the density of the powder material within a powder bed. The powder material may be unused, recycled, new, or aged.

Figure 16:
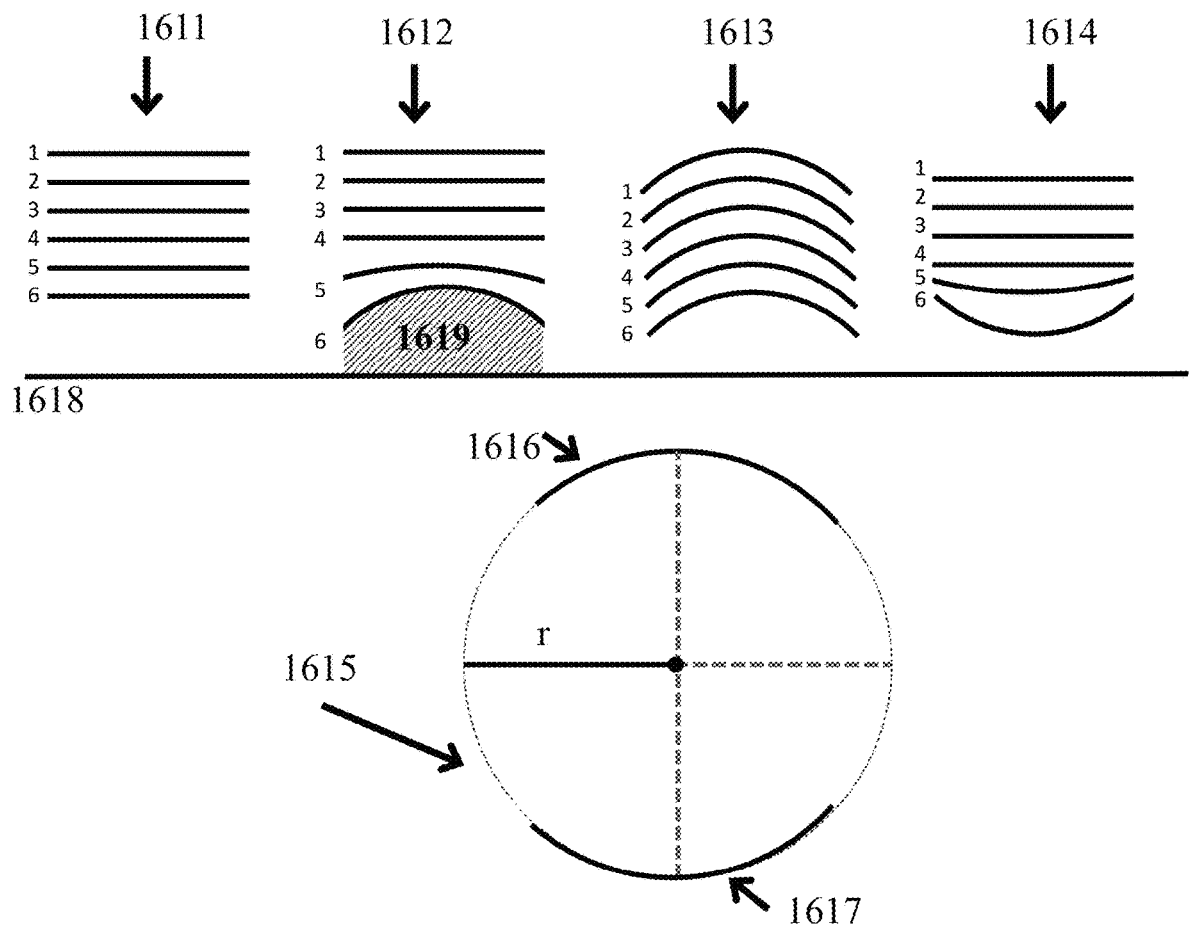
FIG. 16 shows schematics of various vertical cross-sectional views of different 3D objects.

In some embodiments, the methods, apparatuses, software, and/or systems comprise corrective deformation of a 3D model of the desired 3D structure, that substantially result in the desired 3D structure. The corrective deformation may take into account features comprising stress within the forming structure, deformation of transformed material as it hardens to form at least a portion of the 3D object, the manner of temperature depletion during the printing process, the manner of deformation of the transformed material as a function of the density of the pre-transformed material within the material bed (e.g., powder material within a powder bed). The modification may comprise alteration of a path of a cross section (or portion thereof) in the 3D model that is used in the 3D printing instructions. The alteration of the path may comprise alteration of the path filling at least a portion of the cross section (e.g., hatches). The alteration of the hatches may comprise alteration of the direction of hatches, the density of the hatch lines, the length of the hatch lines, and/or the shape of the hatch lines. The modification may comprise alteration of the thickness of the transformed material. The modification may comprise varying at least a portion of a cross-section of the 3D model (e.g., that is used in the 3D printing instructions) by an angle, and/or inflicting to at least a portion of a cross section, a radius of curvature. The angle can be planer or compound angle. The radius of curvature may arise from a bending of at least a portion of the cross section of a 3D model. FIG. 16 shows an example of a vertical cross section of a layered object showing layer #6 of 1612 having a curvature, which curvature has a radius of curvature. The radius of curvature, "r," of a curve at a point can be a measure of the radius of the circular arc (e.g., FIG. 16, 1616) which best approximates the curve at that point. FIG. 16 shows an example of a vertical cross section of a 3D object 1612 comprising planar layers (layers numbers 1-4) and non-planar layers (e.g., layers numbers 5-6) that have a radius of curvature. In FIGS. 16, 1616 and 1617 are super-positions of curved layer on a circle 1615 having a radius of curvature "r." The one or more layers may have a radius of curvature equal to the radius of curvature of the layer surface. The radius of curvature can be the inverse of the curvature. In the case of a 3D curve (also herein a "space curve"), the radius of curvature may be the length of the curvature vector. The curvature vector can comprise of a curvature (e.g., the inverse of the radius of curvature) having a particular direction. For example, the particular direction can be the direction towards the platform (e.g., designated herein as negative curvature), or away from the platform (e.g., designated herein as positive curvature). For example, the particular direction can be the direction towards the direction of the gravitational field (e.g., designated herein as negative curvature), or opposite to the direction of the gravitational field (e.g., designated herein as positive curvature). A curve (also herein a "curved line") can be an object similar to a line that is not required to be straight. A straight line can be a special case of curved line wherein the curvature is (e.g., substantially) zero. A line of substantially zero curvature has a (e.g., substantially) infinite radius of curvature. A curve can be in two dimensions (e.g., vertical cross section of a plane), or in three-dimension (e.g., curvature of a plane). The curve may represent a cross section of a curved plane. A straight line may represent a cross section of a flat (e.g., planar) plane.

In some examples, the path of the transforming energy deviates. The path of the transforming energy may deviate at least in part from a cross section of a desired 3D object. In some instances, the generated 3D object (e.g., substantially) corresponds to the desired 3D object. In some instances, the transforming energy beam follows a path that differs from a cross section of a model of the desired 3D object (e.g., a deviated path), to form a transformed material. When that transformed material hardens, the hardened transformed material may (e.g., substantially) correspond to the respective cross section of a model of the desired 3D object. In some instances, when that transformed material hardens, the hardened material may not correspond to the respective cross section of a model of the desired 3D object. In some instances, when that transformed material hardens, the hardened transformed material may not correspond to the respective cross section of a model of the desired 3D object, however the accumulated transformed material (e.g., accumulated as it forms a plurality of layers of hardened material) may (e.g., substantially) correspond to the desired 3D object. In some instances, when that transformed material hardens, the accumulated hardened material that forms the generated 3D object substantially corresponds to the desired 3D object. The deviation from the path may comprise a deviation between different cross-sections of the desired 3D object. The deviation may comprise a deviation within a cross-section of the desired 3D object. The path can comprise a path section that is larger than a corresponding path section in the cross section of the desired 3D object. Larger may be larger within the plane of the cross section (e.g., horizontally larger) and/or outside the plane of the cross section (e.g., vertically larger). The path may comprise a path section that is smaller than a respective path section in the cross section of a model of the desired 3D object. Smaller may be within the plane of the cross section (e.g., horizontally smaller) and/or outside the plane of the cross section (e.g., vertically smaller).

Figure 10:
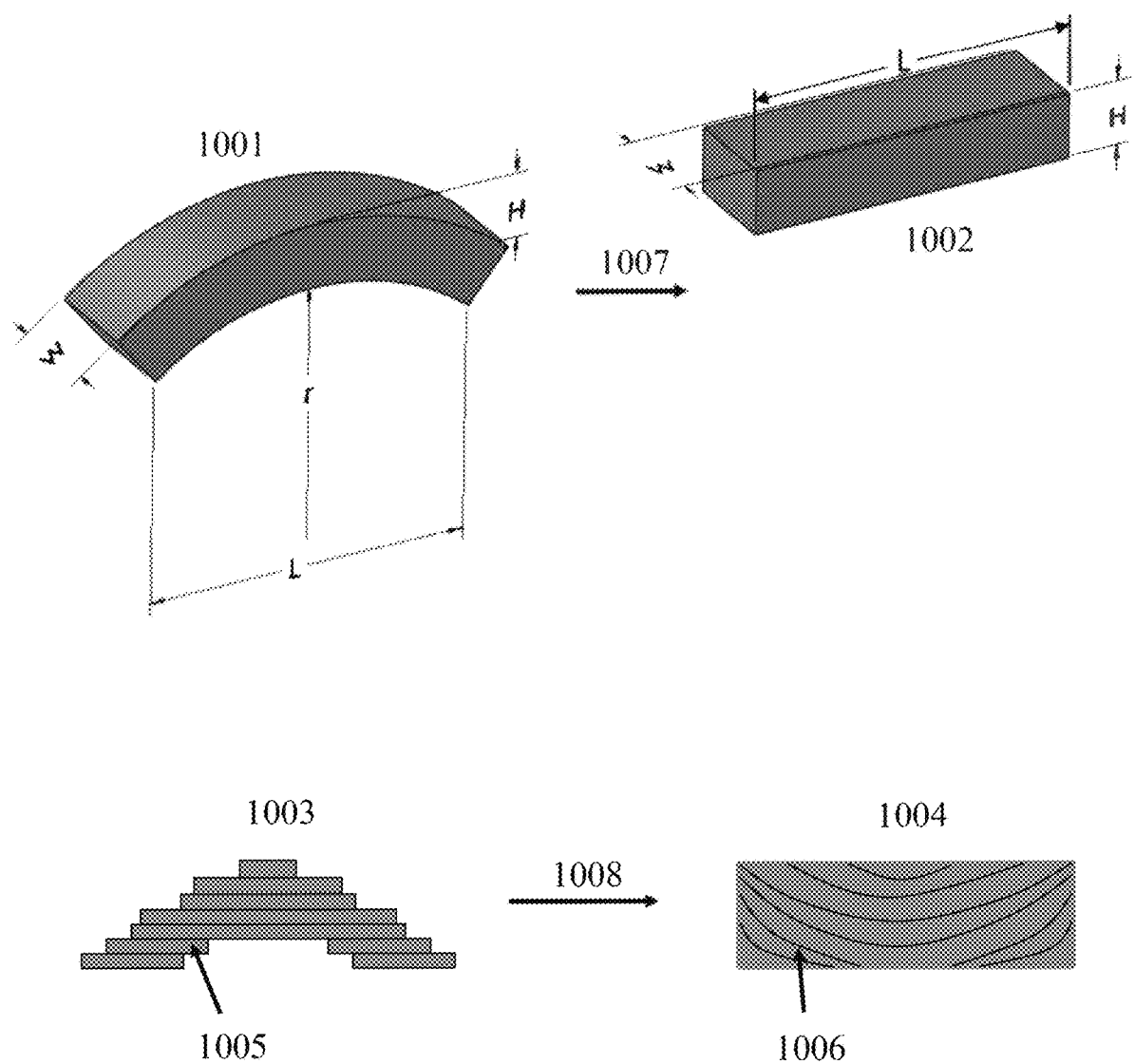
FIG. 10 shows schematics of various vertical cross-sectional views of different 3D objects.

In some embodiments, the transformed material deforms upon hardening (e.g., cooling). The deformation of the hardened material may be anticipated. Sometimes, the hardened material may be generated such that the transformed material may deviate from its intended structure, which subsequently forming hardened material therefrom assumes the intended structure. The intended structure may be devoid of deformation, or may have a (e.g., substantially) reduced amount of deformation in relation to its intended use. Such corrective deviation from the intended structure of the tile is termed herein as "geometric correction." FIG. 10 depicts an example of a transformed material 1001 that hardened into a hardened material 1002, which hardened material is devoid of bending deformation.

Figure 12:
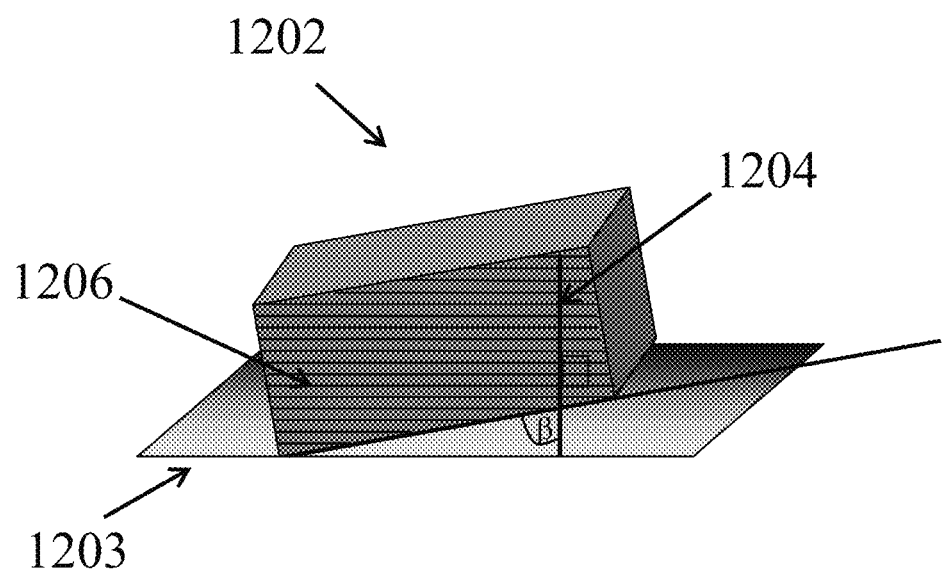
FIG. 12 schematically illustrates a 3D object.

In some examples, a newly formed layer of material (e.g., comprising transformed material) reduces in volume during its hardening (e.g., by cooling). Such reduction in volume (e.g., shrinkage) may cause a deformation in the desired 3D object. The deformation may include cracks, and/or tears in the newly formed layer and/or in other (e.g., adjacent) layers. The deformation may include geometric deformation of the 3D object or at least a portion thereof. The newly formed layer can be a portion of a 3D object. The one or more layers that form the 3D printed object (e.g., sequentially) may be (e.g., substantially) parallel to the building platform. An angle may be formed between a layer of hardened material of the 3D printed object and the platform. The angle may be measured relative to the average layering plane of the layer of hardened material. The platform (e.g., building platform) may include the base, substrate, or bottom of the enclosure. The building platform may be a carrier plate. FIG. 12 shows an example of a 3D object 1202 formed by sequential binding of layers of hardened material adjacent to a platform 1203. The average layering plane of the layers of hardened material forms an angle (e.g., beta) with a normal 1204 to the layering plane 1206.

In an aspect provided herein is a 3D object comprising a layer of hardened material generated by at least one 3D printing method described herein, wherein the layer of material (e.g., hardened) is different from a corresponding cross section of a model of the 3D object. For example, the generated layers differ from the proposed slices. The layer of material within a 3D object can be indicated by the microstructure of the material. The material microstructures may be those disclosed in Patent Application serial number PCT/US15/36802 that is incorporated herein by reference in its entirety. The 3D model may comprise a generated, ordered, provided, or replicated 3D model. The model may be generated, ordered, provided, or replicated by a customer, individual, manufacturer, engineer, artist, human, computer, or software. The software can be neural network software. The 3D model can be generated by a 3D modeling program (e.g., SolidWorks®, Google SketchUp®, SolidEdge®, Engineer®, Auto-CAD®, or I-Deas®). In some cases, the 3D model can be generated from a provided sketch, image, or 3D object.

In some examples, the layer of transformed material differs from a respective slice in a model of the 3D object. The layer of transformed material may differ from a respective cross section (e.g., slice) of a model of the 3D object. The difference may be in the area of the transformed material layer as compared to a respective cross section of a model of the 3D object. For example, the area of the transformed material layer may be smaller than the respective cross section of a model of the 3D object. The area of the transformed material layer may be larger than the respective cross section of a model (e.g., model slice) of the 3D object. The area of the transformed material layer may be a portion of the respective cross section of a model of the 3D object. The area of the respective cross section of a model of the 3D object may be divided between at least two different layers of transformed material. The area of the transformed material layer may be larger than the respective cross section of a model of the 3D object, and may shrink to form a hardened material that is substantially identical to the respective cross section of a model of the 3D object. The area of the transformed material layer may be different than the respective cross section of a model of the 3D object, and may deform to form a hardened material that is substantially identical to the respective cross section of a model of the 3D object. The layer of hardened material may differ from a respective cross section (e.g., slice) of a model of the 3D object. The layer of hardened material may be (e.g., substantially) the same as a respective cross section (e.g., slice) of a model of the 3D object. The area of the transformed material layer may be different than the respective cross section of a model of the 3D object, and may deform to form a hardened material within the generated 3D object, wherein the generated 3D object may be substantially identical to the respective cross section of a model of the 3D object. The area of the transformed material layer may be different than the respective cross section of a model of the 3D object, and may form a hardened material within the generated 3D object, wherein the generated 3D object may be (e.g., substantially) identical to the respective cross section of a model of the 3D object. The layer of hardened material may differ from a respective cross section of a model of the 3D object. The difference may be in the area of the hardened material layer as compared to a respective cross section of a model of the 3D object. For example, the area of the hardened material layer may be smaller than the respective cross section of a model of the 3D object. The area of the hardened material layer may be larger than the respective cross section of a model of the 3D object. The area of the hardened material layer may be a portion of the respective cross section of a model of the 3D object. The area of the respective cross section of a model of the 3D object may be divided between at least two different layers of hardened material. The area of the hardened material layer may be different than the respective cross section of a model of the 3D object, and the generated 3D object may be substantially identical to the respective cross section of a model of the 3D object.

Figure 13A:
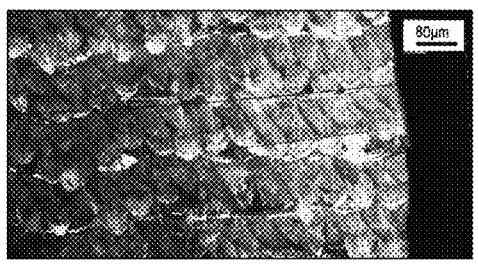
FIGS. 13A-13C shows various 3D objects and schemes thereof.
Figure 13B:
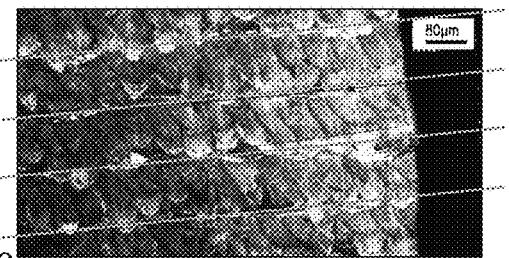
Figure 13C:
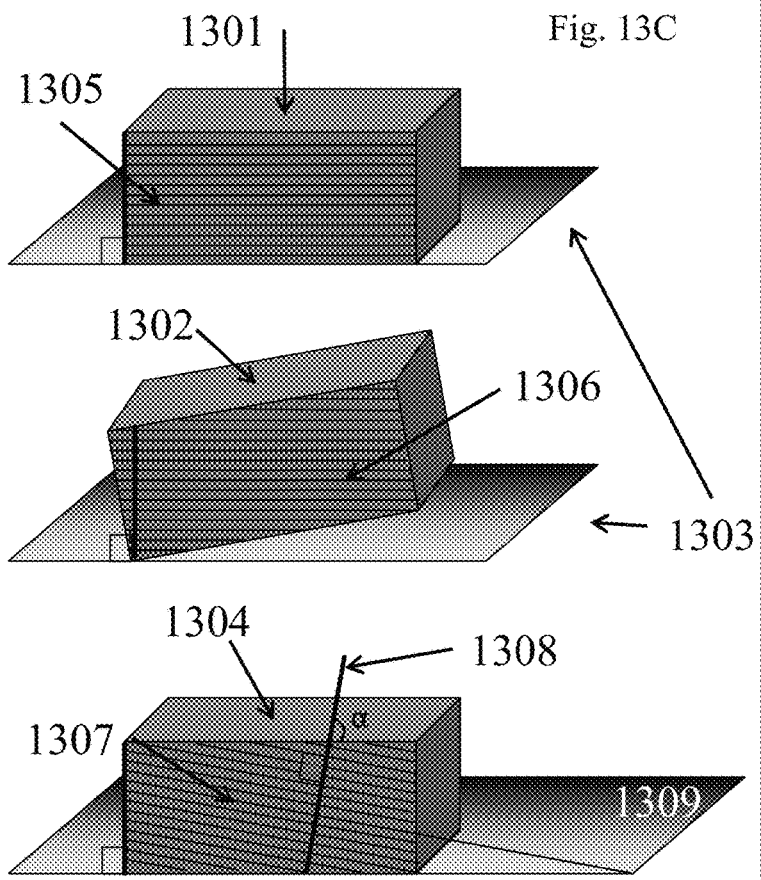

In some embodiments, the material microstructure of the 3D object reveals the manner in which the 3D object was generated. The material microstructure in a hardened material layer within the 3D object may reveal the manner in which the 3D object was generated. The microstructure of the material in a hardened material layer within the 3D object may reveal the manner in which the layer within the 3D object was generated. The microstructure may comprise the grain-structure, or the melt-pool structure. For example, the path in which the energy traveled and transformed the pre-transformed material to form the hardened material within the printed 3D object may be indicated by the microstructure of the material within the 3D object. FIG. 13C, 1301 shows an example of a 3D object placed in its natural position, and rests on a plane 1303 that is normal to the field of gravity. The natural position may be with respect to gravity (e.g., a stable position), with respect to everyday position of the desired object as intended (e.g., for its use), or with respect to a 3D model of the desired 3D object. The object 1301 was printed in this position, as illustrated by the parallel layering planes (e.g., vertical cross section 1305 of a layering plane). FIG. 13C, 1302 shows an example of the desired 3D object 1301 that was printed as a 3D object 1302 that was tilted by an angle alpha (α) with respect to the plane 1303. The object 1302 was printed in this position, as illustrated by the parallel layering planes (e.g., vertical cross section 1306 of a layering plane). When the 3D object is subsequently retrieved, it is placed in its natural position, and substantially corresponds to the desired 3D object. The microstructure of the 3D object may reveal that it was printed in as a tilted 3D object. FIG. 13C, 1301 shows an example of a 3D object placed in its natural position with respect to the field of gravity, and rests on a plane 1303 that is normal to the field of gravity. The object 1304 was printed in a tilted position, as illustrated by the parallel layering planes (e.g., vertical cross section 1307 of a layering plane). FIGS. 13A and 13B show example of a vertical cross section of a 3D object disclosed herein. The lines in FIG. 13B (e.g., 1320) illustrate the average layering planes. The 3D object is printed as a tilted 3D object (or part thereof) forming an acute angle alpha with the plane normal to the field of gravity, the plane of natural position of the desired 3D object, or the building platform. The angle alpha may be at least 0 degrees (°), 0.5°, 1°, 1.5°, 2°, 2.5°, 3°, 3.5°, 4°, 4.5°, 5°, 5.5°, 6°, 6.5°, 70, 7.5°, 8°, 8.5°, 9°, 9.50, 10°, 11°, 12°, 13°, 14°, 15°, 20°, 25°, 30°, 35°, 40°, or 45°. The angle alpha may be at most 0.5°, 1°, 1.5°, 2°, 2.5°, 3°, 3.5°, 4°, 4.5°, 5°, 5.5°, 6°, 6.5°, 7°, 7.5°, 8°, 8.5°, 9°, 9.5°, 10°, 11°, 12°, 13°, 14°, 15°, 20°, 25°, 30°, 35°, 40°, or 45°. The angle alpha may be any value between the afore-mentioned alpha values (e.g., from about 0° to about 45°, from about 0° to about 30°, or from about 0° to about 5°).

In some examples, a portion of the generated 3D object is printed with auxiliary support. The term "auxiliary support," as used herein, generally refers to at least one feature that is a part of a printed 3D object, but not part of the desired, intended, designed, ordered, and/or final 3D object. Auxiliary support may provide structural support during and/or subsequent to the formation of the 3D object. The auxiliary support may be anchored to the enclosure. For example, an auxiliary support may be anchored to the platform (e.g., building platform), to the side walls of the material bed, to a wall of the enclosure, to an object (e.g., stationary, or semi-stationary) within the enclosure, or any combination thereof. The auxiliary support may be the platform (e.g., the base, the substrate, or the bottom of the enclosure). The auxiliary support may enable the removal or energy from the 3D object (e.g., or a portion thereof) that is being formed. The removal of energy (e.g., heat) may be during and/or after the formation of the 3D object. Examples of auxiliary support comprise a fin (e.g., heat fin), anchor, handle, pillar, column, frame, footing, wall, platform, or another stabilization feature. In some instances, the auxiliary support may be mounted, clamped, or situated on the platform. The auxiliary support can be anchored to the building platform, to the sides (e.g., walls) of the building platform, to the enclosure, to an object (stationary or semi-stationary) within the enclosure, or any combination thereof.

Figure 11:
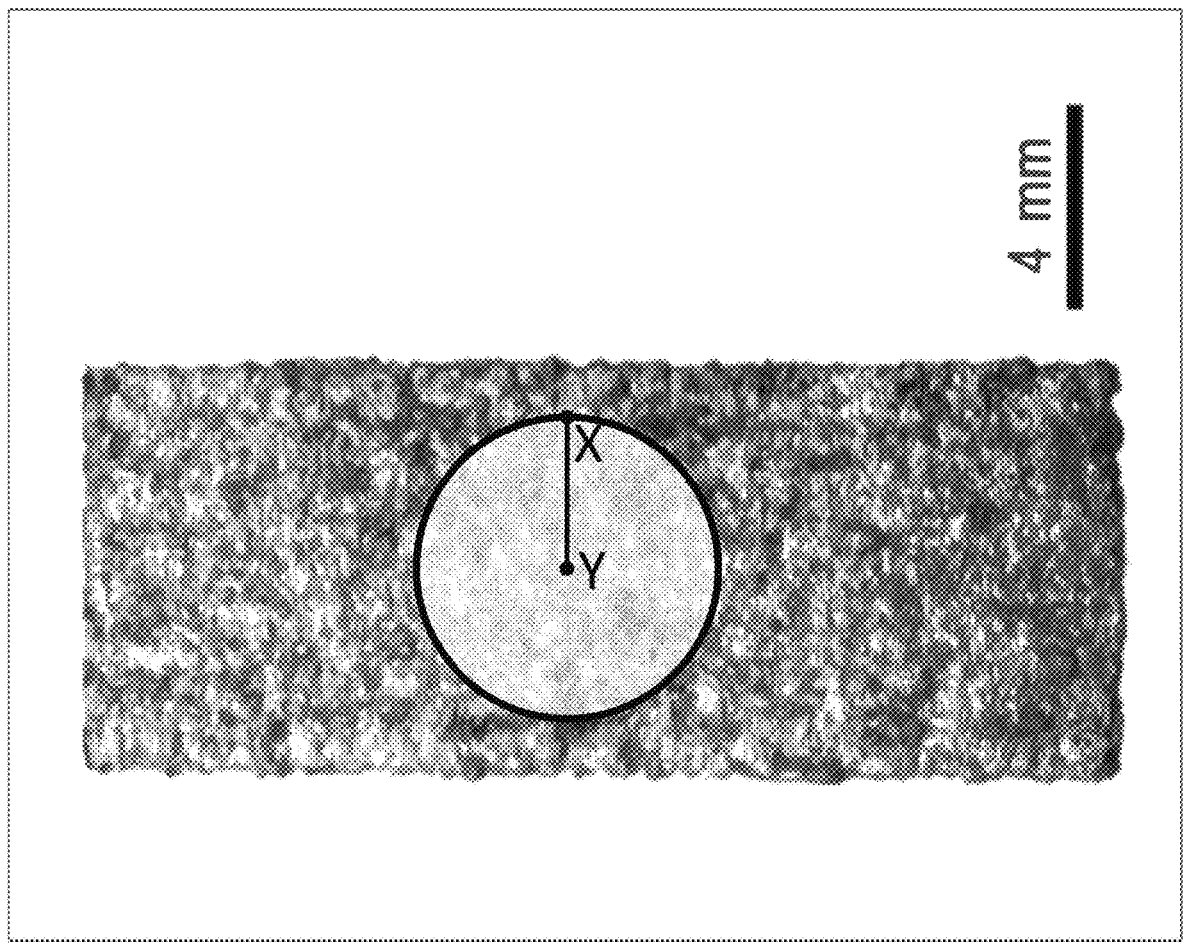
FIG. 11 shows a horizontal view of a 3D object.

In some examples, the generated 3D object is printed without auxiliary support. In some examples, overhanging feature of the generated 3D object can be printed without (e.g., without any) auxiliary support. The generated object can be devoid of auxiliary supports. The generated object may be suspended (e.g., float anchorlessly) in the material bed (e.g., powder bed). The term "anchorlessly," as used herein, generally refers to without or in the absence of an anchor. In some examples, an object is suspended in a powder bed anchorlessly without attachment to a support. For example, the object floats in the powder bed. The generated 3D object may be suspended in the layer of pre-transformed material (e.g., powder material). The pre-transformed material (e.g., powder material) can offer support to the printed 3D object (or the object during its generation). Sometimes, the generated 3D object may comprise one or more auxiliary supports. The auxiliary support may be suspended in the pre-transformed material (e.g., powder material). The auxiliary support may provide weights or stabilizers. The auxiliary support can be suspended in the material bed within the layer of pre-transformed material in which the 3D object (or a portion thereof) has been formed. The auxiliary support (e.g., one or more auxiliary supports) can be suspended in the pre-transformed material within a layer of pre-transformed material other than the one in which the 3D object (or a portion thereof) has been formed (e.g., a previously deposited layer of (e.g., powder) material). The auxiliary support may touch the platform. The auxiliary support may be suspended in the material bed (e.g., powder material) and not touch the platform. The auxiliary support may be anchored to the platform. The distance between any two auxiliary supports can be at least about 1 millimeter, 1.3 millimeters (mm), 1.5 mm, 1.8 mm, 1.9 mm, 2.0 mm, 2.2 mm, 2.4 mm, 2.5 mm, 2.6 mm, 2.7 mm, 3 mm, 4 mm, 5 mm, 10 mm, 11 mm, 15 mm, 20 mm, 30 mm, 40 mm, 41 mm, or 45 mm. The distance between any two auxiliary supports can be at most 1 millimeter, 1.3 mm, 1.5 mm, 1.8 mm, 1.9 mm, 2.0 mm, 2.2 mm, 2.4 mm, 2.5 mm, 2.6 mm, 2.7 mm, 3 mm, 4 mm, 5 mm, 10 mm, 11 mm, 15 mm, 20 mm, 30 mm, 40 mm, 41 mm, or 45 mm. The distance between any two auxiliary supports can be any value in between the afore-mentioned distances (e.g., from about 1 mm to about 45 mm, from about 1 mm to about 11 mm, from about 2.2 mm to about 15 mm, or from about 10 mm to about 45 mm). At times, a sphere intersecting an exposed surface of the 3D object may be devoid of auxiliary support. The sphere may have a radius XY that is equal to the distance between any two auxiliary supports mentioned herein. FIG. 11 shows an example of a top view of a 3D object that has an exposed surface. The exposed surface includes an intersection area of a sphere having a radius XY, which intersection area is devoid of auxiliary support.

In some examples, the diminished number of auxiliary supports or lack of auxiliary support, facilitates a 3D printing process that requires a smaller amount of material, produces a smaller amount of material waste, and/or requires smaller energy as compared to commercially available 3D printing processes. The reduced number of auxiliary supports can be smaller by at least about 1.1, 1.3, 1.5, 2, 3, 4, 5, 6, 7, 8, 9, or 10 as compared to conventional 3D printing. The smaller amount may be smaller by any value between the aforesaid values (e.g., from about 1.1 to about 10, or from about 1.5 to about 5) as compared to conventional 3D printing.

In some embodiments, the generated 3D object has a surface roughness profile. The generated 3D object can have various surface roughness profiles, which may be suitable for various applications. The surface roughness may be the deviations in the direction of the normal vector of a real surface from its ideal form. The surface roughness may be measured as the arithmetic average of the roughness profile (hereinafter "Ra"). The formed object can have a Ra value of at most about 200 µm, 100 µm, 75 µm, 50 µm, 45 µm, 40 µm, 35 µm, 30 µm, 25 µm, 20 µm, 15 µm, 10 µm, 7 µm, 5 µm, 3 µm, 1 µm, 500 nm, 400 nm, 300 nm, 200 nm, 100 nm, 50 nm, 40 nm, or 30 nm. The 3D object can have a Ra value between any of the afore-mentioned Ra values (e.g., from about 50 µm to about 1 µm, from about 100 µm to about 4 µm, from about 30 µm to about 3 µm, from about 60 nm to about 1 µm, or from about 80 nm to about 0.5 µm). The Ra values may be measured by a contact or by a non-contact method. The Ra values may be measured by a roughness tester and/or by a microscopy method (e.g., any microscopy method described herein). The measurements may be conducted at ambient temperatures (e.g., R.T.). The roughness (e.g., as Ra values) may be measured by a contact or by a non-contact method. The roughness measurement may comprise one or more sensors (e.g., optical sensors). The roughness measurement may comprise a metrological measurement device (e.g., using metrological sensor(s)). The roughness may be measured using an electromagnetic beam (e.g., visible or IR).

In some embodiments, the generated 3D object (e.g., the hardened cover) is substantially smooth. The generated 3D object may have a deviation from an ideal planar surface (e.g., atomically flat or molecularly flat) of at most about 1.5 nanometers (nm), 2 nm, 3 nm, 4 nm, 5 nm, 10 nm, 15 nm, 20 nm, 25 nm, 30 nm, 35 nm, 100 nm, 300 nm, 500 nm, 1 micrometer ($\mu m$), 1.5 $\mu m$, 2 $\mu m$, 3 $\mu m$, 4 $\mu m$, 5 $\mu m$, 10 $\mu m$, 15 $\mu m$, 20 $\mu m$, 25 $\mu m$, 30 $\mu m$, 35 $\mu m$, 100 $\mu m$, 300 $\mu m$, 500 $\mu m$, or less. The generated 3D object may have a deviation from an ideal planar surface of at least about 1.5 nanometers (nm), 2 nm, 3 nm, 4 nm, 5 nm, 10 nm, 15 nm, 20 nm, 25 nm, 30 nm, 35 nm, 100 nm, 300 nm, 500 nm, 1 micrometer ($\mu m$), 1.5 $\mu m$, 2 $\mu m$, 3 $\mu m$, 4 $\mu m$, 5 $\mu m$, 10 $\mu m$, 15 $\mu m$, 20 $\mu m$, 25 $\mu m$, 30 $\mu m$, 35 $\mu m$, 100 $\mu m$, 300 $\mu m$, 500 $\mu m$, or more. The generated 3D object may have a deviation from an ideal planar surface between any of the afore-mentioned deviation values. The generated 3D object may comprise a pore. The generated 3D object may comprise pores. The pores may be of an average FLS (diameter or diameter equivalent in case the pores are not spherical) of at most about 1.5 nanometers (nm), 2 nm, 3 nm, 4 nm, 5 nm, 10 nm, 15 nm, 20 nm, 25 nm, 30 nm 35 nm, 100 nm, 300 nm, 500 nm, 1 micrometer ($\mu m$), 1.5 $\mu m$, 2 $\mu m$, 3 $\mu m$, 4 $\mu m$, 5 $\mu m$, 10 $\mu m$, 15 $\mu m$, 20 $\mu m$, 25 $\mu m$, 30 $\mu m$, 35 $\mu m$, 100 $\mu m$, 300 $\mu m$, or 500 $\mu m$. The pores may be of an average FLS of at least about 1.5 nanometers (nm), 2 nm, 3 nm, 4 nm, 5 nm, 10 nm, 15 nm, 20 nm, 25 nm, 30 nm, 35 nm, 100 nm, 300 nm, 500 nm, 1 micrometer ($\mu m$), 1.5 $\mu m$, 2 $\mu m$, 3 $\mu m$, 4 $\mu m$, 5 $\mu m$, 10 $\mu m$, 15 $\mu m$, 20 $\mu m$, 25 $\mu m$, 30 $\mu m$, 35 $\mu m$, 100 $\mu m$, 300 $\mu m$, or 500 $\mu m$. The pores may be of an average FLS between any of the afore-mentioned FLS values (e.g., from about 1 nm to about 500 tam, or from about 20 tam, to about 300 $\mu m$). The 3D object (or at least a layer thereof) may have a porosity of at most about 0.05 percent (%), 0.1% 0.2%, 0.3%, 0.4%, 0.5%, 0.6%, 0.7%, 0.8%, 0.9%, 1%, 2%, 3%, 4%, 5%, 6%, 7%, 8%, 9%, 10%, 20%, 30%, 40%, 50%, 60%, 70%, or 80%. The 3D object (or at least a layer thereof) may have a porosity of at least about 0.05%, 0.1%, 0.2%, 0.3%, 0.4%, 0.5%, 0.6%, 0.7%, 0.8%, 0.9%, 1%, 2%, 3%, 4%, 5%, 6%, 7%, 8%, 9%, 10%, 20%, 30%, 40%, 50%, 60%, 70%, or 80%. The 3D object (or at least a layer thereof) may have porosity between any of the afore-mentioned porosity percentages (e.g., from about 0.05% to about 80%, from about 0.05% to about 40%, from about 10% to about 40%, or from about 40% to about 90%). In some instances, a pore may traverse the generated 3D object. For example, the pore may start at a face of the 3D object and end at the opposing face of the 3D object. The pore may comprise a passageway extending from one face of the 3D object and ending on the opposing face of that 3D object. In some instances, the pore may not traverse the generated 3D object. The pore may form a cavity in the generated 3D object. The pore may form a cavity on a face of the generated 3D object. For example, pore may start on a face of the plane and not extend to the opposing face of that 3D object.

In some embodiments, the formed plane comprises a protrusion. The protrusion can be a grain, a bulge, a bump, a ridge, or an elevation. The generated 3D object may comprise protrusions. The protrusions may be of an average FLS of at most about 1.5 nanometers (nm), 2 nm, 3 nm, 4 nm, 5 nm, 10 nm, 15 nm, 20 nm, 25 nm, 30 nm, 35 nm, 100 nm, 300 nm, 500 nm, 1 micrometer ($\mu m$), 1.5 $\mu m$, 2 $\mu m$, 3 $\mu m$, 4 $\mu m$, 5 $\mu m$, 10 $\mu m$, 15 $\mu m$, 20 $\mu m$, 25 $\mu m$, 30 $\mu m$, 35 $\mu m$, 100 $\mu m$, 300 $\mu m$, 500 $\mu m$, or less. The protrusions may be of an average FLS of at least about 1.5 nanometers (nm), 2 nm, 3 nm, 4 nm, 5 nm, 10 nm, 15 nm, 20 nm, 25 nm, 30 nm, 35 nm, 100 nm, 300 nm, 500 nm, 1 micrometer ($\mu m$), 1.5 $\mu m$, 2 $\mu m$, 3 $\mu m$, 4 $\mu m$, 5 $\mu m$, 10 $\mu m$, 15 $\mu m$, 20 $\mu m$, 25 $\mu m$, 30 $\mu m$, 35 $\mu m$, 100 $\mu m$, 300 $\mu m$, 500 $\mu m$, or more. The protrusions may be of an average FLS between any of the afore-mentioned FLS values. The protrusions may constitute at most about 0.05%, 0.1%, 0.2%, 0.3%, 0.4%, 0.5%, 0.6%, 0.7%, 0.8%, 0.9%, 1%, 2%, 3%, 4%, 5%, 10%, 20%, 30%, 40%, or 50% of the area of the generated 3D object. The protrusions may constitute at least about 0.05%, 0.1%, 0.2%, 0.3%, 0.4%, 0.5%, 0.6%, 0.7%, 0.8%, 0.9%, 1%, 2%, 3%, 4%, 5%, 10%, 20%, 30%, 40%, or 50% of the area of the 3D object. The protrusions may constitute a percentage of an area of the 3D object that is between the afore-mentioned percentages of 3D object area. The protrusion may reside on any surface of the 3D object. For example, the protrusions may reside on an external surface of a 3D object. The protrusions may reside on an internal surface (e.g., a cavity) of a 3D object. At times, the average size of the protrusions and/or of the holes may determine the resolution of the printed (e.g., generated) 3D object. The resolution of the printed 3D object may be at least about 1 micrometer, 1.3 micrometers ($\mu m$), 1.5 $\mu m$, 1.8 $\mu m$, 1.9 $\mu m$, 2.0 $\mu m$, 2.2 $\mu m$, 2.4 $\mu m$, 2.5 $\mu m$, 2.6 $\mu m$, 2.7 $\mu m$, 3 $\mu m$, 4 $\mu m$, 5 $\mu m$, 10 $\mu m$, 20 $\mu m$, 30 $\mu m$, 40 $\mu m$, 50 $\mu m$, 60 $\mu m$, 70 $\mu m$, 80 $\mu m$, 90 $\mu m$, 100 $\mu m$, 200 tam, or more. The resolution of the printed 3D object may be at most about 1 micrometer, 1.3 micrometers ($\mu m$), 1.5 $\mu m$, 1.8 $\mu m$, 1.9 $\mu m$, 2.0 $\mu m$, 2.2 $\mu m$, 2.4 $\mu m$, 2.5 $\mu m$, 2.6 $\mu m$, 2.7 $\mu m$, 3 $\mu m$, 4 $\mu m$, 5 $\mu m$, 10 $\mu m$, 20 $\mu m$, 30 $\mu m$, 40 $\mu m$, 50 $\mu m$, 60 $\mu m$, 70 $\mu m$, 80 $\mu m$, 90 $\mu m$, 100 $\mu m$, 200 $\mu m$, or less. The resolution of the printed 3D object may be any value between the above-mentioned resolution values. At times, the 3D object may have a material density of at least about 99.9%, 99.8%, 99.7%, 99.6%, 99.5%, 99.4%, 99.3%, 99.2% 99.1%, 99%, 98%, 96%, 95%, 94%, 93%, 92%, 91%, 90%, 8%, or 70%. At times, the 3D object may have a material density of at most about 99.5%, 99%, 98%, 96%, 95%, 94%, 93%, 92%, 91%, 90%, 8%, or 70%. At times, the 3D object may have a material density between the afore-mentioned material densities. The resolution of the 3D object may be at least about 100 dots per inch (dpi), 300 dpi, 600 dpi, 1200 dpi, 2400 dpi, 3600 dpi, or 4800 dpi. The resolution of the 3D object may be at most about 100 dpi, 300 dpi, 600 dpi, 1200 dpi, 2400 dpi, 3600 dpi, or 4800 dip. The resolution of the 3D object may be any value between the afore-mentioned values (e.g., from 100 dpi to 4800 dpi, from 300 dpi to 2400 dpi, or from 600 dpi to 4800 dpi). The height uniformity (e.g., deviation from average surface height) of a planar surface of the 3D object may be at least about 100 $\mu m$, 90 $\mu m$, 80 $\mu m$, 70 $\mu m$, 60 $\mu m$, 50 $\mu m$, 40 $\mu m$, 30 $\mu m$, 20 $\mu m$, 10 $\mu m$, or 5 $\mu m$. The height uniformity of the planar surface may be at most about 100 $\mu m$, 90 $\mu m$, 80, 70 $\mu m$, 60 $\mu m$, 50 $\mu m$, 40 $\mu m$, 30 $\mu m$, 20 $\mu m$, 10 $\mu m$, or 5 $\mu m$. The height uniformity of the planar surface of the 3D object may be any value between the afore-mentioned height deviation values (e.g., from about 100 $\mu m$ to about 5 $\mu m$, from about 50 $\mu m$ to about 5 $\mu m$, from about 30 $\mu m$ to about 5 µm, or from about 20 µm to about 5 µm). The height uniformity may comprise high precision uniformity.

In some embodiments, the energy (e.g., heat) is transferred from the material bed to the cooling member (e.g., heat sink) through any one or combination of heat transfer mechanisms. FIG. 1, 113 shows an example of a cooling member. The heat transfer mechanism may comprise conduction, radiation, or convection. The convection may comprise natural or forced convection. The cooling member can be solid, liquid, gas, or semi-solid. In some examples, the cooling member (e.g., heat sink) is solid. The cooling member may be located above, below, or to the side of the powder layer. The cooling member may comprise an energy conductive material. The cooling member may comprise an active energy transfer or a passive energy transfer. The cooling member may comprise a cooling liquid (e.g., aqueous or oil), cooling gas, or cooling solid. The cooling member may be further connected to a cooler and/or a thermostat. The gas, semi-solid, or liquid comprised in the cooling member may be stationary or circulating. The cooling member may comprise a material that conducts heat efficiently. The heat (thermal) conductivity of the cooling member may be at least about 20 Watts per meters times Kelvin (W/mK), 50 W/mK, 100 W/mK, 150 W/mK, 200 W/mK, 205 W/mK, 300 W/mK, 350 W/mK, 400 W/mK, 450 W/mK, 500 W/mK, 550 W/mK, 600 W/mK, 700 W/mK, 800 W/mK, 900 W/mK, or 1000 W/mK. The heat conductivity of the heat sink may be at most about 20 W/mK, 50 W/mK, 100 W/mK, 150 W/mK, 200 W/mK, 205 W/mK, 300 W/mK, 350 W/mK, 400 W/mK, 450 W/mK, 500 W/mK, 550 W/mK, 600 W/mK, 700 W/mK, 800 W/mK, 900 W/mK, or 1000 W/mK. The heat conductivity of the heat sink may any value between the afore-mentioned heat conductivity values. The heat (thermal) conductivity of the cooling member may be measured at ambient temperature (e.g., room temperature) and/or pressure. For example, the heat conductivity may be measured at about 20° C. and a pressure of 1 atmosphere. The heat sink can be separated from the powder bed or powder layer by a gap. The gap can be filled with a gas. The cooling member may be any cooling member (e.g., that is used in 3D printing) such as, for example, the ones described in Patent Application serial number PCT/US15/36802, or in Provisional Patent Application Ser. No. 62/252,330 filed on Nov. 6, 2015, titled "APPARATUSES, SYSTEMS AND METHODS FOR THREE-DIMENSIONAL PRINTING" both of which are entirely incorporated herein by references.

In some embodiments, when the energy source is in operation, the material bed reaches a certain (e.g., average) temperature. The average temperature of the material bed can be an ambient temperature or "room temperature." The average temperature of the material bed can have an average temperature during the operation of the energy (e.g., beam). The average temperature of the material bed can be an average temperature during the formation of the transformed material, the formation of the hardened material, or the generation of the 3D object. The average temperature can be below or just below the transforming temperature of the material. Just below can refer to a temperature that is at most about 1° C., 2° C., 3° C., 4° C., 5° C., 6° C., 7° C., 8° C., 9° C., 10° C., 15° C., or 20° C. below the transforming temperature. The average temperature of the material bed (e.g., pre-transformed material) can be at most about 10° C. (degrees Celsius), 20° C., 25° C., 30° C., 40° C., 50° C., 60° C., 70° C., 80° C., 90° C., 100° C., 120° C., 140° C., 150° C., 160° C., 180° C., 200° C., 250° C., 300° C., 400° C., 500° C., 600° C., 700° C., 800° C., 900° C., 1000° C., 1200° C., 1400° C., 1600° C., 1800° C., or 2000° C. The average temperature of the material bed (e.g., pre-transformed material) can be at least about 10° C., 20° C., 25° C., 30° C., 40° C., 50° C., 60° C., 70° C., 80° C., 90° C., 100° C., 120° C., 140° C., 150° C., 160° C., 180° C., 200° C., 250° C., 300° C., 400° C., 500° C., 600° C., 700° C., 800° C., 900° C., 1000° C., 1200° C., 1400° C., 1600° C., 1800° C., or 2000° C. The average temperature of the material bed (e.g., pre-transformed material) can be any temperature between the afore-mentioned material average temperatures. The average temperature of the material bed (e.g., pre-transformed material) may refer to the average temperature during the 3D printing. The pre-transformed material can be the material within the material bed that has not been transformed and generated at least a portion of the 3D object (e.g., the remainder). The material bed can be heated or cooled before, during, or after forming the 3D object (e.g., hardened material). Bulk heaters can heat the material bed. The bulk heaters can be situated adjacent to (e.g., above, below, or to the side of) the material bed, or within a material dispensing system. For example, the material can be heated using radiators (e.g., quartz radiators, or infrared emitters). The material bed temperature can be substantially maintained at a predetermined value. The temperature of the material bed can be monitored. The material temperature can be controlled manually and/or by a control system.

In some examples, the pre-transformed material within the material bed is heated by a first energy source such that the heating will transform the pre-transformed material. The remainder of the material that did not transform to generate at least a portion of the 3D object (e.g., the remainder) can be heated by a second energy source. The remainder can be at an average temperature that is less than the liquefying temperature of the material (e.g., during the 3D printing). The maximum temperature of the transformed portion of the material bed and the average temperature of the remainder of the material bed can be different. The solidus temperature of the material can be a temperature wherein the material is in a solid state at a given pressure (e.g., ambient pressure). Ambient may refer to the surrounding. After the portion of the material bed is heated to the temperature that is at least a liquefying temperature of the material by the first energy source, that portion of the material may be cooled to allow the transformed (e.g., liquefied) material portion to harden (e.g., solidify). In some cases, the liquefying temperature can be at least about 100° C., 200° C., 300° C., 400° C., or 500° C., and the solidus temperature can be at most about 500° C., 400° C., 300° C., 200° C., or 100° C. For example, the liquefying temperature is at least about 300° C. and the solidus temperature is less than about 300° C. In another example, the liquefying temperature is at least about 400° C. and the solidus temperature is less than about 400° C. The liquefying temperature may be different from the solidus temperature. In some instances, the temperature of the pre-transformed material is maintained above the solidus temperature of the material and below its liquefying temperature. In some examples, the material from which the pre-transformed material is composed has a super cooling temperature (or super cooling temperature regime). In some examples, as the first energy source heats up the pre-transformed material to cause at least a portion of it to melt, the molten material will remain molten as the material bed is held at or above the material super cooling temperature of the material, but below its melting point. When two or more materials make up the material layer at a specific ratio, the materials may form a eutectic material on transformation of the material. The liquefying temperature of the formed eutectic material may be the temperature at the eutectic point, close to the eutectic point, or far from the eutectic point. Close to the eutectic point may designate a temperature that is different from the eutectic temperature (i.e., temperature at the eutectic point) by at most about 0.1° C., 0.5° C., 1° C., 2° C., 4° C., 5° C., 6° C., 8° C., 10° C., or 15° C. A temperature that is farther from the eutectic point than the temperature close to the eutectic point is designated herein as a temperature far from the eutectic Point. The process of liquefying and solidifying a portion of the material can be repeated until the entire object has been formed. At the completion of the generated 3D object, it can be removed from the remainder of material in the container. The remaining material can be separated from the portion at the generated 3D object. The generated 3D object can be hardened and removed from the container (e.g., from the substrate or from the base).

In some examples, the methods described herein further comprise stabilizing the temperature within the enclosure. For example, stabilizing the temperature of the atmosphere or the pre-transformed material (e.g., within the material bed). Stabilization of the temperature may be to a predetermined temperature value. The methods described herein may further comprise altering the temperature within at least one portion of the container. Alteration of the temperature may be to a predetermined temperature. Alteration of the temperature may comprise heating and/or cooling the material bed. Elevating the temperature (e.g., of the material bed) may be to a temperature below the temperature at which the pre-transformed material fuses (e.g., melts or sinters), connects, or bonds.

In some embodiments, the apparatus and/or systems described herein comprise an optical system. The optical components may be controlled manually and/or via a control system (e.g., a controller). The optical system may be configured to direct at least one energy beam from the at least one energy source to a position on the material bed within the enclosure (e.g., a predetermined position). A scanner can be included in the optical system. The printing system may comprise a processor (e.g., a central processing unit). The processor can be programmed to control a trajectory of the at least one energy beam and/or energy source with the aid of the optical system. The systems and/or the apparatus described herein can further comprise a control system in communication with the at least one energy source and/or energy beam. The control system can regulate a supply of energy from the at least one energy source to the material in the container. The control system may control the various components of the optical system (e.g., FIG. 1, 120). The various components of the optical system (e.g., FIG. 5) may include optical components comprising a mirror (e.g., 505), a lens (e.g., concave or convex), a fiber, a beam guide, a rotating polygon, or a prism. The lens may be a focusing or a dispersing lens. The lens may be a diverging or converging lens. The mirror can be a deflection mirror. The optical components may be tiltable and/or rotatable. The optical components may be tilted and/or rotated. The mirror may be a deflection mirror. The optical components may comprise an aperture. The aperture may be mechanical. The optical system may comprise a variable focusing device. The variable focusing device may be connected to the control system. The variable focusing device may be controlled by the control system and/or manually. The variable focusing device may comprise a modulator. The modulator may comprise an acousto-optical modulator, mechanical modulator, or an electro optical modulator. The focusing device may comprise an aperture (e.g., a diaphragm aperture). The optical system may comprise an optical window (e.g., 504). FIG. 5 shows an example of an optical system and an energy source 506 that produces an energy beam 507 that travels through the components of the optical system (e.g., 505 and 504) to a target surface 502.

In some embodiments, the container described herein comprises at least one sensor. The sensor may be connected and/or controlled by the control system (e.g., computer control system, or controller). The control system may be able to receive signals from the at least one sensor. The control system may act upon at least one signal received from the at least one sensor. The control may utilize (e.g., rely on) feedback and/or feed forward mechanisms that has been pre-programmed. The feedback and/or feed forward mechanisms may rely on input from at least one sensor that is connected to the control unit.

In some embodiments, the sensor detects the amount of material (e.g., pre-transformed material) in the enclosure. The controller may monitor the amount of material in the enclosure (e.g., within the material bed). The systems and/or the apparatus described herein can include a pressure sensor. The pressure sensor may measure the pressure of the chamber (e.g., pressure of the chamber atmosphere). The pressure sensor can be coupled to a control system. The pressure can be electronically and/or manually controlled. The controller may control (e.g., regulate, maintain, or alter) the pressure (e.g., with the aid of one or more pumps such as vacuum pumps or pressure pumps) according to input from at least one pressure sensor. The sensor may comprise light sensor, image sensor, acoustic sensor, vibration sensor, chemical sensor, electrical sensor, magnetic sensor, fluidity sensor, movement sensor, speed sensor, position sensor, pressure sensor, force sensor, density sensor, metrology sensor, sonic sensor (e.g., ultrasonic sensor), or proximity sensor. The metrology sensor may comprise measurement sensor (e.g., height, length, width, angle, and/or volume). The metrology sensor may comprise a magnetic, acceleration, orientation, or optical sensor. The optical sensor may comprise a camera (e.g., IR camera, or CCD camera (e.g., single line CCD camera)), or CCD camera (e.g., single line CCD camera). The sensor may transmit and/or receive sound (e.g., echo), magnetic, electronic, or electromagnetic signal. The electromagnetic signal may comprise a visible, infrared, ultraviolet, ultrasound, radio wave, or microwave signal. The metrology sensor may measure the tile. The metrology sensor may measure the gap. The metrology sensor may measure at least a portion of the layer of material (e.g., pre-transformed, transformed, and/or hardened). The layer of material may be a pre-transformed material (e.g., powder), transformed material, or hardened material. The metrology sensor may measure at least a portion of the 3D object. The sensor may comprise a temperature sensor, weight sensor, powder level sensor, gas sensor, or humidity sensor. The gas sensor may sense any gas enumerated herein. The temperature sensor may comprise Bolometer, Bimetallic strip, calorimeter, Exhaust gas temperature gauge, Flame detection, Gardon gauge, Golay cell, Heat flux sensor, Infrared thermometer, Microbolometer, Microwave radiometer, Net radiometer, Quartz thermometer, Resistance temperature detector, Resistance thermometer, Silicon band gap temperature sensor, Special sensor microwave/imager, Temperature gauge, Thermistor, Thermocouple, Thermometer, Pyrometer, IR camera, or CCD camera (e.g., single line CCD camera). The temperature sensor may measure the temperature without contacting the material bed (e.g., non-contact measurements). The pyrometer may comprise a point pyrometer, or a multi-point pyrometer. The Infrared (IR) thermometer may comprise an IR camera. The pressure sensor may comprise Barograph, Barometer, Boost gauge, Bourdon gauge, hot filament ionization gauge, Ionization gauge, McLeod gauge, Oscillating U-tube, Permanent Downhole Gauge, Piezometer, Pirani gauge, Pressure sensor, Pressure gauge, tactile sensor, or Time pressure gauge. The position sensor may comprise Auxanometer, Capacitive displacement sensor, Capacitive sensing, Free fall sensor, Gravimeter, Gyroscopic sensor, Impact sensor, Inclinometer, Integrated circuit piezoelectric sensor, Laser rangefinder, Laser surface velocimeter, LIDAR, Linear encoder, Linear variable differential transformer (LVDT), Liquid capacitive inclinometers, Odometer, Photoelectric sensor, Piezoelectric accelerometer, Rate sensor, Rotary encoder, Rotary variable differential transformer, Selsyn, Shock detector, Shock data logger, Tilt sensor, Tachometer, Ultrasonic thickness gauge, Variable reluctance sensor, or Velocity receiver. The optical sensor may comprise a Charge-coupled device, Colorimeter, Contact image sensor, Electro-optical sensor, Infra-red sensor, Kinetic inductance detector, light emitting diode as light sensor, Light-addressable potentiometric sensor, Nichols radiometer, Fiber optic sensors, optical position sensor, photo detector, photodiode, photomultiplier tubes, phototransistor, photoelectric sensor, photoionization detector, photomultiplier, photo resistor, photo switch, phototube, scintillometer, Shack-Hartmann, single-photon avalanche diode, superconducting nanowire single-photon detector, transition edge sensor, visible light photon counter, or wave front sensor. The weight of the enclosure (e.g., container), or any components within the enclosure can be monitored by at least one weight sensor in or adjacent to the material. For example, a weight sensor can be situated at the bottom of the enclosure. The weight sensor can be situated between the bottom of the enclosure and the substrate. The weight sensor can be situated between the substrate and the base. The weight sensor can be situated between the bottom of the container and the base. The weight sensor can be situated between the bottom of the container and the top of the material bed. The weight sensor can comprise a pressure sensor. The weight sensor may comprise a spring scale, a hydraulic scale, a pneumatic scale, or a balance. At least a portion of the pressure sensor can be exposed on a bottom of the container. In some cases, the at least one weight sensor can comprise a button load cell. Alternatively, or additionally a sensor can be configured to monitor the weight of the material by monitoring a weight of a structure that contains the material (e.g., a material bed). One or more position sensors (e.g., height sensors) can measure the height of the material bed relative to the substrate. The position sensors can be optical sensors. The position sensors can determine a distance between one or more energy sources and a surface of the material bed. The surface of the material bed can be the upper surface of the material bed. For example, FIG. 1, 119 shows an example of an upper surface of the material bed 104.

In some embodiments, the methods, systems, and/or the apparatus described herein comprise at least one valve. The valve may be shut or opened according to an input from the at least one sensor, or manually. The degree of valve opening or shutting may be regulated by the control system, for example, according to at least one input from at least one sensor. The systems and/or the apparatus described herein can include one or more valves, such as throttle valves.

In some embodiments, the methods, systems, and/or the apparatus described herein comprise an actuator. In some embodiments, the methods, systems, and/or the apparatus described herein comprise a motor. The motor may be controlled by the control system and/or manually. The apparatuses and/or systems described herein may include a system providing the material (e.g., powder material) to the material bed. The system for providing the material may be controlled by the control system, or manually. The motor may connect to a system providing the material (e.g., powder material) to the material bed. The system and/or apparatus of the present disclosure may comprise a material reservoir. The material may travel from the reservoir to the system and/or apparatus of the present disclosure may comprise a material reservoir. The material may travel from the reservoir to the system for providing the material to the material bed. The motor may alter (e.g., the position of) the substrate and/or to the base. The motor may alter (e.g., the position of) the elevator. The motor may alter an opening of the enclosure (e.g., its opening or closure). The motor may be a step motor or a servomotor. The motor may comprise a stepper motor. The methods, systems and/or the apparatus described herein may comprise a piston. The piston may be a trunk, crosshead, slipper, or deflector piston.

In some embodiments, the systems and/or the apparatus described herein comprise at least one nozzle. The nozzle may be regulated according to at least one input from at least one sensor. The nozzle may be controlled automatically or manually. The controller may control the nozzle. The nozzle may include jet (e.g., gas jet) nozzle, high velocity nozzle, propelling nozzle, magnetic nozzle, spray nozzle, vacuum nozzle, or shaping nozzle (e.g., a die). The nozzle can be a convergent or a divergent nozzle. The spray nozzle may comprise an atomizer nozzle, an air-aspirating nozzle, or a swirl nozzle.

In some embodiments, the systems and/or the apparatus described herein comprise at least one pump. The pump may be regulated according to at least one input from at least one sensor. The pump may be controlled automatically or manually. The controller may control the pump. The one or more pumps may comprise a positive displacement pump. The positive displacement pump may comprise rotary-type positive displacement pump, reciprocating-type positive displacement pump, or linear-type positive displacement pump. The positive displacement pump may comprise rotary lobe pump, progressive cavity pump, rotary gear pump, piston pump, diaphragm pump, screw pump, gear pump, hydraulic pump, rotary vane pump, regenerative (peripheral) pump, peristaltic pump, rope pump or flexible impeller. Rotary positive displacement pump may comprise gear pump, screw pump, or rotary vane pump. The reciprocating pump comprises plunger pump, diaphragm pump, piston pumps displacement pumps, or radial piston pump. The pump may comprise a valve-less pump, steam pump, gravity pump, eductor-jet pump, mixed-flow pump, bellow pump, axial-flow pumps, radial-flow pump, velocity pump, hydraulic ram pump, impulse pump, rope pump, compressed-air-powered double-diaphragm pump, triplex-style plunger pump, plunger pump, peristaltic pump, roots-type pumps, progressing cavity pump, screw pump, or gear pump. In some examples, the systems and/or the apparatus described herein include one or more vacuum pumps selected from mechanical pumps, rotary vain pumps, turbomolecular pumps, ion pumps, cryopumps, and diffusion pumps. The one or more vacuum pumps may comprise Rotary vane pump, diaphragm pump, liquid ring pump, piston pump, scroll pump, screw pump, Wankel pump, external vane pump, roots blower, multistage Roots pump, Toepler pump, or Lobe pump. The one or more vacuum pumps may comprise momentum transfer pump, regenerative pump, entrapment pump, Venturi vacuum pump, or team ejector.

In some embodiments, the systems, apparatuses, and/or parts thereof comprise a communication technology. The systems, apparatuses, and/or parts thereof may comprise Bluetooth technology. The systems, apparatuses, and/or parts thereof may comprise a communication port. The communication port may be a serial port or a parallel port. The communication port may be a Universal Serial Bus port (i.e., USB). The systems, apparatuses, and/or parts thereof may comprise USB ports. The USB can be micro or mini USB. The USB port may relate to device classes comprising 00h, 01h, 02h, 03h, 05h, 06h, 07h, 08h, 09h, 0Ah, 0Bh, 0Dh, 0Eh, 0Fh, 10h, 11h, DCh, E0h, EFh, FEh, or FFh. The surface identification mechanism may comprise a plug and/or a socket (e.g., electrical, AC power, DC power). The systems, apparatuses, and/or parts thereof may comprise an adapter (e.g., AC and/or DC power adapter). The systems, apparatuses, and/or parts thereof may comprise a power connector. The power connector can be an electrical power connector. The power connector may comprise a magnetically attached power connector. The power connector can be a dock connector. The connector can be a data and power connector. The connector may comprise pins. The connector may comprise at least 10, 15, 18, 20, 22, 24, 26, 28, 30, 40, 42, 45, 50, 55, 80, or 100 pins.

In some embodiments, the controller monitors and/or directs (e.g., physical) alteration of the operating conditions of the apparatuses, software, and/or methods described herein. The controller may be a manual or a non-manual controller. The controller may be an automatic controller. The controller may operate upon request. The controller may be a programmable controller. The controller may be programed. The controller may comprise a processing unit (e.g., CPU or GPU). The controller may receive an input (e.g., from a sensor). The controller may deliver an output. The controller may comprise multiple controllers. The controller may receive multiple inputs. The controller may generate multiple outputs. The controller may be a single input single output controller (SISO) or a multiple input multiple output controller (MIMO). The controller may interpret the input signal received. The controller may acquire data from the one or more sensors. Acquire may comprise receive or extract. The data may comprise measurement, estimation, determination, generation, or any combination thereof. The controller may comprise a control scheme including feedback control. The controller may comprise feed-forward control. The control may comprise on-off control, proportional control, proportional-integral (PI) control, or proportional-integral-derivative (PID) control. The control may comprise open loop control, or closed loop control. The controller may comprise closed loop control. The controller may comprise open loop control. The controller may comprise a user interface. The user interface may comprise a keyboard, keypad, mouse, touch screen, microphone, speech recognition package, camera, imaging system, or any combination thereof. The outputs may include a display (e.g., screen), speaker, or printer. The controller may be any controller (e.g., a controller used in 3D printing) such as, for example, the controller disclosed in Provisional Patent Application Ser. No. 62/252,330 that was filed on Nov. 6, 2015, titled "APPARATUSES, SYSTEMS AND METHODS FOR THREE-DIMENSIONAL PRINTING," or in Provisional Patent Application Ser. No. 62/325,402 that was filed on Apr. 20, 2016, titled "METHODS, SYSTEMS, APPARATUSES, AND SOFTWARE FOR ACCURATE THREE-DIMENSIONAL PRINTING," both of which are incorporated herein by reference in their entirety.

In some embodiments, the methods, systems, and/or the apparatus described herein further comprise a control system. The control system can be in communication with one or more energy sources and/or energy (e.g., energy beams). The energy sources may be of the same type or of different types. For example, the energy sources can be both lasers, or a laser and an electron beam. For example, the control system may be in communication with the first energy and/or with the second energy. The control system may regulate the one or more energies (e.g., energy beams). The control system may regulate the energy supplied by the one or more energy sources. For example, the control system may regulate the energy supplied by a first energy beam and by a second energy beam, to the pre-transformed material within the material bed. The control system may regulate the position of the one or more energy beams. For example, the control system may regulate the position of the first energy beam and/or the position of the second energy beam.

Figure 6:
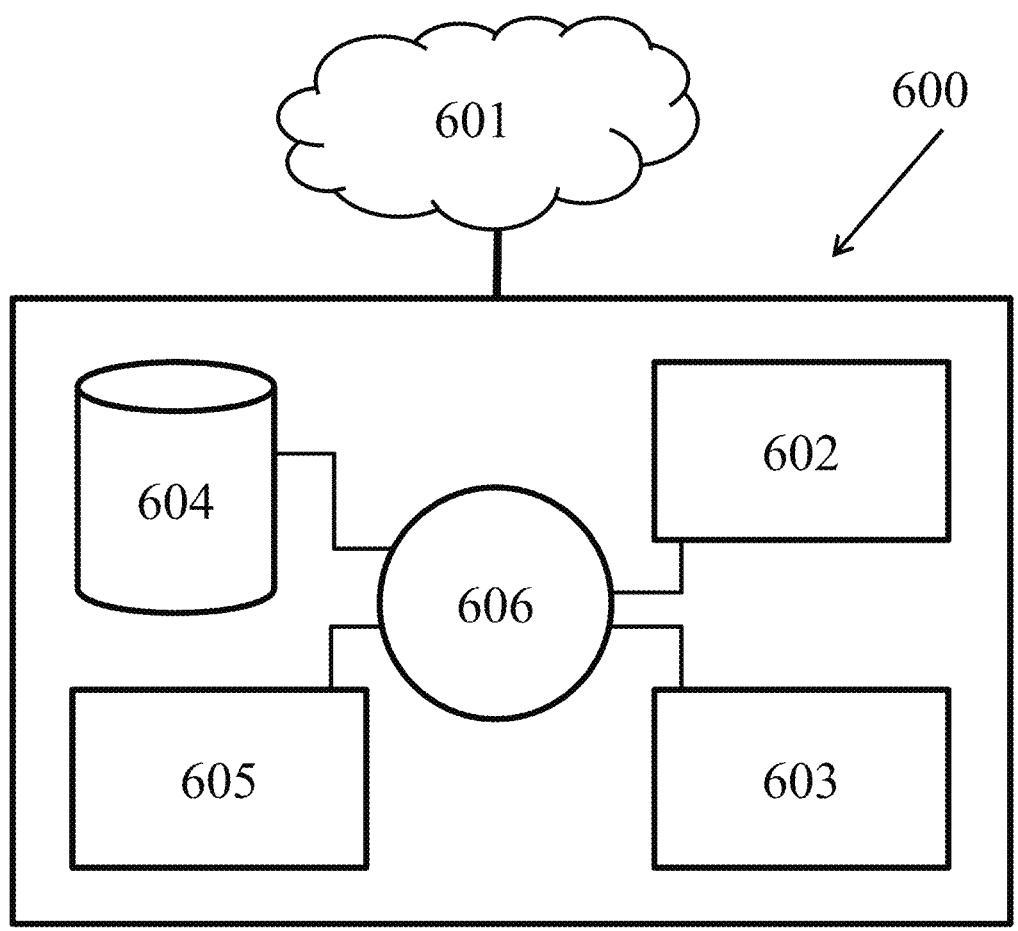
FIG. 6 schematically illustrates a computer control system that is programmed or otherwise configured to facilitate the formation of one or more 3D objects.

In some embodiments, the 3D printing system comprises a processor. The processor may be a processing unit. The controller may comprise a processing unit. The processing unit may be central. The processing unit may comprise a central processing unit (herein "CPU"). The controllers or control mechanisms (e.g., comprising a computer system) may be programmed to implement methods of the disclosure. The processor (e.g., 3D printer processor) may be programmed to implement methods of the disclosure. The controller may control at least one component of the systems and/or apparatuses disclosed herein. FIG. 6 is a schematic example of a computer system 600 that is programmed or otherwise configured to facilitate the formation of a 3D object according to the methods provided herein. The computer system 600 can control (e.g., direct, monitor, and/or regulate) various features of printing methods, apparatuses and systems of the present disclosure, such as, for example, control force, translation, heating, cooling and/or maintaining the temperature of a powder bed, process parameters (e.g., chamber pressure), scanning rate (e.g., of the energy beam and/or the platform), scanning route of the energy source, position and/or temperature of the cooling member(s), application of the amount of energy emitted to a selected location, or any combination thereof. The computer system 600 can be part of, or be in communication with, a 3D printing system or apparatus. The computer may be coupled to one or more mechanisms disclosed herein, and/or any parts thereof. For example, the computer may be coupled to one or more sensors, valves, switches, motors, pumps, scanners, optical components, or any combination thereof.

In some embodiments, the computer system 600 includes a processing unit 606 (also "processor," "computer" and "computer processor" used herein). The computer system may include memory or memory location 602 (e.g., random-access memory, read-only memory, flash memory), electronic storage unit 604 (e.g., hard disk), communication interface 603 (e.g., network adapter) for communicating with one or more other systems, and peripheral devices 605, such as cache, other memory, data storage and/or electronic display adapters. The memory 602, storage unit 604, interface 603, and peripheral devices 605 are in communication with the processing unit 606 through a communication bus (solid lines), such as a motherboard. The storage unit can be a data storage unit (or data repository) for storing data. The computer system can be operatively coupled to a computer network ("network") 601 with the aid of the communication interface. The network can be the Internet, an internet and/or extranet, or an intranet and/or extranet that is in communication with the Internet. In some cases, the network is a telecommunication and/or data network. The network can include one or more computer servers, which can enable distributed computing, such as cloud computing. The network, in some cases with the aid of the computer system, can implement a peer-to-peer network, which may enable devices coupled to the computer system to behave as a client or a server.

In some embodiments, the processing unit executes a sequence of machine-readable instructions, which can be embodied in a program or software. The instructions may be stored in a memory location, such as the memory 602. The instructions can be directed to the processing unit, which can subsequently program or otherwise configure the processing unit to implement methods of the present disclosure. Examples of operations performed by the processing unit can include fetch, decode, execute, and write back. The processing unit may interpret and/or execute instructions. The processor may include a microprocessor, a data processor, a central processing unit (CPU), a graphical processing unit (GPU), a system-on-chip (SOC), a co-processor, a network processor, an application specific integrated circuit (ASIC), an application specific instruction-set processor (ASIPs), a controller, a programmable logic device (PLD), a chipset, a field programmable gate array (FPGA), or any combination thereof. The processing unit can be part of a circuit, such as an integrated circuit. One or more other components of the computer system 600 can be included in the circuit.

In some embodiments, the storage unit 604 stores files, such as drivers, libraries and saved programs. The storage unit can store user data (e.g., user preferences and user programs). In some cases, the computer system can include one or more additional data storage units that are external to the computer system, such as located on a remote server that is in communication with the computer system through an intranet or the Internet.

In some embodiments, the computer system communicates with one or more remote computer systems through a network. For instance, the computer system can communicate with a remote computer system of a user (e.g., operator). Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. A user (e.g., client) can access the computer system via the network.

In some examples, the methods as described herein are implemented by way of machine (e.g., computer processor) executable code stored on an electronic storage location of the computer system, such as, for example, on the memory 602 or electronic storage unit 604. The machine executable or machine-readable code can be provided in the form of software. During use, the processing unit 606 can execute the code. In some cases, the code can be retrieved from the storage unit and stored on the memory for ready access by the processor. In some situations, the electronic storage unit can be precluded, and machine-executable instructions are stored on memory.

In some embodiments, the code is pre-compiled and configured for use with a machine that has a processor adapted to execute the code, or can be compiled during runtime. The code can be supplied in a programming language that can be selected to enable the code to execute in a pre-compiled or as-compiled fashion.

In some embodiments, the processing unit includes one or more cores. The computer system may comprise a single core processor, multi core processor, or a plurality of processors for parallel processing. The processing unit may comprise one or more central processing unit (CPU) and/or a graphic processing unit (GPU). The multiple cores may be disposed in a physical unit (e.g., Central Processing Unit, or Graphic Processing Unit). The processing unit may include one or more processing units. The physical unit may be a single physical unit. The physical unit may be a die. The physical unit may comprise cache coherency circuitry. The multiple cores may be disposed in close proximity. The physical unit may comprise an integrated circuit chip. The integrated circuit chip may comprise one or more transistors. The integrated circuit chip may comprise at least about 0.2 billion transistors (BT), 0.5 BT, 1 BT, 2 BT, 3 BT, 5 BT, 6 BT, 7 BT, 8 BT, 9 BT, 10 BT, 15 BT, 20 BT, 25 BT, 30 BT, 40 BT, or 50 BT. The integrated circuit chip may comprise at most about 7 BT, 8 BT, 9 BT, 10 BT, 15 BT, 20 BT, 25 BT, 30 BT, 40 BT, 50 BT, 70 BT, or 100 BT. The integrated circuit chip may comprise any number of transistors between the afore-mentioned numbers (e.g., from about 0.2 BT to about 100 BT, from about 1 BT to about 8 BT, from about 8 BT to about 40 BT, or from about 40 BT to about 100 BT). The integrated circuit chip may have an area of at least about 50 mm$^2$, 60 mm$^2$, 70 mm$^2$, 80 mm$^2$, 90 mm$^2$, 100 mm$^2$, 200 mm$^2$, 300 mm$^2$, 400 mm$^2$, 500 mm$^2$, 600 mm$^2$, 700 mm$^2$, or 800 mm$^2$. The integrated circuit chip may have an area of at most about 50 mm$^2$, 60 mm$^2$, 70 mm$^2$, 80 mm$^2$, 90 mm$^2$, 100 mm$^2$, 200 mm$^2$, 300 mm$^2$, 400 mm$^2$, 500 mm$^2$, 600 mm$^2$, 700 mm$^2$, or 800 mm$^2$. The integrated circuit chip may have an area of any value between the afore-mentioned values (e.g., from about 50 mm$^2$ to about 800 mm$^2$, from about 50 mm$^2$ to about 500 mm$^2$, or from about 500 mm$^2$ to about 800 mm$^2$) The close proximity may allow substantial preservation of communication signals that travel between the cores. The close proximity may diminish communication signal degradation. A core as understood herein is a computing component having independent central processing capabilities. The computing system may comprise a multiplicity of cores, which are disposed on a single computing component. The multiplicity of cores may include two or more independent central processing units. The independent central processing units may constitute a unit that read and execute program instructions. The independent central processing units may constitute parallel processing units. The parallel processing units may be cores and/or digital signal processing slices (DSP slices). The multiplicity of cores can be parallel cores. The multiplicity of DSP slices can be parallel DSP slices. The multiplicity of cores and/or DSP slices can function in parallel. The multiplicity of cores may include at least about 2, 10, 40, 100, 400, 1000, 2000, 3000, 4000, 5000, 6000, 7000, 8000, 9000, 10000, 11000, 12000, 13000, 14000 or 15000 cores. The multiplicity of cores may include at most about 1000, 2000, 3000, 4000, 5000, 6000, 7000, 8000, 9000, 10000, 11000, 12000, 13000, 14000, 15000, 20000, 30000, or 40000 cores. The multiplicity of cores may include cores of any number between the afore-mentioned numbers (e.g., from about 2 to about 40000, from about 2 to about 400, from about 400 to about 4000, from about 2000 to about 4000, from about 4000 to about 10000, from about 4000 to about 15000, or from about 15000 to about 40000 cores). In some processors (e.g., FPGA), the cores may be equivalent to multiple digital signal processor (DSP) slices (e.g., slices). The plurality of DSP slices may be equal to any of plurality core values mentioned herein. The processor may comprise low latency in data transfer (e.g., from one core to another). Latency may refer to the time delay between the cause and the effect of a physical change in the processor (e.g., a signal). Latency may refer to the time elapsed from the source (e.g., first core) sending a packet to the destination (e.g., second core) receiving it (also referred as two-point latency). One-point latency may refer to the time elapsed from the source (e.g., first core) sending a packet (e.g., signal) to the destination (e.g., second core) receiving it, and the designation sending a packet back to the source (e.g., the packet making a round trip). The latency may be sufficiently low to allow a high number of floating point operations per second (FLOPS). The number of FLOPS may be at least about 0.1 Tera FLOPS (T-FLOPS), 0.2 T-FLOPS, 0.25 T-FLOPS, 0.5 T-FLOPS, 0.75 T-FLOPS, 1 T-FLOPS, 2 T-FLOPS, 3 T-FLOPS, 5 T-FLOPS, 6 T-FLOPS, 7 T-FLOPS, 8 T-FLOPS, 9 T-FLOPS, or 10 T-FLOPS. The number of flops may be at most about 0.2 T-FLOPS, 0.25 T-FLOPS, 0.5 T-FLOPS, 0.75 T-FLOPS, 1 T-FLOPS, 2 T-FLOPS, 3 T-FLOPS, 5 T-FLOPS, 6 T-FLOPS, 7 T-FLOPS, 8 T-FLOPS, 9 T-FLOPS, 10 T-FLOPS, 20 T-FLOPS, 30 T-FLOPS, 50 T-FLOPS, 100 T-FLOPS, 1 P-FLOPS, 2 P-FLOPS, 3 P-FLOPS, 4 P-FLOPS, 5 P-FLOPS, 10 P-FLOPS, 50 P-FLOPS, 100 P-FLOPS, 1 EXA-FLOP, 2 EXA-FLOPS, or 10 EXA-FLOPS. The number of FLOPS may be any value between the afore-mentioned values (e.g., from about 0.1 T-FLOP to about 10 EXA-FLOPS, from about 0.1 T-FLOPS to about 1 T-FLOPS, from about 1 T-FLOPS to about 4 T-FLOPS, from about 4 T-FLOPS to about 10 T-FLOPS, from about 1 T-FLOPS to about 10 T-FLOPS, or from about 10 T-FLOPS to about 30 T-FLOPS, from about 50 T-FLOPS to about 1 EXA-FLOP, or from about 0.1 T-FLOP to about 10 EXA-FLOPS). In some processors (e.g., FPGA), the operations per second may be measured as (e.g., Giga) multiply-accumulate operations per second (e.g., MACs or GMACs). The MACs value can be equal to any of the T-FLOPS values mentioned herein measured as Tera-MACs (T-MACs) instead of T-FLOPS respectively. The FLOPS can be measured according to a benchmark. The benchmark may be a HPC Challenge Benchmark. The benchmark may comprise mathematical operations (e.g., equation calculation such as linear equations), graphical operations (e.g., rendering), or encryption/decryption benchmark. The benchmark may comprise a High Performance LINPACK, matrix multiplication (e.g., DGEMM), sustained memory bandwidth to/from memory (e.g., STREAM), array transposing rate measurement (e.g., PTRANS), Random-access, rate of Fast Fourier Transform (e.g., on a large one-dimensional vector using the generalized Cooley-Tukey algorithm), or Communication Bandwidth and Latency (e.g., MPI-centric performance measurements based on the effective bandwidth/latency benchmark). LINPACK may refer to a software library for performing numerical linear algebra on a digital computer. DGEMM may refer to double precision general matrix multiplication. STREAM benchmark may refer to a synthetic benchmark designed to measure sustainable memory bandwidth (in MB/s) and a corresponding computation rate for four simple vector kernels (Copy, Scale, Add and Triad). PTRANS benchmark may refer to a rate measurement at which the system can transpose a large array (global). MPI refers to Message Passing Interface.

In some embodiments, the computer system includes hyper-threading technology. The computer system may include a chip processor with integrated transform, lighting, triangle setup, triangle clipping, rendering engine, or any combination thereof. The rendering engine may be capable of processing at least about 10 million polygons per second. The rendering engines may be capable of processing at least about 10 million calculations per second. As an example, the GPU may include a GPU by NVidia, ATI Technologies, S3 Graphics, Advanced Micro Devices (AMD), or Matrox. The processing unit may be able to process algorithms comprising a matrix or a vector. The core may comprise a complex instruction set computing core (CISC), or reduced instruction set computing (RISC).

In some embodiments, the computer system includes an electronic chip that is reprogrammable (e.g., field programmable gate array (FPGA)). For example, the FPGA may comprise Tabula, Altera, or Xilinx FPGA. The electronic chips may comprise one or more programmable logic blocks (e.g., an array). The logic blocks may compute combinational functions, logic gates, or any combination thereof. The computer system may include custom hardware. The custom hardware may comprise an algorithm.

In some embodiments, the computer system includes configurable computing, partially reconfigurable computing, reconfigurable computing, or any combination thereof. The computer system may include a FPGA. The computer system may include an integrated circuit that performs the algorithm. For example, the reconfigurable computing system may comprise FPGA, CPU, GPU, or multi-core microprocessors. The reconfigurable computing system may comprise a High-Performance Reconfigurable Computing architecture (HPRC). The partially reconfigurable computing may include module-based partial reconfiguration, or difference-based partial reconfiguration. The FPGA may comprise configurable FPGA logic, and/or fixed-function hardware comprising multipliers, memories, microprocessor cores, first in-first out (FIFO) and/or error correcting code (ECC) logic, digital signal processing (DSP) blocks, peripheral Component interconnect express (PCI Express) controllers, Ethernet media access control (MAC) blocks, or high-speed serial transceivers. DSP blocks can be DSP slices.

In some embodiments, the computing system includes an integrated circuit that performs the algorithm (e.g., control algorithm). The physical unit (e.g., the cache coherency circuitry within) may have a clock time of at least about 0.1 Gigabits per second (Gbit/s), 0.5 Gbit/s, 1 Gbit/s, 2 Gbit/s, 5 Gbit/s, 6 Gbit/s, 7 Gbit/s, 8 Gbit/s, 9 Gbit/s, 10 Gbit/s, or 50 Gbit/s. The physical unit may have a clock time of any value between the afore-mentioned values (e.g., from about 0.1 Gbit/s to about 50 Gbit/s, or from about 5 Gbit/s to about 10 Gbit/s). The physical unit may produce the algorithm output in at most about 0.1 microsecond (µs), 1 µs, 10 µs, 100 µs, or 1 millisecond (ms). The physical unit may produce the algorithm output in any time between the above mentioned times (e.g., from about 0.1 µs, to about 1 ms, from about 0.1 µs, to about 100 µs, or from about 0.1 µs to about 10 µs).

In some instances, the controller uses calculations, real time measurements, or any combination thereof to regulate the energy beam(s). The sensor (e.g., temperature and/or positional sensor) may provide a signal (e.g., input for the controller and/or processor) at a rate of at least about 0.1 KHz, 1 KHz, 10 KHz, 100 KHz, 1000 KHz, or 10000 KHz). The sensor may provide a signal at a rate between any of the above-mentioned rates (e.g., from about 0.1 KHz to about 10000 KHz, from about 0.1 KHz to about 1000 KHz, or from about 1000 KHz to about 10000 KHz). The memory bandwidth of the processing unit may be at least about 1 gigabytes per second (Gbytes/s), 10 Gbytes/s, 100 Gbytes/s, 200 Gbytes/s, 300 Gbytes/s, 400 Gbytes/s, 500 Gbytes/s, 600 Gbytes/s, 700 Gbytes/s, 800 Gbytes/s, 900 Gbytes/s, or 1000 Gbytes/s. The memory bandwidth of the processing unit may be at most about 1 gigabyte per second (Gbytes/s), 10 Gbytes/s, 100 Gbytes/s, 200 Gbytes/s, 300 Gbytes/s, 400 Gbytes/s, 500 Gbytes/s, 600 Gbytes/s, 700 Gbytes/s, 800

Gbytes/s, 900 Gbytes/s, or 1000 Gbytes/s. The memory bandwidth of the processing unit may have any value between the afore-mentioned values (e.g., from about 1 Gbytes/s to about 1000 Gbytes/s, from about 100 Gbytes/s to about 500 Gbytes/s, from about 500 Gbytes/s to about 1000 Gbytes/s, or from about 200 Gbytes/s to about 400 Gbytes/s). The sensor measurements may be real-time measurements. The real-time measurements may be conducted during the 3D printing process. The real-time measurements may be in situ measurements in the 3D printing system and/or apparatus. the real-time measurements may be during the formation of the 3D object. In some instances, the processing unit may use the signal obtained from the at least one sensor to provide a processing unit output, which output is provided by the processing system at a speed of at most about 100 min, 50 min, 25 min, 15 min, 10 min, 5 min, 1 min, 0.5 min (i.e., 30 sec), 15 sec, 10 sec, 5 sec, 1 sec, 0.5 sec, 0.25 sec, 0.2 sec, 0.1 sec, 80 milliseconds (msec), 50 msec, 10 msec, 5 msec, 1 msec, 80 microseconds (µsec), 50 µsec, 20 µsec, 10 µsec, 5 µsec, or 1 µsec. In some instances, the processing unit may use the signal obtained from the at least one sensor to provide a processing unit output, which output is provided at a speed of any value between the afore-mentioned values (e.g., from about 100 min to about 1 µsec, from about 100 min to about 10 min, from about 10 min to about 1 min, from about 5 min to about 0.5 min, from about 30 sec to about 0.1 sec, from about 0.1 sec to about 1 msec, from about 80 msec to about 10 µsec, from about 50 µsec to about 1 µsec, from about 20 µsec to about 1 µsec, or from about 10 µsec to about 1 µsec).

In some embodiments, the processing unit computes an output. The processing unit output may comprise an evaluation of the temperature at a location, position at a location (e.g., vertical, and/or horizontal), or a map of locations. The location may be on the target surface. The map may comprise a topological or temperature map. The temperature sensor may comprise a temperature imaging device (e.g., IR imaging device).

In some embodiments, the processing unit uses the signal obtained from the at least one sensor in an algorithm that is used in controlling the energy beam. The algorithm may comprise the path of the energy beam. In some instances, the algorithm may be used to alter the path of the energy beam on the target surface. The path may deviate from a cross section of a model corresponding to the desired 3D object. The processing unit may use the output in an algorithm that is used in determining the manner in which a model of the desired 3D object may be sliced. The processing unit may use the signal obtained from the at least one sensor in an algorithm that is used to configure one or more parameters and/or apparatuses relating to the 3D printing process. The parameters may comprise a characteristic of the energy beam. The parameters may comprise movement of the platform and/or material bed. The parameters may comprise relative movement of the energy beam and the material bed. In some instances, the energy beam, the platform (e.g., material bed disposed on the platform), or both may translate. The controller may use historical data for the control. The processing unit may use historical data in its one or more algorithms. The parameters may comprise the height of the layer of powder material disposed in the enclosure and/or the gap by which the cooling element (e.g., heat sink) is separated from the target surface. The target surface may be the exposed layer of the material bed.

In some examples, aspects of the systems, apparatuses, and/or methods provided herein, such as the computer system, are embodied in programming (e.g., using a software). Various aspects of the technology may be thought of as "product," "object," or "articles of manufacture" typically in the form of machine (or processor) executable code and/or associated data that is carried on or embodied in a type of machine-readable medium. Machine-executable code can be stored on an electronic storage unit, such memory (e.g., read-only memory, random-access memory, flash memory) or a hard disk. The storage may comprise non-volatile storage media. "Storage" type media can include any or all of the tangible memory of the computers, processors or the like, or associated modules thereof, such as various semiconductor memories, tape drives, disk drives, external drives, and the like, which may provide non-transitory storage at any time for the software programming.

In some embodiments, the memory comprises a random-access memory (RAM), dynamic random access memory (DRAM), static random access memory (SRAM), synchronous dynamic random access memory (SDRAM), ferroelectric random access memory (FRAM), read only memory (ROM), programmable read only memory (PROM), erasable programmable read only memory (EPROM), electrically erasable programmable read only memory (EEPROM), a flash memory, or any combination thereof. The flash memory may comprise a negative-AND (NAND) or NOR logic gates. A NAND gate (negative-AND) may be a logic gate which produces an output which is false only if all its inputs are true. The output of the NAND gate may be complement to that of the AND gate. The storage may include a hard disk (e.g., a magnetic disk, an optical disk, a magneto-optic disk, a solid-state disk, etc.), a compact disc (CD), a digital versatile disc (DVD), a floppy disk, a cartridge, a magnetic tape, and/or another type of computer-readable medium, along with a corresponding drive.

In some examples, the portions of the software include communication. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical, and electromagnetic waves, such as used across physical interfaces between local devices, through wired and optical landline networks and over various air-links. The physical elements that carry such waves, such as wired or wireless links, optical links, or the like, also may be considered as media bearing the software. As used herein, unless restricted to non-transitory, tangible "storage" media, terms such as computer or machine "readable medium" refer to any medium that participates in providing instructions to a processor for execution. Hence, a machine-readable medium, such as computer-executable code, may take many forms, including but not limited to, a tangible storage medium, a carrier wave medium, or physical transmission medium. Non-volatile storage media include, for example, optical or magnetic disks, such as any of the storage devices in any computer(s) or the like, such as may be used to implement the databases. Volatile storage media can include dynamic memory, such as main memory of such a computer platform. Tangible transmission media can include coaxial cables, wire (e.g., copper wire), and/or fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, any other medium from which a computer may read programming code and/or data, or any combination thereof. The memory and/or storage may comprise a storing device external to and/or removable from device, such as a Universal Serial Bus (USB) memory stick, or/and a hard disk. Many of these forms of computer readable media may be involved in carrying one or more sequences of one or more instructions to a processor for execution.

In some embodiments, the computer system includes or is in communication with an electronic display that comprises a user interface (UI) for providing, for example, a model design or graphical representation of a 3D object to be printed. Examples of UI's include, without limitation, a graphical user interface (GUI) and web-based user interface. The computer system can monitor and/or control various aspects of the 3D printing system. The control may be manual and/or programmed. The control may utilize (e.g., rely on) a feedback mechanisms (e.g., from the one or more sensors). The control may utilize (e.g., rely on) historical data. The feedback mechanism (e.g., feedback control scheme) may be pre-programmed. The feedback mechanisms may rely on input from sensors (described herein) that are connected to the control unit (i.e., control system or control mechanism e.g., computer) and/or processing unit. The computer system may store historical data concerning various aspects of the operation of the 3D printing system. The historical data may be retrieved at predetermined times and/or at a whim. The historical data may be accessed by an operator and/or by a user. The historical, sensor, and/or operative data may be provided in an output unit such as a display unit. The output unit (e.g., monitor) may output various parameters of the 3D printing system (as described herein) in real time or in a delayed time. The output unit may output the current 3D printed object, the ordered 3D printed object, or both. The output unit may output the printing progress of the 3D printed object. The output unit may output at least one of the total time, time remaining, and time expanded on printing the 3D object. The output unit may output (e.g., display, voice, and/or print) the status of sensors, their reading, and/or time for their calibration or maintenance. The output unit may output the type of material(s) used and various characteristics of the material(s) such as temperature and flowability of the pre-transformed material. The output unit may output the amount of oxygen, water, and pressure in the printing chamber (i.e., the chamber where the 3D object is being printed). The computer may generate a report comprising various parameters of the 3D printing system, method, and or objects at predetermined time(s), on a request (e.g., from an operator), and/or at a whim. The output unit may comprise a screen, printer, or speaker. The control system may provide a report. The report may comprise any items recited as optionally output by the output unit.

In some embodiments, the system and/or apparatus described herein (e.g., controller) and/or any of their components comprises an output and/or an input device. The input device may comprise a keyboard, touch pad, or microphone. The output device may be a sensory output device. The output device may include a visual, tactile, or audio device. The audio device may include a loudspeaker. The visual output device may include a screen and/or a printed hard copy (e.g., paper). The output device may include a printer. The input device may include a camera, a microphone, a keyboard, or a touch screen.

In some embodiments, the computer system includes, or is in communication with, an electronic display unit that comprises a user interface (UI) for providing, for example, a model design or graphical representation of an object to be printed. Examples of UI's include a graphical user interface (GUI) and web-based user interface. The historical and/or operative data may be displayed on a display unit. The computer system may store historical data concerning various aspects of the operation of the cleaning system. The historical data may be retrieved at predetermined times and/or at a whim. The historical data may be accessed by an operator and/or by a user. The display unit (e.g., monitor) may display various parameters of the printing system (as described herein) in real time or in a delayed time. The display unit may display the desired printed 3D object (e.g., according to a model), the printed 3D object, real time display of the 3D object as it is being printed, or any combination thereof. The display unit may display the cleaning progress of the object, or various aspects thereof. The display unit may display at least one of the total time, time remaining, and time expanded on the cleaned object during the cleaning process. The display unit may display the status of sensors, their reading, and/or time for their calibration or maintenance. The display unit may display the type or types of material used and various characteristics of the material or materials such as temperature and flowability of the pre-transformed material. The particulate material that did not transform to form the 3D object (e.g., the remainder) disposed in the material bed may be flowable (e.g., during the 3D printing process). The display unit may display the amount of a certain gas in the chamber. The gas may comprise oxygen, hydrogen, water vapor, or any of the gasses mentioned herein. The display unit may display the pressure in the chamber. The computer may generate a report comprising various parameters of the methods, objects, apparatuses, or systems described herein. The report may be generated at predetermined time(s), on a request (e.g., from an operator) or at a whim.

In some examples, the methods, apparatuses, and/or systems of the present disclosure are implemented by way of one or more algorithms. An algorithm can be implemented by way of software upon execution by one or more computer processors. For example, the processor can be programmed to calculate the path of the energy beam and/or the power per unit area emitted by the energy source (e.g., that should be provided to the material bed in order to achieve the desired result). Other control and/or algorithm examples may be found in provisional patent application No. 62/325,402, which is incorporated herein by reference in its entirety.

Figure 7:
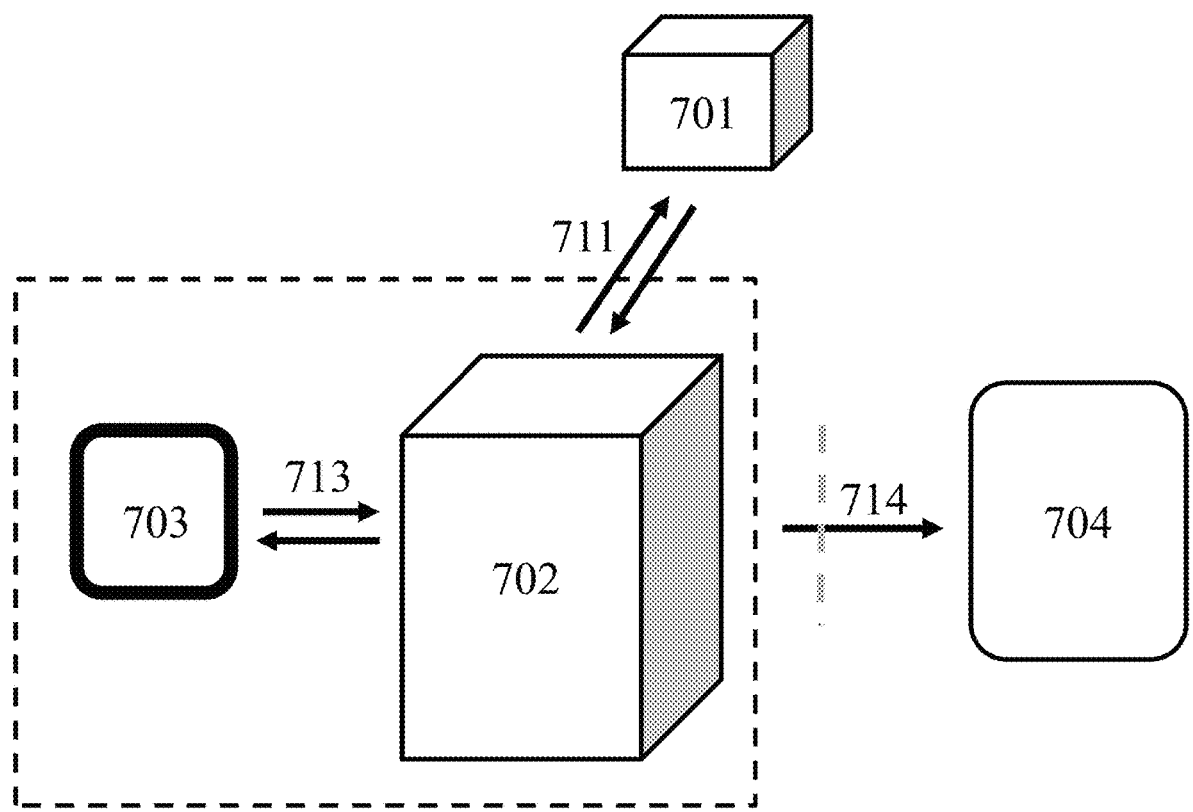
FIG. 7 schematically illustrates a processor and 3D printer architecture that facilitates the formation of one or more 3D objects.
Figure 8:
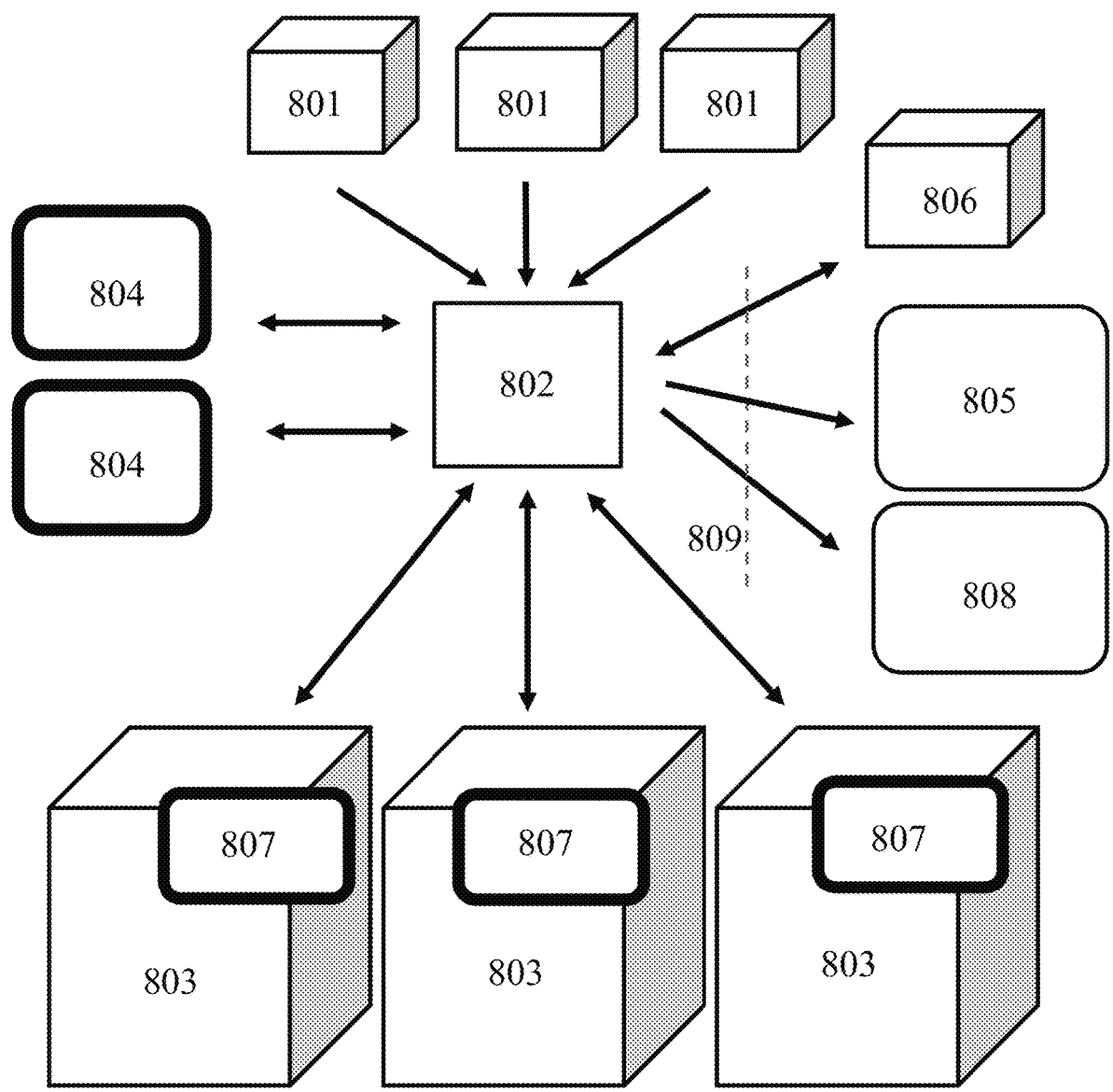
FIG. 8 schematically illustrates a processor and 3D printer architecture that facilitates the formation of one or more 3D objects.

In some embodiments, the 3D printer comprises and/or communicates with a multiplicity of processors. The processors may form a network architecture. Examples of processor architectures are shown in FIGS. 7 and 8. FIG. 7 shows an example of a 3D printer 702 comprising a processor that is in communication with a local processor (e.g., desktop) 701, a remote processor 704, and a machine interface 703. The 3D printer interface is termed herein as "machine interface." The communication of the 3D printer processor with the remote processor and/or machine interface may or may not be through a server. The server may be integrated within the 3D printer. The machine interface may be integrated with, or closely situated adjacent to, the 3D printer 702. Arrows 711 and 713 designate local communications. Arrow 714 designates communicating through a firewall (shown as a discontinuous line). FIG. 8 shows an example of a plurality of 3D printers 803 in communication with a server 802. The server may be external to the 3D printers. The 3D printer(s) may be in communication with one or more machine interfaces. The machine interface (e.g., 807) may be adjacent to (e.g., integrated in) the 3D printer (e.g., 803). The machine interface (e.g., 804) may be distant from the 3D printer (e.g., 803). A machine interface may communicate directly or indirectly with the 3D printer processor. A 3D printing processor may comprise a plurality of machine interfaces. Any of the machine interfaces may be optionally included in the 3D printing system. The communication between the 3D printer processor and the machine interface processor may be unidirectional (e.g., from the machine interface processor to the 3D printer processor), or bidirectional. The arrows in FIG. 8 illustration the directionality of the communication (e.g., flow of information direction) between the processors. The 3D printer processor may be connected directly or indirectly to one or more stationary processors (e.g., desktop). The 3D printer processor may be connected directly or indirectly to one or more mobile processors (e.g., mobile device). The 3D printer processor may be connected directly or indirectly (e.g., through a server) to processors that direct 3D printing instructions (e.g., 801 and/or 806). The connection may be local (e.g., in 801) or remote (e.g., in 806). The 3D printer processor may communicate with at least one 3D printing monitoring processor (e.g., 805 or 808). The 3D printing processor may be owned by the entity supplying the printing instruction to the 3D printer (e.g., 808), or by a client (e.g., 805). The client may be an entity or person that desires at least one 3D printing object. The arrows in FIG. 8 designate the direction of communications (e.g., information) flow.

In some embodiments, the 3D printer comprises at least one processor (referred herein as the "3D printer processor"). The 3D printer may comprise a plurality of processors. At least two of the plurality of the 3D printer processors may interact with each other. At times, at least two of the plurality of the 3D printer processors may not interact with each other. Discontinuous line 809 illustrates a firewall.

In some embodiments, a 3D printer processor interacts with at least one processor that acts as a 3D printer interface (also referred to herein as "machine interface processor"). The processor (e.g., machine interface processor) may be stationary or mobile. The processor may be a remote computer systems. The machine interface one or more processors may be connected to at least one 3D printer processor. The connection may be through a wire (e.g., cable) or be wireless (e.g., via Bluetooth technology). The machine interface may be hardwired to the 3D printer. The machine interface may directly connect to the 3D printer (e.g., to the 3D printer processor). The machine interface may indirectly connect to the 3D printer (e.g., through a server, or through wireless communication). The cable may comprise coaxial cable, shielded twisted cable pair, unshielded twisted cable pair, structured cable (e.g., used in structured cabling), or fiber-optic cable.

In some embodiments, the machine interface processor directs 3D print job production, 3D printer management, 3D printer monitoring, or any combination thereof. The machine interface processor may not be able to influence (e.g., direct, or be involved in) pre-print or 3D printing process development. The machine management may comprise controlling the 3D printer controller (e.g., directly, or indirectly). The printer controller may direct starting of a 3D printing process, stopping a 3D printing process, maintenance of the 3D printer, clearing alarms (e.g., concerning safety features of the 3D printer).

In some embodiments, the machine interface processor allows monitoring of the 3D printing process (e.g., accessible remotely or locally). The machine interface processor may allow viewing a log of the 3D printing and status of the 3D printer at a certain time (e.g., 3D printer snapshot). The machine interface processor may allow to monitor one or more 3D printing parameters. The one or more printing parameters monitored by the machine interface processor can comprise 3D printer status (e.g., 3D printer is idle, preparing to 3D print, 3D printing, maintenance, fault, or offline), active 3D printing (e.g., including a build module number), status and/or position of build module(s), status of build module and processing chamber engagement, type and status of pre-transformed material used in the 3D printing (e.g., amount of pre-transformed material remaining in the reservoir), status of a filter, atmosphere status (e.g., pressure, gas level(s)), ventilator status, layer dispensing mechanism status (e.g., position, speed, rate of deposition, level of exposed layer of the material bed), status of the optical system (e.g., optical window, mirror), status of scanner, alarm (, boot log, status change, safety events, motion control commands (e.g., of the energy beam, or of the layer dispensing mechanism), or printed 3D object status (e.g., what layer number is being printed).

In some embodiments, the machine interface processor allows monitoring the 3D print job management. The 3D print job management may comprise status of each build module (e.g., atmosphere condition, position in the enclosure, position in a queue to go in the enclosure, position in a queue to engage with the processing chamber, position in queue for further processing, power levels of the energy beam, type of pre-transformed material loaded, 3D printing operation diagnostics, status of a filter. The machine interface processor (e.g., output device thereof) may allow viewing and/or editing any of the job management and/or one or more printing parameters. The machine interface processor may show the permission level given to the user (e.g., view, or edit). The machine interface processor may allow viewing and/or assigning a certain 3D object to a particular build module, prioritize 3D objects to be printed, pause 3D objects during 3D printing, delete 3D objects to be printed, select a certain 3D printer for a particular 3D printing job, insert and/or edit considerations for restarting a 3D printing job that was removed from 3D printer. The machine interface processor may allow initiating, pausing, and/or stopping a 3D printing job. The machine interface processor may output message notification (e.g., alarm), log (e.g., other than Excursion log or other default log), or any combination thereof.

In some embodiments, the 3D printer interacts with at least one server (e.g., print server). The 3D print server may be separate or interrelated in the 3D printer.

In some embodiments, one or more users interact with the one or more 3D printing processors through one or more user processors (e.g., respectively). The interaction may be in parallel and/or sequentially. The users may be clients. The users may belong to entities that desire a 3D object to be printed, or entities who prepare the 3D object printing instructions. The one or more users may interact with the 3D printer (e.g., through the one or more processors of the 3D printer) directly and/or indirectly. Indirect interaction may be through the server. One or more users may be able to monitor one or more aspects of the 3D printing process. One or more users can monitor aspects of the 3D printing process through at least one connection (e.g., network connection). For example, one or more users can monitor aspects of the printing process through direct or indirect connection. Direct connection may be using a local area network (LAN), and/or a wide area network (WAN). The network may interconnect computers within a limited area (e.g., a building, campus, neighborhood). The limited area network may comprise Ethernet or Wi-Fi. The network may have its network equipment and interconnects locally managed. The network may cover a larger geographic distance than the limited area. The network may use telecommunication circuits and/or internet links. The network may comprise Internet Area Network (IAN), and/or the public switched telephone network (PSTN). The communication may comprise web communication. The aspect of the 3D printing process may comprise a 3D printing parameter, machine status, or sensor status. The 3D printing parameter may comprise hatch strategy, energy beam power, energy beam speed, energy beam focus, thickness of a layer (e.g., of hardened material or of pre-transformed material).

In some embodiments, a user develops at least one 3D printing instruction and directs it to the 3D printer (e.g., through communication with the 3D printer processor) to print in a desired manner according to the developed at least one 3D printing instruction. A user may or may not be able to control (e.g., locally, or remotely) the 3D printer controller. For example, a client may not be able to control the 3D printing controller (e.g., maintenance of the 3D printer).

In some embodiments, the user (e.g., other than a client) processor uses real-time and/or historical 3D printing data. The 3D printing data may comprise metrology data, or temperature data. The user processor may comprise quality control. The quality control may use a statistical method (e.g., statistical process control (SPC)). The user processor may log excursion log, report when a signal deviates from the nominal level, or any combination thereof. The user processor may generate a configurable response. The configurable response may comprise a print/pause/stop command (e.g., automatically) to the 3D printer (e.g., to the 3D printing processor). The configurable response may be based on a user defined parameter, threshold, or any combination thereof. The configurable response may result in a user defined action. The user processor may control the 3D printing process and ensure that it operates at its full potential. For example, at its full potential, the 3D printing process may make a maximum number of 3D object with a minimum of waste and/or 3D printer down time. The SPC may comprise a control chart, design of experiments, and/or focus on continuous improvement.

In some embodiments, the user (e.g., non-client) processor comprises a pre-print non-transitory computer-readable medium (e.g., software). The pre-print non-transitory computer-readable medium may comprise work flow. The work flow may comprise (1) importing a model geometry of a desired 3D object, (2) repairing the desired 3D object geometry, (3) inputting 3D printing parameters (also referred to herein as "process parameters") to the desired 3D object geometry, (4) selecting or inputting a preferred orientation of the 3D object in the material bed according to which orientation the desired 3D object will be printed, (5) creating or adding auxiliary support geometry to the desired 3D object model, (6) optimizing the geometry and/or number of auxiliary supports (e.g., using at least one simulation), (7) optimizing the orientation of the 3D object (e.g., using at least one simulation), (8) creating a layout of individual parts in a material bed. So, that several could be printed together. The process parameters may comprise pre-transformed material type, hatching scheme, energy beam characteristic (e.g., varied energy beam characteristic disclosed herein), deformation tolerance, surface roughness tolerance, target porosity of the hardened material, resolution. The work flow may further comprise an object pre-correction operation (e.g., OPC). The OPC may depend on the process parameters. The OPC may comprise using at least one simulation. For example, the OPC may be added to the work flow after (2) repairing the desired 3D object geometry. For example, the OPC may be added to the work flow before (8) creating a layout of individual parts in a material bed. The order of work flow operations (3) to (8) may be interchangeable. Any of the operations (3) to (8) may be omitted from the work flow. The work flow may comprise repeating any of the operations (3) to (8) until an optimized work flow is formed. Optimized may be in terms of 3D print time, quality of the 3D object (e.g., minimal deformation, resolution, density), amount of pre-transformed material used, energy used, gas used, electricity used, heat excreted, or any combination thereof. The repair the 3D object model geometry may be such that the geometry of the desired 3D object is watertight. Watertight geometry refers to a geometry that includes continuous a surface(s). The orientation of the 3D object may comprise a deviation from its natural position (e.g., FIG. 13C).

Figure 9:
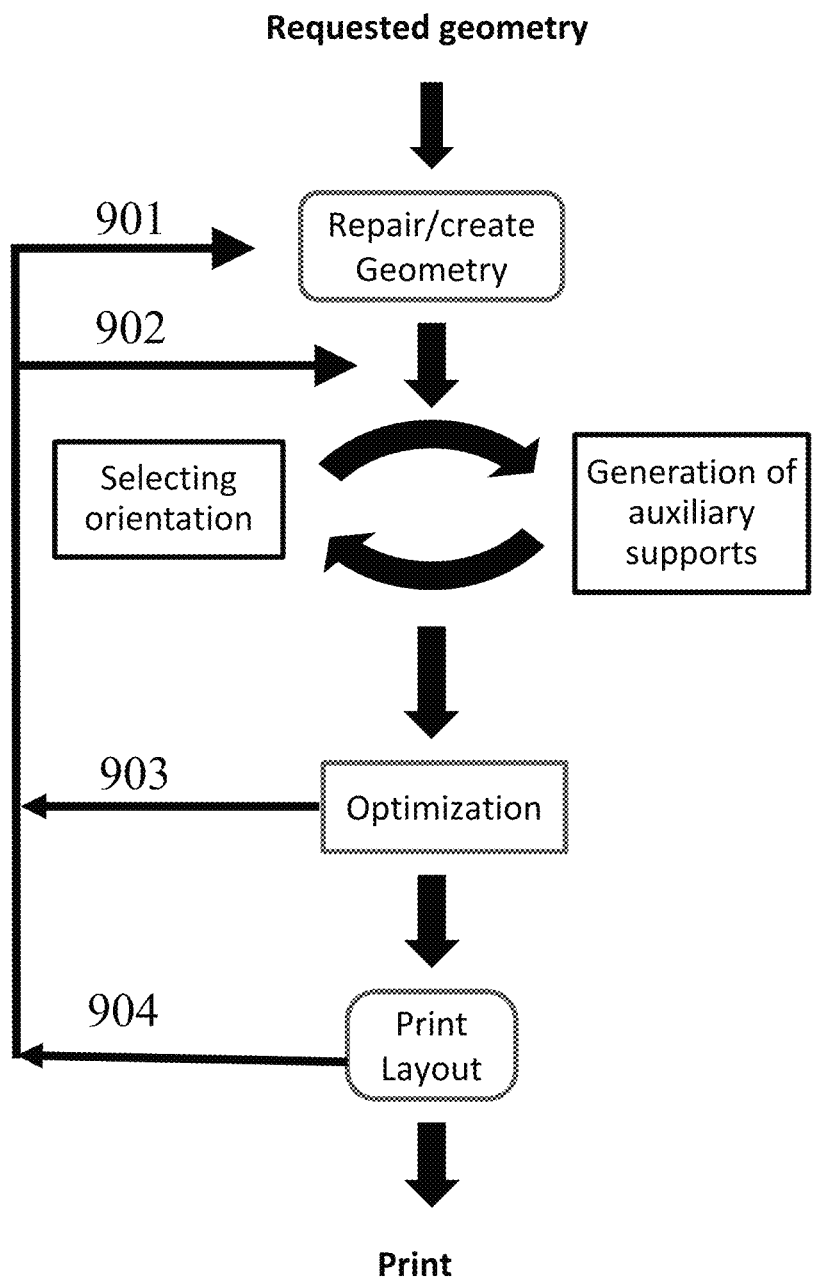
FIG. 9 schematically illustrates a flow diagram used in the printing one or more 3D objects.

FIG. 9 shows an example of a work flow. The work flow may be repeated. Repetition may comprise repeating the optimization of auxiliary support and orientation, as well as the auxiliary support and orientation selection (e.g., from 903 to 902). Repetition may comprise repeating the optimization of auxiliary support and orientation, auxiliary support and orientation selection, and geometry formation (e.g., from 903 to 901). Repetition may comprise repeating the print layout (e.g., optimization thereof), optimization of auxiliary support and orientation, auxiliary support and orientation selection, and geometry formation (e.g., from 904 to 901). Repetition may comprise repeating the print layout (e.g., optimization thereof), optimization of auxiliary support and orientation, and auxiliary support and orientation selection, (e.g., from 904 to 902). At times, the geometry formation may take into account OPC.

In some embodiments, the work flow facilitates printing a portion of the 3D object. The fundamental length scale (e.g., the diameter, spherical equivalent diameter, diameter of a bounding circle, or largest of height, width and length; abbreviated herein as "FLS") of the printed 3D object or a portion thereof can be at least about 50 micrometers ($\mu$m), 80 $\mu$m, 100 $\mu$m, 120 $\mu$m, 150 $\mu$m, 170 $\mu$m, 200 $\mu$m, 230 $\mu$m, 250 $\mu$m, 270 $\mu$m, 300 $\mu$m, 400 $\mu$m, 500 $\mu$m, 600 $\mu$m, 700 $\mu$m, 800 $\mu$m, 1 $\mu$m, 1.5 mm, 2 mm, 3 mm, 5 mm, 1 cm, 1.5 cm, 2 cm, 10 cm, 20 cm, 30 cm, 40 cm, 50 cm, 60 cm, 70 cm, 80 cm, 90 cm, 1 m, 2 m, 3 m, 4 m, 5 m, 10 m, 50 m, 80 m, or 100 m. The FLS of the printed 3D object or a portion thereof can be at most about 150 $\mu$m, 170 $\mu$m, 200 $\mu$m, 230 $\mu$m, 250 $\mu$m, 270 $\mu$m, 300 $\mu$m, 400 $\mu$m, 500 $\mu$m, 600 $\mu$m, 700 $\mu$m, 800 $\mu$m, 1 mm, 1.5 mm, 2 mm, 3 mm, 5 mm, 1 cm, 1.5 cm, 2 cm, 10 cm, 20 cm, 30 cm, 40 cm, 50 cm, 60 cm, 70 cm, 80 cm, 90 cm, 1 m, 2 m, 3 m, 4 m, 5 m, 10 m, 50 m, 80 m, 100 m, 500 m, or 1000 m. The FLS of the printed 3D object or a portion thereof can any value between the afore-mentioned values (e.g., from about 50 $\mu$m to about 1000 m, from about 500 $\mu$m to about 100 m, from about 50 $\mu$m to about 50 cm, or from about 50 cm to about 1000 m). In some cases, the FLS of the printed 3D object or a portion thereof may be in between any of the afore-mentioned FLS values. The portion of the 3D object may be a heated portion or disposed portion (e.g., tile).

In some embodiments, the layer of pre-transformed material (e.g., powder) is of a predetermined height (thickness). The layer of pre-transformed material can comprise the material prior to its transformation in the 3D printing process. The layer of pre-transformed material may have an upper surface that is substantially flat, leveled, or smooth. In some instances, the layer of pre-transformed material may have an upper surface that is not flat, leveled, or smooth. The layer of pre-transformed material may have an upper surface that is corrugated or uneven. The layer of pre-transformed material may have an average or mean (e.g., pre-determined) height. The height of the layer of pre-transformed material (e.g., powder) may be at least about 5 micrometers ($\mu m$), 10 $\mu m$, 20 $\mu m$, 30 $\mu m$, 40 $\mu m$, 50 $\mu m$, 60 $\mu m$, 70 $\mu m$, 80 $\mu m$, 90 $\mu m$, 100 $\mu m$, 200 $\mu m$, 300 $\mu m$, 400 $\mu m$, 500 $\mu m$, 600 $\mu m$, 700 $\mu m$, 800 $\mu m$, 900 $\mu m$, 1 mm, 2 mm, 3 mm, 4 mm, 5 mm, 6 mm, 7 mm, 8 mm, 9 mm, 10 mm, 20 mm, 30 mm, 40 mm, 50 mm, 60 mm, 70 mm, 80 mm, 90 mm, 100 mm, 200 mm, 300 mm, 400 mm, 500 mm, 600 mm, 700 mm, 800 mm, 900 mm, or 1000 mm. The height of the layer of pre-transformed material may be at most about 5 micrometers ($\mu m$), 10 $\mu m$, 20 $\mu m$, 30 $\mu m$, 40 $\mu m$, 50 $\mu m$, 60 $\mu m$, 70 $\mu m$, 80 $\mu m$, 90 $\mu m$, 100 $\mu m$, 200 $\mu m$, 300 $\mu m$, 400 $\mu m$, 500 $\mu m$, 600 $\mu m$, 700 $\mu m$, 800 $\mu m$, 900 $\mu m$, 1 mm, 2 mm, 3 mm, 4 mm, 5 mm, 6 mm, 7 mm, 8 mm, 9 mm, 10 mm, 20 mm, 30 mm, 40 mm, 50 mm, 60 mm, 70 mm, 80 mm, 90 mm, 100 mm, 200 mm, 300 mm, 400 mm, 500 mm, 600 mm, 700 mm, 800 mm, 900 mm, or 1000 mm. The height of the layer of pre-transformed material may be any number between the afore-mentioned heights (e.g., from about 5 $\mu m$ to about 1000 mm, from about 5 $\mu m$ to about 1 mm, from about 25 $\mu m$ to about 1 mm, or from about 1 mm to about 1000 mm) The "height" of the layer of material (e.g., powder) may at times be referred to as the "thickness" of the layer of material. In some instances, the layer of hardened material may be a sheet of metal. The layer of hardened material may be fabricated using a 3D manufacturing methodology. Occasionally, the first layer of hardened material may be thicker than a subsequent layer of hardened material. The first layer of hardened material may be at least about 1.1 times, 1.2 times, 1.4 times, 1.6 times, 1.8 times, 2 times, 4 times, 6 times, 8 times, 10 times, 20 times, 30 times, 50 times, 100 times, 500 times, 1000 times, or thicker (higher) than the average (or mean) thickness of a subsequent layer of hardened material, the average thickens of an average subsequent layer of hardened material, or the average thickness of any of the subsequent layers of hardened material. FIG. 16 shows an example of a schematic cross section in a 3D object 1611 comprised of layers of hardened material numbered 1 to 6, with 6 being the first layer (e.g., bottom skin layer). In some instances, layer #1 can be thicker than any of the layers #2 to #6. In some instances, layer #1 can be thicker than an average thickens of layers #2 to #6. The very first layer of hardened material formed in the material bed by 3D printing may be referred herein as the "bottom skin" layer.

In some instances, one or more intervening layers separate adjacent components from one another. For example, the one or more intervening layers can have a thickness of at most about 10 micrometers ("microns"), 1 micron, 500 nanometers ("nm"), 100 nm, 50 nm, 10 nm, or 1 nm. For example, the one or more intervening layers can have a thickness of at least about 10 micrometers ("microns"), 1 micron, 500 nanometers ("nm"), 100 nm, 50 nm, 10 nm, or 1 nm. In an example, a first layer is adjacent to a second layer when the first layer is in direct contact with the second layer. In another example, a first layer is adjacent to a second layer when the first layer is separated from the second layer by a third layer. In some instances, adjacent to may be 'above' or 'below.' Below can be in the direction of the gravitational force or towards the platform. Above can be in the direction opposite to the gravitational force or away from the platform.

While preferred embodiments of the present invention(s) have been shown, and described herein, it will be obvious to those skilled in the art that such embodiments are provided by way of example only. It is not intended that the invention(s) be limited by the specific examples provided within the specification. While the invention(s) has been described with reference to the afore-mentioned specification, the descriptions and illustrations of the embodiments herein are not meant to be construed in a limiting sense. Numerous variations, changes, and substitutions will now occur to those skilled in the art without departing from the invention(s). Furthermore, it shall be understood that all aspects of the invention(s) are not limited to the specific depictions, configurations, or relative proportions set forth herein which depend upon a variety of conditions and variables. It should be understood that various alternatives to the embodiments of the invention(s) described herein might be employed in practicing the invention(s). It is therefore contemplated that the invention(s) shall also cover any such alternatives, modifications, variations, or equivalents. It is intended that the following claims define the scope of the invention(s) and that methods and structures within the scope of these claims and their equivalents be covered thereby.

What is claimed is:

1. An apparatus for printing at least one three-dimensional object, the apparatus comprising:
   a processing chamber configured to facilitate the printing of the at least one three-dimensional object, the processing chamber being configured to accommodate a first atmosphere; and
   a build module configured to accommodate the at least one three-dimensional object, the build module being configured to accommodate a second atmosphere,
   the processing chamber and the build module being configured to reversibly engage and disengage one another, the build module being configured to accommodate a positive pressure of the second atmosphere after the printing of the at least one three-dimensional object, the positive pressure being above ambient pressure external to the build module, and
   one or more of the following:
   (A) the apparatus further comprises an energy source configured to generate an energy beam that transforms a pre-transformed material into a transformed material as part of the printing of the at least one three-dimensional object;
   (B) the build module is configured to accommodate the positive pressure of the second atmosphere at a time including (i) after the printing of the at least one three-dimensional object, and (ii) after disengagement of the build module from the processing chamber;
   (C) the build module is configured to accommodate the at least one three-dimensional object during the printing;
   (D) the build module is configured to engage with a first shutter;
   (E) the processing chamber is configured to engage with a second shutter;
   (F) the build module comprises a reversibly closable shutter that is configured to maintain in the build module the second atmosphere excluding at least one component present in an ambient atmosphere, the at least one component present in the ambient atmosphere being a reactive agent, and the reversibly closable shutter being configured to facilitate excluding the reactive agent in the second atmosphere below a threshold value, the reactive agent being able to react with the pre-transformed material during the printing, the reversibly closable shutter being configured to exclude the reactive agent at least in part by keeping an amount of the reactive agent below the threshold value; or (G) any combination of (A), (B), (C), (D), (E), and (F).

2. The apparatus of claim 1, wherein the processing chamber and/or the build module are configured to facilitate pressure regulation to at least about 0.3 pound per square inch (PSI) above the ambient pressure, the pressure regulated being (i) of the first atmosphere and/or (ii) of the second atmosphere.

3. The apparatus of claim 1, wherein the build module is configured to accommodate the positive pressure of the second atmosphere at the time including (i) after the printing of the at least one three-dimensional object, and (ii) after the disengagement of the build module from the processing chamber.

4. The apparatus of claim 1, wherein (i) the build module and/or (ii) the processing chamber, are configured to be reversibly sealable including sealing and unsealing.

5. The apparatus of claim 1, wherein the apparatus is configured to maintain the first atmosphere and/or the second atmosphere during a plurality of printing cycles such that the first atmosphere and/or the second atmosphere: (a) is above the ambient pressure, (b) is inert, (c) is different from the ambient atmosphere, (d) is non-reactive with the pre-transformed material and/or the at least one three-dimensional object, (e) comprises the reactive agent below the threshold value, or (f) any combination thereof, wherein the apparatus is configured to print one or more three-dimensional objects during each printing cycle of the plurality of printing cycles.

6. The apparatus of claim 1, wherein the build module is configured to cool the at least one three-dimensional object.

7. The apparatus of claim 1, wherein the build module comprises a platform configured to be vertically translatable at least in part by using a translation mechanism comprising: an encoder, a vertical guide post, a vertical screw, a horizontal screw, a linear motor, a bearing, a shaft, a gear, or a bellow; and wherein the mechanism is operatively coupled to the platform.

8. The apparatus of claim 7, wherein the build module comprises the platform configured to be vertically translatable at least in part by using the encoder.

9. The apparatus of claim 1, wherein the build module comprises a platform that is configured to be vertically translatable at least in part by using a translation mechanism comprising: an optical encoder, a magnetic encoder, an air bearing, or a ball bearing; and wherein the mechanism is operatively coupled to the platform.

10. The apparatus of claim 9, wherein the build module comprises the platform that is configured to be vertically translatable at least in part by using the optical encoder.

11. The apparatus of claim 1, further comprising the energy source configured to generate the energy beam that transforms the pre-transformed material into the transformed material as part of the printing of the at least one three-dimensional object.

12. The apparatus of claim 1, wherein the build module comprises the reversibly closable shutter that is configured to maintain in the build module the second atmosphere (i) having a pressure above the ambient pressure, (ii) having an inert atmosphere, (iii) excluding the at least one component present in the ambient atmosphere, or (iv) any combination of (i), (ii) and (iii); and wherein the reversibly closable shutter is configured to reversibly close and open.

13. The apparatus of claim 12, further comprising a force source configured to automatically actuate the reversibly closable shutter.

14. The apparatus of claim 13, wherein the force source is configured to generate a force comprising: a mechanical, a magnetic, a pneumatic, a hydraulic, an electrostatic, or an electric force.

15. The apparatus of claim 12, wherein the reversibly closable shutter is configured to be at least in part manually actuated.

16. The apparatus of claim 1, wherein the build module comprises the reversibly closable shutter that is configured to maintain in the build module the second atmosphere excluding the at least one component present in the ambient atmosphere, the at least one component present in the ambient atmosphere being the reactive agent, the reversibly closable shutter being configured to facilitate excluding the reactive agent in the second atmosphere below the threshold value, the reversibly closable shutter being configured to exclude the reactive agent, the reactive agent being able to react with the pre-transformed material during the printing, and the reversibly closable shutter being configured to exclude the reactive agent at least in part by keeping the amount of the reactive agent below the threshold value.

17. The apparatus of claim 1, wherein the build module is configured to accommodate the at least one three-dimensional object during the printing.

18. The apparatus of claim 1, wherein the build module is configured to seal and accommodate the positive pressure of the second atmosphere after the printing of the at least one three-dimensional object.

19. The apparatus of claim 18, wherein the build module is configured to engage with the first shutter to (i) seal the build module and (ii) accommodate the positive pressure in the build module.

20. The apparatus of claim 1, wherein the build module is configured to engage with the first shutter.

21. The apparatus of claim 1, wherein the processing chamber is configured to engage with the second shutter.

22. A method of printing at least one three-dimensional object, the method comprising: (I) providing the apparatus of claim 1; and (II) using the apparatus to print the at least one three-dimensional object.

23. The method of claim 22, further comprising accommodating the positive pressure of the second atmosphere in the build module at the time including (i) after the printing of the at least one three-dimensional object, and (ii) after the disengagement of the build module from the processing chamber.

24. The method of claim 22, further comprising maintaining the first atmosphere and/or the second atmosphere during a plurality of printing cycles such that the first atmosphere and/or the second atmosphere: (a) is above the ambient pressure, (b) is inert, (c) is different from the ambient atmosphere, (d) is non-reactive with the pre-transformed material and/or the at least one three-dimensional object, (e) comprises the reactive agent below the threshold value, or (f) any combination of (a) to (e), wherein one or more three-dimensional objects are printed during each printing cycle of the plurality of printing cycles.

25. The method of claim 22, further comprising cooling the at least one three-dimensional object at least in part by using the build module.

26. The method of claim 22, further comprising maintaining in the second atmosphere the reactive agent below the threshold value, the reactive agent being present in the ambient atmosphere external to the build module at least in part by shutting the reversibly closable shutter, the reversibly closable shutter being configured to facilitate excluding the reactive agent in the second atmosphere below the threshold value.

27. The method of claim 22, further comprising regulating pressure in the processing chamber and/or the build module; and wherein regulating the pressure is to at least about 0.3 pound per square inch (PSI) above the ambient pressure, the pressure being (i) of the first atmosphere and/or (ii) of the second atmosphere.

28. The method of claim 22, further comprising reversibly sealing including sealing and unsealing: (i) the build module and/or (ii) the processing chamber.

29. The method of claim 22, further comprising engaging the processing chamber with the second shutter.

30. The method of claim 22, wherein the build module comprises a platform; and wherein the method further comprises vertically translating the platform at least in part by using a translation mechanism comprising: an encoder, a vertical guide post, a vertical screw, a horizontal screw, a linear motor, a bearing, a shaft, a gear, or a bellow.

31. The method of claim 30, wherein using the translation mechanism comprises using the encoder.

32. The method of claim 22, wherein the build module comprises a platform that is configured to be vertically translatable at least in part by using a translation mechanism comprising: an optical encoder, a magnetic encoder, an air bearing, or a ball bearing.

33. The method of claim 32, wherein using the translation mechanism comprises using the optical encoder.

34. The method of claim 22, wherein the build module comprises the reversibly closable shutter; and wherein the method further comprises using the reversibly closable shutter to maintain in the build module the second atmosphere (i) having a pressure above the ambient pressure, (ii) having an inert atmosphere, (iii) excluding the at least one component present in the ambient atmosphere, or (iv) any combination of (i), (ii) and (iii); and wherein using the reversibly closable shutter comprises reversibly closing and opening the reversibly closable shutter.

35. The method of claim 34, wherein using the reversibly closable shutter comprises manually actuating the reversibly closable shutter.

36. The method of claim 34, further comprising using a force source to automatically actuate the reversibly closable shutter.

37. The method of claim 36, further comprising using the force source to generate a force comprising: a mechanical, a magnetic, a pneumatic, a hydraulic, an electrostatic, or an electric force.

38. The method of claim 22, further comprising using the build module to seal and accommodate the positive pressure of the second atmosphere after the printing of the at least one three-dimensional object.

39. The method of claim 38, further comprising engaging the build module with the first shutter to (i) seal the build module and (ii) accommodate the positive pressure in the build module.

40. The method of claim 22, further comprising using the energy source to generate the energy beam to transform the pre-transformed material into the transformed material as part of the printing of the at least one three-dimensional object.

41. The method of claim 22, further compromising accommodating in the build module the at least one three-dimensional object during the printing.

42. The method of claim 22, further comprising engaging the build module and the first shutter.

* * * * *

UNITED STATES PATENT AND TRADEMARK OFFICE
CERTIFICATE OF CORRECTION

PATENT NO. : 11,691,343 B2
APPLICATION NO. : 16/419912
DATED : July 4, 2023
INVENTOR(S) : Benyamin Buller et al.

Page 1 of 2

It is certified that error appears in the above-identified patent and that said Letters Patent is hereby corrected as shown below:

In the Claims

In Claim 1, Column 149, Lines 3-4:
"reactive agent in the second atmosphere below a threshold value"
Should read:
--reactive agent in the second atmosphere to below a threshold value--

In Claim 7, Column 149, Lines 44-45:
"wherein the mechanism is operatively coupled to the platform"
Should read:
--wherein the translation mechanism is operatively coupled to the platform--

In Claim 9, Column 149, Lines 53-54:
"wherein the mechanism is operatively coupled to the platform"
Should read:
--wherein the translation mechanism is operatively coupled to the platform--

In Claim 16, Column 150, Lines 21-23:
"the reactive agent in the second atmosphere below the threshold value"
Should read:
--the reactive agent in the second atmosphere to below the threshold value--

In Claim 26, Column 151, Lines 7-8:
"the reactive agent in the second atmosphere below the threshold value"
Should read:
--the reactive agent in the second atmosphere to below the threshold value--

Signed and Sealed this
Sixth Day of February, 2024

Katherine Kelly Vidal
*Director of the United States Patent and Trademark Office*

CERTIFICATE OF CORRECTION (continued)
U.S. Pat. No. 11,691,343 B2

In Claim 42, Column 152, Lines 34-35:
"engaging the build module and the first shutter"
Should read:
--engaging the build module with the first shutter--